(12) United States Patent
Isobe et al.

(10) Patent No.: US 7,749,818 B2
(45) Date of Patent: Jul. 6, 2010

(54) SEMICONDUCTOR DEVICE AND METHOD OF MANUFACTURING THE SAME

(75) Inventors: Atsuo Isobe, Kanagawa (JP); Shunpei Yamazaki, Tokyo (JP); Chiho Kokubo, Tochigi (JP); Koichiro Tanaka, Kanagawa (JP); Akihisa Shimomura, Kanagawa (JP); Tatsuya Arao, Kanagawa (JP); Hidekazu Miyairi, Kanagawa (JP); Mai Akiba, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 47 days.

(21) Appl. No.: 10/352,233

(22) Filed: Jan. 28, 2003

(65) Prior Publication Data

US 2003/0218171 A1 Nov. 27, 2003

(30) Foreign Application Priority Data

| Jan. 28, 2002 | (JP) | ............................. 2002-019286 |
| Feb. 4, 2002 | (JP) | ............................. 2002-027382 |
| Feb. 4, 2002 | (JP) | ............................. 2002-027492 |
| Apr. 19, 2002 | (JP) | ............................. 2002-118154 |

(51) Int. Cl.
*H01L 21/00* (2006.01)
*H01L 21/84* (2006.01)

(52) U.S. Cl. ................. 438/151; 257/E21.633
(58) Field of Classification Search ................. 438/142, 438/151, 166, 478–479, 482, 485–486, 487, 438/149, 182, 280
See application file for complete search history.

(56) References Cited

U.S. PATENT DOCUMENTS

| 4,330,363 A | 5/1982 | Biegesen et al. |
| 4,385,937 A | 5/1983 | Ohmura |
| 4,565,584 A | 1/1986 | Tamura et al. |
| 4,597,060 A | 6/1986 | Mitchell et al. |

(Continued)

FOREIGN PATENT DOCUMENTS

EP  1 049 144  11/2000

(Continued)

OTHER PUBLICATIONS

Wolf, S., "Silicon Processing for the VLSI ERA", vol. 2 —Process Integration, ISBN 0-961672-4-5 (1990).*

(Continued)

*Primary Examiner*—W. David Coleman
(74) *Attorney, Agent, or Firm*—Eric J. Robinson; Robinson Intellectual Property Law Office, P.C.

(57) ABSTRACT

An objective is to provide a method of manufacturing a semiconductor device, and a semiconductor device manufactured by using the manufacturing method, in which a laser crystallization method is used that is capable of preventing the formation of grain boundaries in TFT channel formation regions, and is capable of preventing conspicuous drops in TFT mobility, reduction in the ON current, and increases in the OFF current, all due to grain boundaries. Stripe shape or rectangular shape unevenness or opening is formed. Continuous wave laser light is then irradiated to a semiconductor film formed on an insulating film. Note that although it is most preferable to use continuous wave laser light at this point, pulse wave oscillation laser light may also be used.

30 Claims, 70 Drawing Sheets

U.S. PATENT DOCUMENTS

| | | | |
|---|---|---|---|
| 4,933,298 A | 6/1990 | Hasegawa | |
| 5,011,787 A | 4/1991 | Jeuch | |
| 5,338,959 A | 8/1994 | Kim et al. | |
| 5,397,908 A | 3/1995 | Dennison et al. | |
| 5,432,122 A | 7/1995 | Chae | |
| 5,568,288 A | 10/1996 | Yamazaki et al. | |
| 5,643,826 A | 7/1997 | Ohtani et al. | |
| 5,696,003 A | 12/1997 | Makita et al. | |
| 5,759,879 A | 6/1998 | Iwasaki | |
| 5,770,486 A * | 6/1998 | Zhang et al. | 438/163 |
| 5,808,321 A | 9/1998 | Mitanaga et al. | |
| 5,821,562 A | 10/1998 | Makita et al. | |
| 5,851,862 A | 12/1998 | Ohtani et al. | |
| 5,854,803 A | 12/1998 | Yamazaki et al. | |
| 5,893,990 A * | 4/1999 | Tanaka | 219/121.8 |
| 5,894,137 A | 4/1999 | Yamazaki et al. | |
| 5,894,151 A * | 4/1999 | Yamazaki et al. | 257/347 |
| 5,937,282 A | 8/1999 | Nakajima et al. | |
| 5,942,768 A | 8/1999 | Zhang | |
| 5,986,306 A | 11/1999 | Nakajima et al. | |
| 5,990,527 A | 11/1999 | Wen | |
| 6,029,680 A * | 2/2000 | Hawthorne et al. | 134/1.3 |
| 6,127,702 A * | 10/2000 | Yamazaki et al. | 257/347 |
| 6,133,583 A | 10/2000 | Ohtani et al. | |
| 6,160,269 A | 12/2000 | Takemura et al. | |
| 6,171,890 B1 * | 1/2001 | Adachi et al. | 438/162 |
| 6,365,933 B1 | 4/2002 | Yamazaki et al. | |
| 6,373,082 B1 | 4/2002 | Ohno et al. | |
| 6,410,368 B1 | 6/2002 | Kawasaki et al. | |
| 6,413,802 B1 | 7/2002 | Hu et al. | |
| 6,479,331 B1 | 11/2002 | Takemura | |
| 6,558,989 B1 * | 5/2003 | Moon | 438/151 |
| 6,599,783 B2 | 7/2003 | Takatoku | |
| 6,599,790 B1 * | 7/2003 | Yamazaki et al. | 438/166 |
| 6,600,197 B1 | 7/2003 | Nakajima et al. | |
| 6,617,226 B1 | 9/2003 | Suguro et al. | |
| 6,636,280 B1 * | 10/2003 | Miyazawa et al. | 349/43 |
| 6,677,191 B1 * | 1/2004 | Battersby | 438/161 |
| 6,700,133 B1 | 3/2004 | Ohtani et al. | |
| 6,746,901 B2 | 6/2004 | Kasahara et al. | |
| 6,780,687 B2 | 8/2004 | Nakajima et al. | |
| 6,841,797 B2 | 1/2005 | Isobe et al. | |
| 6,906,383 B1 | 6/2005 | Zhang et al. | |
| 6,933,527 B2 | 8/2005 | Isobe et al. | |
| 7,064,016 B2 | 6/2006 | Kasahara et al. | |
| 7,109,069 B2 | 9/2006 | Kokubo et al. | |
| 7,115,903 B2 | 10/2006 | Isobe et al. | |
| 7,129,522 B2 | 10/2006 | Nakajima et al. | |
| 7,297,585 B2 | 11/2007 | Maeda et al. | |
| 7,339,235 B1 * | 3/2008 | Yamazaki et al. | 257/345 |
| 2001/0000243 A1 * | 4/2001 | Sugano et al. | 438/166 |
| 2001/0002719 A1 | 6/2001 | Shimizu et al. | |
| 2001/0035526 A1 | 11/2001 | Yamazaki et al. | |
| 2001/0036755 A1 * | 11/2001 | Tanaka | 438/795 |
| 2001/0055830 A1 * | 12/2001 | Yoshimoto | 438/48 |
| 2002/0036290 A1 | 3/2002 | Inaba et al. | |
| 2002/0048864 A1 | 4/2002 | Yamazaki et al. | |
| 2002/0098628 A1 | 7/2002 | Hamada et al. | |
| 2002/0134981 A1 | 9/2002 | Nakamura et al. | |
| 2002/0192956 A1 * | 12/2002 | Kizilyalli et al. | 438/689 |
| 2003/0141505 A1 * | 7/2003 | Isobe et al. | 257/66 |
| 2003/0141521 A1 * | 7/2003 | Isobe et al. | 257/200 |
| 2003/0186490 A1 | 10/2003 | Kato et al. | |
| 2003/0230749 A1 | 12/2003 | Isobe et al. | |
| 2003/0234395 A1 | 12/2003 | Kokubo et al. | |
| 2004/0132236 A1 * | 7/2004 | Doris et al. | 438/182 |
| 2006/0246634 A1 | 11/2006 | Kasahara et al. | |
| 2007/0015323 A1 | 1/2007 | Isobe et al. | |
| 2007/0051957 A1 | 3/2007 | Nakajima et al. | |
| 2007/0085080 A1 | 4/2007 | Isobe et al. | |

FOREIGN PATENT DOCUMENTS

| | | | |
|---|---|---|---|
| JP | 57-023217 | | 2/1982 |
| JP | 58015226 A | * | 1/1983 |
| JP | 58-086717 | | 5/1983 |
| JP | 58-151042 | | 9/1983 |
| JP | 62-104117 | | 5/1987 |
| JP | 02-143417 | | 6/1990 |
| JP | 03-288475 | | 12/1991 |
| JP | 04-180030 | | 6/1992 |
| JP | 06-244208 | | 9/1994 |
| JP | 07-130652 | | 5/1995 |
| JP | 07-249779 | | 9/1995 |
| JP | 08-078329 | | 3/1996 |
| JP | 08-097431 | | 4/1996 |
| JP | 08-195357 | | 7/1996 |
| JP | 08-288515 | | 11/1996 |
| JP | 10064842 A | * | 3/1998 |
| JP | 10-135468 | | 5/1998 |
| JP | 10-135469 | | 5/1998 |
| JP | 11-121753 | | 4/1999 |
| JP | 11-177102 | | 7/1999 |
| JP | 2000-068520 | | 3/2000 |
| JP | 2000-183351 | | 6/2000 |
| JP | 2001-011085 | | 1/2001 |
| JP | 2001-091941 | | 4/2001 |
| JP | 2001-144027 | | 5/2001 |
| JP | 02001144302 A | * | 5/2001 |
| JP | 2001-274433 | | 10/2001 |
| JP | 2001-284601 | | 10/2001 |
| JP | 2001-324723 | | 11/2001 |
| JP | 2002-009289 | | 1/2002 |
| JP | 2002-014337 | | 1/2002 |
| JP | 2002-033330 | | 1/2002 |
| JP | 2002-313811 | | 10/2002 |
| JP | 2002-324808 | | 11/2002 |

OTHER PUBLICATIONS

Geis et al., "Crystalline Silicon on Insulators by Graphoepitaxy," IEEE 1979, pp. 210-212.

Geis et al., "Grapho-epitaxy of Silicon on Fused Silica Using Surface Micropatterns and Laser Crystallization," J. Vac. Sci. Tech., 16(6), Nov./Dec. 1979, pp. 1640-1643.

Smith et al., *Oriented Crystal Growth on Amorphous Substrates Using Artificial Surface-Relief Gratings*, Applied Physics Letters, vol. 32, No. 6, pp. 349-350, Mar. 15, 1978.

Biegelsen et al., *Laser-Induced Crystallization of Silicon Islands on Amorphous Substrates: Multilayer Structures*, Applied Physics Letters, vol. 38, No. 3, pp. 150-152, Feb. 1, 1981.

Lam et al., *Characteristics of MOSFETS Fabricated in Laser-Recrystallized Polysilicon Islands with a Retaining Wall Structure on an Insulating Substrate*, IEEE Electron Device Letters, vol. EDL-1, No. 10, pp. 206-208, Oct. 1980.

Official Action dated Aug. 9, 2005 for U.S. Appl. No. 10/352,240, filed Jan. 28, 2003 to Isobe.

'Office Action U.S. Appl. No. 200710142234.X) Dated Aug. 14, 2009.

Office Action (Application No. JP 2003-019447) dated Dec. 15, 2009.

* cited by examiner

Fig. 2A  $d < t02$, $W1, W2 \leq 1\mu m$
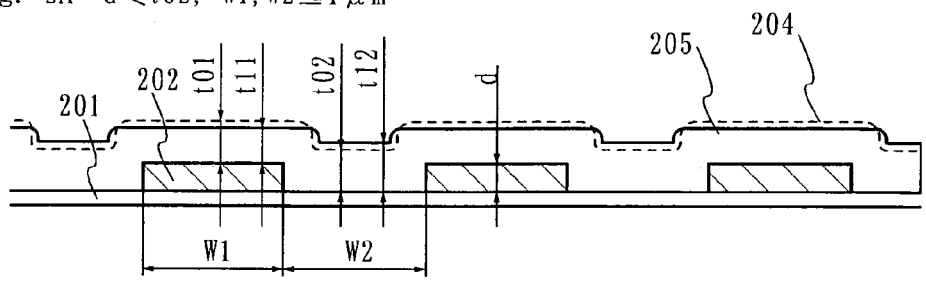
Fig. 2B  $d \geq t02$, $W1, W2 \leq 1\mu m$
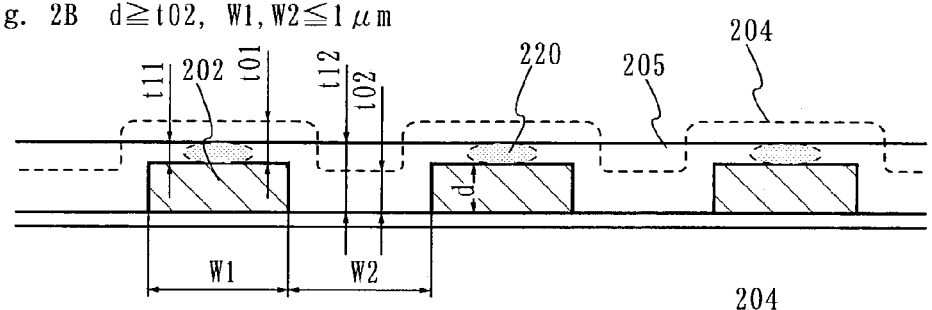
Fig. 2C  $d \gg t02$, $W1, W2 \leq 1\mu m$
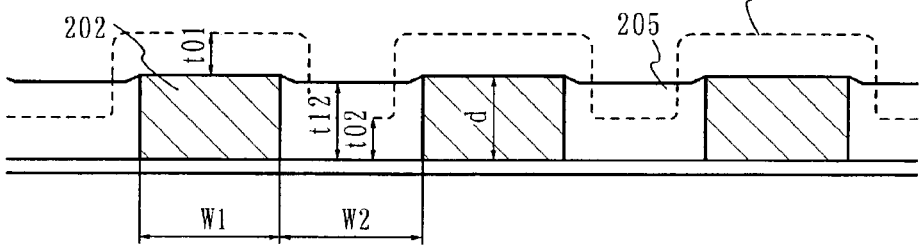
Fig. 2D  $d \geq t02$, $W1, W2 \geq 1\mu m$
(W1, W2 are almost equal to or slightly greater than $1\mu m$)
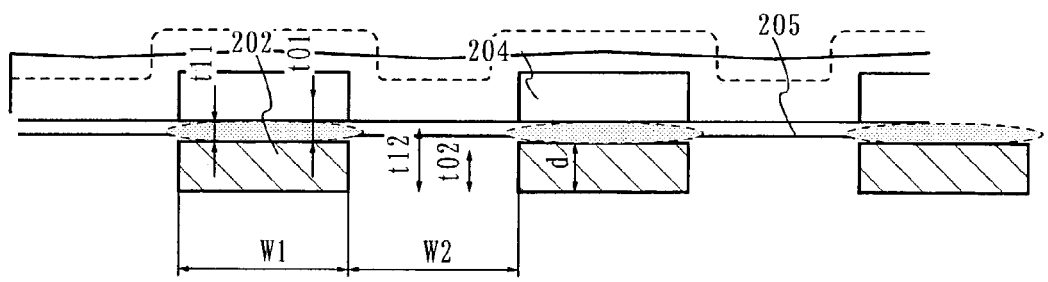
Fig. 2E  $d \geq t02$, $W1, W2 > 1\mu m$
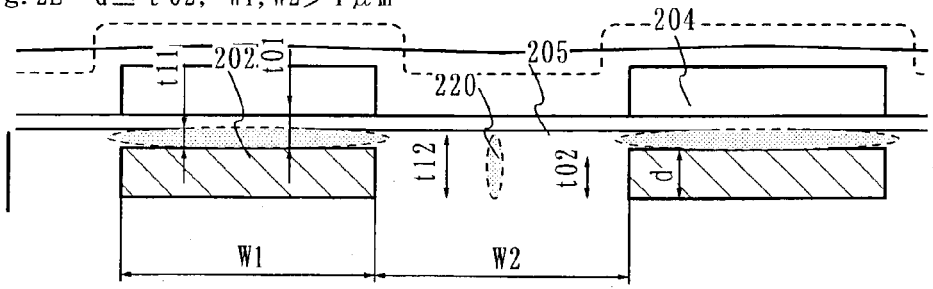

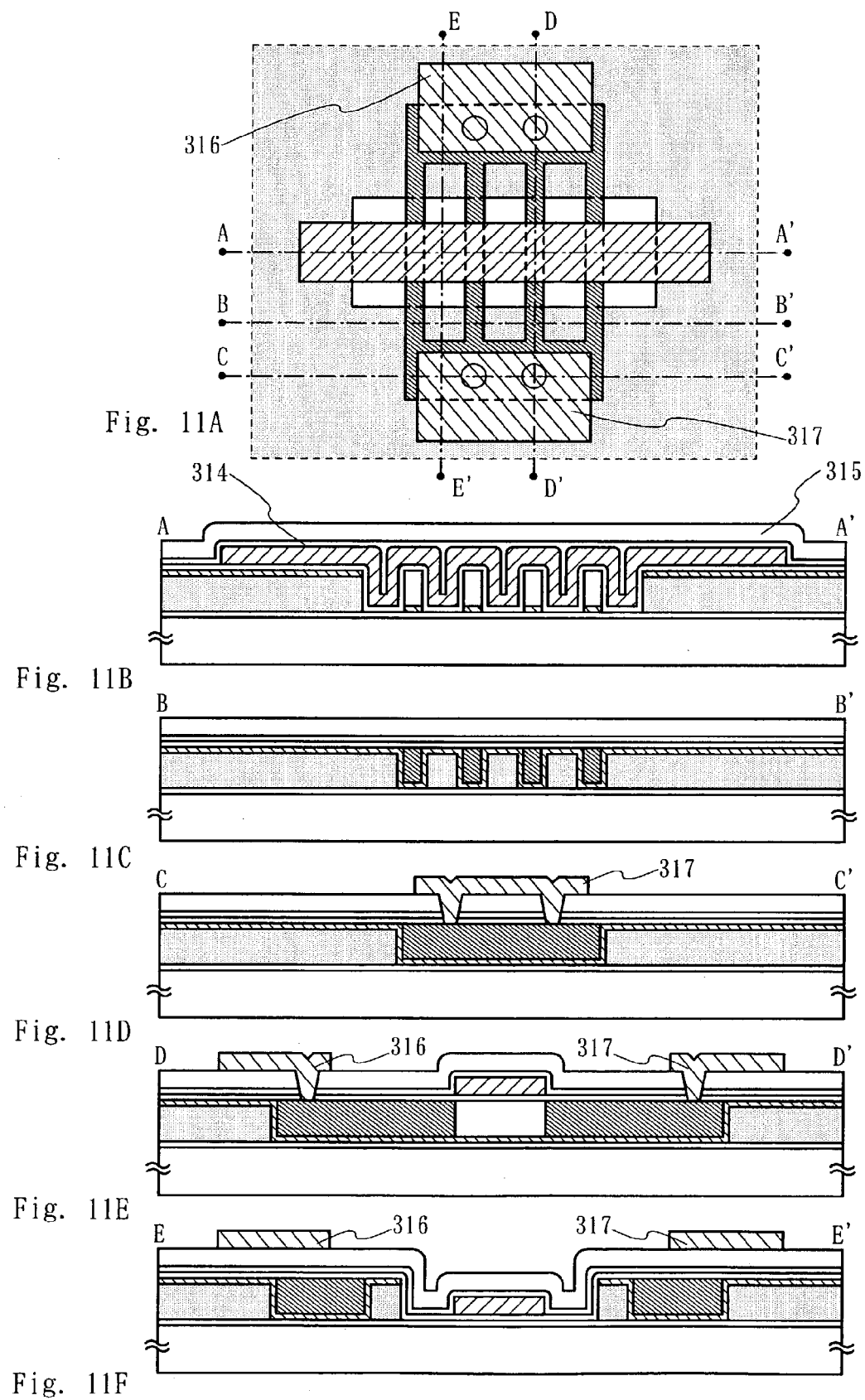

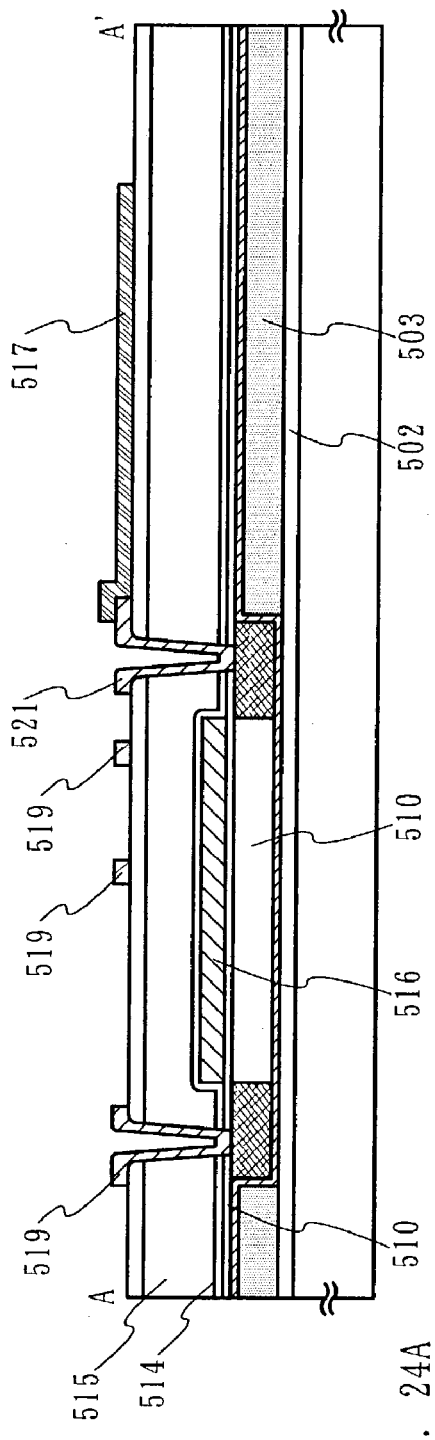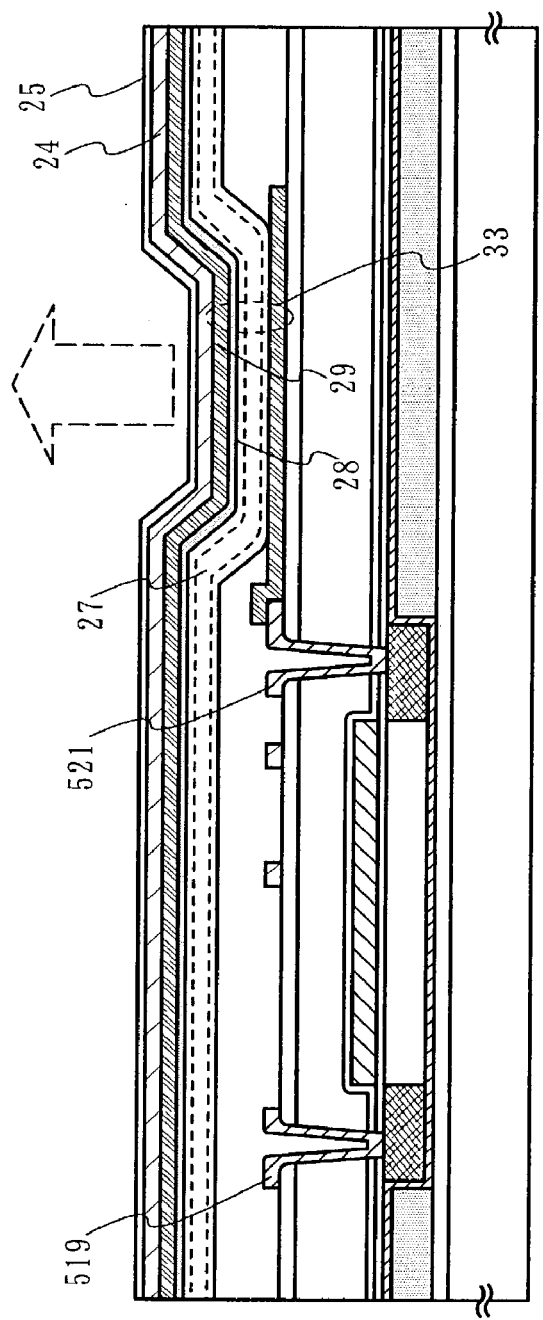
Fig. 24A
Fig. 24B

Fig. 27
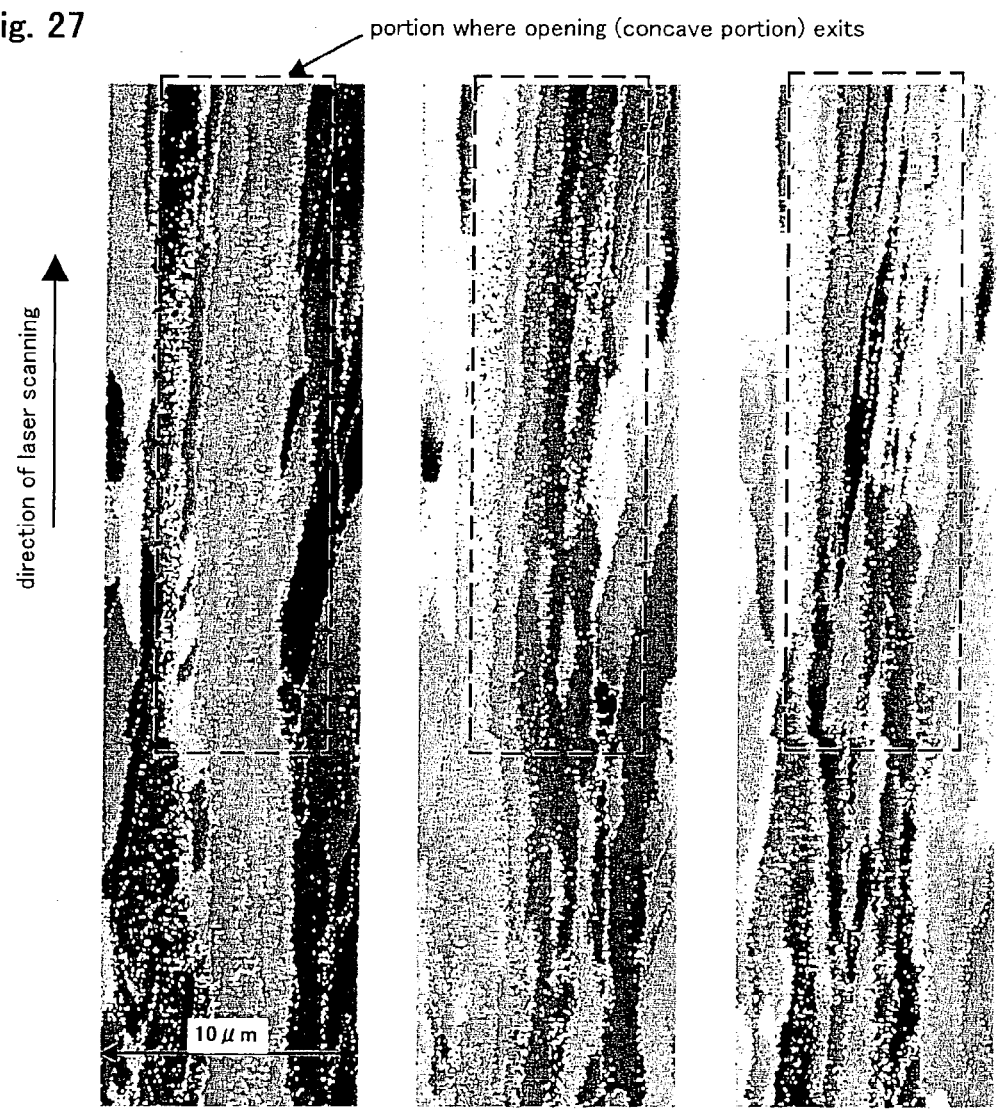
portion where opening (concave portion) exits
direction of laser scanning
10 μm
2.00 μm = 20 st  2.00 μm = 20 st  2.00 μm = 20 st
IPF [100]        IPF [010]        IPF [001]
Laser scan direction [100]
Gray Scale Map Type: <none>
Color Coded Map Type: Inverse Pole Figure [001]
fcc_generic
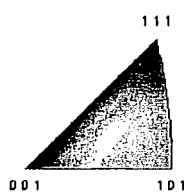
direction of laser scanning
[100]
[010]
[001]
direction perpendicular to substarte
Boundaries: <none>

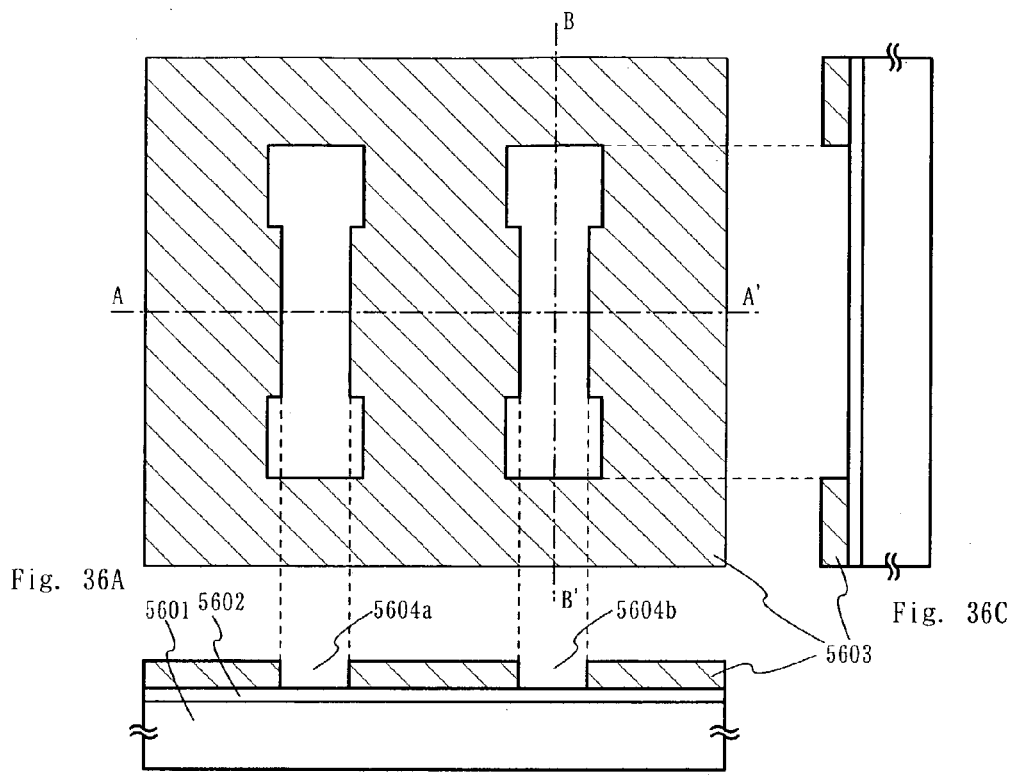
Fig. 36A
Fig. 36B
Fig. 36C
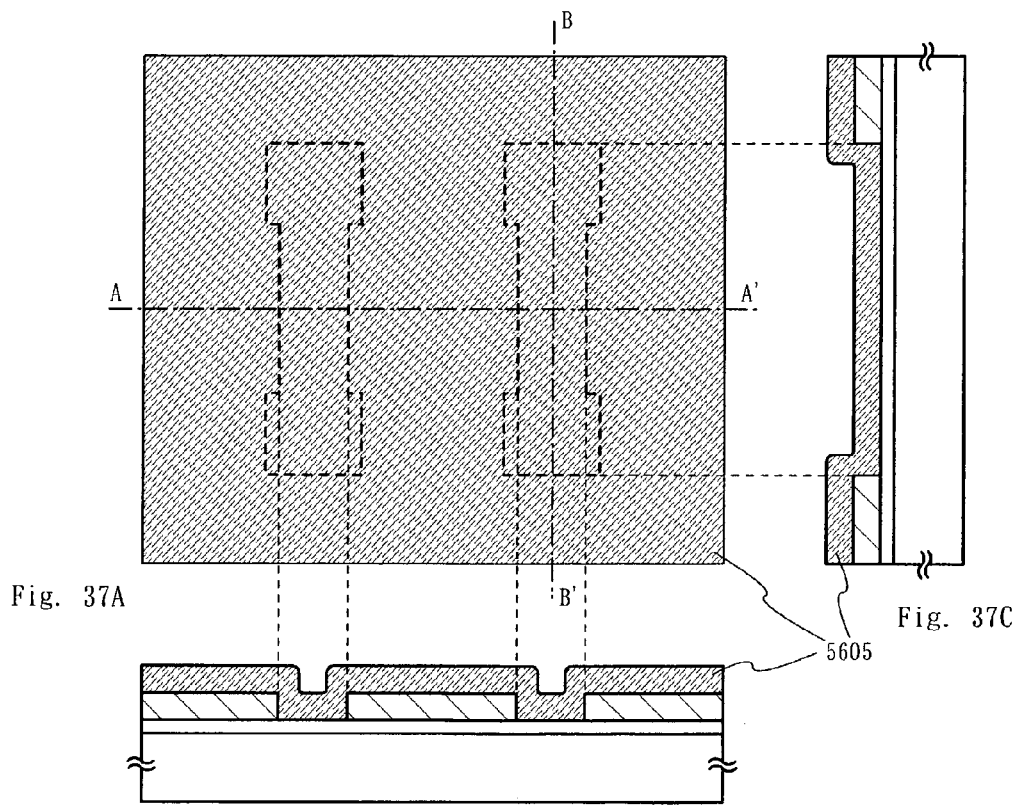
Fig. 37A
Fig. 37B
Fig. 37C

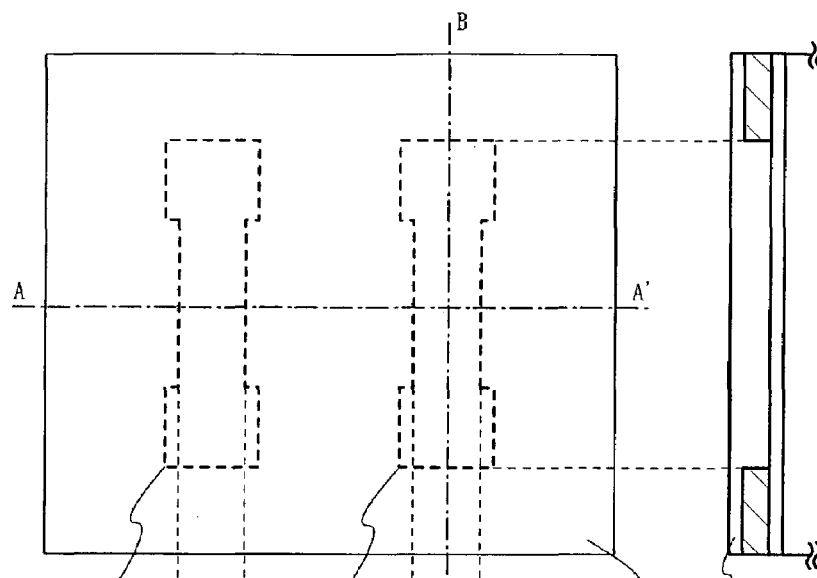
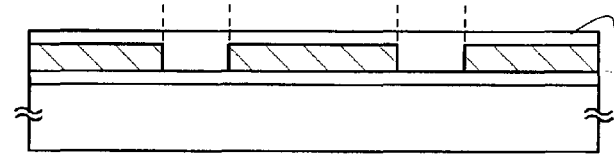
Fig. 38A  5604a  5604b  Fig. 38C
Fig. 38 B  5606
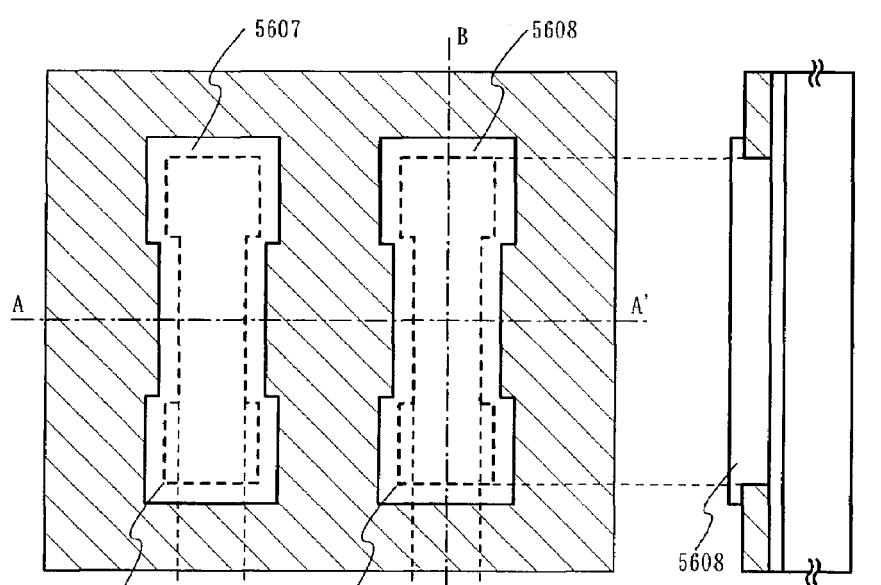
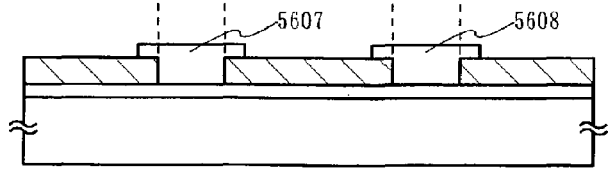
Fig. 39A  5604a  5604b  Fig. 39C
Fig. 39B  5607  5608

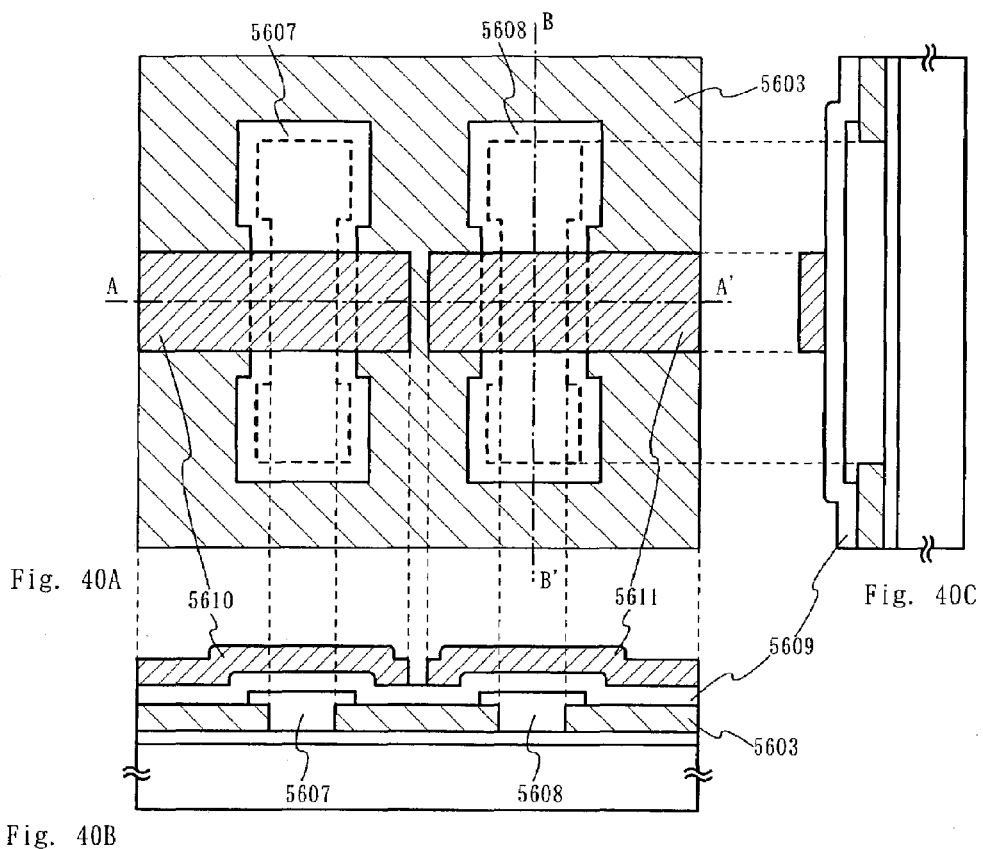
Fig. 40A
Fig. 40B
Fig. 40C
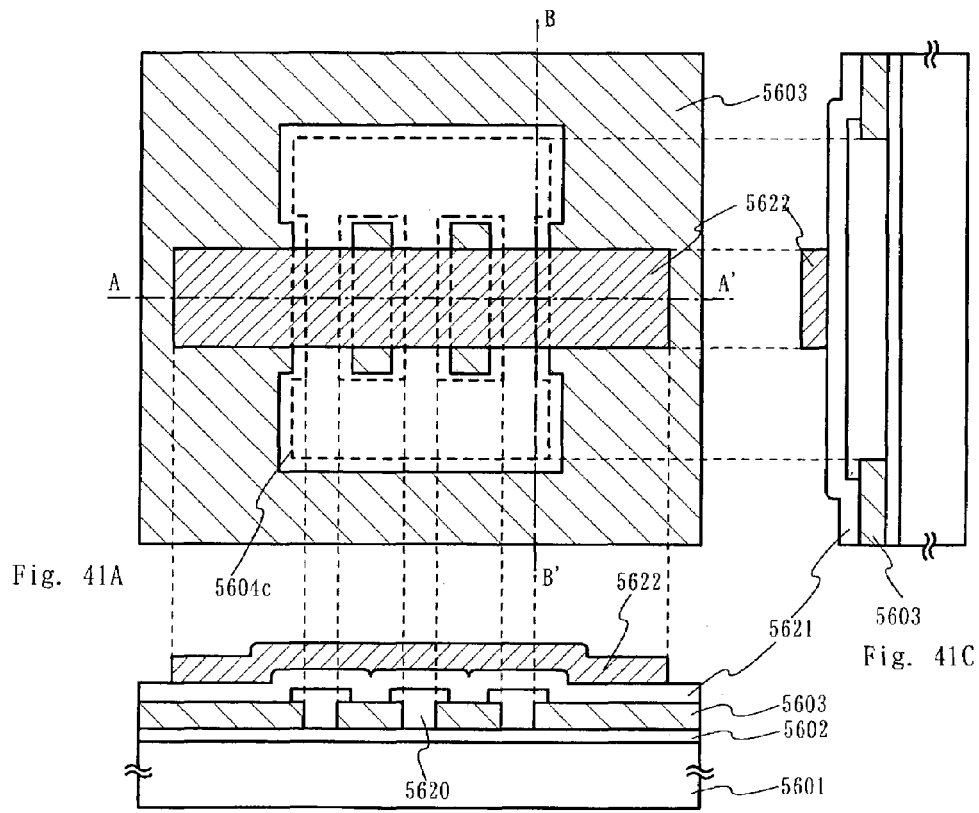
Fig. 41A
Fig. 41B
Fig. 41C

Fig. 67A B-B'
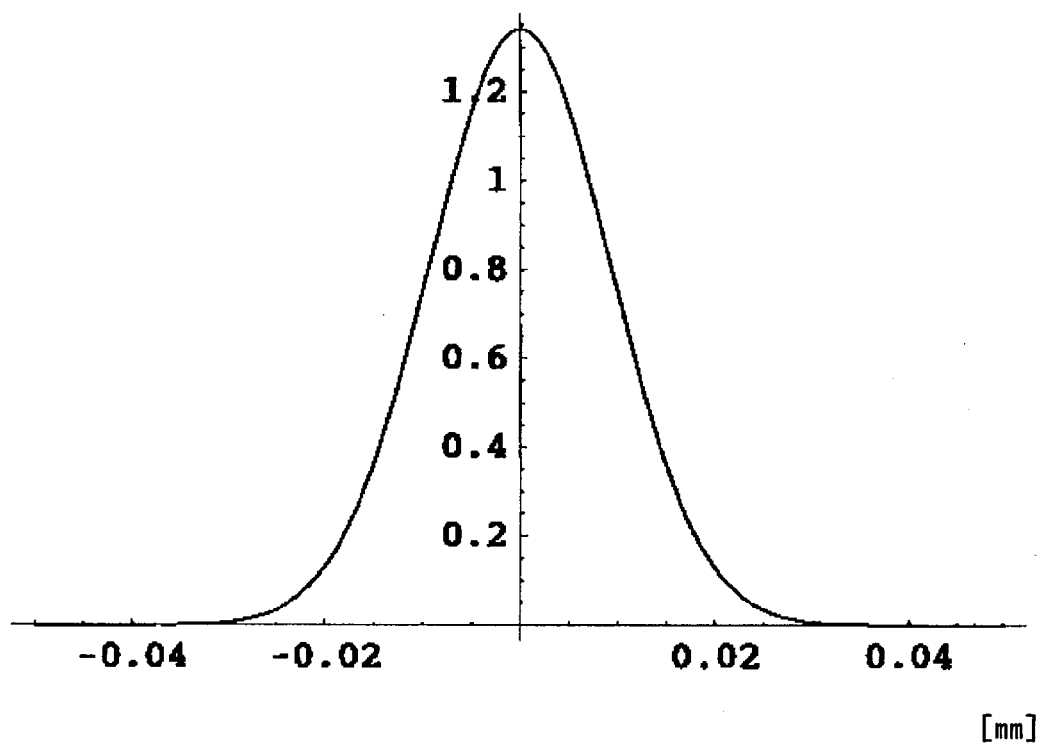
Fig. 67B C-C'
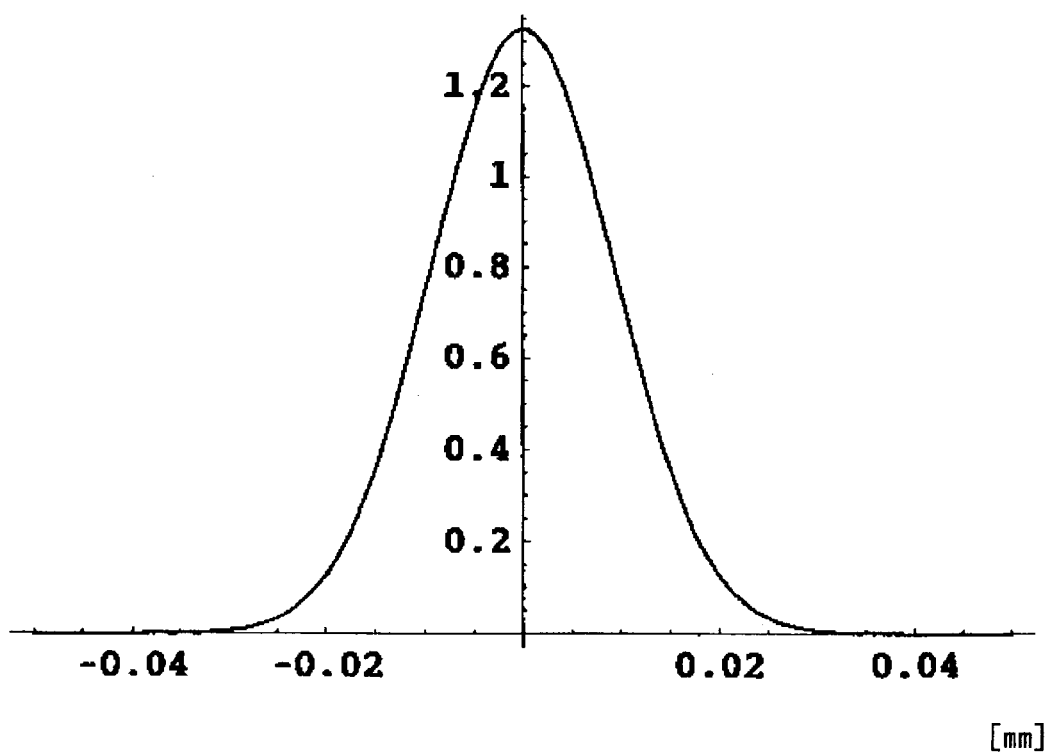

SEMICONDUCTOR DEVICE AND METHOD OF MANUFACTURING THE SAME

BACKGROUND OF THE INVENTION

1. Field of the Invention

The present invention relates to a semiconductor device formed by using a semiconductor film having a crystalline structure (crystalline semiconductor film), and to a method of manufacturing the semiconductor device. The present invention particularly relates to a semiconductor device containing a field effect transistor in which a channel formation region is formed by a crystalline semiconductor film formed on an insulating surface, and to a method of manufacturing the semiconductor device.

2. Description of the Related Art

In recent years, a technique of forming a thin film transistor (TFT) over a substrate has greatly progressed, and its application and development for active matrix semiconductor display devices have been advanced. A thin film transistor (hereinafter referred to as TFT) which is manufactured by using a semiconductor film having a crystalline structure has been applied to flat panel displays represented by a liquid crystal display device. In particular, since a TFT using a polycrystalline semiconductor film has higher field-effect mobility (also referred to as mobility) than a TFT using a conventional amorphous semiconductor film, it enables high-speed operation. It is therefore possible to control the pixel by the driver circuit formed over the same substrate where the pixel is formed, though the pixel is conventionally controlled by a driver circuit provided outside the substrate.

For substrates used in semiconductor devices, a glass substrate is regarded as promising in comparison with a single crystal silicon substrate in terms of the cost. A glass substrate is inferior in heat resistance and is easily subjected to thermal deformation. Therefore, a technique of forming an amorphous silicon film on an insulating substrate made of glass or the like and using laser processing (laser annealing) for crystallization is known. Therefore, in the case where a polysilicon TFT is formed over the glass substrate, in order to avoid thermal deformation of the glass substrate, the use of laser annealing for crystallization of the semiconductor film is extremely effective.

The term "laser annealing" in the semiconductor manufacturing process indicates a technique for re-crystallizing a damaged layer formed on a semiconductor substrate or on a semiconductor film and a technique for crystallizing a semiconductor film formed on an insulating surface. This also includes a technique that is applied to leveling or improvement of a surface quality of the semiconductor substrate or the semiconductor film. Laser oscillation apparatuses used for laser annealing are: gas laser oscillation apparatuses represented by an excimer laser; and solid state laser oscillation apparatuses represented by a YAG laser. It is known that such a device performs crystallization by heating a surface layer of the semiconductor by irradiation of the laser light in an extremely short period of time of about several tens of nanoseconds to several tens of microseconds.

Laser annealing has characteristics such as remarkable reduction of processing time compared to an annealing method utilizing radiant heating or thermal conductive heating. In addition, a semiconductor or a semiconductor film is selectively and locally heated so that a substrate is scarcely thermally damaged.

Lasers are roughly divided into two types: pulse wave oscillation and continuous wave oscillation, according to an oscillation method. In the pulse wave oscillation laser, an output energy is relatively high, so that mass productivity can be increased by setting the size of a laser beam to several $cm^2$ or more. In particular, when the shape of the laser beam is processed using an optical system and made to be a linear shape of 10 cm or more in length, it is possible to efficiently perform irradiation of the laser light to the substrate and further enhance the mass productivity. Thus, for crystallization of the semiconductor film, the use of a pulse wave oscillation laser is becoming mainstream.

In recent years, however, it has been found that the grain size of crystals formed in a semiconductor film is larger when a continuous wave oscillation laser is used to crystallize a semiconductor film than when a pulse wave oscillation laser is used. With crystals of larger grain size in a semiconductor film, the mobility of TFTs formed from this semiconductor film is increased. As a result, continuous wave oscillation lasers are now suddenly attracting attention.

One example of crystallizing an amorphous semiconductor film by using laser light irradiation is a technique, disclosed in JP 62-104117 A (p. 92), in which laser light is scanned at a high speed, equal to or greater than the beam spot diameter× 5000/sec, thus performing multi-crystallization of the amorphous semiconductor film without reaching a state in which the amorphous semiconductor film is completely melted. A technique in which drawn out laser light is irradiated to a semiconductor film formed in an island-like shape, substantially forming a single crystal region is disclosed in U.S. Pat. No. 4,330,363 (FIG. 4). Alternatively, a method is known in which a beam is processed into a linear shape by an optical system and then irradiated like a laser irradiating apparatus disclosed in JP 8-195357 A (pp. 3–4, FIGS. 1–5).

In addition, a technique of manufacturing a TFT in which the second harmonic of laser light is irradiated to an amorphous semiconductor film using a solid state laser oscillation apparatus, such as an Nd:$YVO_4$ laser, thus forming a crystalline semiconductor film having a large crystal grain size compared to a conventionally formed crystalline semiconductor film, is disclosed in JP 2001-144027 A (p. 4).

Incidentally, tests of forming a single crystal semiconductor film on an insulating surface have been carried out from long ago, and a technique referred to as graphoepitaxy has been proposed as a very progressive test. Graphoepitaxy is a technique in which a step is formed on the surface of a quartz substrate, an amorphous semiconductor film or a polycrystalline semiconductor film is formed over the quartz substrate, heat treatment is then performed by using a laser beam or a heater, thus forming an epitaxial growth layer with the step shape formed over the quartz substrate taken as a nucleus. This technique is disclosed in following Document 1 and the like, for example.

Document 1: J. Vac. Sci. Technol., "Grapho-Epitaxy of Silicon on Fused Silica Using Surface Micropatterns and Laser Crystallization", 16(6), 1979, pp. 1640–3.

Further, a semiconductor film crystallization technique referred to as graphoepitaxy is also disclosed in following Document 2, for example. This is a technique in which epitaxial growth of a semiconductor film by the introduction of an artificially formed surface relief grating on an amorphous substrate surface was tested. The graphoepitaxy technique disclosed in Document 2 is one in which a step is formed on the surface of an insulating film, and epitaxial growth of a semiconductor film crystal is attained by conducting heat treatment, laser light irradiation, or other processing on a semiconductor film formed on the insulating film.

Document 2: M. W. Geis, et al., "CRYSTALLINE SILICON ON INSULATORS BY GRAPHOEPITAXY" Technical Digest of International Electron Devices Meeting, 1979, p. 210.

However, when a laser light is irradiated to an amorphous semiconductor film formed over a flat surface for crystallization, crystals become polycrystals, thereby arbitrarily forming defects such as a grain boundaries, so that crystals with aligned orientation cannot be obtained. Differing from the crystal grains, countless carrier traps such as recombination centers and capture centers exist in the grain boundaries due to an amorphous structure, crystal defects, and the like. It is known that when a carrier is trapped in the carrier trap, the potential of the grain boundaries rises, and the grain boundaries become impediments with respect to the carrier such as an electron or a hole, and therefore the current transporting characteristics (mobility) for the carrier are reduced.

The existence of grain boundaries within the TFT active layer, in particular within a channel formation region, therefore exerts a great influence on the characteristics of the TFT in which the TFT mobility drops considerably, the ON current is reduced, and the OFF current is increased due to electric current flowing in the grain boundaries. Further, the characteristics of a plurality of TFTs, manufactured on the premise that the same characteristics can be obtained, may vary depending on the existence of grain boundaries within the active layers.

The position and size of the crystal grains obtained when irradiating laser light to a semiconductor film become random due to the following reasons. A certain amount of time is required until the generation of solid state nuclei within a liquid semiconductor film which is completely melted by the irradiation of laser light. Countless crystal nuclei are generated in completely melted regions along with the passage of time, and crystals grow from each of the crystal nuclei. The positions at which the crystal nuclei are generated are random, and therefore the crystal nuclei are distributed non-uniformly. Crystal growth stops at points where the crystal nuclei run into each other, and therefore the position and the size of the crystal grains become random.

A crystalline semiconductor film manufactured by using a laser annealing method, which is roughly divided into pulse wave oscillation and continuous wave oscillation types, is generally formed with an aggregation of a plurality of crystal grains. The position and size of the crystal grains are random, and it is difficult to specify the crystal grain position and size when forming a crystalline semiconductor film. Crystal grain interfaces (grain boundaries) therefore exist within an active layer formed by patterning the aforementioned crystalline semiconductor film into an island-like shape.

In the flat panel displays described above, a semiconductor film is formed on a glass substrate to build a TFT and the TFT is arranged giving no regard to randomly-formed grain boundaries. Therefore the crystallinity of a channel formation region of the TFT cannot be controlled strictly. The randomly-formed grain boundaries and crystal defects degrade the characteristics and cause fluctuation in characteristics between elements.

It is ideal to form the channel formation region, which exerts a great influence on the TFT characteristics, by a single crystal grain, thus eliminating the influence of grain boundaries. However, it is nearly impossible to form an amorphous silicon film, in which grain boundaries do not exist, by using a laser annealing method. It has therefore not been possible to date to obtain characteristics equivalent to those of a MOS transistor, which is manufactured on a single crystal silicon substrate, in a TFT that uses a crystalline silicon film crystallized by employing laser annealing.

Therefore, a method of recrystallization from a melted state by heating a semiconductor film on an insulating substrate to a high temperature, known as zone melting and the like, is in the mainstream in order to form a high quality crystalline semiconductor film on an insulating surface having aligned orientation, few defects, few crystal grain boundaries, and few subboundaries.

However, a single crystal semiconductor film cannot be formed on a glass substrate having a relatively low distortion point even though a known graphoepitaxy technique, which is one of zone melting methods is used.

In any case, it has not been possible to form a crystalline semiconductor film in which semiconductor volumetric contraction caused by crystallization, defects due to thermal stresses with the base, lattice mismatching, or the like, crystal grain boundaries, and subboundaries do not exist. Except a bonded SOI (silicon on insulator), it has not been possible to obtain quality equivalent to that of a MOS transistor formed on a single crystal substrate, in a crystalline semiconductor film that is formed on an insulating surface and then crystallized or recrystallized.

SUMMARY OF THE INVENTION

In view of the aforementioned problems, an object of the present invention is to provide a semiconductor device structured by a semiconductor element or a group of semiconductor elements having high speed performance and high current driver performance and having little variation among a plurality of elements in which a crystalline semiconductor film is formed on an insulating surface, and the crystalline semiconductor film has as few crystal grain boundaries and crystal subboundaries as possible intersecting at least with a channel longitudinal direction. Further, another object is to provide a method of manufacturing a semiconductor device, and a semiconductor device manufactured by using the manufacturing method, that is capable of preventing the formation of grain boundaries in TFT channel formation regions, and is capable of preventing conspicuous drops in TFT mobility, reduction in the ON current, and increases in the OFF current, all due to grain boundaries.

The applicants of the present invention discovered that, when a semiconductor film is formed on an insulating film having unevenness, and laser light is irradiated to the semiconductor film, grain boundaries is selectively formed in portions of a crystallized semiconductor film located on convex portions of the insulating film.

FIGS. 47A and 47B show a TEM cross sectional image in a direction orthogonal to a laser light scanning direction when continuous wave laser light is irradiated to a 200 nm thick amorphous semiconductor film formed on an insulating film having unevenness at a scanning speed of 5 cm/sec. Reference numerals 6001 and 6002 in FIG. 47A denote convex portions formed on the insulating film 6005. A crystallized semiconductor film 6004 has grain boundaries 6003 in the portions on the convex portions 6001 and 6002.

The TEM cross sectional image shown in FIG. 47A is shown schematically in FIG. 47B. The grain boundaries 6003 are formed in the upper portions of the convex portions 6001 and 6002. The applicants of the present invention considered that the semiconductor film disposed above the insulating film is volumetrically transferred toward a bottom of a concave portion due to its temporary melting state caused by laser light irradiation, and therefore the semiconductor film disposed above the convex portions becomes thinner, to be unable to withstand stress, and grain boundaries develop therein. Although a semiconductor film thus crystallized has grain boundaries selectively formed in the upper portions of the convex portions 6001, 6002, grain boundaries do not form easily in portions disposed in concave portions. Note that the term "concave portion" indicates sunken regions where the convex portions are not formed.

The applicants of the present invention then considered that the locations at which the grain boundaries are formed could be determined selectively by intentionally forming portions in the semiconductor film at which stress will concentrate. An insulating film having unevenness is formed on a substrate in the present invention, and a semiconductor film is formed on the insulating film. Portions at which stress is concentrated are thus formed selectively in the semiconductor film during crystallization performed by laser light. Specifically, unevenness is formed in the semiconductor film. Continuous wave laser light is then irradiated along the longitudinal direction of the unevenness formed in the semiconductor film. Note that, although it is most preferable that continuous wave laser light be used at this point, pulse wave oscillation laser light may also be used. Note also that the cross section of the convex portions in a direction orthogonal to the scanning direction of the laser light may be rectangular, triangular, or trapezoidal.

With this structure, grain boundaries are thus formed selectively on the convex portions of the semiconductor film during crystallization by laser light. Grain boundaries are relatively difficult to be formed in the semiconductor film disposed on the concave portions of the insulating film. The semiconductor film disposed on the concave portions of the insulating film has superior crystallinity, but does not always contain no grain boundaries. However, even if grain boundaries do exist, the crystal grains are larger, and the crystallinity is relatively superior, compared to those in the semiconductor film located on the convex portions of the semiconductor film. The locations at which grain boundaries are formed in the semiconductor film can therefore be forecast to a certain extent at the stage when the shape of the insulating film is designed. That is, the locations at which the grain boundaries are formed in the present invention can be selectively determined, and therefore it becomes possible to lay out an active layer so that as few grain boundaries as possible are contained in the active layer, preferably as few as possible in the channel formation region.

The formation of grain boundaries in the TFT channel formation region can be prevented with the present invention by effectively using the semiconductor film disposed on the concave portions of the insulating film for TFT active layers. Conspicuous drops in TFT mobility, reductions in the ON current, and increases in the OFF current, all due to grain boundaries, can be prevented. Note that the designer can suitably determine a portion to be removed by patterning as being in the vicinity of the edges of the convex portions or the concave portions.

Note that the energy density in the vicinity of the edge of the laser beam of laser light generally is low compared to that near the center of the beam, and the crystallinity of the corresponding semiconductor film often degrades. It is therefore preferable that laser light scanning be performed such that portions which later become TFT channel formation regions and the edges of the trajectory do not overlap with each other.

With the present invention, data (pattern information) obtained at the design stage on the shape of the insulating film or the semiconductor film as seen from above the substrate is first stored in a storing means. A scanning path for the laser light is then determined from the pattern information and from the width in a direction orthogonal to the scanning direction of the laser beam of laser light, so that at least portions that become TFT channel formation regions do not overlap with the edge of the laser light trajectory. The substrate position is then aligned using a marker as a reference, and laser light is irradiated to the semiconductor film on the substrate in accordance with the determined scanning path.

With the aforementioned structure, the laser light can be irradiated at least only to necessary portions, not to the entire substrate. Time required to irradiate the laser light to unnecessary portions can therefore be omitted, the time needed for laser light irradiation can be reduced, and the substrate processing speed can be increased. Further, damage imparted to the substrate by irradiating the laser light to unnecessary portions can be prevented.

Note that the marker may be formed by directly etching the substrate using laser light or the like, and that the marker may also be formed in a portion of the insulating film at the same time as the insulating film having unevenness is formed. Furthermore, position alignment of the substrate may also be performed by reading the shape of the actually formed insulating film or the actually formed semiconductor film by using an image pickup element such as a CCD, storing the shape as data in a first storing means, storing the pattern information for the insulating film or the semiconductor film obtained at the design stage in a second storing means, and checking the data stored in the first storing means against the pattern information stored in the second storing means.

The number of masks used for the marker can be reduced by one by forming the marker in a portion of the insulating film or using the shape of the insulating film or the semiconductor film as a marker. Moreover, the marker can be formed in a more accurate location and the precision of the position alignment can be increased more as compared to the case of forming the marker in the substrate by using laser light.

Note that the energy density of the laser light is generally not completely uniform, but instead the energy density changes in accordance with position within the laser beam. It is necessary with the present invention to irradiate laser light having a fixed energy density to, at least, portions that become channel formation regions, and preferably over all flat surfaces of the concave portion or all flat surfaces of the convex portion. It is therefore necessary with the present invention to use a laser beam having an energy density distribution such that a region having a uniform energy density completely overlaps, at least the portions that become channel formation regions, and preferably, all flat surfaces of the concave portion or all flat surfaces of the convex portion. It is considered that the shape of the laser beam is preferably rectangular, linear, or the like in order to satisfy the aforementioned energy density conditions.

In addition, portions of the laser beam having a low energy density may be blocked through use of a slit. Laser light having a relatively uniform energy density can be irradiated to all flat surfaces of the concave portion or all flat surfaces of the convex portion by using the slit, and crystallization can be performed uniformly. Further, the width of the laser beam can be partially changed in accordance with the insulating film or semiconductor film pattern information by providing the slit. The constraints in the channel formation region, and in addition the layout of the TFT active layer, can be made smaller. Note that the term laser beam width denotes the length of the laser beam in a direction that is orthogonal to the scanning direction.

Further, one laser beam obtained by synthesizing laser lights emitted from a plurality of laser oscillation apparatuses may also be used in laser crystallization. Portions at which the energy density is weak in each of the laser lights can complemented each other by using the aforementioned structure.

Further, laser light irradiation may be performed without exposure to the atmosphere after forming the semiconductor film (for example, under a specific gas atmosphere of an inert gas, nitrogen, oxygen, or the like, or under a reduced pressure atmosphere), thus crystallizing the semiconductor film. Contaminant substances on a molecular level within a clean room, for example boron and the like contained within a filter for increasing the cleanliness of air, can be prevented from mixing into the semiconductor film when performing crystallization with laser light with the aforementioned structure.

In order to solve the above-mentioned problems, the present invention forms an insulating film with an opening on a substrate having an insulating surface, forms on the insulating film and over the opening an amorphous semiconductor film or a polycrystalline semiconductor film that has randomly-formed grain boundaries (non-single crystalline semiconductor film), melts the semiconductor film pouring the melted semiconductor into the opening of the insulating film, and crystallizes or re-crystallizes the semiconductor film to form a crystalline semiconductor film. To elaborate, the crystalline semiconductor film is formed to fill the opening by forming a non-single crystalline semiconductor film, melting the non-single crystalline semiconductor film, and crystallizing or re-crystallizing the non-single crystalline semiconductor film. Then, portions of the crystalline semiconductor film that are remained on the insulating film are removed. This is followed by removal of the insulating film at least from an area for forming a channel formation region to expose side surfaces of the crystalline semiconductor film. Then a gate insulating film, which is in contact with the top and side surfaces of the crystalline semiconductor film, is formed as well as a gate electrode. The above is a characteristic of the present invention.

The opening may be formed by directly etching the surface of the insulating substrate, and the opening may also be formed by using a silicon oxide film, silicon nitride film, silicon oxynitride film, or the like, and performing etching thereon. The opening may be aligned with the position of an island-like semiconductor film containing a TFT channel formation region, and it is preferable to form the opening to conform at least with the channel formation region. Further, the opening is aligned along the channel length direction. The width of the opening (channel width direction in the case of a channel formation region) is made to be 0.01 µm or larger and 2 µm or smaller, preferably 1.1 to 1 µm, and the depth thereof is made to be 0.01 µm or larger and 3 µm or smaller, preferably 1.1 to 2 µm.

For, a semiconductor film that is formed on the insulating film and the opening in the first step, an amorphous semiconductor film or a polycrystalline semiconductor film formed by plasma CVD, sputtering, or reduced pressure CVD, a polycrystalline semiconductor film formed by solid state growth, or the like is applied. Note that the term amorphous semiconductor film as used in the present invention includes not only its strict definition of semiconductor films having a completely amorphous structure, but also includes semiconductor films in a state containing microcrystalline grains, so-called microcrystalline semiconductor films, and semiconductor films containing a locally crystalline structure. An amorphous silicon film is typically applied. In addition, amorphous silicon germanium films, amorphous silicon carbide films, and the like can also be applied. Further, the polycrystalline semiconductor film is made by crystallizing these amorphous semiconductor films by a known method.

Pulse wave oscillation or continuous wave laser light having a gas laser oscillation apparatus or a solid state laser oscillation apparatus as a light source is applied as a means of melting the crystalline semiconductor film and performing crystallization. The laser light irradiated is collected into a linear shape by using an optical system. The intensity distribution of the laser light has a uniform region in a longitudinal direction, and may also possess a distribution in a transverse direction. A solid state laser oscillation apparatus having a rectangular shape beam is applied as the laser oscillation apparatus used as the light source. In particular, it is preferable to apply a slab laser oscillation apparatus. Alternatively, a construction may be applied in which a solid state laser oscillation apparatus using a rod doped with Nd, Tm, and Ho, in particular a solid state laser oscillation apparatus using crystals of YAG, $YVO_4$, YLF, $YalO_3$ or the like doped with crystals of Nd, Tm, and Ho, is combined with a slab structure amplifier. Crystals of Nd:YAG, Nd:GGG (gadolinium, gallium, garnet), Nd:GsGG (gadolinium, scandium, gallium, garnet), and the like can be used as the slab material. A zigzag light path is followed with a slab laser, while total reflection is repeated within the planer shape laser medium.

Further, intense light corresponding to the laser light may also be applied. For example, light having a high energy density obtained by collecting light emitted from a halogen lamp, a xenon lamp, a high pressure mercury lamp, a metal halide lamp, or an excimer lamp by using a reflection mirror, a lens, or the like may also be used.

The laser light collected and expanded into a linear shape or the intense light is irradiated to the non-single crystalline semiconductor film, and the laser light irradiation position and the substrate on which the non-single crystalline semiconductor film is formed are moved relative to each other. The laser light is scanned over a portion of or the entire substrate, thus melting the non-single crystalline semiconductor film, and after this state, performing crystallization or recrystallization. Laser scanning is performed in a direction along the longitudinal direction of the openings or the longitudinal direction of the channel formation regions of the transistor. Crystals thus grow along the laser light scanning direction, and crystal grain boundaries and crystal subboundaries can be prevented from intersecting the channel longitudinal direction. Further, at this point, irradiation of the laser light or the intense light may be performed while heating the substrate on which the subject to be processed is formed.

The semiconductor device of the present invention manufactured as described above is provided with a crystalline semiconductor film that is formed on an insulating surface, adjoins a pair of impurity regions of one conductivity type, has a plurality of crystal orientations, and has an aggregation of a plurality of crystal grains which stretch in a direction parallel to a channel length direction without forming a grain boundary.

In another structure of the present invention, a channel formation region is formed by a crystalline semiconductor film and a conductive layer, the crystalline semiconductor film being formed on an insulating surface, the crystalline semiconductor film adjoining a pair of impurity regions of one conductivity type, the crystalline semiconductor film having a plurality of crystal orientations, the crystalline semiconductor film having an aggregation of a plurality of crystal grains which stretch in the direction parallel to the channel length direction without forming a grain boundary, the conductive layer overlapping the crystalline semiconductor film with an insulating layer sandwiched therebetween, and the structure is characterized in that the crystalline semiconductor film of the channel formation region measures equal to or more than 0.01 μm and equal to or less than 2 μm in channel width direction, preferably equal to or more than 0.1 μm and equal to or less than 1 μm, and has a thickness of equal to or more than 0.01 μm and equal to or less than 3 μm, preferably equal to or more than 0.1 μm and equal to or less than 2 μm. In one characteristic mode of the channel formation region, it is formed on the top and side surfaces of the crystalline semiconductor film from a gate electrode that overlaps the crystalline semiconductor film with a gate insulating film sandwiched therebetween, the gate insulating film covering the top and side surfaces of the crystalline semiconductor film.

By making the depth of the opening on the same order as, or greater than, the semiconductor film thickness, the semiconductor melted by the laser light or the intense light will aggregate and harden in the opening (that is, concave portion) due to surface tension. As a result, the thickness of the semiconductor film in the opening (that is, concave portion) becomes thinner, and stress distortion can be made to concentrate there. Further, side surfaces of the opening have an effect to a certain extent for prescribing the crystal orientation. The angles of the side surfaces of the opening are formed at 5 to 120° with respect to the substrate surface, preferably at 80 to 100°. By scanning the laser light in a direction parallel to the channel length direction, along openings extending in the direction, a specified crystal orientation can be properly aligned.

The semiconductor film placed in a melted state aggregates in the opening formed in the insulating surface due to surface tension, and crystal growth occurs roughly from the intersection between the bottom and side surfaces of the opening. Distortions that develop accompanying crystallization can thus be concentrated in regions outside of the opening. In other words, the crystalline semiconductor film formed so as to fill the opening can be freed from distortions. Then, the crystalline semiconductor film remaining on the insulating film and containing grain boundaries and crystal defects is removed by etching.

The present invention described above makes it possible to specify the location for forming a semiconductor element such as a transistor, in particular, a channel formation region of a TFT, so that a crystalline semiconductor film having no grain boundaries is obtained. This eliminates causes of fluctuation in characteristics of TFTs such as randomly-formed grain boundaries and crystal defects, and provides a TFT or a group of TFTs less fluctuated in characteristics.

By forming a gate insulating film and a gate electrode so as to overlap the top and side surfaces of the crystalline semiconductor film, the area of a channel formation region is expanded to increase ON current. Furthermore, application of gate voltage from three directions reduces carriers, in particular, hot carriers injected to the gate insulating film and thereby improves the reliability of the transistor.

Further, the present invention is characterized in that an insulating film with an opening is formed on a substrate having an insulating surface, that a region of a crystalline semiconductor film formed on the substrate fills the opening, and that a channel formation region is placed in the filled region.

Another structure of the present invention is characterized in that an insulating film with an opening is formed on a substrate having an insulating surface, the opening stretching in the channel length direction, that a region of a crystalline semiconductor film formed on the substrate fills the opening, that a channel formation region is placed in the filled region, and that the opening is as deep as the crystalline semiconductor film or deeper.

According to another structure of the present invention, a semiconductor device is characterized by including: an insulating surface having an opening extending in a rectangular shape or a strip shape; a crystalline semiconductor film formed in the opening; a gate insulating film; and a gate electrode overlapping with the crystalline semiconductor film through the gate insulating film.

According to another structure of the present invention, a semiconductor device is characterized by including: an insulating surface having an opening extending in a channel longitudinal direction; a crystalline semiconductor film formed in the opening; a gate insulating film; and a gate electrode overlapping with the crystalline semiconductor film through the gate insulating film.

After the semiconductor film is melted by irradiation of the laser light or the intense light, hardening begins from a region at which the bottom surfaces and the side surfaces of the opening intersect, and crystal growth begins from here. For example, thermal analysis simulations are performed at points A, B, C, and D in a system shown in FIG. 45 in which a step shape is formed by an insulating film (1) and an insulating film (2). Heat escapes from directly underneath the insulating film (2) and from the insulating film (1) existing on the side surfaces, and therefore the fastest temperature drop is at the point B. The points A, C, and D follow in that order. The simulation results are for a case in which a sidewall angle is 45°, but a qualitatively similar phenomenon can also be considered for a case in which the angle is 90°.

That is, the semiconductor film is once placed in a melted state, it aggregates in the opening formed in the insulating surface due to surface tension, and crystal growth occurs roughly from the intersection between the bottom and sidewalls of the opening. Distortions that develop accompanying crystallization can thus be concentrated in regions outside of the opening. In other words, the crystalline semiconductor film formed so as to fill the opening can be freed from distortions.

Note that the conventional technique of crystallizing a semiconductor film referred to as graphoepitaxy tests epitaxial growth of a semiconductor film induced by a surface relief grating on a surface an artificially formed amorphous substrate. Techniques relating to graphoepitaxy can be found in the aforementioned Document 2 and the like. The graphoepitaxy is disclosed in the aforementioned document and the like as forming a step in the surface of an insulating film, and performing heat treatment, laser light irradiation, or the like to a semiconductor film formed on the insulating film, thus causing crystals in the semiconductor film to grow epitaxially. However, the temperature necessary for epitaxial growth is, at minimum, on the order of 700° C. If epitaxial growth is performed on a glass substrate, then grain boundaries are formed in the semiconductor film in the vicinity of the edges of the concave portion or the convex portion of the insulating film. With the present invention an island mask is laid out, and the shape of the concave portion or the convex portion of the insulating film, and its edge locations, are designed to line up with the layout of the island mask so as to increase crystallinity in portions that become the islands. Specifically, the shape, the size, and the like of the concave portion or the convex portion are determined so that the edges of the concave portion or the convex portion, and the vicinity of the center between the edges of the concave portion or the convex portion, do not overlap with the islands. By using the insulating film having patterns designed in alignment with the island layout, formation of grain boundaries in a portion where the island is to be formed is avoided. Then, patterning is performed to form islands having relatively superior crystallinity. The technique disclosed in the present invention therefore is in agreement with conventional graphoepitaxy in the following points: a semiconductor film is formed on an insulating film in which a step has been formed; and the semiconductor film is crystallized by utilizing the step. However, the locations of the grain boundaries are not controlled by using the step in conventional graphoepitaxy, and the concept of avoiding grain boundaries entering the islands is not included in conventional graphoepitaxy. The conventional technique resembles but differs from the present invention.

BRIEF DESCRIPTION OF THE DRAWINGS

In the accompanying drawings:

FIGS. 2A to 2E are vertical sectional views illustrating in detail the relation between the shape of an opening and the form of a crystalline semiconductor film in crystallization;

FIGS. 11A to 11F are a top view and vertical sectional views illustrating a process of manufacturing a TFT in accordance with the present invention;

FIGS. 24A and 24B are vertical sectional views illustrating the structure of the pixel portion of FIG. 21;

FIG. 27 is EBSP mapping data showing orientations of crystals formed in concave portions;

FIGS. 36A to 36C are a top view and vertical sectional views illustrating a process of manufacturing a TFT in accordance with the present invention;

FIGS. 37A to 37C are a top view and vertical sectional views illustrating a process of manufacturing a TFT in accordance with the present invention;

FIGS. 38A to 38C are a top view and vertical sectional views illustrating a process of manufacturing a TFT in accordance with the present invention;

FIGS. 39A to 39C are a top view and vertical sectional views illustrating a process of manufacturing a TFT in accordance with the present invention;

FIGS. 40A to 40C are a top view and vertical sectional views illustrating a process of manufacturing a TFT in accordance with the present invention;

FIGS. 41A to 41C are a top view and vertical sectional views illustrating an example of a TFT manufactured in accordance with the present invention;

FIGS. 67A and 67B are diagrams showing the energy density distribution of a laser beam;

DETAILED DESCRIPTION OF THE PREFERRED EMBODIMENT MODES

Embodiment Mode 1

Embodiment modes of the present invention are explained below with reference to the figures. FIGS. 1A to 1E are longitudinal cross sectional diagrams, respectively, for explaining the process of forming a crystalline semiconductor film according to the present invention.

Figure 1A:
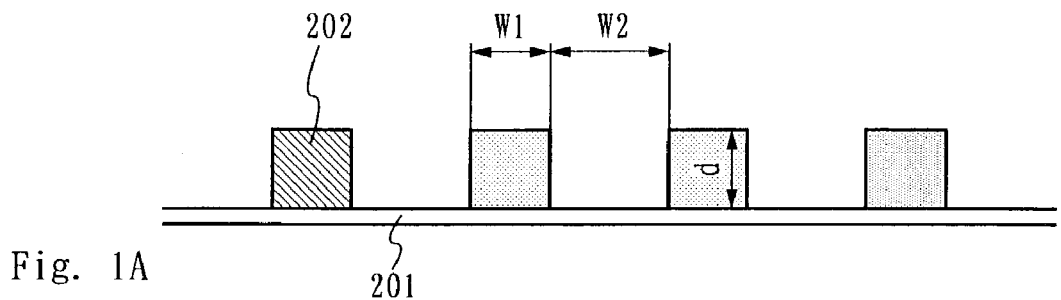
FIGS. 1A to 1E are diagrams illustrating a crystallization method in the present invention.

In FIG. 1A, a first insulating film 201 is formed to a thickness of 30 to 300 nm from silicon nitride, silicon oxynitride whose nitrogen content is larger than its oxygen content, aluminum nitride, or aluminum oxynitride. On the first insulating film 201, a second insulating film 202 is formed from silicon oxide or silicon oxynitride to a thickness of 10 to 3000 nm, preferably 100 to 2000 nm. The second insulating film 202 has openings of a given shape. The given shape may be a rectangle, a circle, a polygon, a belt, or a shape matching the shape of an island-like semiconductor film (active layer) of a TFT to be manufactured. A silicon oxide film can be formed by plasma CVD using a mixture of tetraethyl ortho silicate (TEOS) and $O_2$. A silicon oxynitride film can be formed by plasma CVD using as materials $SiH_4$ and $N_2O$ or $SiH_4$, $NH_3$, and $N_2O$.

Selective processing of the first insulating film 201 and the second insulating film 202 is performed by etching using buffer hydrofluoric acid or dry etching using $CHF_3$ or $CF_4$. In any case, it is preferable to suitably adjust the materials and the film formation conditions so that the etching speed of the second insulating films becomes relatively faster than that of the first insulating film in order to ensure selectivity during etching processing. The angle of side surfaces of the openings formed of the second insulating film may be suitably set in a range from 5 to 120°, preferably in a range from 80 to 100°.

A member to be used as the substrate can apply a commercially available non-alkaline glass substrate, a quartz substrate, a sapphire substrate, a single crystal or a polycrystalline semiconductor substrate whose surface is covered by an insulating film, or a metal substrate whose surface is covered by an insulating film.

A width W1 of the second insulating films 202 remaining after the etching is not limited but around 0.1 to 10 μm. A width W2 of each opening in the second insulating film 202 is 0.01 to 2 μm (preferably 0.1 to 1 μm). A thickness d of the second insulating film is 0.01 to 3 μm (preferably 0.1 to 2 μm). The length of each opening (in the direction perpendicular to the paper face of the drawing) is not particularly limited and the openings may be linear or curved. It is sufficient if each opening is long enough to form a channel formation region of a TFT, for example.

Figure 1B:
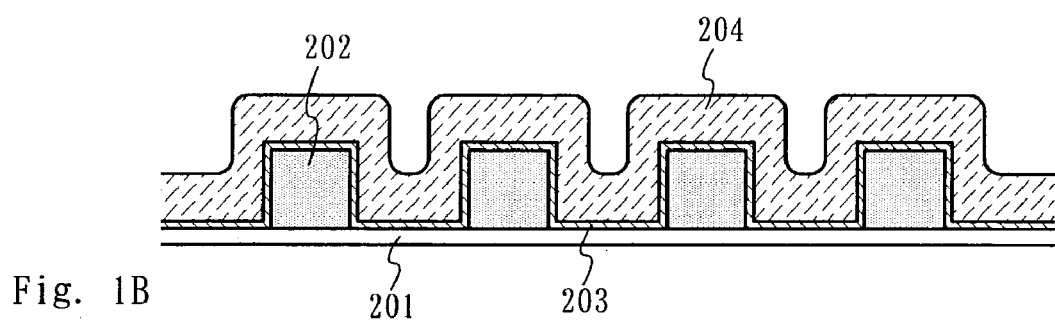

As shown in FIG. 1B, an amorphous semiconductor film 204 with a thickness of 0.01 to 3 μm (preferably 0.1 to 1 μm) is formed to cover the surface and openings composed of the first insulating film 201 and the second insulating film 202. In other words, a desirable thickness of the amorphous semiconductor film 204 is equal to or more than the depth of the openings formed in the second insulating film 202. The amorphous semiconductor film is formed of silicon, a compound or alloy of silicon and germanium, or a compound or alloy of silicon and carbon. As shown in the drawing, the amorphous semiconductor film is formed on the base insulating film and over the opening so that the semiconductor is deposited reflecting the unevenness of the base. It is preferable to form as a third insulating film 203 a silicon oxynitride film under the amorphous semiconductor film by forming the films in succession in the same film forming chamber without exposing them to the air. This removes influence of chemical contamination by, e.g., boron adhered to the surfaces of the first insulating film and second insulating film and also prevents direct contact between silicon nitride and the amorphous semiconductor film.

The amorphous semiconductor film 204 is melted in an instant and crystallized. In crystallization, the semiconductor film is irradiated with laser light or light emitted from a lamp light source after the light is collected by an optical system to have an energy density sufficient enough to melt the semiconductor film. In this step, laser light emitted from a continuous wave oscillation type laser oscillation apparatus is particularly preferable. The laser light used is collected into a linear shape and expanded in the longitudinal direction by an optical system. The intensity of the laser light is desirably uniform in the longitudinal direction while it is varied in the lateral direction.

A rectangular beam solid state laser oscillation apparatus is applied as a laser oscillation apparatus and in particular, it is preferable to apply a slab laser oscillation apparatus. Crystals such as Nd:YAG, Nd:GGG (gadolinium, gallium, garnet), and Nd:GsGG (gadolinium, scandium, gallium, garnet) can be used as the slab material. A zigzag light path is followed with the slab laser, while total reflection is repeated within the planer shape laser medium. Alternatively, a solid state laser oscillation apparatus that uses a rod doped with Nd, Tm, and Ho, in particular a solid state laser oscillation apparatus that uses a crystal such as YAG, $YVO_4$, YLF, or $YAlO_3$, doped with Nd, Tm, and Ho may also be combined with a slab structure amplifier. The scanning is then performed as shown by an arrow in the figure in a direction that intersects with the linear shape longitudinal direction. Note that the term linear as used here denotes a shape in which the ratio of the length in the longitudinal direction to the length in the transverse direction, is equal to or greater than the ratio of 1 to 10.

Further, considering the light absorption coefficient of the amorphous semiconductor film, it is preferable that the wavelength of the continuous wave laser light be from 400 to 700 nm. Light in this wavelength range is obtained by extracting the second harmonic or the third harmonic of the fundamental wave using a wavelength converter element. ADP (ammonium dihydrogen phosphate), $Ba_2NaNb_5O_{15}$ (barium sodium niobate), CdSe (selenium cadmium), KDP (potassium dihydrogen phosphate), $LiNbO_3$ (lithium niobate), Se, Te, LBO, BBO, KB5, and the like can be applied as the wavelength converter element. In particular, it is preferable to use LBO. A typical example is to use the second harmonic (532 nm) of an Nd:$YVO_4$ laser oscillation apparatus (fundamental wave: 1064 nm). Further, the laser oscillation mode uses a single mode, which is a $TEM_{00}$ mode.

For a case in which silicon is selected as the most suitable material, its absorption coefficient is in a region from $10^3$ to $10^4$ $cm^{-1}$, which is nearly the visible light region. If a substrate having a high transmittivity of visible light is used, such as glass, and an amorphous semiconductor film is formed by silicon having a thickness from 30 to 200 nm, then crystallization can be performed without imparting damage to the base insulating film by irradiating visible light with a wavelength of 400 to 700 nm, thus selectively heating the semiconductor film. Specifically, the penetration depth of light having the wavelength of 532 nm is nearly 100 to 1000 nm with respect to an amorphous silicon film, and inside portions of the amorphous semiconductor film 204 formed at a film thickness of 30 to 200 nm can be sufficiently reached. That is, it is possible to heat from the inside of the semiconductor film, and nearly the entire semiconductor film can be heated uniformly in the laser light irradiation region.

Figure 1C:
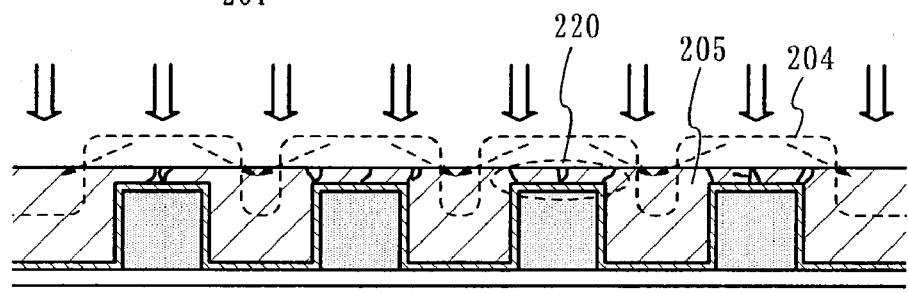

The semiconductors that have been melted instantly by the laser light irradiation aggregate in the openings (concave portions) due to the action of surface tension. The surface of the crystalline semiconductor film 205 thus formed through solidification is nearly flat, as shown in FIG. 1C. Crystal growth ends and crystal grain boundaries are formed on the second insulating films (convex portions, regions 220 denoted in FIG. 1C).

Figure 1D:
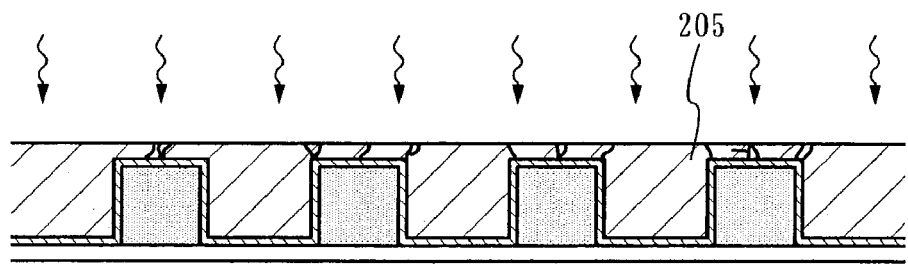

Thereafter, heat treatment is preferably conducted at 500 to 600° C. as shown in FIG. 1D to remove distortion accumulated in the crystalline semiconductor film. The distortion is caused by semiconductor volume shrinkage, thermal stress with the base, and lattice mismatch which are brought by crystallization. This heat treatment employs, for example, gas heating type rapid thermal annealing (RTA) and lasts for 1 to 10 minutes. This step is not indispensable in the present invention but optional.

Figure 1E:
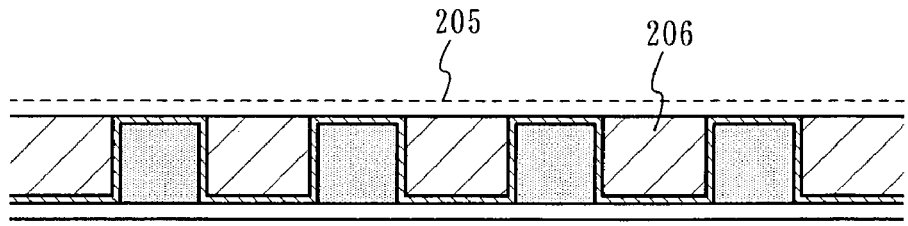

As shown in FIG. 1E, the surface of the crystalline semiconductor film 205 is etched to extract crystalline semiconductor films 206 buried in the openings (concave portions). This is to remove the crystalline semiconductor film which is remained on the second insulating film 202 and which contains grain boundaries and crystal defects, thereby leaving only high quality crystals that are in the openings (concave portions). The crystalline semiconductor films 206 are characterized by having varying crystal orientations and no grain boundaries.

Then a gate insulating film and a gate electrode are formed from the crystalline semiconductors filling the openings (concave portions) so that channel formation regions are positioned at the openings. In this way, a TFT is completed. If the openings are formed in the direction parallel to the channel length direction of the TFT and laser light runs in this direction, crystals grow in the direction. This makes it possible to grow crystals primarily in a specific crystal orientation.

FIGS. 2A to 2E are conceptual diagrams showing findings of crystallization obtained from experimental results drawn out by the present inventors. FIGS. 2A to 2E are diagrams for schematically explaining the relationship between the depth of, and gap between, openings (concave portions) formed by the first insulating film and the second insulating films, and crystal growth.

Reference symbols relating to lengths shown in FIGS. 2A to 2E are as follows: t01 denotes the thickness of the amorphous semiconductor film 204 on the second insulating films (convex portions) 202; t02 denotes the thickness of the amorphous semiconductor film 204 of the openings (concave portions); t11 denotes the thickness of the crystalline semiconductor film 205 on the second insulating films (convex portions) 202; t12 denotes the thickness of the crystalline semiconductor film 205 of the openings (concave portions); d denotes the thickness of the second semiconductor films 202 (depth of the openings); W1 denotes the width of the second insulating films 202; and W2 denotes the width of the openings.

FIG. 2A shows a case in which d<t02, and W1, W2≦1 μm. If the depth of the opening grooves is less than the amorphous semiconductor film 204, the openings are shallow even if it passes through a melting and crystallization process, and the surface of the crystalline semiconductor film 205 does not sufficiently become level. That is, the uneven shape base of the crystalline semiconductor film 205 remains nearly preserved.

FIG. 2B shows a case in which d≧t02, and W1, W2≦1 μm. If the depth of the opening grooves is nearly equal to, or greater than, the amorphous semiconductor film 204, surface tension acts and there is accumulation in the openings (concave portions). The surface becomes nearly flat as shown in FIG. 2B with a state thus solidified. In this case, t11 becomes less than t12, stress concentrates in portions 220 on the second insulating films 202 having a thin film thickness, distortions accumulate, and further, grain boundaries are formed there.

Figure 25:
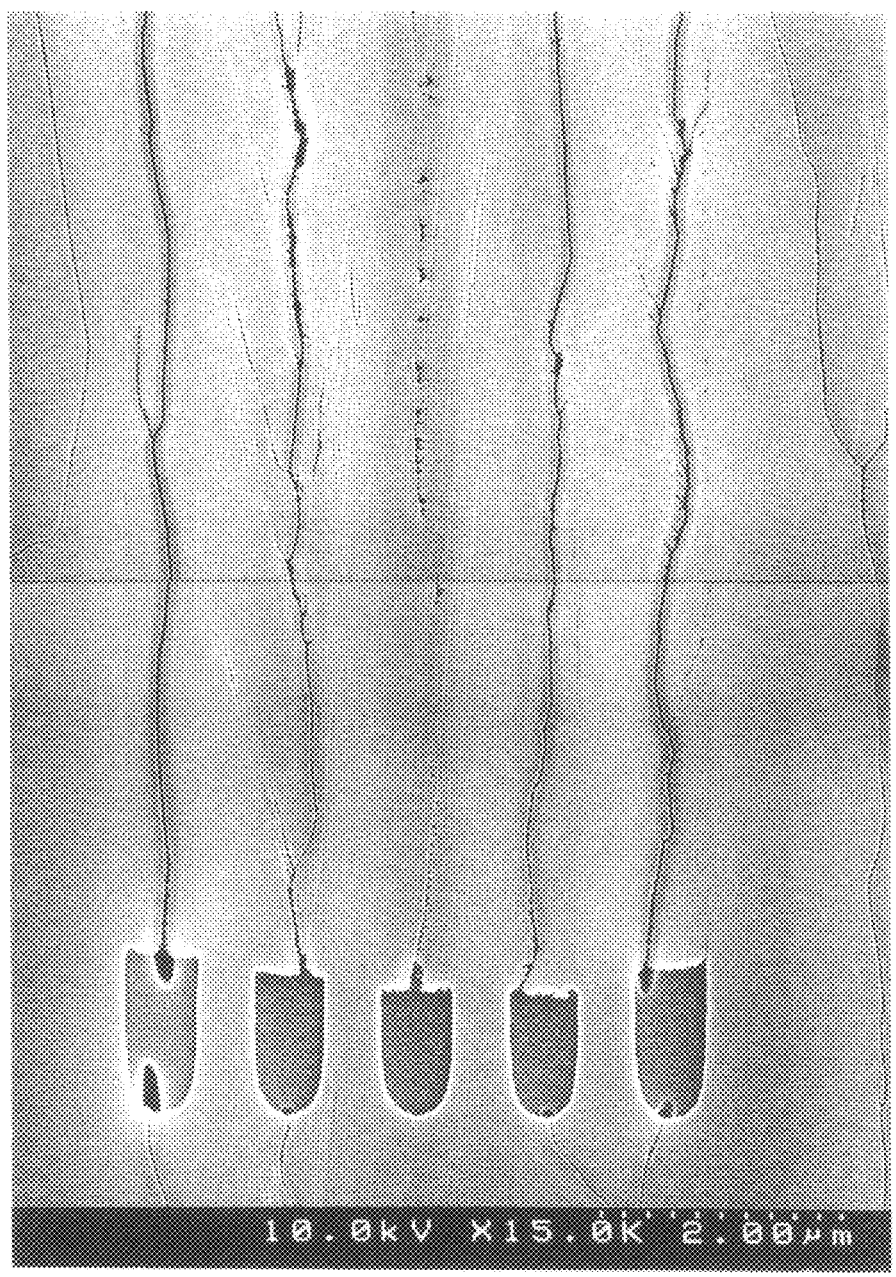
FIG. 25 is a scanning electron microscope (SEM) picture (after Secco etching) showing a surface state of an amorphous silicon film formed to a thickness of 150 nm and crystallized on a base insulating film that has a 170 nm deep step and 0.5 μm width convex portions with an interval of 0.5 μm.

The scanning electron microscope (SEM) picture of FIG. 25 shows an example thereof. In the example, a 170 nm deep step is formed on a base insulating film where convex portions having the width of 0.5 μm are formed with an interval of 0.5 μm and an amorphous silicon film is formed to a thickness of 150 nm and crystallized on the base insulating film. The surface of the crystalline semiconductor film is etched by a Secco solution in order to show grain boundaries clearly. The Secco solution is a chemical prepared by mixing $K_2Cr_2O_7$ as additive with $HF:H_2O=2:1$. It is apparent from this picture that grain boundaries are concentrated on the convex portions forming steps.

FIG. 27 shows results of obtaining the orientation of the crystalline semiconductor films in the openings (concave portions) by electron back scatter diffraction pattern (EBSP). EBSP is a method in which a special detector is attached to a scanning electron microscope (SEM), a crystal surface is irradiated with an electron beam, and the crystal orientation is identified from its Kikuchi line by a computer through image recognition to measure the micro crystallinity not in surface orientation alone but rather in all directions of the crystal (hereinafter this method is called an EBSP method for conveniences' sake).

Data of FIG. 27 shows that crystals have grown in a direction parallel to the scanning direction of the laser light collected into a linear shape in the openings (concave portions).

FIG. 2C shows a case in which d>>t02, and W1, W2≦1 μm. In this case, the crystalline semiconductor film 205 is formed so as to fill the openings, and it is possible that almost none of the crystalline semiconductor film 205 remains on the second insulating films 202.

FIG. 2D shows a case in which d≧t02, and W1 and W2 are almost equal to or slightly greater than 1 μm (W1, W2≧1 μm). If the width of the openings is expanded, then although the crystalline semiconductor film 205 fills the openings and there is a leveling effect, crystal grain boundaries and crystal grain subboundaries develop near the center of the openings. Further, stress similarly concentrates on the second insulating films, distortions accumulate, and further, grain boundaries are formed there. It is conjectured that this is due to the stress relief effect being reduced by the wide gaps.

FIG. 2E shows a case in which d≧t02, and W1, W2>1 μm, and the state of FIG. 2D is further realized.

Figure 26:
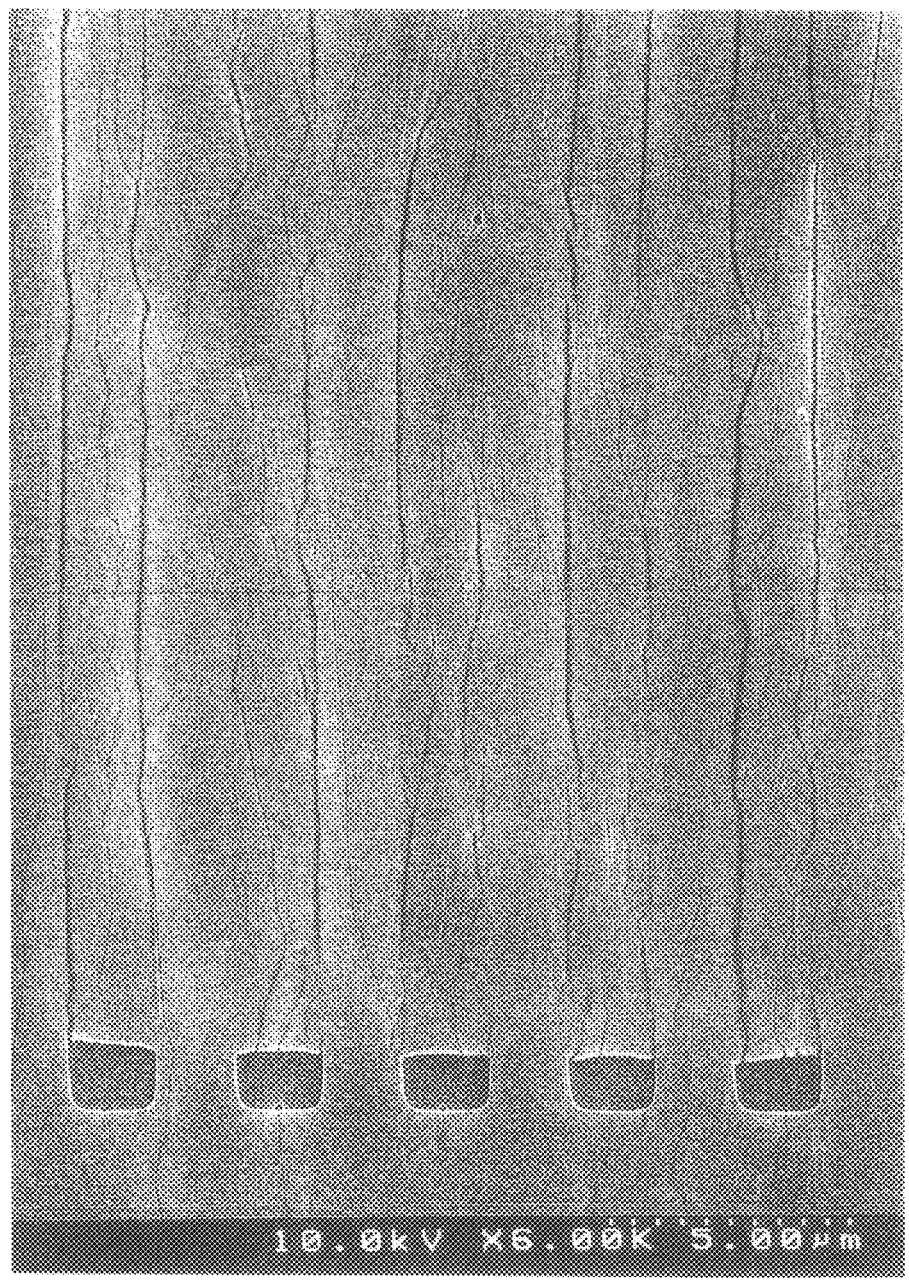
FIG. 26 is a scanning electron microscope (SEM) picture (after Secco etching) showing a surface state of an amorphous silicon film formed to a thickness of 150 nm and crystallized on a base insulating film that has a 170 nm deep step and 1.8 μm width convex portions with an interval of 1.8 μm.

The scanning electron microscope (SEM) picture of FIG. 26 shows an example thereof. In the example, a 170 nm-deep step is formed on a base insulating film where convex portions having the width of 1.8 μm are formed with an interval of 0.5 μm and an amorphous silicon film is formed to a thickness of 150 nm and crystallized on the base insulating film. The surface of the crystalline semiconductor film is etched by a Secco solution in order to show grain boundaries clearly. As is apparent from the comparison with FIG. 25, grain boundaries are not concentrated only on the convex portions in a step shape, but are scattered in the openings (concave portions). Therefore, according to such a structure, it is impossible to selectively take out a crystalline semiconductor film having no grain boundaries.

As explained above using FIGS. 2A to 2E, the modes of FIG. 2B can be considered the most suitable when forming a semiconductor element, particularly when forming a channel formation region in a transistor using such a semiconductor film. One example is shown in the above explanation for the uneven shape of the base for forming the crystalline semiconductor film, formed by the first insulating film 201 and the second insulating films 202, but the present invention is not limited to the modes shown here. Bases having similar shapes may also be used as a substitute therefor. For example, openings may be formed directly by etching the surface of a quartz substrate, thus forming an uneven shape.

Figure 14:
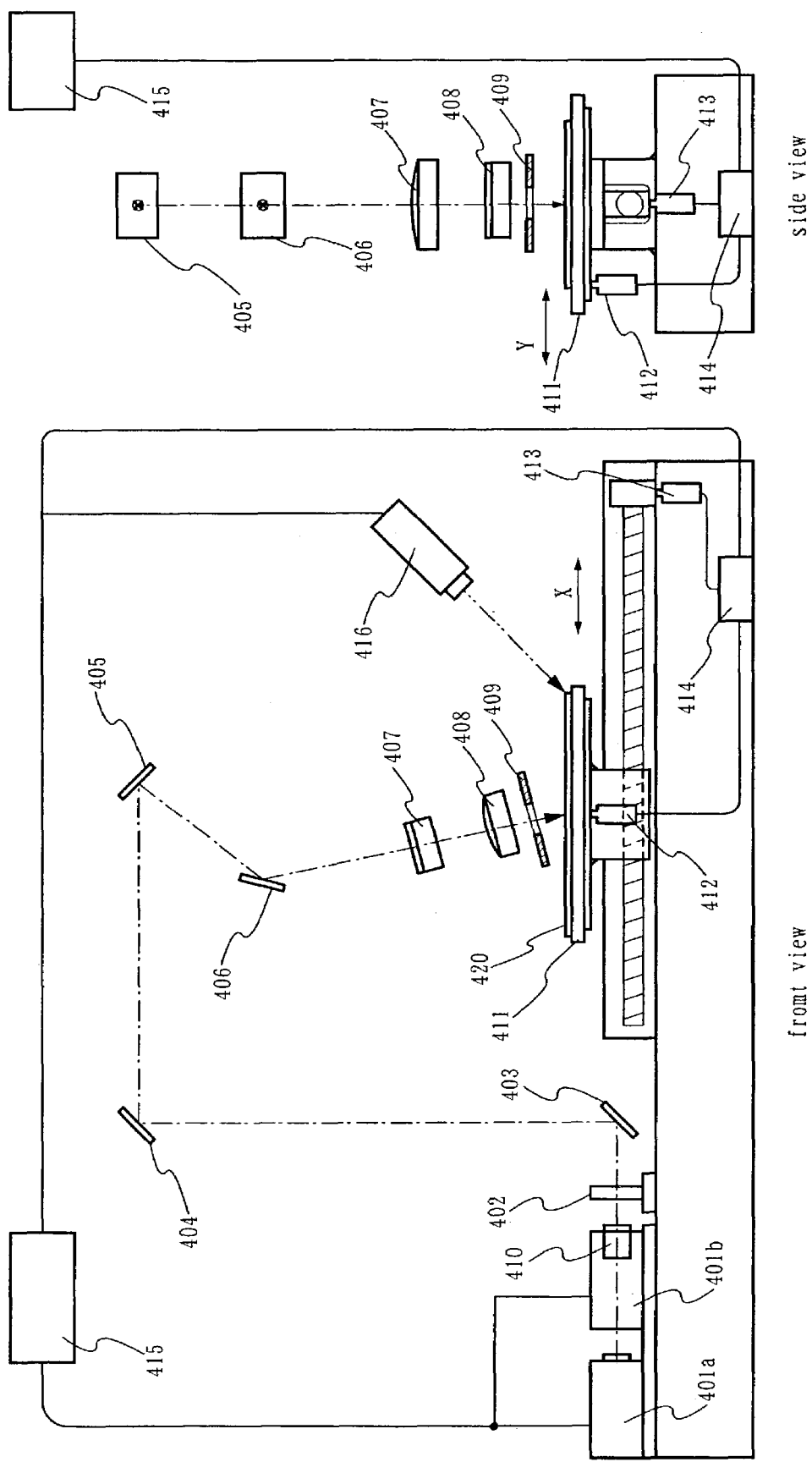
FIG. 14 is an arrangement diagram showing a mode of laser irradiation apparatus employed in the present invention.

FIG. 14 shows an example of a structure of a laser irradiation apparatus capable of being applied for crystallization. FIG. 14 is a diagram showing a front view and a side view of the structure of a laser irradiation apparatus including a laser oscillation apparatuses 401a and 401b, a shutter 402, high conversion mirrors 403 to 406, cylindrical lenses 407 and 408, a slit 409, a holding platform 411, driving means 412 and 413 for displacing the holding platform 411 in the X-direction and the Y-direction, a controlling means 414 for controlling the driving means, an information processing means 415 for sending signals to the laser oscillation apparatuses 401a and 401b and the controlling means 414 based on a program stored in advance, and the like.

To the laser oscillation apparatus, a rectangular beam solid state laser oscillation apparatus is applied, and in particular, it is preferable to apply a slab laser oscillation apparatus. Alternatively, a solid state laser oscillation apparatus that uses a crystal such as YAG, $YVO_4$, YLF, or $YAlO_3$, doped with Nd, Tm, and Ho may also be combined with a slab structure amplifier. Crystals such as Nd:YAG, Nd:GGG (gadolinium, gallium, garnet), and Nd:GsGG (gadolinium, scandium, gallium, garnet) can be used as the slab material. In addition, a gas laser oscillation apparatus, or a solid state laser oscillation apparatus, capable of continuous wave oscillation can also be applied. Laser oscillation apparatuses using crystals such as YAG, $YVO_4$, YLF, or $YAlO_3$, doped with Cr, Nd, Er, Ho, Ce, Co, Ti, or Tm are applied as continuous wave oscillation solid state laser oscillation apparatuses. Although differing by the dopant material, the fundamental wave is oscillated at an oscillation wavelength ranging from 1 μm to 2 μm. A diode excited solid state laser oscillation apparatus may be connected by a cascade in order to obtain high output of 5W or more.

Circular or rectangular laser light that is output from these laser oscillation apparatuses is concentrated into a linear shape in the cross sectional shape of an irradiation surface by the cylindrical lenses 407 and 408. Further, in order to prevent interference on the irradiation surface, high conversion mirrors are suitably adjusted so that the laser light is incident obliquely with an angle of 10° to 80°. A high transmittivity is obtained if the cylindrical lenses 407 and 408 are manufactured from synthetic quartz, and coating conducted on the surfaces of the lenses is applied in order to achieve a transmittivity equal to or greater than 99% with respect to the wavelength of the laser light. Needless to say, the cross sectional shape of the irradiation surface is not limited to a linear shape, and arbitrary shapes such as a rectangular shape, an elliptical shape, and an oval shape may also be used. Whichever shape is used, shapes having a ratio between the minor axis and the major axis which falls within a range of 1 to 10, to 1 to 100, are indicated. Further, the wavelength converter element 410 is prepared in order to obtain a harmonic with respect to a fundamental wave.

Further, laser annealing of the substrate 420 is possible by moving the holding platform 411 in two axial directions by using the driving means 412 and 413. For movement in one direction, it is possible to continuously move the holding platform 411 at a uniform velocity of 1 to 200 cm/sec, preferably of 5 to 75 cm/sec, over a distance longer than the length of one side of the substrate 420. It becomes possible to perform non-continuous stepwise movement in the other direction over a distance nearly corresponding to that of the longitudinal direction of the linear beam. Oscillation of the laser oscillation apparatuses 401a and 401b, and the movement of the holding platform 411 are performed in synchronism with each other by the information processing means 415 in which a microprocessor is mounted.

It is possible to process the entire surface of the substrate by laser light irradiated from a fixed optical system by linear motion of the holding platform 411 in the X-direction shown in the figure. A position detecting means 416 detects that the substrate 420 is in a laser light irradiation position, and transfers this signal to the information processing means 415. The laser light is irradiated at timings in synchronism therewith by the information processing means 415. That is, the shutter 402 is closed when the substrate 420 is not in the laser light irradiation position, and irradiation of the laser light is stopped.

Laser light irradiated to the substrate 420 by the laser irradiation apparatus having this type of structure can be used to process desired regions, or the entire surface, of the semiconductor film by relative motion in the X-direction and the Y-direction shown in the figure.

As described above, openings (or resultant step) are provided under an amorphous semiconductor film and the amorphous semiconductor film is crystallized by irradiation of continuous wave laser light, thereby making distortion or stress that accompanies crystallization concentrate on regions other than the openings. This makes it possible to selectively remove regions of poor crystallinity which have grain boundaries or the like. In other words, only crystalline semiconductor films in the openings are left and the crystalline semiconductor films include aggregation of plural crystal grains which have varying crystal orientations and which stretch in the direction parallel to the growth direction without forming grain boundaries. To rephrase it once more, this makes it possible to avoid giving distortion or stress to a crystalline semiconductor that serves as an active layer. A TFT is formed in a way that places its channel formation region in such crystalline semiconductor films. As a result, the current drive performance is improved at high speed and the reliability of the element is also improved.

Figure 35:
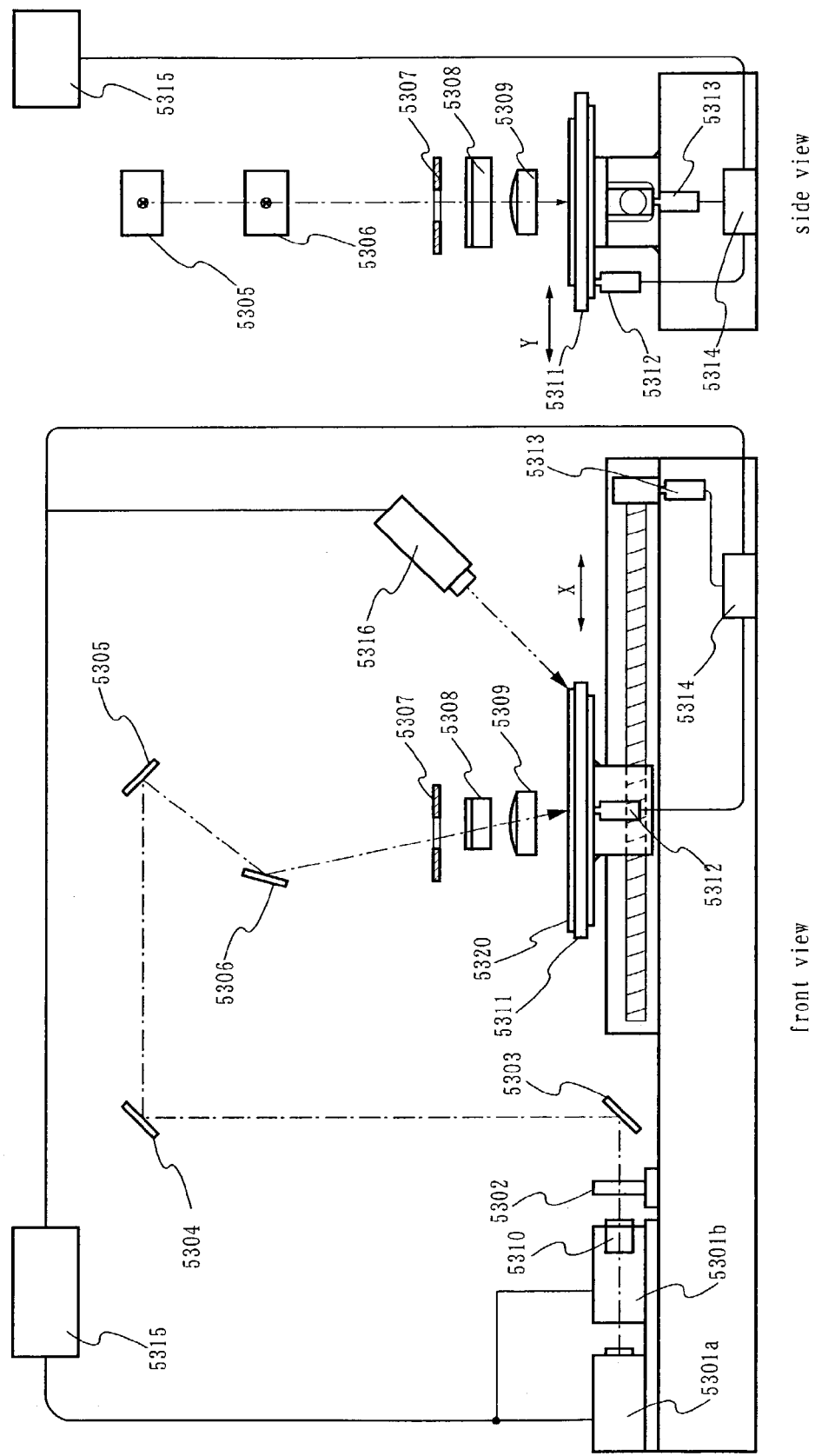
FIG. 35 is an arrangement diagram showing a mode of laser irradiation apparatus employed in the present invention.

FIG. 35 shows another example of the structure of laser irradiation apparatus employable in crystallization. The laser irradiation apparatus shown in FIG. 35 is identical with the laser irradiation apparatus shown in FIG. 14 except its optical system.

FIG. 35 is a diagram showing a front view and a side view of the structure of a laser irradiation apparatus including a laser oscillation apparatuses 5301a and 5301b, a shutter 5302, high conversion mirrors 5303 to 5306, a slit 5307, cylindrical lenses 5308 and 5309, a holding platform 5311, driving means 5312 and 5313 for displacing the holding platform 5311 in the X-direction and the Y-direction, a controlling means 5314 for controlling the driving means, an information processing means 5315 for sending signals to the laser oscillation apparatuses 5301a and 5301b and the controlling means 5314 based on a program stored in advance, and the like.

In FIG. 35, laser light concentrated into a linear shape in the cross sectional shape of an irradiation surface by the cylindrical lenses 5308 and 5309 is made incident obliquely to a surface of a substrate 5320 on the holding platform 5311. Therefore, a linear shape light collecting surface can be formed in the irradiation surface or its vicinity when the focal point position shifts due to aberrations such as astigmatisms. A high transmittivity is obtained if the cylindrical lenses 5308 and 5309 are manufactured from synthetic quartz, and coating performed on the surfaces of the lenses is applied in order to achieve a transmittivity equal to or greater than 99% with respect to the wavelength of the laser light.

Embodiment Mode 2

Figure 31:
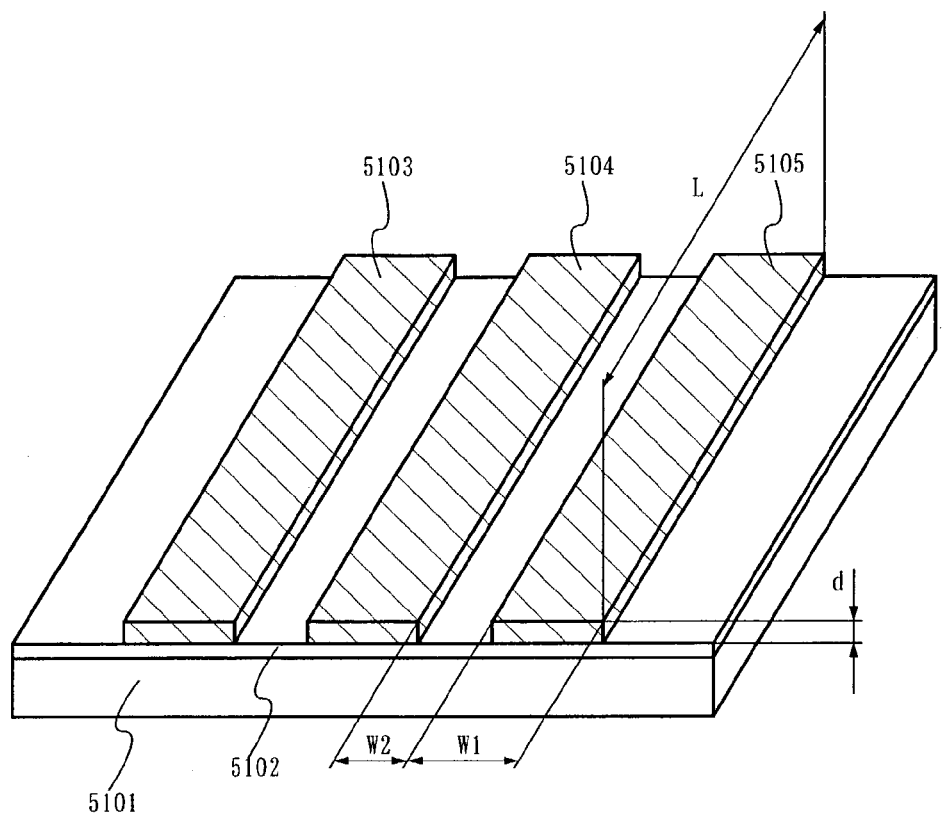
FIG. 31 is a perspective view illustrating a crystallization method in the present invention.

A perspective view shown in FIG. 31 shows an embodiment in which a first insulating film 5102, and second insulating films 5103 to 5105 that are patterned into stripe shapes, are formed on a substrate 5101. Three stripe shape patterns are shown here using the second insulating films, but of course there are no limitations placed on the number of stripe shape patterns. The substrate can apply a commercially available non-alkaline glass substrate, a quartz substrate, a sapphire substrate, a single crystal or a polycrystalline semiconductor substrate whose surface is covered by an insulating film, or a metal substrate whose surface is covered by an insulating film.

The width W1 of the second insulating films 5103 to 5105 formed in stripe shapes is set from 0.1 to 10 μm (preferably from 0.5 to 1 μm), a gap W2 between adjacent second insulating films 5103 to 5105 is set from 0.1 to 5 μm (preferably from 0.5 to 1 μm), and a thickness d of the second insulating films 5103 to 5105 is set to the same order as, or greater than, the thickness of a non-single crystalline semiconductor film formed on the second insulating films. Further, step shapes need not have a regulated periodic pattern, and may be formed to align with the layout and shape of island-like regions containing TFT channel formation regions. A length L of the second insulating films 5103 to 5105 is also not limited, and the length L may be on an order such that the TFT channel formation regions can be formed, for example.

The first insulating film 5102 is formed using silicon nitride or silicon oxynitride. Further, the second insulating films 5103 to 5105 are formed using silicon oxide or silicon oxynitride. Silicon oxide can be formed by plasma CVD by mixing tetraethyl-ortho-silicate (TEOS) and $O_2$. Silicon oxynitride films can be formed by plasma CVD using $SiH_4$, $NH_3$, and $N_2O$, or $SiH_4$ and $N_2O$ as raw materials.

It is preferable to suitably regulate the materials and the film formation conditions so that the etching speed of the second insulating films 5103 to 5105 becomes relatively fast in order to ensure selectivity during etching processing in the case where an uneven shape is formed by the first insulating film 5102 and the second insulating films 5103 to 5105 with openings as the mode shown in FIG. 31. The angle of sidewalls of the openings formed of the second insulating films 5103 to 5105 may be suitably set in a range from 5 to 120°, preferably in a range from 80 to 100°.

Figure 32:
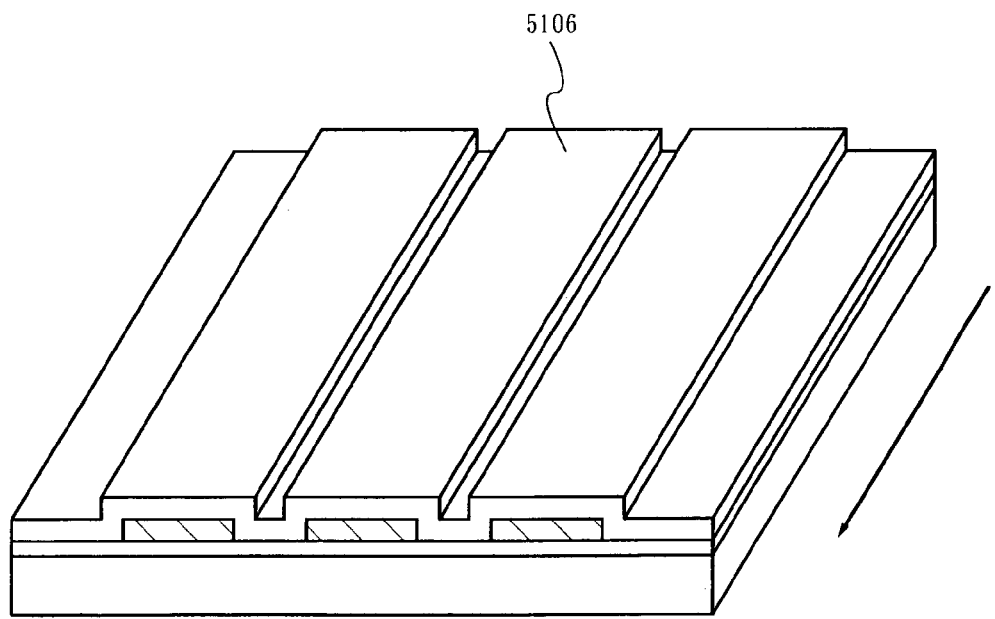
FIG. 32 is a perspective view illustrating a crystallization method in the present invention.

An amorphous semiconductor film 5106 having a thickness of 50 to 200 nm is formed covering a surface composed of the first insulating film 5102 and the second insulating films 5103 to 5105, and the openings, as shown in FIG. 32. The amorphous semiconductor film can apply silicon, a chemical compound or alloy of silicon and germanium, or a chemical compound or alloy of silicon and carbon.

Continuous wave laser light is then irradiated to the amorphous semiconductor film 5106, thereby performing crystallization. Applicable laser light is concentrated and expanded into a linear shape by an optical system. The intensity distribution of the laser light has a uniform region in the longitudinal direction, and may possess a distribution in the transverse region. A rectangular beam solid state laser oscillation apparatus is applied as a laser oscillation apparatus which is used as a light source, and in particular it is preferably to apply a slab laser oscillation apparatus. Alternatively, a solid state laser oscillation apparatus that uses a rod doped with Nd, Tm, and Ho, in particular a solid state laser oscillation apparatus that uses a crystal such as YAG, $YVO_4$, YLF, or $YAlO_3$, doped with Nd, Tm, and Ho may also be combined with a slab structure amplifier. The scanning is then performed as shown by an arrow in the figure in a direction that intersects with the linear shape longitudinal direction. It is most preferable at this point to scan in a direction parallel to the longitudinal direction of the stripe shape pattern formed in the base insulating film. Note that the term linear as used here denotes a shape in which the ratio of the length in the longitudinal direction to the length in the transverse direction, is equal to or greater than the ratio of 1 to 10.

Crystals such as Nd:YAG, Nd:GGG (gadolinium, gallium, garnet), and Nd:GsGG (gadolinium, scandium, gallium, garnet) can be used as the slab material. A zigzag light path is followed with the slab laser, while total reflection is repeated within the planer shape laser medium.

Further, considering the light absorption coefficient of the amorphous semiconductor film 5106, it is preferable that the wavelength of the continuous wave laser light be from 400 to 700 nm. Light in this wavelength range is obtained by extracting the second harmonic or the third harmonic of the fundamental wave using a wavelength converter element. ADP (ammonium dihydrogen phosphate), $Ba_2NaNb_5O_{15}$ (barium sodium niobate), CdSe (selenium cadmium), KDP (potassium dihydrogen phosphate), $LiNbO_3$ (lithium niobate), Se, Te, LBO, BBO, KB5, and the like can be applied as the wavelength converter element. In particular, it is preferable to use LBO. A typical example is to use the second harmonic (532 nm) of an Nd:$YVO_4$ laser oscillation apparatus (fundamental wave 1064 nm). Further, the laser oscillation mode uses a single mode, which is a $TEM_{00}$ mode.

For a case in which silicon is selected as the most suitable material, its absorption coefficient is in a region from $10^3$ to $10^4$ $cm^{-1}$, which is nearly the visible light region. If a substrate having a high transmittivity of visible light is used, such as glass, and an amorphous semiconductor film 5106 is formed by silicon having a thickness from 30 to 200 nm, then crystallization can be performed without imparting damage to the base insulating film by irradiating a light of visible light region with a wavelength of 400 to 700 nm, thus selectively heating the semiconductor region. Specifically, the penetration depth of 532 nm wavelength light is nearly 100 to 1000 nm with respect to the amorphous silicon film 5106, and inside portions of the amorphous semiconductor film 5106 formed at a film thickness of 30 to 200 nm can be sufficiently reached. That is, it is possible to heat from the inside of the semiconductor film, and nearly the entire semiconductor film can be heated uniformly in the laser light irradiation region.

Figure 33:
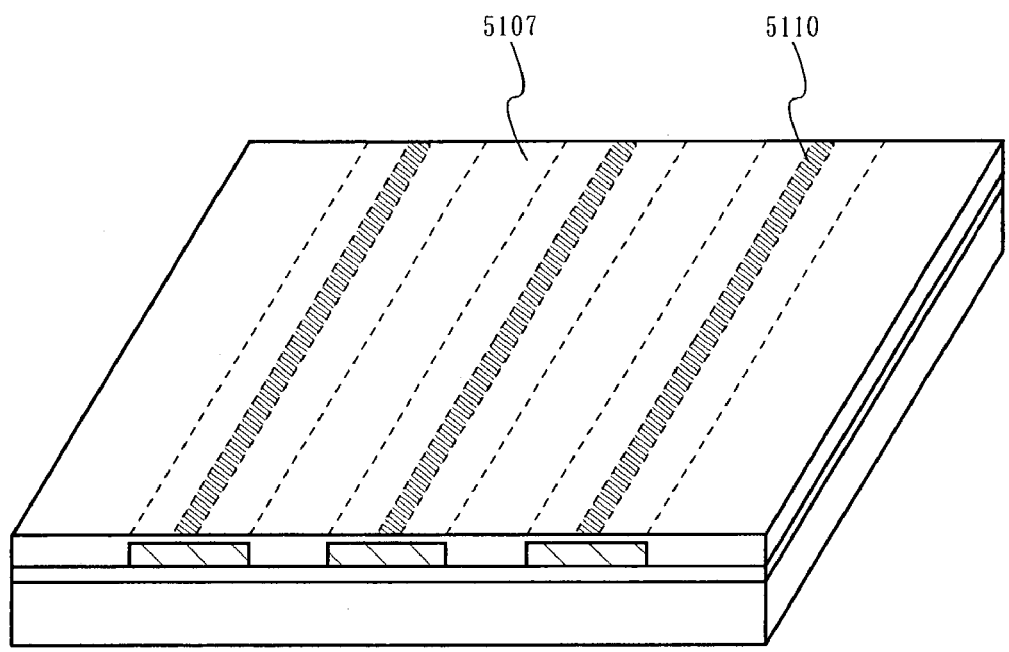
FIG. 33 is a perspective view illustrating a crystallization method in the present invention.

The semiconductor film that has been melted by the laser light irradiation aggregates in the openings (concave portions) due to the action of surface tension. The surface is nearly flat in a state thus solidified, as shown by FIG. 33. In addition, crystal growth ends, crystal grain boundaries, and crystal subboundaries are formed on the second insulating films 5103 to 5105 (convex portions, regions 5110 denoted by hatch marks in the figure). A crystalline semiconductor film 5107 is thus formed.

Figure 34:
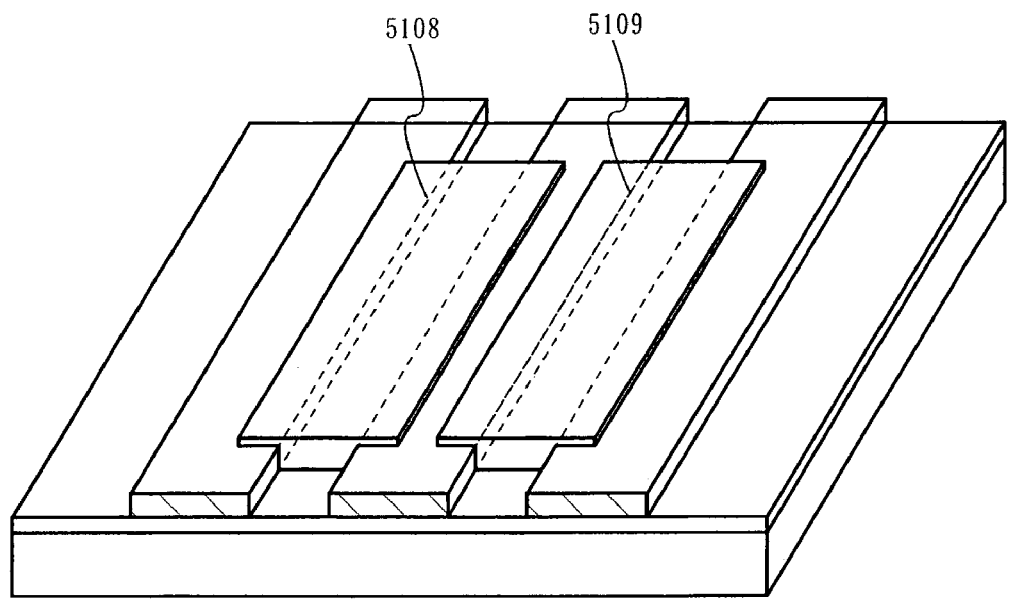
FIG. 34 is a perspective view illustrating a crystallization method in the present invention.

The crystalline semiconductor film 5107 is then etched, forming island-like semiconductor regions 5108 and 5109 as shown in FIG. 34. Only good quality semiconductor regions can remain in accordance with etching and removing the regions 5110 in which the growth ends, crystal grain boundaries, and crystal subboundaries are concentrated. A gate insulating film and gate electrodes are then formed so that channel formation regions 5108 and 5109 can be positioned by using the island-like crystalline semiconductor film filling particularly the openings (concave portions). TFTs can thus be completed through each stage.

Embodiment Mode 3

Next, a method of irradiating laser light used in the present invention is explained using FIGS. 48A to 48D.

Figure 48A:
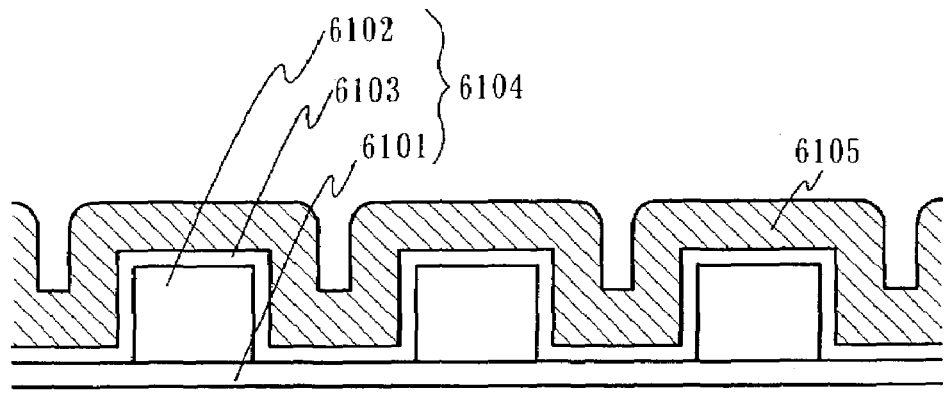
FIGS. 48A to 48D are diagrams showing the flow of crystallization of a semiconductor film of the present invention.

First, a first base film 6101 made from an insulating film is formed on a substrate as shown in FIG. 48A. Second base films 6102 made from rectangular shape insulating films are then formed on the first base film 6101, and a third base film 6103 is formed so as to cover the first base film 6101 and the second base films 6102. Silicon nitride is used as the first base film 6101 in this embodiment mode, silicon oxide is used as the second base film 6102, and a silicon oxide film is used as the third insulating film 6103. Note that the materials used in the first insulating film 6101, the second insulating films 6102, and the third insulating film 6103 are not limited to the aforementioned materials. Other materials may also be used provided that: they are insulating films capable of withstanding heat treatment performed in later process steps; they can prevent the mixing in of alkaline metals, which can impart adverse influence to TFT characteristics, to a semiconductor film formed later; and unevenness can be formed on them. Note that a method for forming this unevenness is explained in detail later. Further, insulating films other than these may also be used, and a laminate structure of two or more films may also be used.

Although the first insulating film 6101, the second insulating film 6102, and the third insulating film 6103 are shown separately in FIGS. 48A to 48D, the three base films are all taken together and referred to as a base film 6104. Note that, although the base film 6104 having unevenness is formed by using the three base films in this embodiment mode, the structure of the base film used by the present invention is not limited to this structure.

A marker may also be formed at the same time as the base film 6104 by utilizing a portion of the base film.

The substrate (not shown) may be a substance capable of withstanding the processing temperatures of later process steps. For example, quartz substrates, silicon substrates, glass substrates such as barium borosilicate glass and aluminum borosilicate glass, and metal substrates and stainless steel substrates on whose surface an insulating film is formed can be sued. Further, plastic substrates having thermal resistance characteristics of an extent capable of withstanding the processing temperatures may also be used.

A semiconductor film 6105 is formed next so as to cover the base film 6104. The semiconductor film 6105 can be formed by a known method (such as sputtering, LPCVD, or plasma CVD). Note that the semiconductor film may be an amorphous semiconductor film, and may also be a microcrystalline semiconductor film or a crystalline semiconductor film containing a polycrystalline semiconductor film. Further, not only silicon but also silicon germanium or other semiconductors may also be used as a semiconductor film.

Furthermore, impurities can be prevented from mixing in between the semiconductor film 6105 and the base film 6104 by forming the semiconductor film in succession, without exposure to the atmosphere, after forming the third base film 6103.

Note that a designer can suitably determine the shape and the size of convex portions of the base film 6104. It is necessary, however, to set the thickness of the convex portions on an order such that the semiconductor film formed later is not cut off in the vicinity of the edges of the convex portions.

Figure 48B:
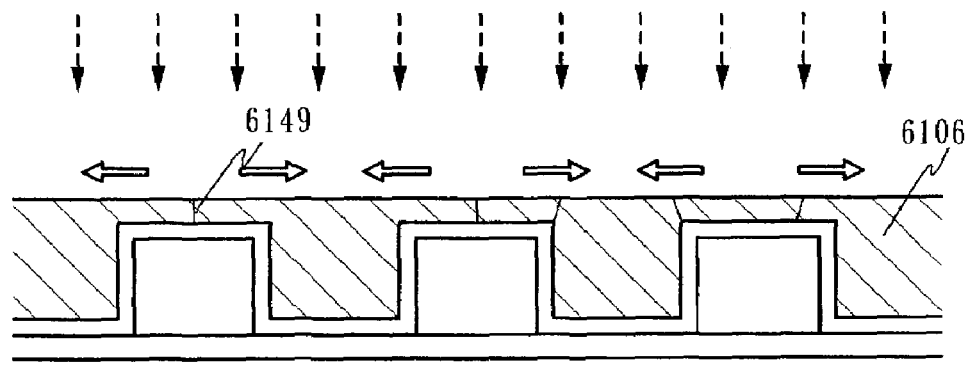

Laser light is irradiated to the semiconductor film 6105 next as shown in FIG. 48B. The semiconductor film 6105 melts once due to the laser light irradiation, and its volume moves from upper portions of the convex portions toward the concave portions, as shown by the outline arrows. A semiconductor film (after LC) 6106 having a leveled surface and increased crystallinity is formed. The energy density of the laser light becomes lower in the vicinity of the edges of the laser beam, and therefore the crystal grains become smaller in the vicinity of the edges, and protruding portions (ridges) appear along the crystal grain boundaries. Irradiation is therefore performed such that the edges of the laser beam of the laser light trajectory do not overlap with portions that become channel formation regions and portions located on the concave portions of the semiconductor film 6105.

Note that the scanning direction for the laser light may be set so that it becomes parallel to the longitudinal direction of the convex portions of the base film 6104, or other directions.

Known lasers can be used in the present invention. It is preferable that the laser light be continuous wave oscillation, but it can be considered that a certain level of the effect of the present invention can be obtained even if a pulse wave oscillation type is used. The laser can use a gas laser or a solid state laser. Excimer lasers, Ar lasers, Kr lasers and the like exist as gas lasers, and YAG lasers, $YVO_4$ lasers, YLF lasers, $YAlO_3$ lasers, glass lasers, ruby lasers, Alexandrite lasers, Ti:sapphire lasers, $Y_2O_3$ lasers and the like can be given as solid state lasers. Lasers using crystals such as YAG, $YVO_4$, YLF, or $YAlO_3$, doped with Cr, Nd, Er, Ho, Ce, Co, Ti, Yb or Tm are applied as the solid state laser. Although differing by the material used in doping, laser light having a fundamental wave of approximately 1 µm is obtained. Harmonics with respect to the fundamental wave can be obtained by using a non-linear optical element.

In addition, after converting infrared laser light emitted from a solid state laser to green laser light by using a non-linear optical element, ultraviolet laser light then obtained by using another non-linear optical element can also be used.

As for the semiconductor film (after LC) 6106, its film thickness becomes thicker on the concave portions of the base film 6104, and conversely its film thickness becomes thinner on the convex portions of the base film 6104, by volumetric movement due to the laser light irradiation. Grain boundaries 6149 therefore easily develop on the convex portions due to stress, and conversely, a state with good crystallinity is obtained on the concave portions. Note that it is not always true that the semiconductor film (after LC) 6106 contains no grain boundaries on the concave portions. However, even if grain boundaries do exist, the crystal grains are large, and therefore the crystallinity becomes relatively superior.

Figure 48C:
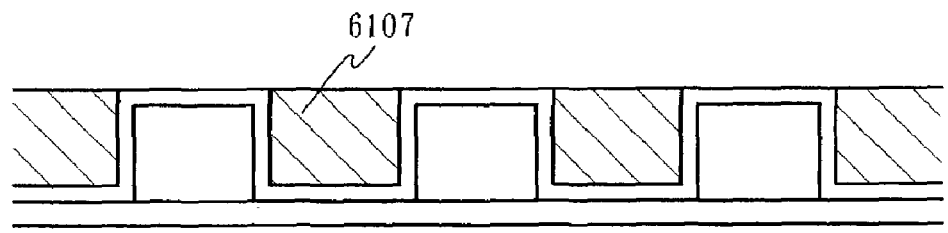
Figure 48D:
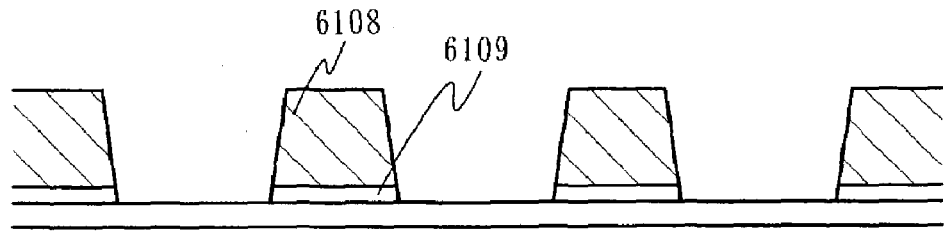

Next, as shown in FIG. 48C, the surface of the semiconductor film (after LC) 6106 is then etched, thus exposing upper surfaces of the convex portions of the base film 6104. Note that the semiconductor film (after LC) 6106 is etched so as to expose the upper surfaces of the convex portions of the third base film 6103 in this embodiment mode. Semiconductor films 6107 are remained in the concave portions of the base film 6104.

Next, the base film 6104 alone is removed by etching. It is important to choose for the base film 6104 and the semiconductor film (after etching) 6107 materials that ensure selective ratio during etching. For example, when silicon oxide is used for the second base film 6102 and the third base film 6103 as in this embodiment mode, dry etching using $CHF_3$ or $CF_3$ gas or wet etching using a fluoric acid-based etchant is preferable. When dry etching is employed, the side surfaces of the semiconductor film can be tapered while avoiding etching the base film 6104 below the semiconductor film 6107 by accident. With the side surfaces of the semiconductor film tapered, discontinuity in an insulating film and gate electrode which are formed later can be prevented. On the other hand, when wet etching is employed, the convex portions of the base film can be removed without etching the top face of the semiconductor film.

Figure 4A:
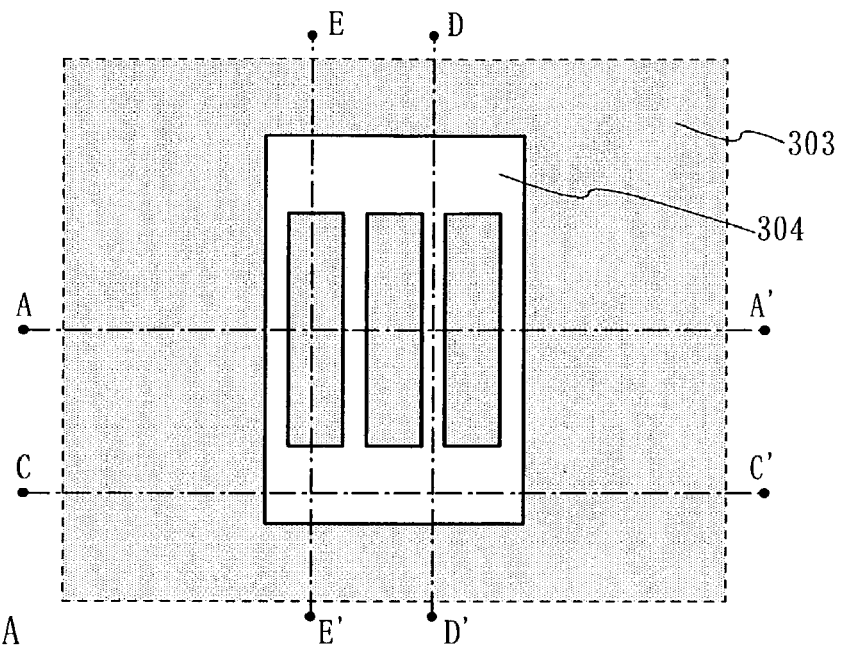
FIGS. 4A to 4E are a top view and vertical sectional views illustrating a process of manufacturing a TFT in accordance with the present invention.
Figure 4B:
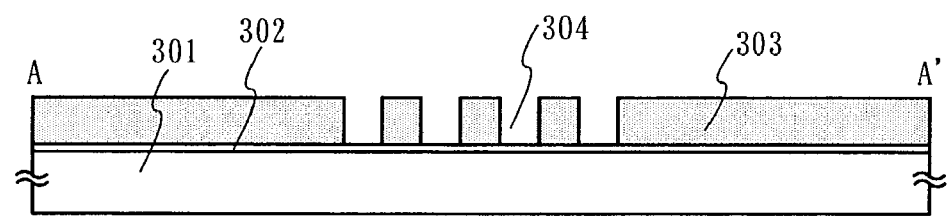
Figure 4C:
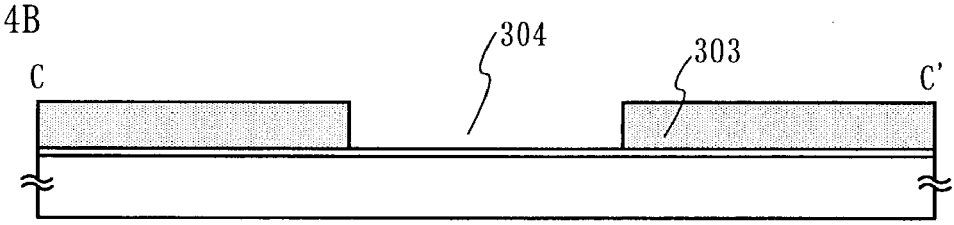
Figure 4D:
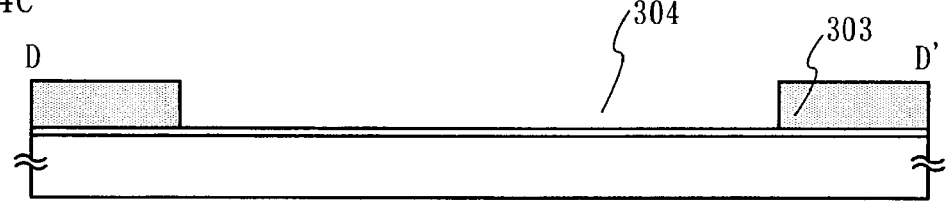
Figure 4E:
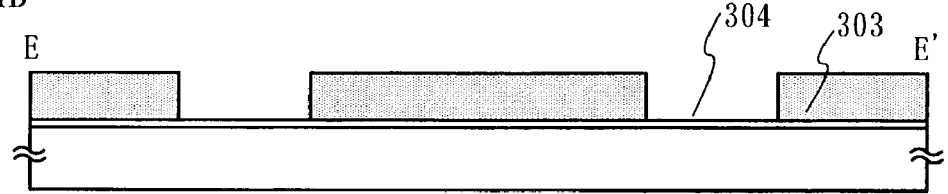
Figure 5A:
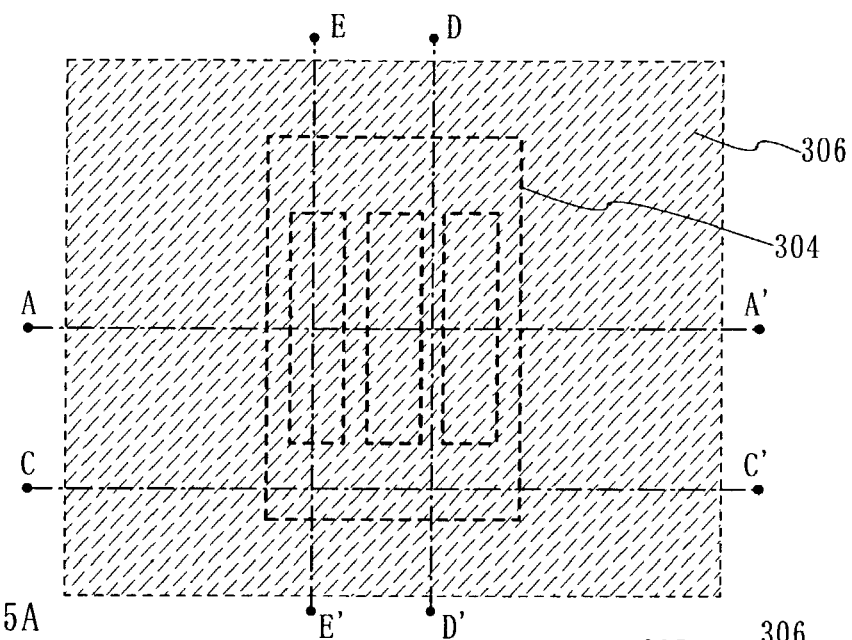
FIGS. 5A to 5E are a top view and vertical sectional views illustrating a process of manufacturing a TFT in accordance with the present invention.
Figure 5B:
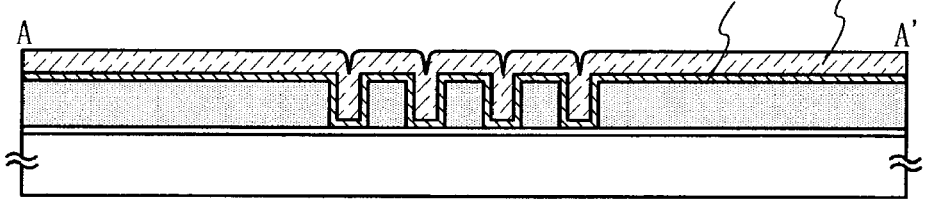
Figure 5C:
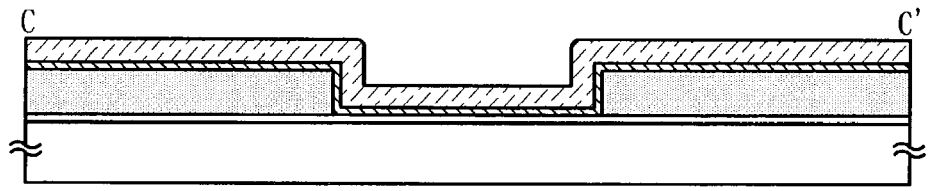
Figure 5D:
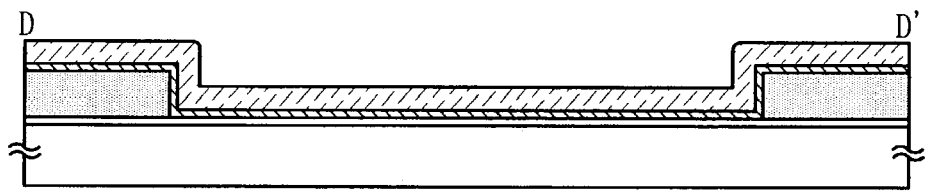
Figure 5E:
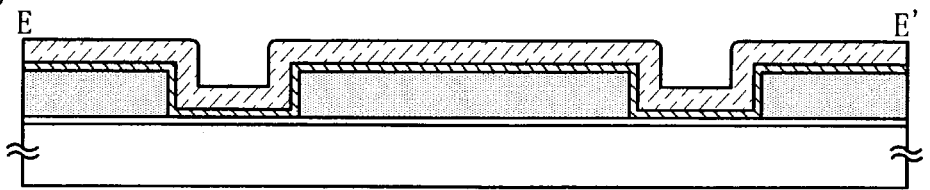
Figure 6A:
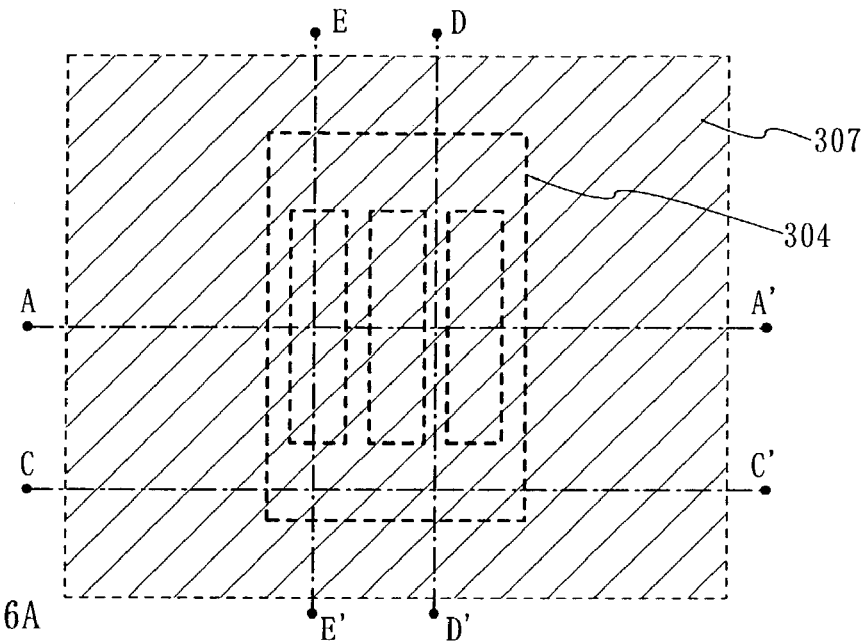
FIGS. 6A to 6E are a top view and vertical sectional views illustrating a process of manufacturing a TFT in accordance with the present invention.
Figure 6B:
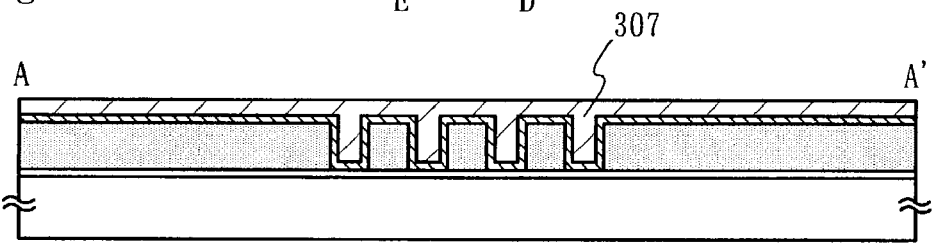
Figure 6C:
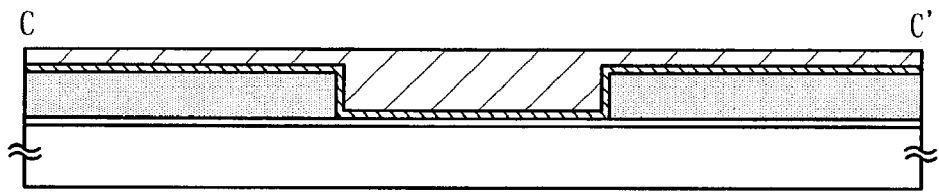
Figure 6D:
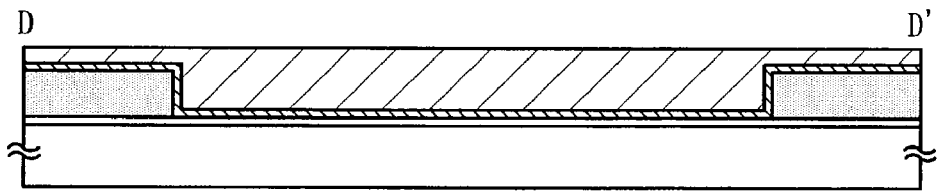
Figure 6E:
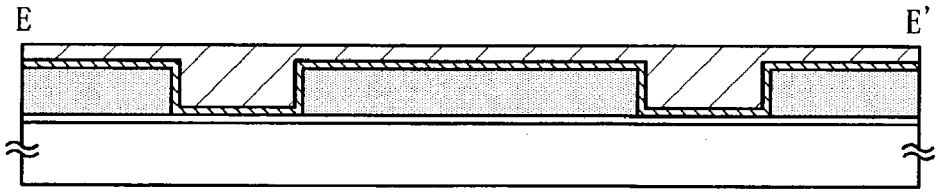
Figure 7A:
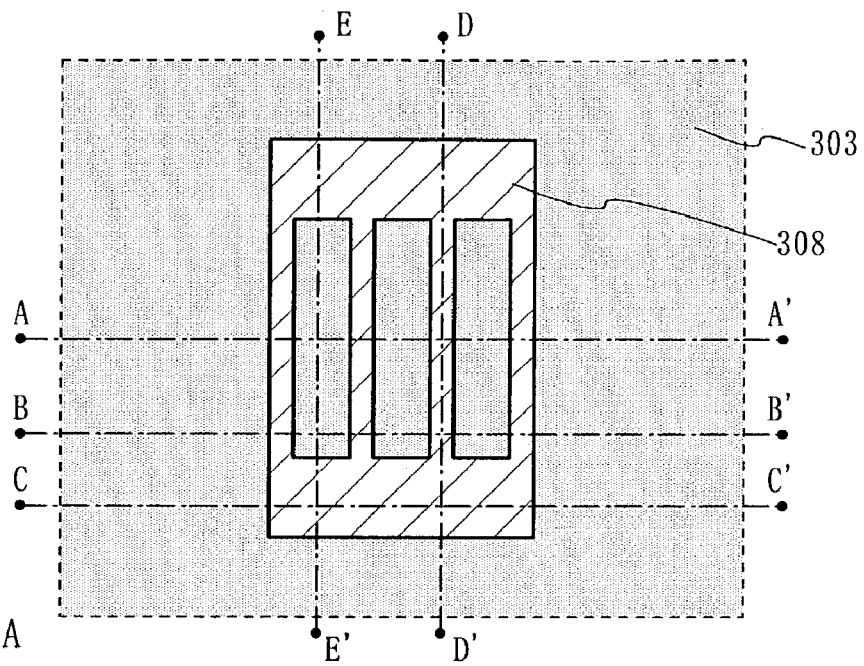
FIGS. 7A to 7E are a top view and vertical sectional views illustrating a process of manufacturing a TFT in accordance with the present invention.
Figure 7B:
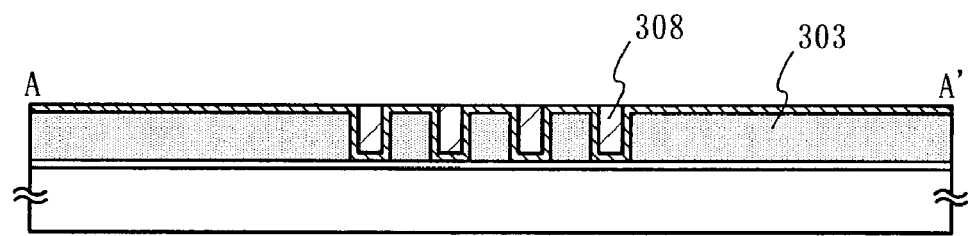
Figure 7C:
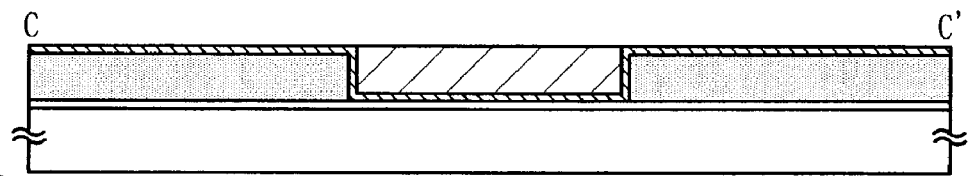
Figure 7D:
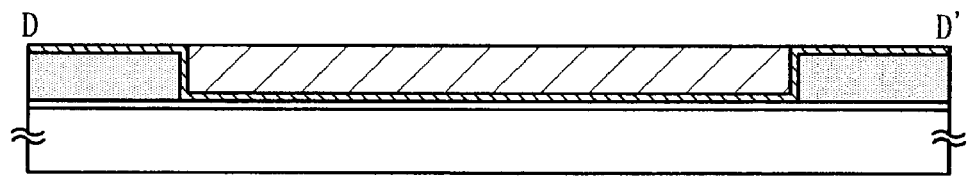
Figure 7E:
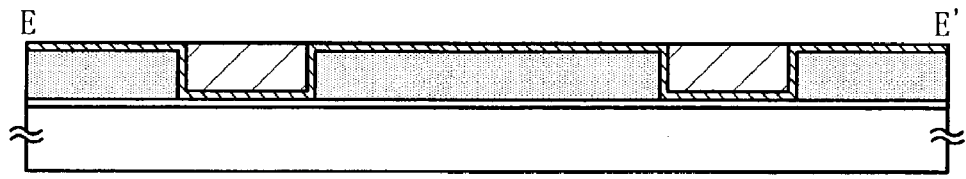

A semiconductor film (island) 6108 shown in FIG. 4D is thus obtained. A part of the third insulating film 6103 that is positioned under the island 6108 serves as a fourth insulating film 6109.

By using the islands obtained in accordance with the above-mentioned series of process steps as TFT active layers, more preferably as TFT channel formation regions, the formation of grain boundaries in the TFT channel formation regions can be prevented, and conspicuous drops in the TFT mobility, reductions in the ON current, and increases in the OFF current, all due to grain boundaries, can be prevented. Note that a designer can suitably determine a portion to be removed as being in the vicinity of the edges of the concave portions, or the edges of the convex portions, by patterning.

Embodiment Mode 4

In forming a crystalline semiconductor film of the present invention, an amorphous semiconductor film may be crystallized by laser light irradiation as in Embodiment Modes 1 through 3. Alternatively, an amorphous semiconductor film may be crystallized using a metal that has a catalytic action and then further irradiated with laser light to melt and re-crystallize the crystallized film.

FIGS. 3A to 3E show an example thereof. First, a first insulating film 201, a second insulating film 202, a silicon oxynitride film 203, and an amorphous semiconductor film 204 are formed in the manner described in Embodiment Mode 1. The amorphous semiconductor film 204 is doped with Ni as a metal element having catalytic action for promoting crystallization, such as lowering the crystallization temperature of silicon and improving the orientation. The method of doping the film with Ni is not limited and spin coating, evaporation, sputtering, or other methods can be employed. When spin coating is used, an aqueous solution containing 5 to 10 ppm of nickel acetate is applied to form a metal element-containing layer 210. The catalytic element is not limited to Ni and other known materials may be employed.

Figures 3A, 3B, 3C, 3D, 3E:
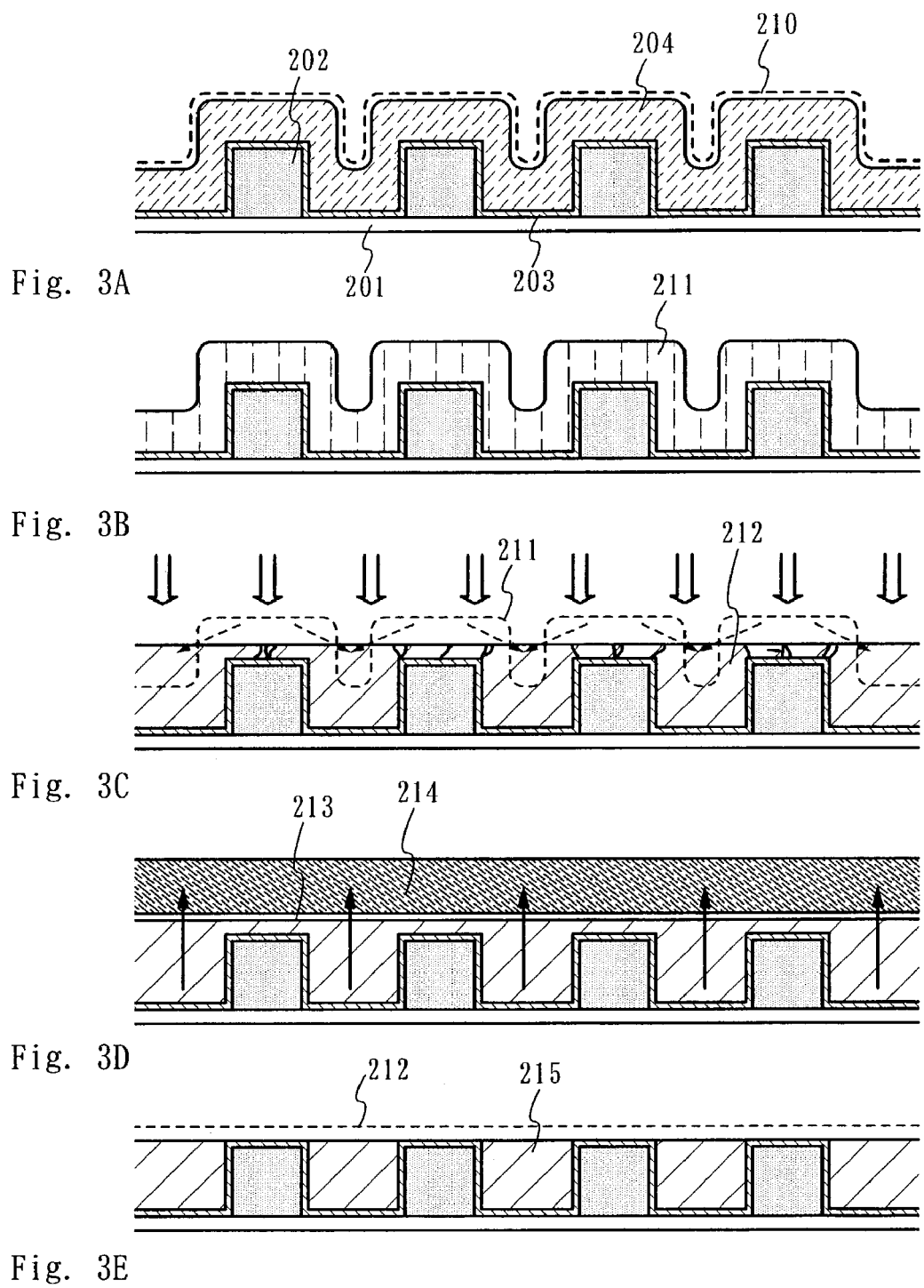
FIGS. 3A to 3E are diagrams illustrating a crystallization method in the present invention.

Next, as shown in FIG. 3B, the amorphous semiconductor film 204 is crystallized by heat treatment at 550 to 580° C. for 4 to 8 hours to form a crystalline semiconductor film 211. The crystalline semiconductor film 211 includes an aggregation of rod-like or needle-like crystals. Macroscopically, each of the crystals grows in a specific orientation and therefore the crystalline semiconductor film 211 has uniform crystallinity. The crystalline semiconductor film 211 is also characterized by having high orientation ratio in a specific orientation.

As shown in FIG. 3C, the crystalline semiconductor film 211 obtained by crystallization through heat treatment is irradiated with continuous wave laser light or equally intense light to melt the film for re-crystallization. Thus obtained is a crystalline semiconductor film 212 that has a mostly flat surface. Crystal growth ends and grain boundaries in the crystalline semiconductor film 212 are on the second insulating film 202 (on the convex portions). An amorphous region remaining in the crystalline semiconductor film 211 is crystallized by this treatment.

An advantage of using a crystalline semiconductor film as a laser light irradiation object is the volatility of the absorption coefficient of a semiconductor film; the absorption coefficient hardly changes when a crystallized semiconductor film is melted by laser light irradiation. This allows a wide margin in setting laser irradiation conditions.

Thereafter, gettering treatment is preferably conducted to remove the metal element remaining in the crystalline semiconductor film 212. A thin barrier film 213 made of silicon oxide or the like is formed so as to come in contact with the crystalline semiconductor film 212. An amorphous silicon film 214 containing a rare gas element in a concentration of $1 \times 10^{20}$ atoms/cm$^3$ or higher is formed as a gettering site. Then the substrate is subjected to heat treatment at 500 to 700° C. For details of this technique, see JP 2002-313811 A. The heat treatment for the gettering treatment also has an effect of relieving distortion of the crystalline semiconductor film 212.

Thereafter, as shown in FIG. 3E, the amorphous silicon film 214 and the barrier film 213 are removed and similar to Embodiment Mode 1, the surface of the crystalline semiconductor film 212 is etched to selectively extract crystalline semiconductor films 215 buried in the openings (concave portions). The thus obtained crystalline semiconductor films 215 have varying crystal orientations and no grain boundaries. Crystallization in two stages as this makes it possible to form a crystalline semiconductor film having relatively less distortion compared to Embodiment Mode 1.

Embodiment Mode 5

This embodiment mode gives a description with reference to FIGS. 4A to 11F on a mode of manufacturing a TFT whose channel formation region is placed in a filled region. The filled region is a region of a crystalline semiconductor film that fills an opening of a base insulating film that is formed under the crystalline semiconductor film. FIG. 4A is a top view whereas FIG. 4B and the subsequent drawings are vertical sectional views of various portions of FIG. 4A. Similarly, FIGS. 5A, 6A, 7A, 8A, 9A, 10A and 11A are top views whereas the rest are vertical sectional views.

In FIGS. 4A to 4E, a first insulating film 302 is formed on a glass substrate 301 to a thickness of 30 to 300 nm from silicon nitride, silicon oxynitride whose nitrogen content is larger than its oxygen content, aluminum nitride, or aluminum oxynitride. On the first insulating film 302, a silicon oxide film or a silicon oxynitride film is formed and subjected to photo etching to form a second insulating film 303 that has rectangular patterns. A silicon oxide film with a thickness of 10 to 3000 nm, preferably 100 to 2000 nm, is formed by plasma CVD using a mixture of TEOS and O$_2$ and setting the reaction pressure to 40 Pa, the substrate temperature to 400° C., and the high-frequency (13.56 MHz) power density to 0.6 W/cm$^2$ for electric discharge. The silicon oxide film is then etched to form an opening 304. The width of the opening, in particular in an area where a channel formation region is to be placed, is 0.01 to 2 µm, preferably 0.1 to 1 µm.

On the first insulating film 302 and the second insulating film 303, as shown in FIGS. 5A to 5E, a third insulating film 305 and an amorphous semiconductor film 306 are formed in succession using the same plasma CVD apparatus without exposing them to the air. The third insulating film 305 is a silicon oxide film or a silicon oxynitride film. The amorphous semiconductor film 306 is a semiconductor film mainly containing silicon and is formed by plasma CVD using SiH$_4$ as material gas. At this stage, the film that covers the bottom and side surfaces of the opening 304 does not have a flat surface.

Then, as shown in FIGS. 6A to 6E, the semiconductor film is crystallized by irradiation of continuous wave laser light. Crystallization conditions include employing a continuous wave oscillation mode YVO$_4$ laser oscillation apparatus, using an optical system to collect its 2 to 10 W power second harmonic (wavelength: 532 nm) into linear laser light which is 10 times longer in the longitudinal direction than in the lateral direction and which has a uniform energy density distribution in the longitudinal direction, and running the laser light at a rate of 10 to 200 cm/sec. The phrase uniform energy density distribution does not exclude everything that is not thoroughly constant. The acceptable range of the energy density distribution is ±10%. Laser irradiation apparatus structured as shown in FIG. 14 or FIG. 35 can be employed in this laser light irradiation.

Figures 15A, 15B:
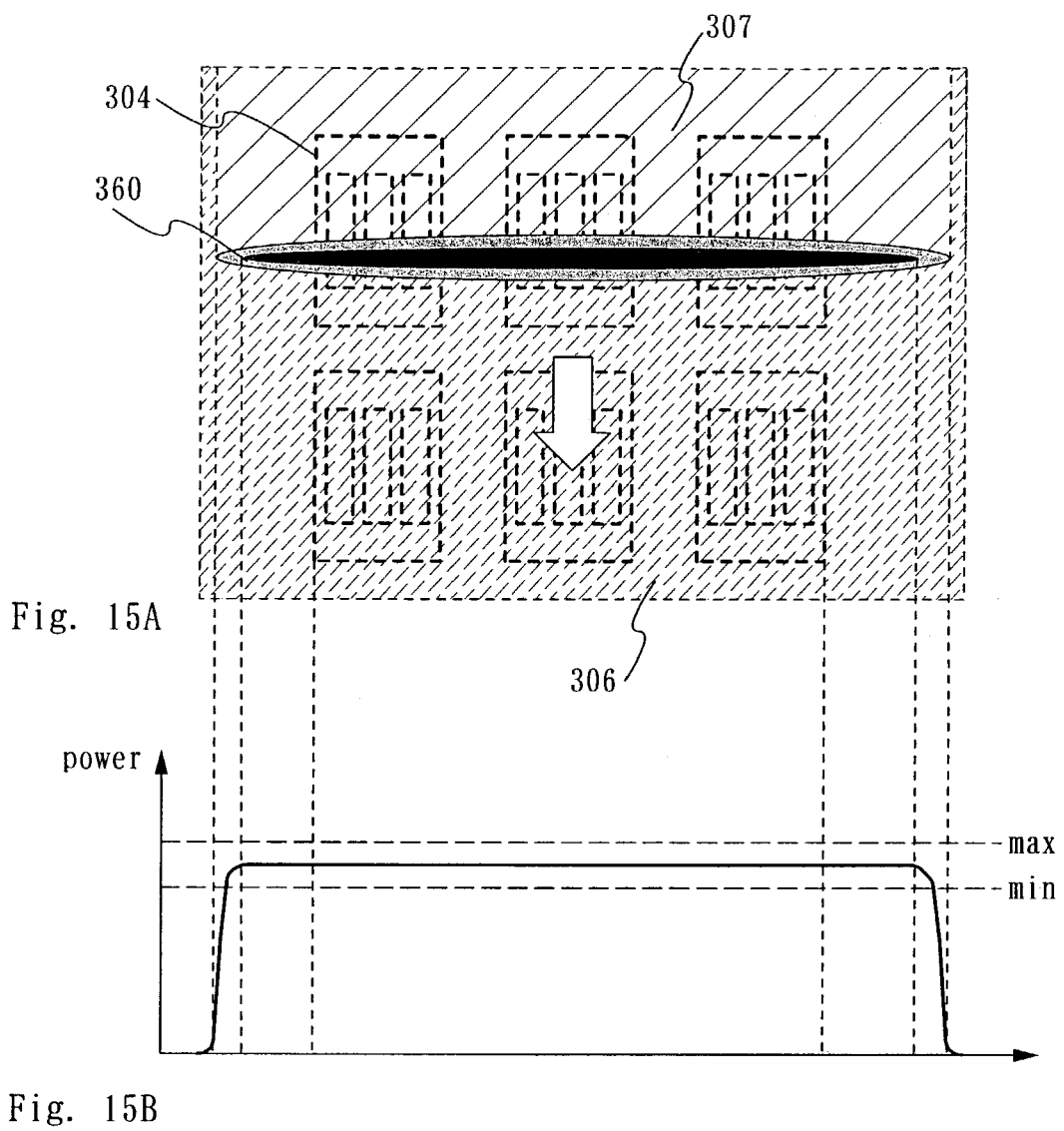
FIGS. 15A and 15B are diagrams illustrating laser light collected into a linear shape and its scanning direction in the present invention.

FIGS. 15A and 15B show the relation between the scanning direction of linearly collected laser light 360 and placement of openings. The intensity distribution of the linearly collected laser light 360 desirably has a region where the intensity is uniform in the longitudinal direction. This is to keep the temperature of the irradiation region constant by the temperature of the heated semiconductor. If the temperature is varied in the longitudinal direction of the linearly collected laser light (the direction intersecting the scanning direction), the crystal growth direction cannot be kept to the laser light scanning direction. As shown in the drawing, the opening 304 is aligned with the scanning direction of the linearly collected laser light 360. This makes the crystal growth direction match the channel length direction of every TFT. Fluctuation in characteristics between TFT elements can thus be reduced.

By irradiation of laser light under these conditions, the amorphous semiconductor film is melted in an instant and crystallized. In practice, crystallization progresses as the melting zone moves. Melted silicon gathers in the openings (concave portions) through surface tension and solidifies. This way a crystalline semiconductor film 307 with a flat surface is formed filling the opening 304 as shown in FIGS. 6A to 6E.

Thereafter, as shown in FIGS. 7A to 7E, the crystalline semiconductor film 307 is etched leaving at least a portion of the crystalline semiconductor film 307 that is in the opening 304. Through this etching treatment, portions of the crystalline semiconductor film that are on the second insulating film 303 are removed and an island-like semiconductor film 308 shaped to match the shape of the openings is formed from the crystalline semiconductor film. The crystalline semiconductor film is etched using as etching gas hydrofluoric acid-based gas and oxygen, thereby ensuring the selectivity with respect to the base silicon oxide film. For example, a mixture of CF$_4$ and O$_2$ is used as etching gas. As in Embodiment Mode 1, the island-like semiconductor film 308 is characterized by having varying crystal orientations and no grain boundaries.

FIGS. 7A to 7E are not to limit the shape of the island-like semiconductor film 308, namely, the shape of the opening 304 comprised of the first insulating film 302 and the second insulating film 303. As mentioned in Embodiment Mode 1, the shape of the island-like semiconductor film is not particularly limited as long as it follows a given design rule. The island-like semiconductor film of FIGS. 7A to 7E is shaped by adjoining plural slip-like crystalline semiconductor films with a pair of rectangular crystalline semiconductor films. As described later, channel formation regions of TFTs are placed in the plural slip-like crystalline semiconductor films.

Figure 8A:
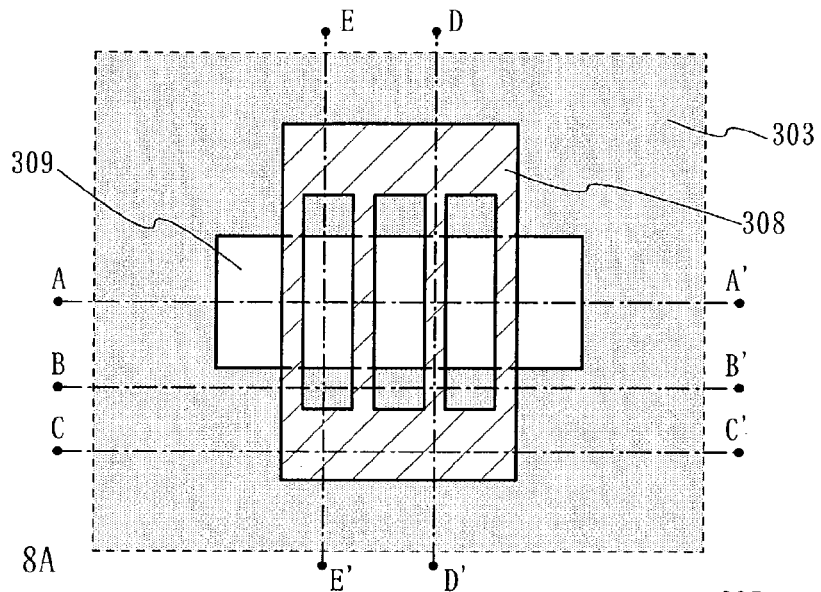
FIGS. 8A to 8F are a top view and vertical sectional views illustrating a process of manufacturing a TFT in accordance with the present invention.
Figure 8B:
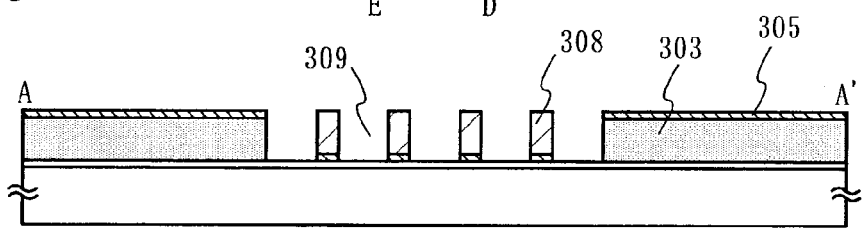
Figure 8C:
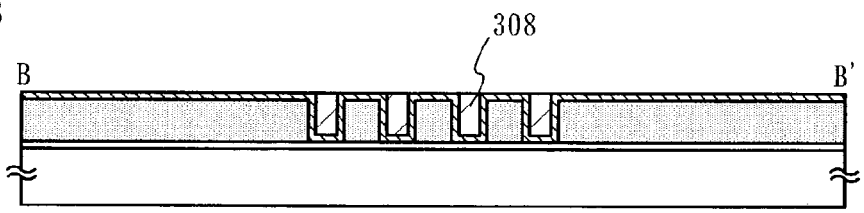
Figure 8D:
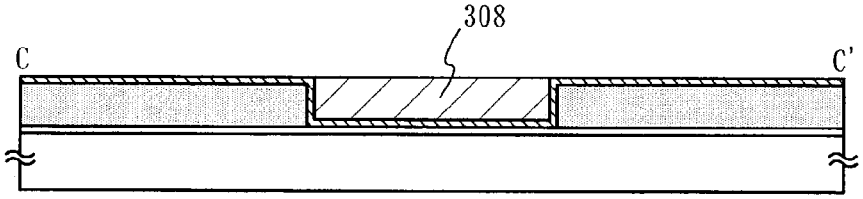
Figure 8E:
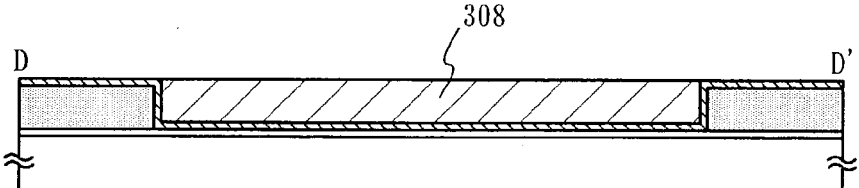
Figure 8F:
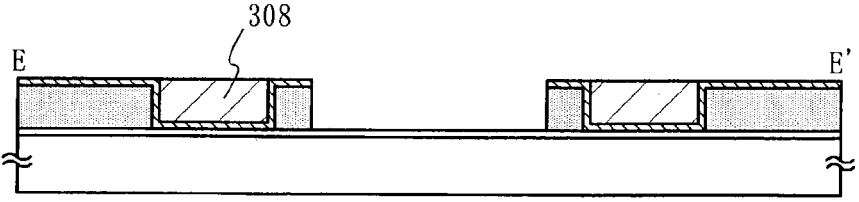
Figure 9A:
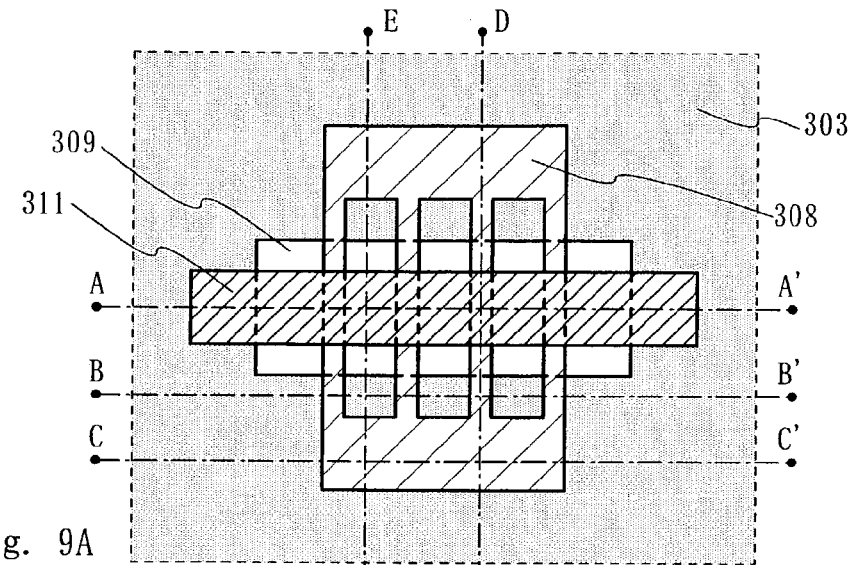
FIGS. 9A to 9F are a top view and vertical sectional views illustrating a process of manufacturing a TFT in accordance with the present invention.
Figure 9B:
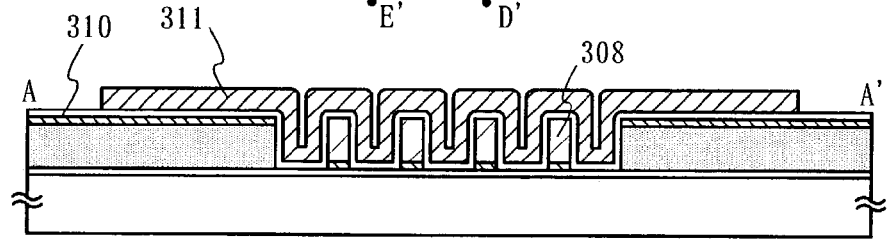
Figure 9C:
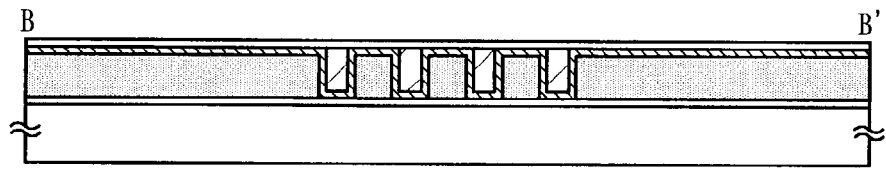
Figure 9D:
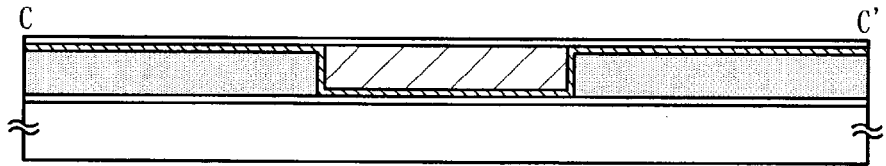
Figure 9E:
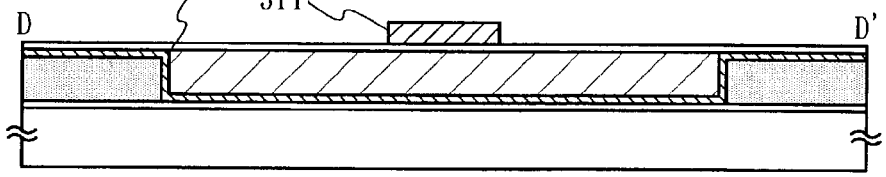
Figure 9F:
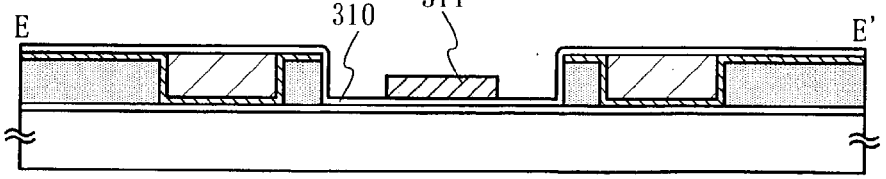
Figure 10A:
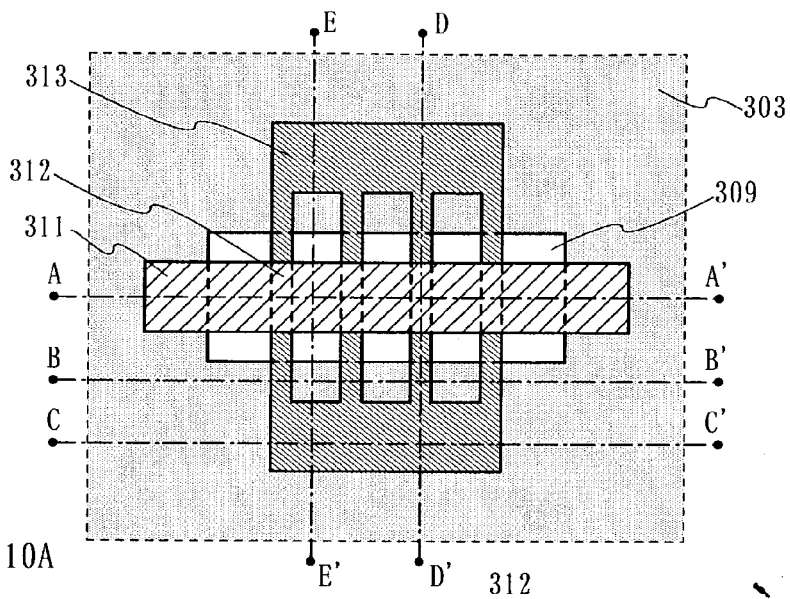
FIGS. 10A to 10F are a top view and vertical sectional views illustrating a process of manufacturing a TFT in accordance with the present invention.
Figure 10B:
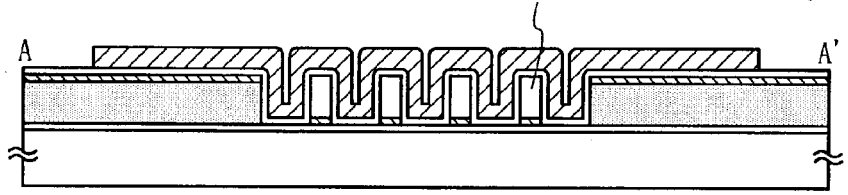
Figure 10C:
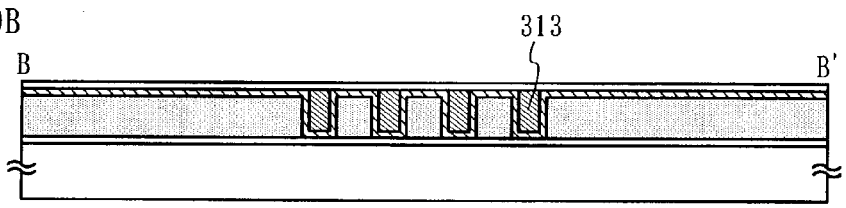
Figure 10D:
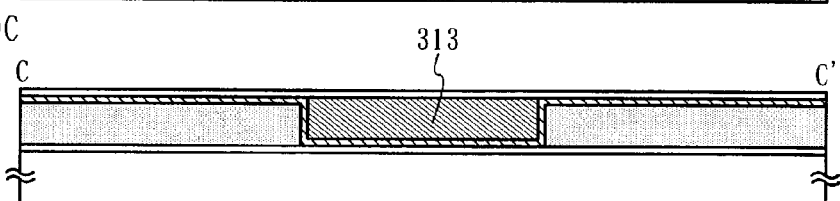
Figure 10E:
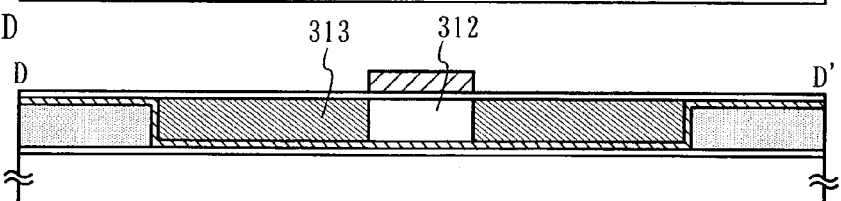
Figure 10F:
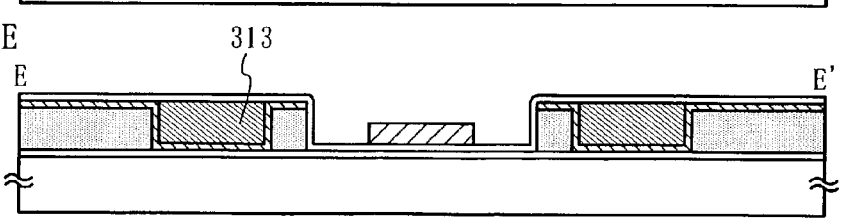

Thereafter, as shown in FIGS. 8A to 8F, a portion of the second insulating film 303 surrounding an area where a channel formation region of the island-like semiconductor film 308 is placed is removed by etching treatment to form an opening 309. This etching treatment can employ chemical treatment by buffer fluoric acid, dry etching using $CHF_3$ or $CF_4$, or the like. Forming the opening 309 exposes the top and side surfaces of the island-like semiconductor film 308 in the region as shown in FIG. 8B. The third insulating film 305 remains in the bottom of the opening and is in contact with the first insulating film 302. The second insulating film 303 remains in the rest of the areas and is in contact with the island-like semiconductor film 308.

Figure 22A:
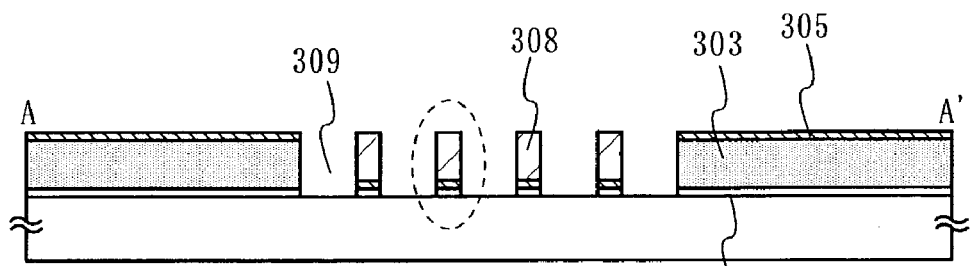
FIGS. 22A and 22B are vertical sectional views illustrating a process of manufacturing a TFT in accordance with the present invention.
Figure 22B:
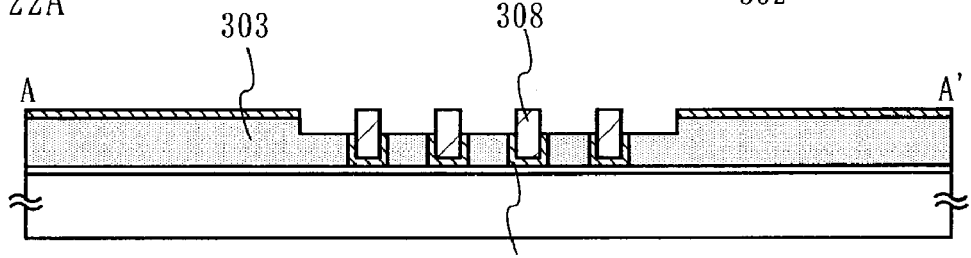

In this etching step, the opening 309 may be formed by etching the second insulating film 303 as well as the first insulating film 302 as shown in FIG. 22A. This makes it possible to use the entire side surfaces of the island-like semiconductor film 308 as a channel formation region when a gate electrode is formed later in the area. Alternatively, etching may be stopped halfway through the second insulating film 303 as shown in FIG. 22B. In either case, the depth of a channel formation region of the island-like semiconductor film 308 can be controlled by adjusting the depth of etching. Accordingly, a region to be crystallized can be chosen.

In FIGS. 9A to 9F, a fourth insulating film 310 serving as a gate insulating film and a conductive film 311 serving as a gate electrode are formed to cover the top and side surfaces of the island-like semiconductor film 308. The fourth insulating film 310 is a silicon oxide film or silicon oxynitride film with a thickness of 30 to 200 nm. The conductive film 311 is formed of tungsten or an alloy containing tungsten.

FIGS. 10A to 10F show a stage where an impurity region 313 of one conductivity type is formed in the island-like semiconductor film 308. The impurity region 313 may be formed in a self-aligning manner using as a mask the conductive film 311 that serves as a gate electrode, or may be formed by masking using photo resist or the like. The impurity region 313 forms source and drain regions and, if necessary, a lightly doped drain region.

The impurity region 313 is formed by ion implantation in which an impurity ion is accelerated by electric field and implanted in a semiconductor film, or by ion doping. Whether or not there is mass separation of ion species implanted is not an essential matter in applying the present invention. However, in order to implant an impurity ion efficiently in the side surfaces of the island-like semiconductor film 308, oblique doping is desirable in which a substrate is set slanted to the ion implantation direction and ion is implanted while rotating the substrate.

Figure 23:
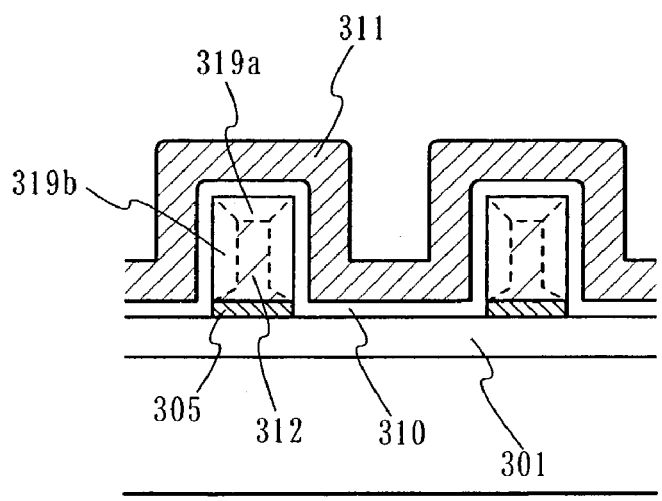
FIG. 23 is a vertical sectional view illustrating details of a channel formation region of a TFT manufactured in accordance with the present invention.

A region of the island-like semiconductor film that overlaps the conductive layer 311 for forming a gate electrode is a channel formation region 312. Details about the channel formation region 312 are shown in FIG. 23. In the channel formation region 312, the conductive layer 311 functioning as a gate electrode is placed above the top and side surfaces of the island-like semiconductor film with the fourth insulating film 310 that functions as a gate insulating film sandwiched therebetween. Accordingly, a channel formed upon application of electric potentials extends over the top and side surfaces of the semiconductor film. This increases the depletion region and improves the current drive ability of the TFT. OFF current in the center of the channel formation region 312 where depletion does not takes place can be avoided by lightly doping the channel formation region 312 with a p type impurity when the TFT is an n-channel transistor, or by lightly doping the channel formation region 312 with an n type impurity when the TFT is a p-channel transistor.

Then, as shown in FIGS. 11A to 11F, a silicon nitride film or silicon oxynitride film containing hydrogen is formed as a fifth insulating film 314 to a thickness of 50 to 100 nm. In this state, heat treatment is conducted at 400 to 450° C. and hydrogen contained in the silicon nitride film or silicon oxynitride film is released to hydrogenate the island-like semiconductor film. A silicon oxide film or the like is formed as a sixth insulating film 315. Then wires 316 and 317 are formed and come to contact with the impurity region 313 that forms source and drain regions.

A TFT is manufactured in this way. The TFT manufactured in accordance with FIGS. 4A to 11F is a multi-channel TFT in which plural channel formation regions are arranged in parallel and are adjoined with a pair of impurity regions. In this structure, the number of channel formation regions arranged in parallel is not limited and can be set as needed.

The channel formation regions are formed from a crystalline semiconductor film having a plurality of crystal orientations and having an aggregation of a plurality of crystal grains which stretch in the direction parallel to the channel length direction without forming a grain boundary.

Embodiment Mode 6

Figure 12A:
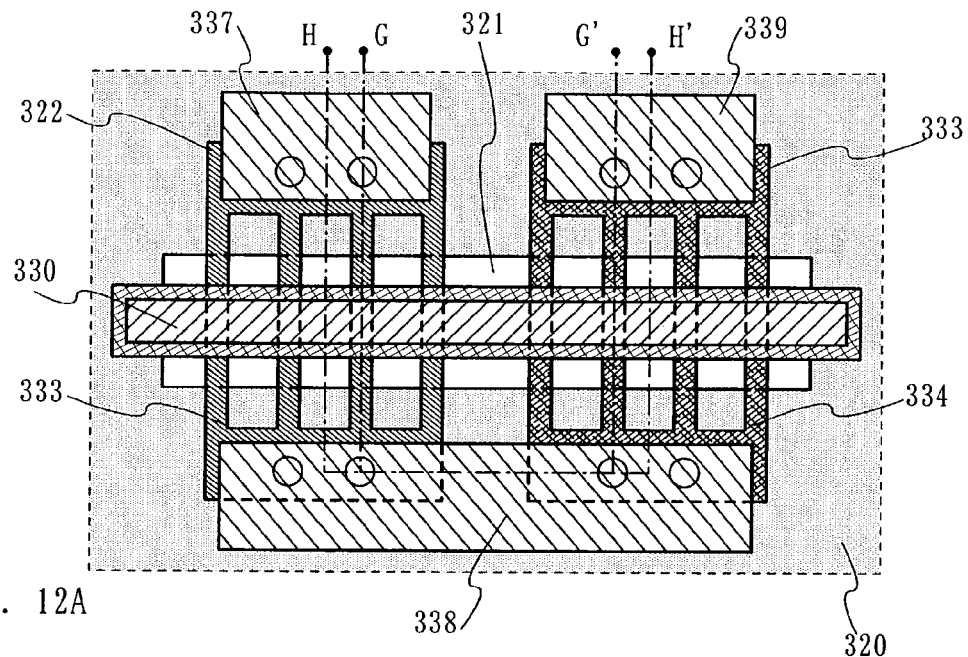
FIGS. 12A to 12C are a top view and vertical sectional views illustrating the structure of a TFT manufactured in accordance with the present invention.
Figure 12B:
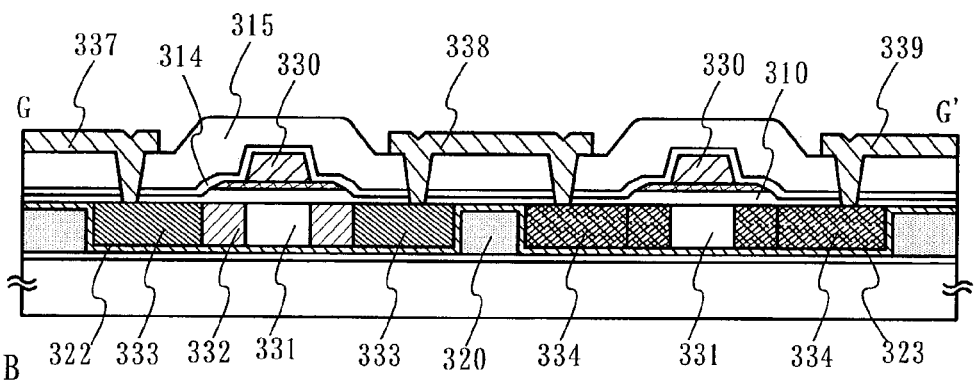
Figure 12C:
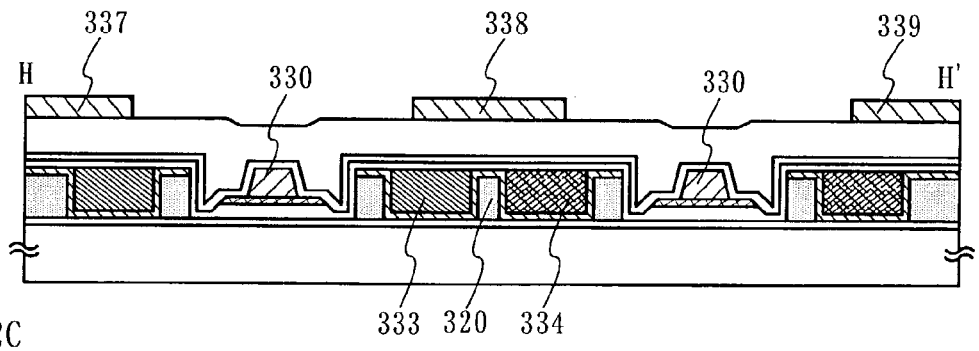
Figure 13A:
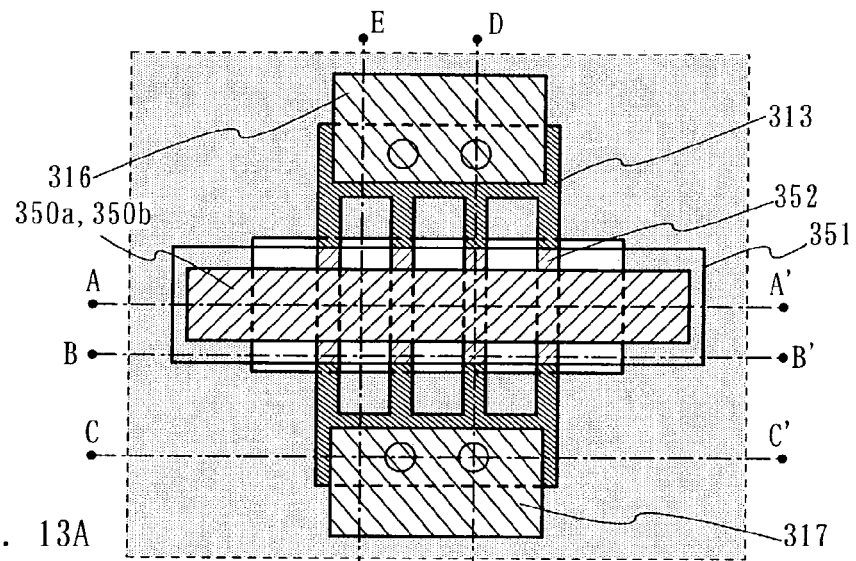
FIGS. 13A to 13F are a top view and vertical sectional views illustrating the structure of a TFT manufactured in accordance with the present invention.
Figure 13B:
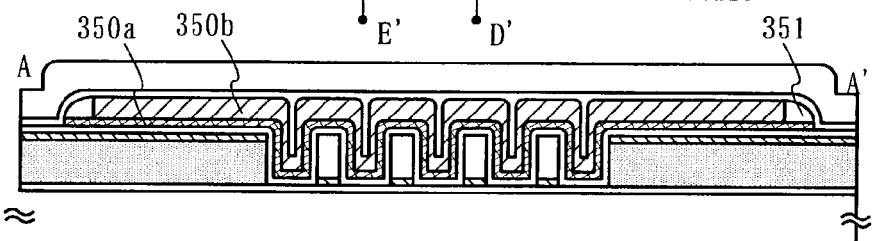
Figure 13C:
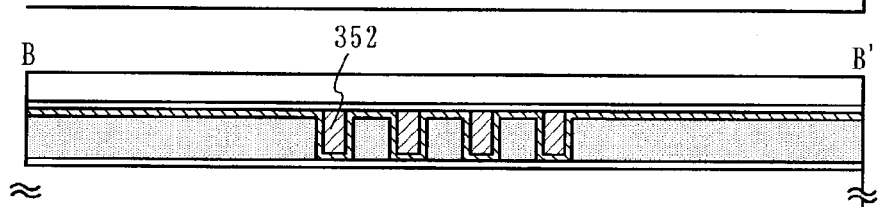
Figure 13D:
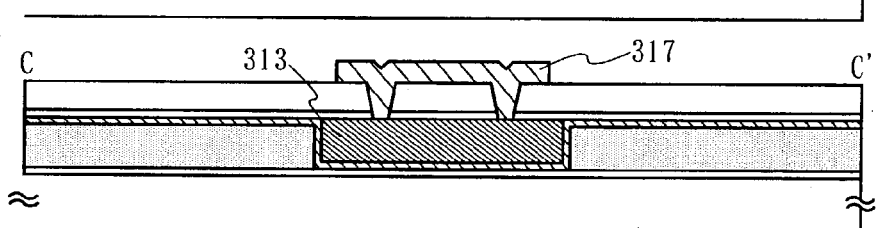
Figure 13E:
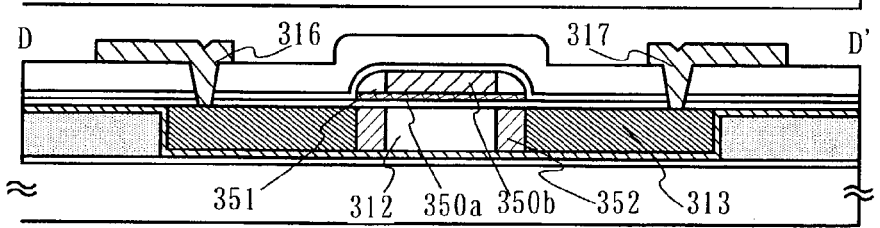
Figure 13F:
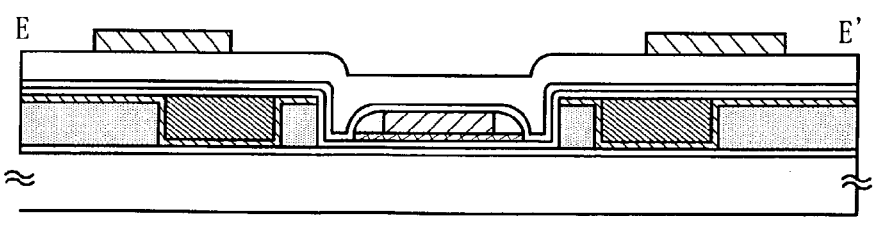

FIGS. 12A to 12C show an example of building an inverter circuit that is a basic circuit of the CMOS structure from an n-channel multi-channel TFT having a lightly doped drain (LDD) structure and a p-channel multi-channel TFT. In FIGS. 12A to 12C, a second insulating film 320, an opening 321, and island-like semiconductor films 322 and 323 are formed in the manner described in Embodiment Mode 5.

FIG. 12A is a top view. A first n type impurity region 333 for forming source and drain regions is formed in the island-like semiconductor film 322. A first p type impurity region 334 for forming source and drain regions is formed in the island-like semiconductor film 323. Other than the impurity regions, conductive layers 330 for forming gate electrodes are formed as well as source and drain wires 337 to 339.

FIGS. 12B and 12C are vertical sectional views taken along the lines G–G' and H–H'. In the n-channel TFT, a second n type impurity region 332 for forming an LDD region is formed next to the first n type impurity region 333. The gate electrodes 330 have a two-layer structure, and the first n type impurity region 322, the second n type impurity region 332, and the first p type impurity region 334 can be formed in a self-aligning manner. Denoted by 331 are channel formation regions. For details of the gate electrodes and impurity regions and manufacturing method thereof, see JP 2002-014337 A or JP No. 2002-324808 A.

A fifth insulating film 314 and a sixth insulating film 315 in FIGS. 12A to 12C are identical with the fifth and sixth insulating films of Embodiment Mode 5, and explanations thereof are omitted here.

Embodiment Mode 7

FIGS. 13A to 13F show a variation of the multi-channel TFT shown in Embodiment Mode 5 in which the gate electrode is structured differently. The TFT in FIGS. 13A to 13F is identical with the one in Embodiment Mode 5 except the structure of the gate electrode and LDD region. The symbols used are common to Embodiment Modes 5 and 7 and detailed explanations are omitted.

The TFT structure shown in FIGS. 13A to 13F is an example of forming a gate electrode from a metal nitride layer 350a such as titanium nitride or tantalum nitride and from a high melting point metal layer 350b such as tungsten or a tungsten alloy. Spacers 351 are formed on the side surfaces of the layer 350b. The spacers 351 may be formed from an insulator such as silicon oxide, or from n type polycrystalline silicon to have a conductivity. Anisotropic dry etching is used to form the spacers 351. An LDD region 352 is formed prior to the spacers, so that it can be formed in a self-aligning manner utilizing the gate electrode 350. When a conductive material is used to form the spacers, the LDD region substantially overlaps the gate electrode to form a gate-overlapped LDD structure.

The structure in which a spacer is provided and an LDD region is formed in a self-aligning manner is effective particularly when the design rule is minute. Although a TFT structure of single polarity is shown here, it is also possible to form a CMOS structure as in Embodiment Mode 6.

Embodiment Mode 8

The present invention can be applied to various semiconductor devices. A mode of display panel manufactured in accordance with Embodiment Modes 1 through 7 will be described.

Figure 16:
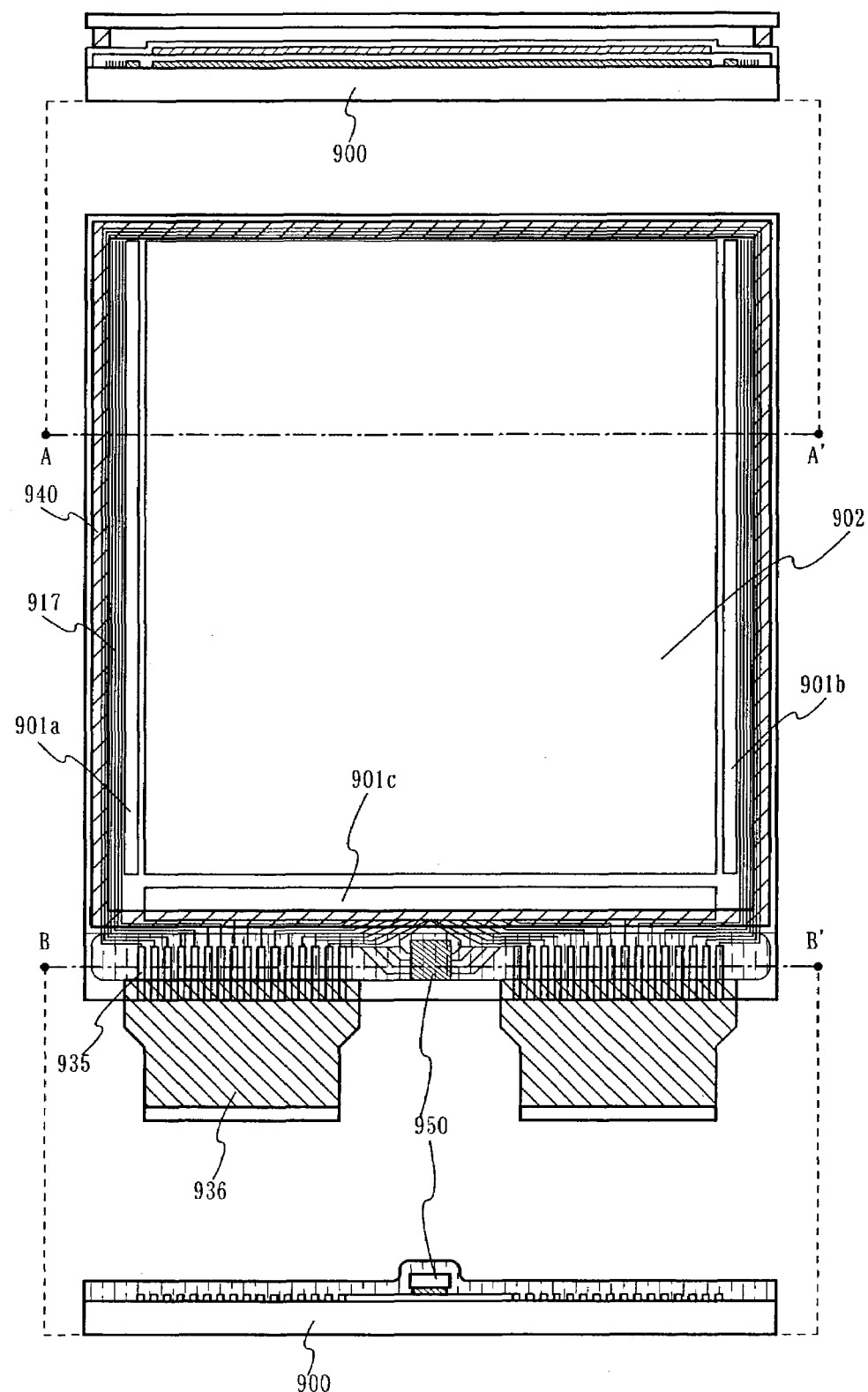
FIG. 16 is an example of an exterior view of a semiconductor device manufactured in accordance with the present invention.

In FIG. 16, a substrate 900 is provided with a pixel portion 902, gate signal side driving circuits 901a and 901b, a data signal side driving circuit 901c, an input output terminal 935, and a wire or a group of wires 917. A seal pattern 940 may partially overlap the gate signal side driving circuits 901a and 901b and the data signal side driving circuit 901c, as well as the wire or group of wires 917 for connecting the driving circuits with input terminals. In this way, the area of the frame region (the region surrounding the pixel portion) of the display panel can be reduced. An FPC 936 is fixed to the input output terminal 935.

A chip 950 in which a microprocessor, a memory, a media processor/DPS (Digital Signal Processor), and the like are formed from a TFT of the present invention may be mounted to the display panel. These function circuits are formed under a design rule different from the one for the pixel portion 902, the gate signal side driving circuits 901a and 901b, and the data signal side driving circuit 901c. Specifically, a design rule smaller than 1 µm is employed. How the chip is mounted is not limited and COG or the like can be employed.

For example, the TFTs shown in Embodiment Modes 1 through 7 can be used as switching elements of the pixel portion 902, and as active elements constituting the gate signal side driving circuits 901a and 901b and the data signal side driving circuit 901c.

Figure 20:
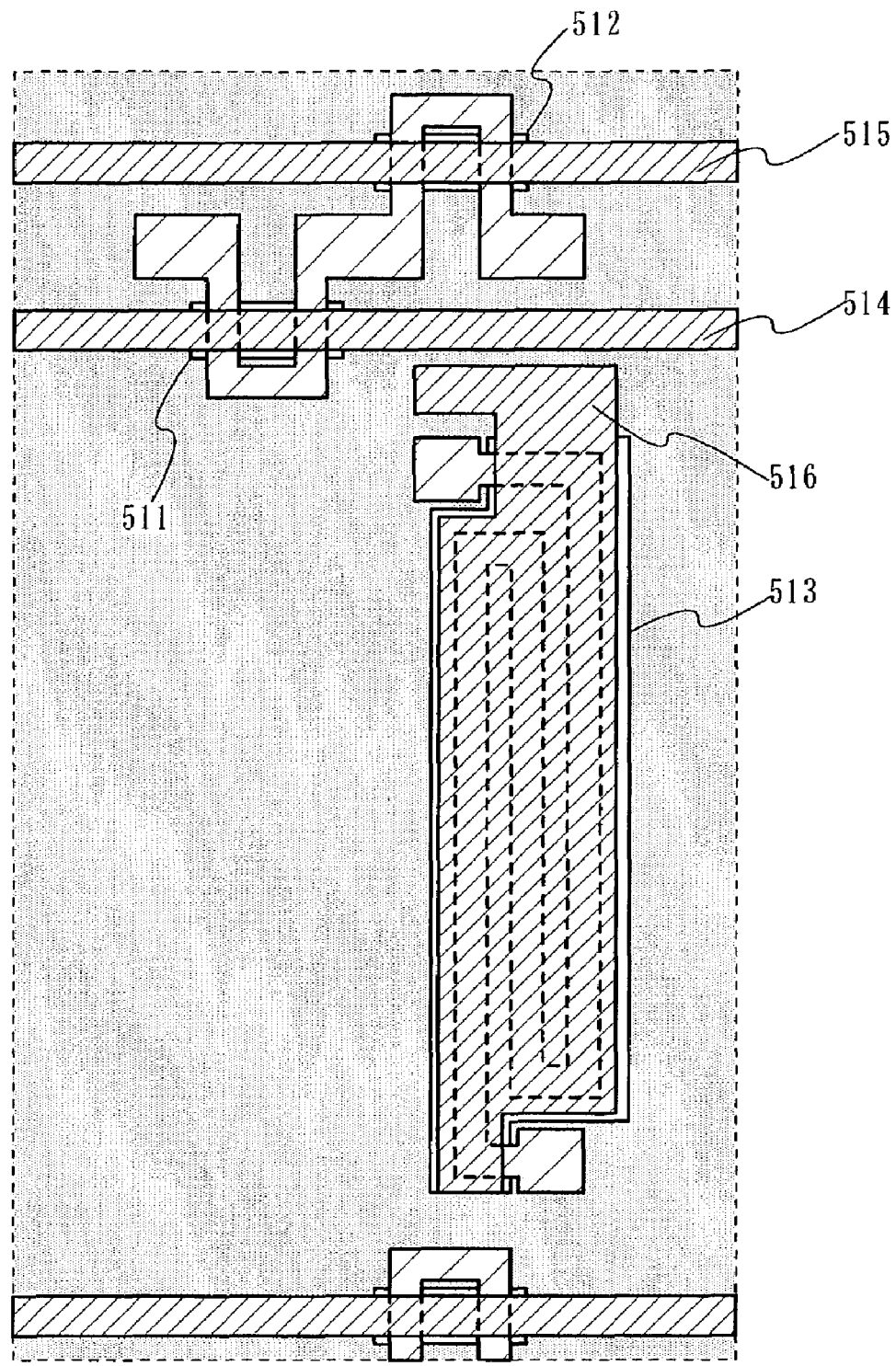
FIG. 20 is a top view illustrating a process of manufacturing a pixel portion of the semiconductor device shown in FIG. 16.
Figure 21:
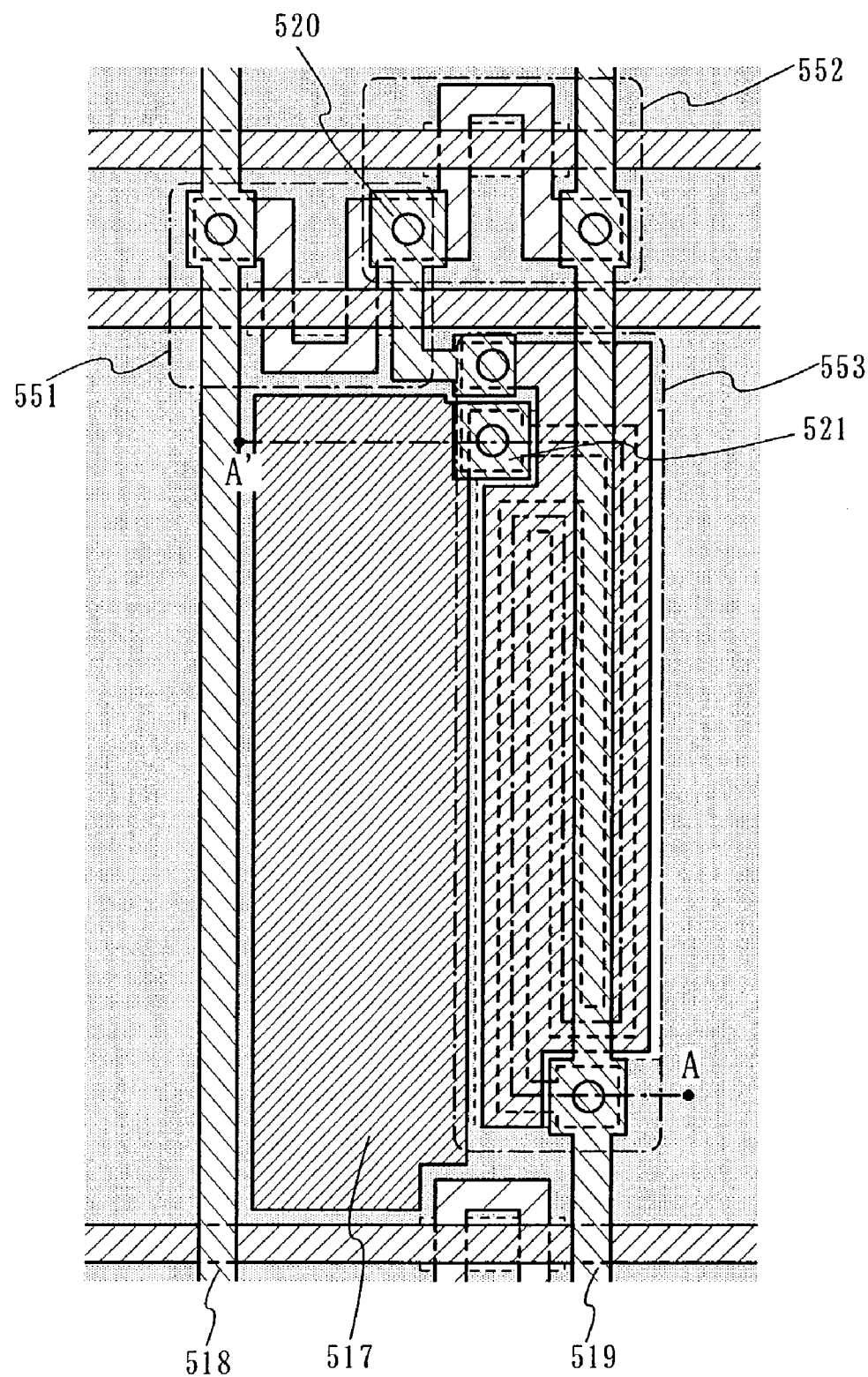
FIG. 21 is a top view illustrating the structure of a pixel portion of the semiconductor device shown in FIG. 16.

FIG. 21 shows an example of the structure of one pixel in the pixel portion 902. The pixel has TFTs 551 to 553, which are a switching TFT, a reset TFT, and a driving TFT, respectively, for controlling a light emitting element or liquid crystal element of the pixel. A process of manufacturing these TFTs is shown in FIGS. 17 to 20. Details of the process are described in Embodiment Mode 5 and the description will not be repeated here.

Figure 17:
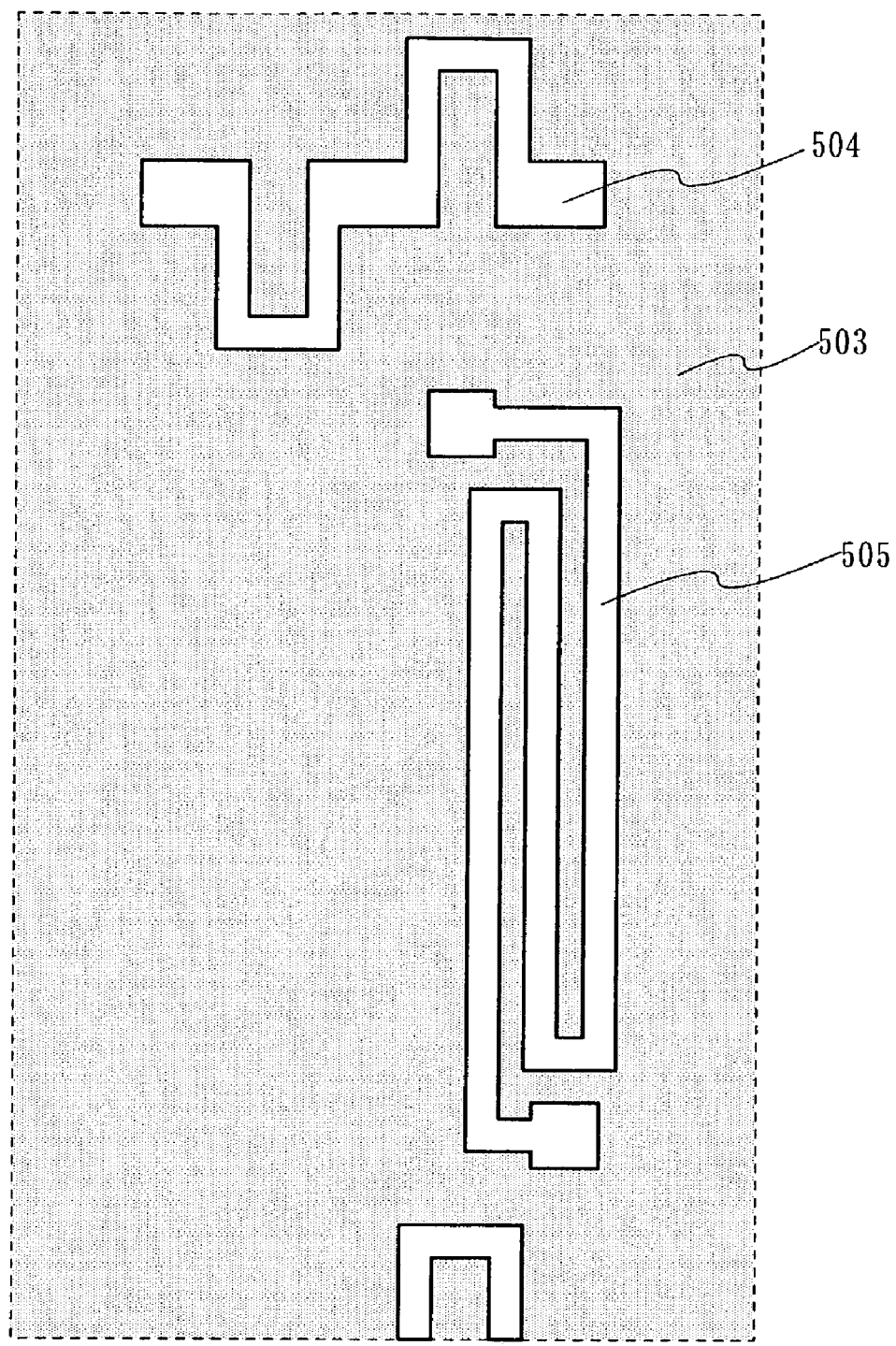
FIG. 17 is a top view illustrating a process of manufacturing a pixel portion of the semiconductor device shown in FIG. 16.
Figure 18:
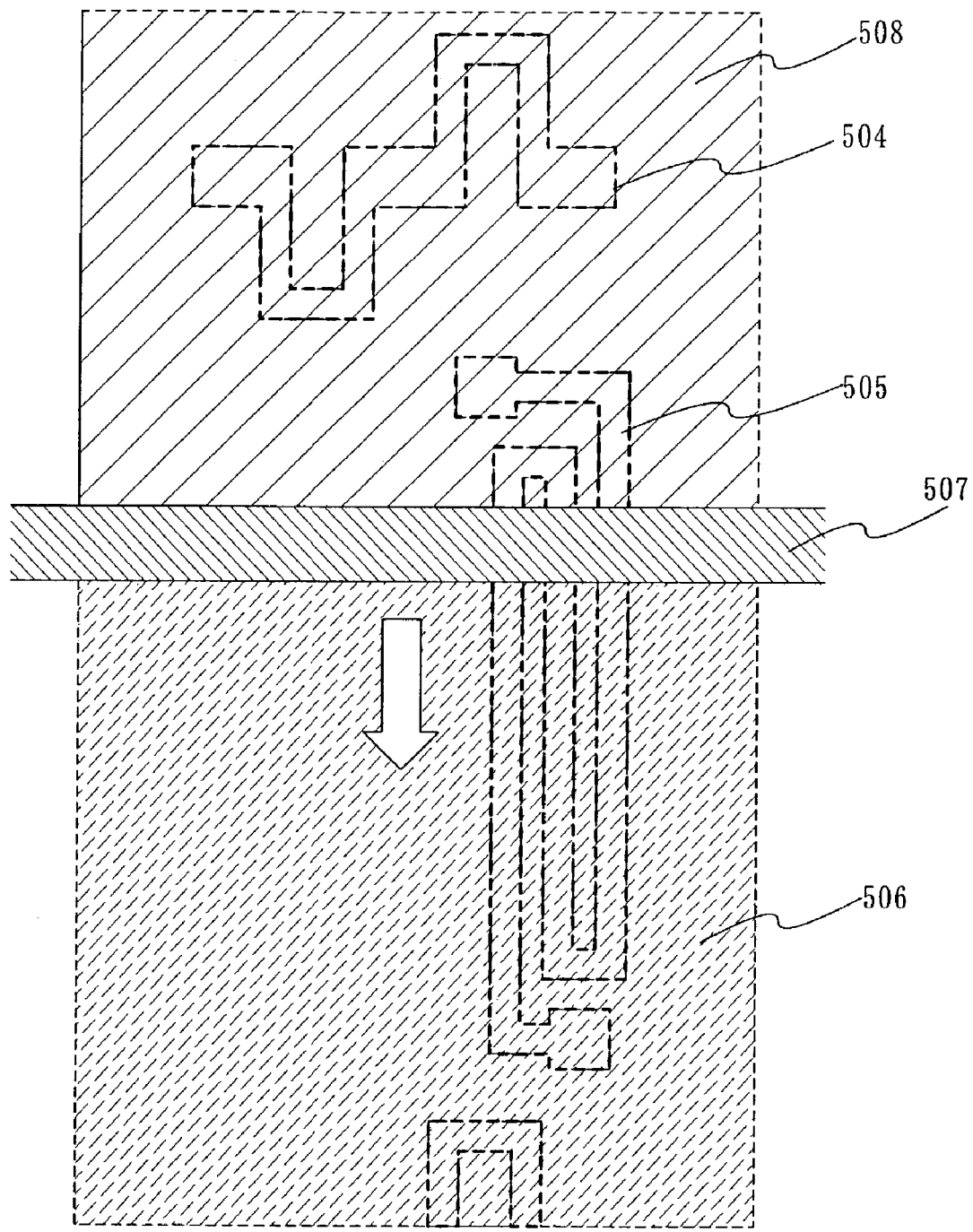
FIG. 18 is a top view illustrating a process of manufacturing a pixel portion of the semiconductor device shown in FIG. 16.

FIG. 17 shows a stage at which a second insulating film 503 is formed and openings 504 and 505 are formed in the second insulating film. FIG. 18 shows a stage after the openings 504 and 505 are formed at which an amorphous semiconductor film 506 is formed by deposition and irradiated with linearly collected laser light 507 to form a crystalline semiconductor film 508.

Figure 19:
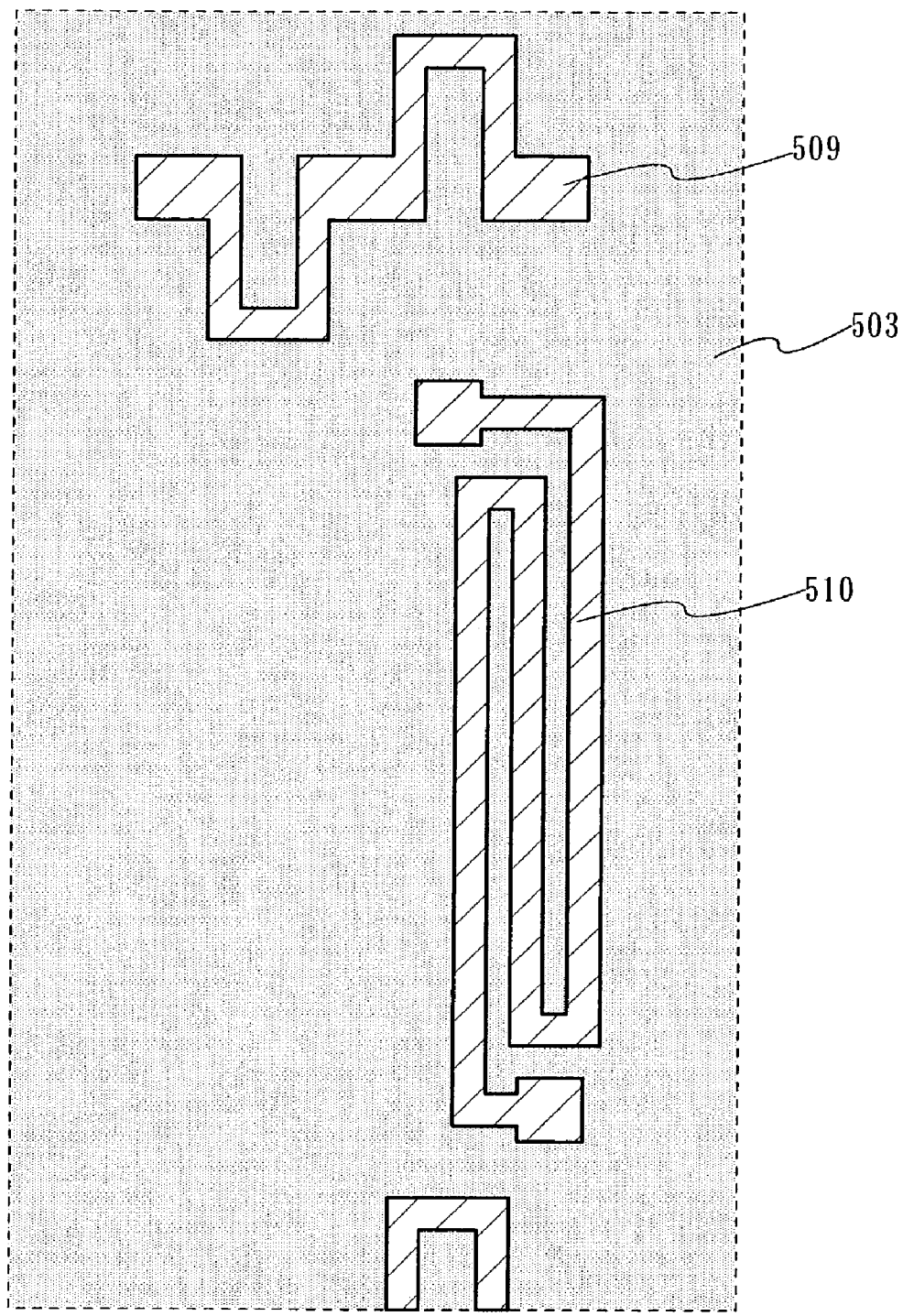
FIG. 19 is a top view illustrating a process of manufacturing a pixel portion of the semiconductor device shown in FIG. 16.

In FIG. 19, the crystalline semiconductor film on the second insulating film 503 is selectively removed by etching to obtain island-like semiconductor films 509 and 510 that are formed from the crystalline semiconductor film filling the openings.

Then the second insulating film 503 is etched as shown in FIG. 20 to form openings 511 to 513 and partially expose the side surfaces of the island-like semiconductor films 509 and 510. A gate insulating film (not shown in the drawing) and gate electrodes (or gate wires) 514 to 516 are formed. The openings 511 to 513 are positioned in regions where the island-like semiconductor films 509 and 510 intersect the gate electrodes (or gate wires) 514 to 516. This way a gate structure similar to the one in Embodiment Mode 5 can be obtained. Thereafter, an n type or p type impurity region is formed, an insulating film is formed thereon, and a signal line 518, a power supply line 519, other various wires 520 and 521, and a pixel electrode 517 are formed on the insulating film. Thus obtained is the pixel structure shown in FIG. 21.

FIG. 24A is a vertical sectional view taken along the line A–A' in FIG. 21. The pixel electrode 517 can be used to form an organic light emitting element as shown in FIG. 24B.

FIG. 24B shows a mode (top emission type) in which light from an organic light emitting element 33 is emitted to the opposite side of the substrate. The pixel electrode 517 serves as a cathode which is one of electrodes of the organic light emitting element 33 and which is connected to the wire 521. An organic compound layer 27 is composed of an electron injection transporting layer, a light emitting layer, and a hole injection transporting layer which are formed in this order with the electron injection transporting layer the closest to the cathode. An anode 29 is formed above the organic compound layer 27. A thin light-transmissive metal layer 28 is formed between the organic compound layer and the anode. The anode 29 is formed by resistance heating evaporation from a light-transmissive conductive film such as an indium tin oxide (ITO) film, a zinc oxide (ZnO) film, or an indium zinc oxide (IZO) film. The metal layer 28 prevents damage to the organic compound layer 27 when the anode 29 is formed and degradation of element characteristics. Then a protective film 24 and a passivation film 25 are formed.

If the organic compound layer 27 is formed from a low-molecular weight organic compound, a hole injection transporting layer is formed from copper phthalocyanine (CuPc) and MTDATA and α-NPD which are aromatic amine-based materials, and an electron injection layer that doubles as a light emitting layer is formed from a tris-8-quinolinolate aluminum complex ($Alq_3$) and laid on the hole injection transporting layer. $Alq_3$ makes it possible to emit light from singlet excitation (fluorescence).

In order to raise the luminance, light emission from triplet excitation (phosphorescence) is preferred. In this case, the organic compound layer 27 may be a laminate of a hole injection transporting layer, a light emitting layer, a hole blocking layer, and an electron injection transporting layer which are layered in this order. The hole injection transporting layer is formed from CuPc which is a phthalocyanine-based material and α-NPD which is an aromatic amine-based material. The light emitting layer is formed of carbazole-based CBP+Ir(ppy)$_3$. The hole blocking layer is formed of bathocuproin (BCP). The electron injection transporting layer is formed of $Alq_3$.

The above two structures are examples of using a low-molecular weight organic compound. It is also possible to obtain an organic light emitting element in which a high-molecular weight organic compound and a low-molecular weight organic compound are combined. For example, the organic compound layer 27 may be a laminate of a hole injection transporting layer formed of a polythiophene derivative (PEDOT) that is a high-molecular weight organic compound, a hole injection transporting layer formed from α-NPD, a light emitting layer formed from CBP+Ir(ppy)$_3$, a hole blocking layer formed of BCP, and an electron injection transporting layer formed of $Alq_3$. They are layered in the order stated with the PEDOT layer the closest to the anode. By using PEDOT in the hole injection layer, the hole injection characteristic is improved as well as light emission efficiency.

In either case, light emission from triplet excitation (phosphorescence) has higher light emission efficiency than light emission from singlet excitation (fluorescence). Therefore the same light emission luminance can be obtained with a lower operation voltage (the voltage required to cause an organic light emitting element to emit light).

As described, a display panel with an organic light emitting element can be manufactured using the present invention. Although not given as an example here, the present invention can also be used to manufacture a display panel that utilizes electric optical characteristics of a liquid crystal.

Figure 44:
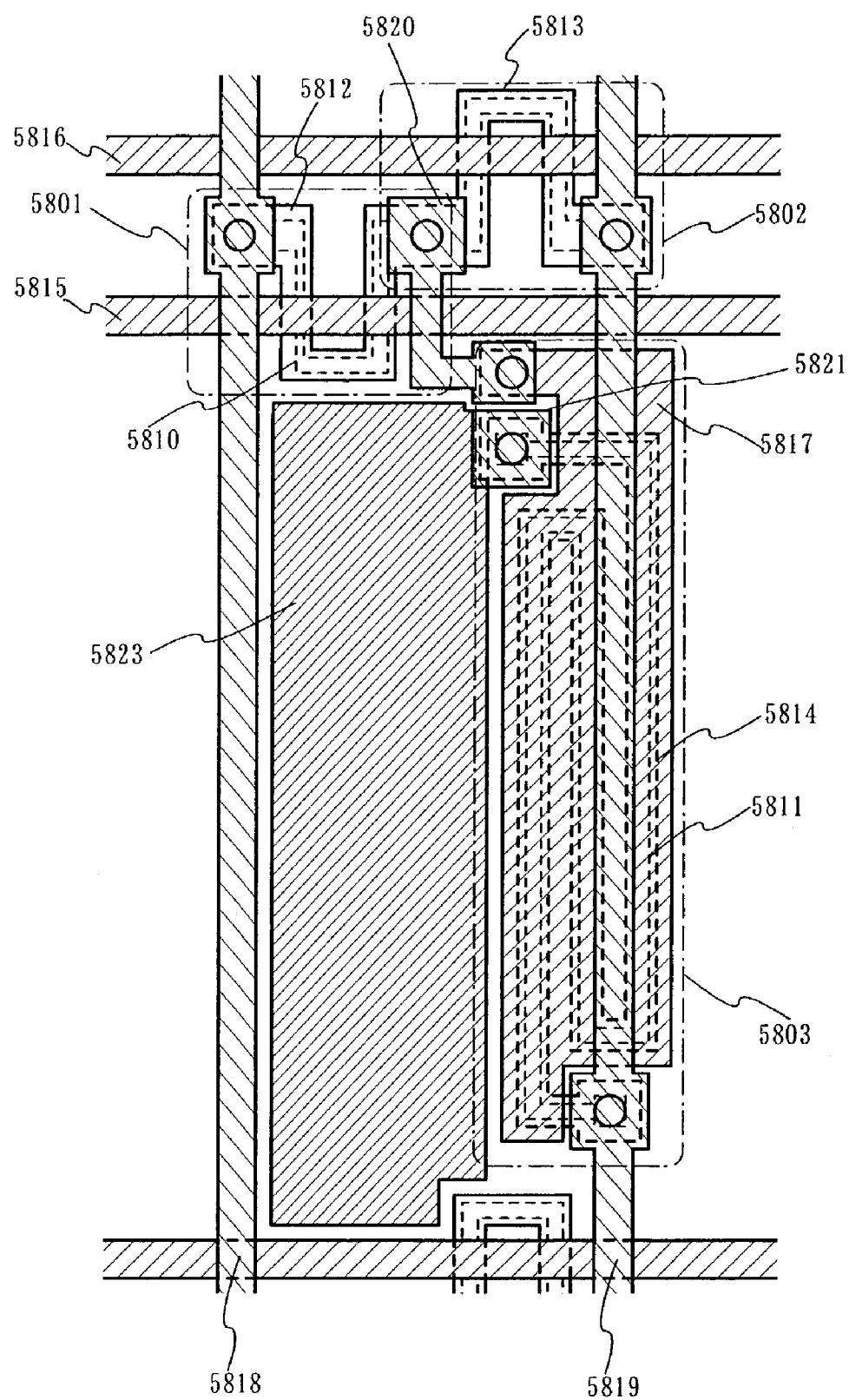
FIG. 44 is a top view illustrating the structure of a pixel portion of a display panel manufactured in accordance with the present invention.
Figure 45:
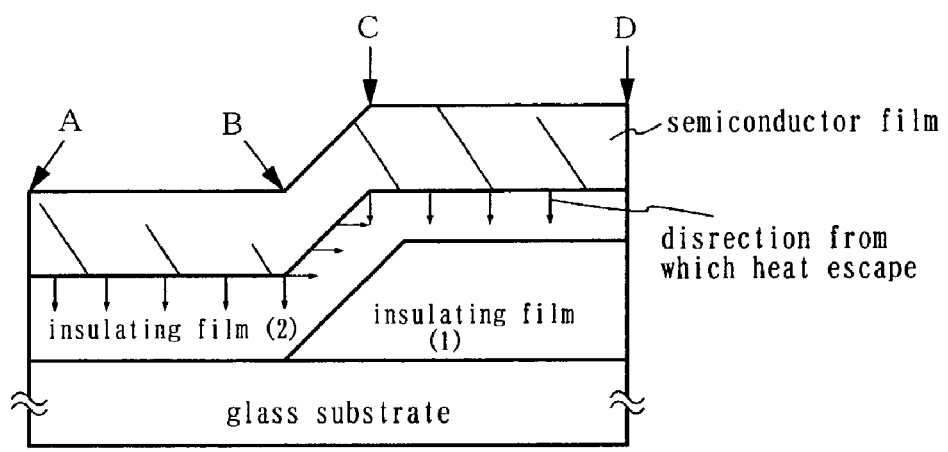
FIG. 45 is a sectional view showing a structure used in thermal analysis simulation.
Figure 46:
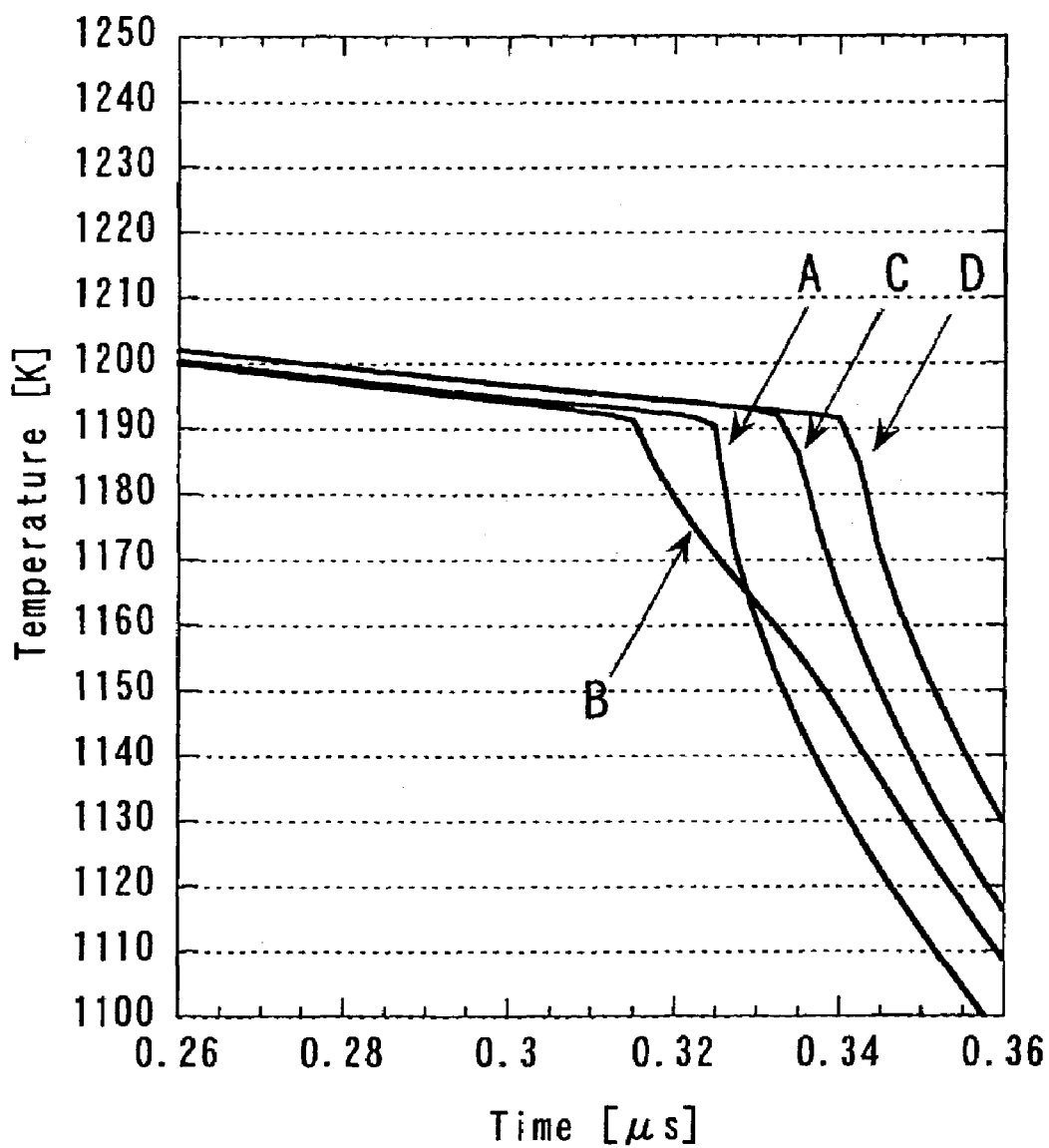
FIG. 46 is a graph showing results of the thermal analysis simulation.
Figure 47A:
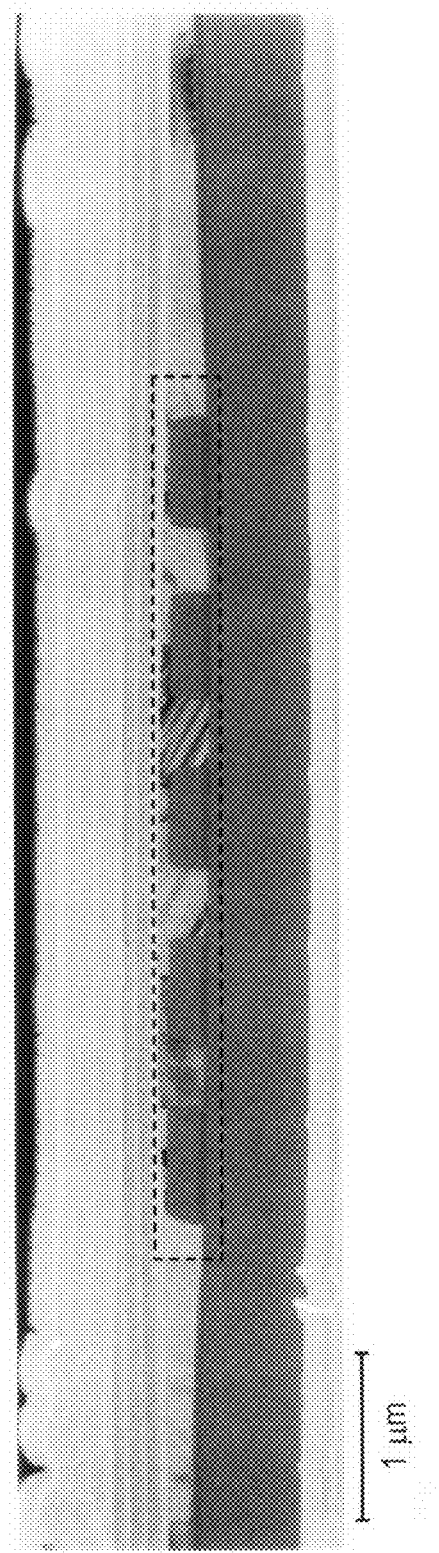
FIGS. 47A and 47B are a TEM sectional image of a semiconductor film formed on a base insulating film that has convex portions after the semiconductor film is crystallized by laser light irradiation, and a schematic diagram thereof.
Figure 47B:
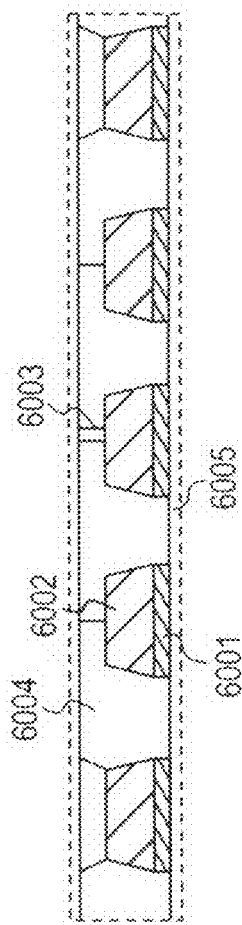

FIG. 44 shows another example of the structure of one pixel in the pixel portion 902. The pixel has TFTs 5801 to 5803, which are a switching TFT, a reset TFT, and a driving TFT, respectively, for controlling a light emitting element or liquid crystal element of the pixel.

Channel formation regions of these TFTs are included in island-like semiconductor regions 5812 to 5814, which are positioned in accordance with openings 5810 and 5811 of a base insulating film under the semiconductor film. The island-like semiconductor regions 5812 to 5814 are obtained following the descriptions in Embodiment Modes 1 through 7. Gate wires 5815 to 5817 are formed on the island-like semiconductor regions 5812 to 5814. A passivation film and a planarization film are formed on the gate wires. A signal line 5818, a power supply line 5819, other various wires 5820 and 5821, and a pixel electrode 5823 are formed on the passivation film and the planarization film.

Thus the present invention can make a display panel without any adverse effect.

Embodiment Mode 9

The present invention can be used in various devices. Examples thereof include portable information terminals (electronic schedulers, mobile computers, cellular phones, and the like), video cameras, digital cameras, personal computers, television monitors, projection display devices, etc. FIGS. 28A to 29D show examples of the devices.

Figure 28A:
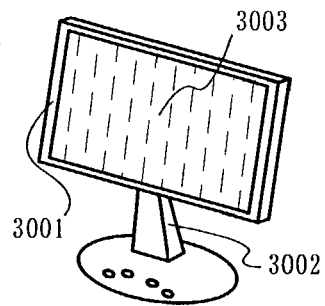
FIGS. 28A to 28G are diagrams showing examples of a semiconductor device.

FIG. 28A shows an example of applying the present invention to a television monitor. The device is composed of a case 3001, a supporting base 3002, a display unit 3003, and others. A TFT manufactured in accordance with the present invention can be used in the display unit 3003 and, in addition, various integrated circuits formed on a glass substrate, such as various logic circuits, high-frequency circuits, memories, microprocessors, media processors, and graphics LSIs.

Figure 28B:
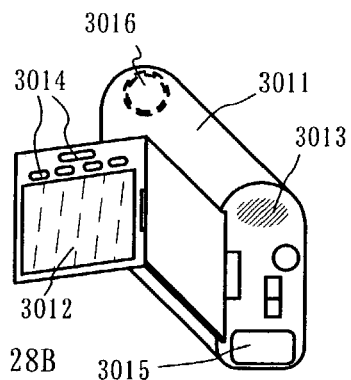

FIG. 28B shows an example of applying the present invention to a video camera. The device is composed of a main body 3011, a display unit 3012, an audio input unit 3013, operation switches 3014, a battery 3015, an image receiving unit 3016, and others. A TFT manufactured in accordance with the present invention can be used in the display unit 3012 and, in addition, various integrated circuits formed on a glass substrate, such as various logic circuits, high-frequency circuits, memories, microprocessors, media processors, and graphics LSIs.

Figure 28C:
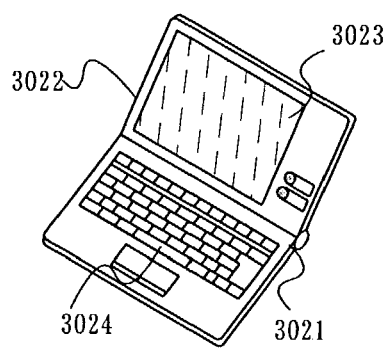

FIG. 28C shows an example of applying the present invention to a notebook computer. The device is composed of a main body 3021, a case 3022, a display unit 3023, a keyboard 3024, and others. A TFT manufactured in accordance with the present invention can be used in the display unit 3023 and, in addition, various integrated circuits formed on a glass substrate, such as various logic circuits, high-frequency circuits, memories, microprocessors, media processors, graphics LSIs, and encoder LSIs.

Figure 28D:
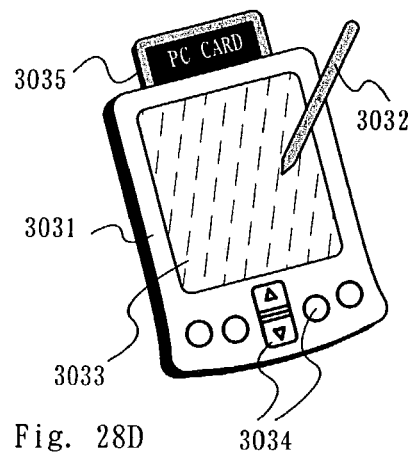

FIG. 28D shows an example of applying the present invention to a PDA (Personal Digital Assistant). The device is composed of a main body 3031, a stylus 3032, a display unit 3033, operation buttons 3034, an external interface 3035, and others. A TFT manufactured in accordance with the present invention can be used in the display unit 3033 and, in addition, various integrated circuits formed on a glass substrate, such as various logic circuits, high-frequency circuits, memories, microprocessors, media processors, graphics LSIs, and encoder LSIs.

Figure 28E:
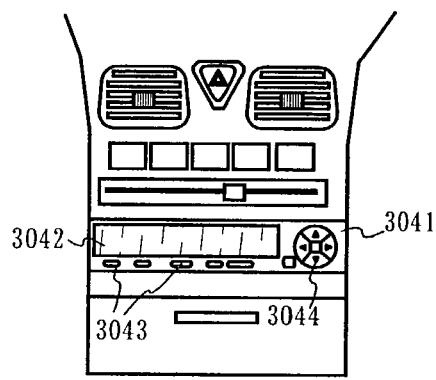

FIG. 28E shows an example of applying the present invention to an audio player, specifically, a car-mount audio device. The device is composed of a main body 3041, a display unit 3042, operation switches 3043 and 3044, and others. A TFT manufactured in accordance with the present invention can be used in the display unit 3042 and, in addition, various integrated circuits formed on a glass substrate, such as various logic circuits, high-frequency circuits, memories, microprocessors, media processors, graphics LSIs, and amplifier circuits.

Figure 28F:
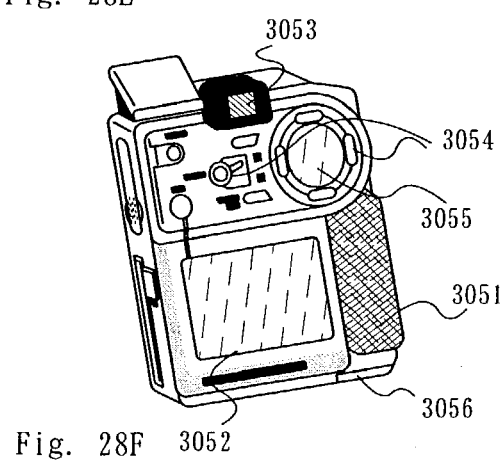

FIG. 28F shows an example of applying the present invention to a digital camera. The device is composed of a main body 3051, a display unit (A) 3052, an eye piece 3053, operation switches 3054, a display unit (B) 3055, a battery 3056, and others. A TFT manufactured in accordance with the present invention can be used in the display unit (A) 3052 and the display unit (B) 3056 and, in addition, various integrated circuits formed on a glass substrate, such as various logic circuits, high-frequency circuits, memories, microprocessors, media processors, graphics LSIs, and encoder LSIs.

Figure 28G:
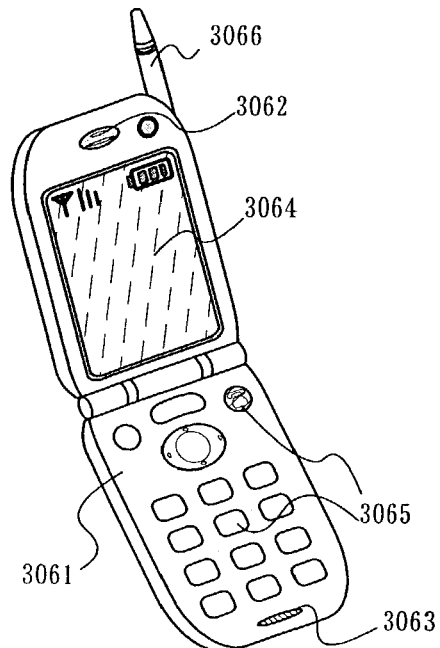

FIG. 28G shows an example of applying the present invention to a cellular phone. The device is composed of a main body 3061, an audio output unit 3062, an audio input unit 3063, a display unit 3064, operation switches 3065, an antenna 3066, and others. A TFT manufactured in accordance with the present invention can be used in the display unit 3064 and, in addition, various integrated circuits formed on a glass substrate, such as various logic circuits, high-frequency circuits, memories, microprocessors, media processors, graphics LSIs, encoder LSIs, and cellular phone LSIs.

Figure 29A:
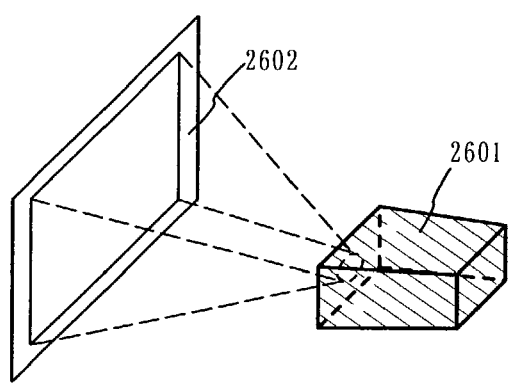
FIGS. 29A to 29D are diagrams showing examples of a projector.
Figure 29B:
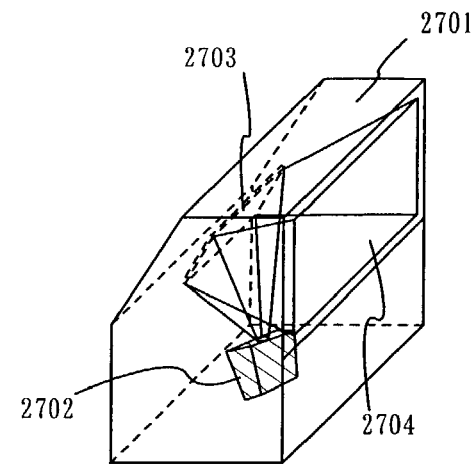

FIG. 29A shows a front projector, which includes a projection device 2601, a screen 2602, and others. FIG. 29B shows a rear projector, which includes a main body 2701, a projection device 2702, a mirror 2703, a screen 2704, and others.

Figure 29C:
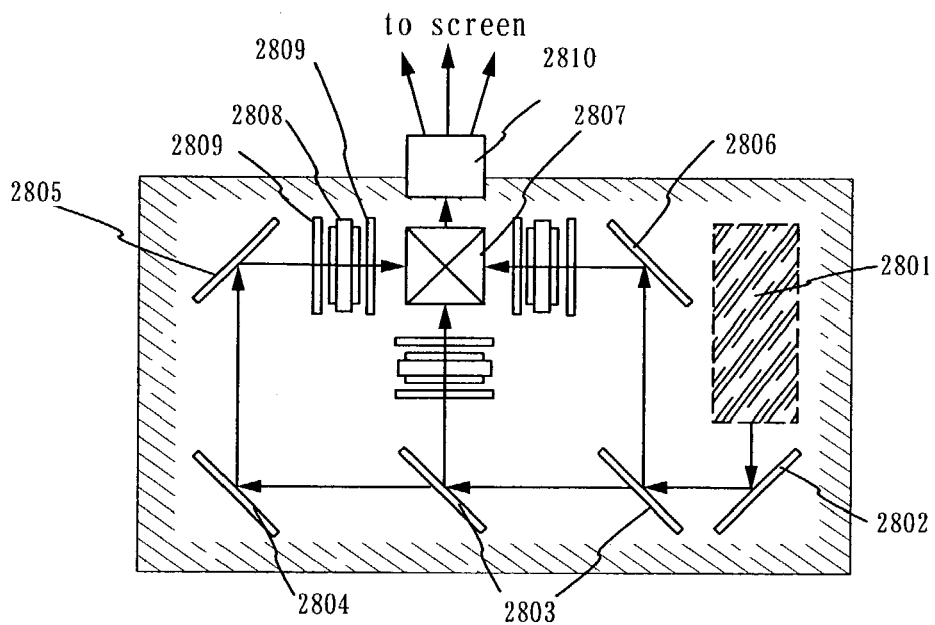

FIG. 29C is a diagram showing an example of the structure of the projection devices 2601 and 2702 in FIGS. 29A and 29B. The projection devices 2601 and 2702 are each composed of a light source optical system 2801, mirrors 2802 and 2804 to 2806, a dichroic mirror 2803, a prism 2807, a liquid crystal display device 2808, a phase difference plate 2809, and a projection optical system 2810. The projection optical system 2810 is an optical system including a projection lens. Shown in this embodiment mode is a three-plate type but there is no particular limitation. For example, it may be a single-plate type. An optical system such as an optical lens, a film having a polarizing function, a film for adjusting the phase difference, or an IR film may be provided in the light path indicated by the arrow in FIG. 29C if so desired.

Figure 29D:
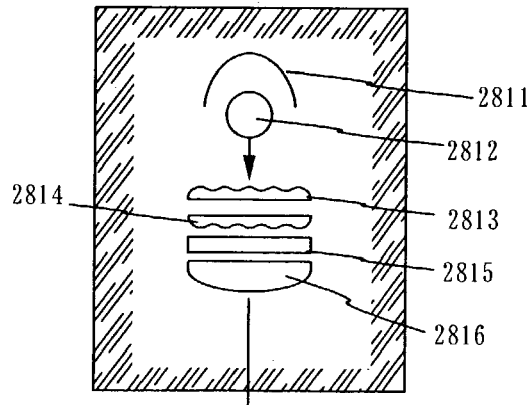

FIG. 29D is a diagram showing an example of the structure of the light source optical system 2801 in FIG. 29C. In this embodiment mode, the light source optical system 2801 is composed of a reflector 2811, a light source 2812, lens arrays 2813 and 2814, a polarization converting element 2815, and a condenser lens 2816. The light source optical system shown in FIG. 29D is merely an example and is not to limit the present invention. For example, an optical system such as an optical lens, a film having a polarizing function, a film for adjusting the phase difference, or an IR film may be provided in the light source optical system if so desired.

The devices shown here are merely examples and the present invention is not limited to these uses.

Embodiment Mode 10

This embodiment mode shows an example of using a glass substrate as an etching stopper when the second insulating film 202 of FIGS. 1A to 1E is formed, and of forming on the second insulating film 202 an insulating film that corresponds to the first insulating film 201.

Figure 30A:
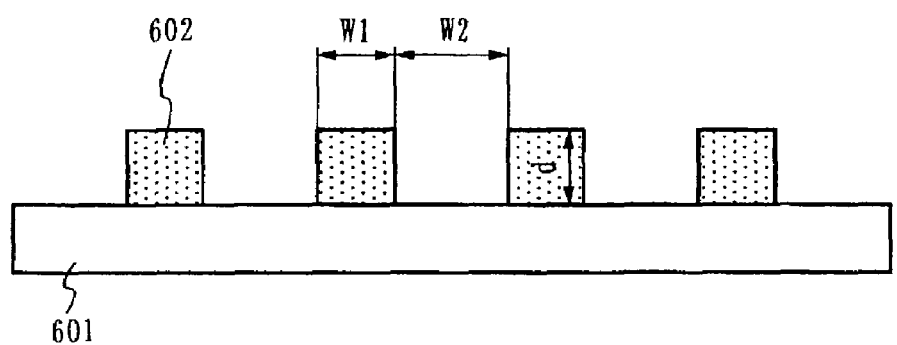
FIGS. 30A and 30B are diagrams illustrating a crystallization method in the present invention.

In FIG. 30A, a second insulating film 602 is formed first on a glass substrate 601 from silicon oxide or silicon oxynitride to a thickness of 10 to 3000 nm, preferably, 100 to 2000 nm. Openings having a given shape are formed in the second insulating film 602. For details, see Embodiment Mode 1. The openings are formed by wet etching or dry etching. In this embodiment mode, dry etching using $CHF_3$ gas is employed. In this case, the gas flow rate is set to 30 to 40 sccm, the reaction pressure is set to 2.7 to 4.0 KPa, the applied voltage to 500 W, and the substrate temperature to 20° C.

A preferred material for the glass substrate 601 in this embodiment mode is one having high selective ratio with respect to a silicon oxide film (for example, Corning #1737 glass substrate (a product of Corning Inc.)). This is because the glass substrate 601 having high selective ratio can be used as an etching stopper in forming the second insulating film 602.

Figure 30B:
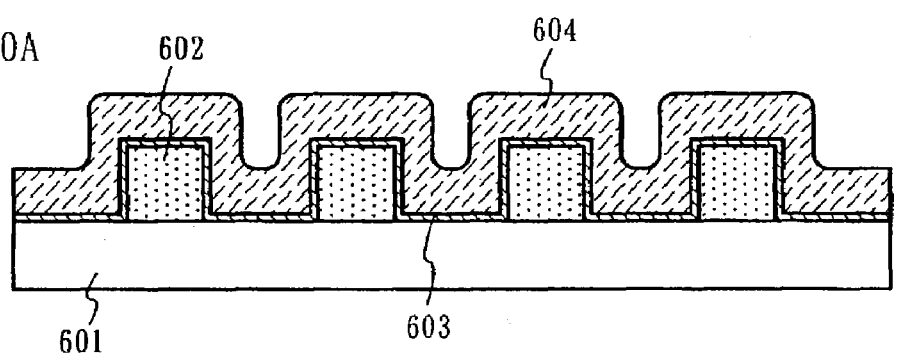

After the second insulating film 602 is formed, it is covered with a first insulating film 603. The first insulating film 603 is a silicon nitride film, or a silicon oxynitride film whose nitrogen content is larger than its oxygen content, or a laminate of these films. An amorphous semiconductor film 604 is formed on the first insulating film 603 to obtain the state of FIG. 30B. For details of the first insulating film 603 and amorphous semiconductor film 604, see the descriptions in Embodiment Mode 1. Steps subsequent to FIG. 30B follow the instructions of Embodiment Mode 1 and they are not repeated here.

According to this embodiment mode, a high enough selective ratio between the glass substrate 601 and the second insulating film 602 is ensured to improve the process margin for forming the openings of the second insulating film 602. This embodiment mode is also free from the problem of the lower edge of the second insulating film 602 being scraped, or other similar problems. In a region where the second insulating film 602 is not formed, a silicon nitride film, or a silicon oxynitride film whose nitrogen content is larger than its oxygen content, or a laminate of these films is placed on the glass substrate. This eliminates the need for a special insulating film such as an aluminum nitride film.

This embodiment mode can be combined freely with any structure of Embodiment Modes 1 through 9.

EMBODIMENTS

Embodiments of the present invention are explained below.

Embodiment 1

This embodiment shows an example of manufacturing a TFT in which a crystalline semiconductor film is formed on a base insulating film having an opening, and a channel formation region is disposed in a filled region filling the opening.

A first insulating film 5602 is formed by a 100 nm silicon oxynitride film on a glass substrate 5601 in FIGS. 36A to 36C. A silicon oxide film is formed on the first insulating film 5602, and second insulating films 5603 having a rectangular shape pattern are formed by photoetching. The silicon oxide film is deposited to a thickness of 150 nm by using plasma CVD with a mixture of TEOS and $O_2$, and by discharging at a high frequency (13.56 MHz) electric power density of 0.6 $W/cm^2$ with a reaction pressure of 40 Pa and a substrate temperature of 400° C. Openings 5604a and 5604b are then formed by etching.

Note that FIG. 36A is an upper surface diagram, FIG. 36B is a longitudinal cross sectional diagram corresponding to a line segment A–A' in FIG. 36A, and FIG. 36C is a longitudinal cross sectional diagram corresponding to a line segment B–B' in FIG. 36A. FIGS. 37A to 37C and 41A to 43C are similarly handled.

An amorphous silicon film 5605 covering the first insulating film 5602 and the second insulating films 5603 is then formed at a thickness of 150 nm as shown in FIGS. 37A to 37C. The amorphous silicon film 5605 is formed by using plasma CVD with $SiH_4$ as a raw material gas.

The continuous wave laser light is then irradiated, thus performing crystallization as shown in FIGS. 38A to 38C. The crystallization conditions are as follows: a continuous wave oscillation mode of a $YVO_4$ laser oscillation apparatus is used; a second harmonic (wavelength 532 nm) output of 5.5 W is collected by an optical system so as to have a uniform energy distribution in a longitudinal direction, with a size of 400 μm in the longitudinal direction and from 50 to 100 μm in a transverse direction; and this is scanned at a velocity of 50 cm/sec, thus causing crystallization. The term uniform energy density distribution does not imply excluding energy density distributions that are not completely uniform, but denotes one with a permissible range for the energy density distribution of ±5%. This type of laser light irradiation can apply the laser processing apparatus structure as shown in FIG. 35. The laser light collected by the optical system may have a range in the longitudinal direction in which the intensity distribution is uniform, and may possess a distribution in the transverse direction. Crystallization is performed such that the intensity distribution forms a uniform region in the longitudinal direction, and the effectiveness for crystal growth in a direction parallel to the laser light scanning direction can be increased.

The amorphous silicon film is melted instantaneously by irradiating the laser light under these conditions, and crystallization proceeds as the melted stripe moves. Surface tension acts on the melted silicon, and the melted silicon aggregates in the openings (concave portions) and solidifies. A crystalline semiconductor film 5606 is thus formed in a state in which it fills the openings 5604a and 5604b.

A mask pattern is then formed and an etching process is implemented so that the crystalline semiconductor film remains at least in the openings 5604a and 5604b, thus forming island-like regions 5607 and 5608 that contain channel formation regions as shown in FIGS. 39A to 39C.

FIGS. 40A to 40C show a state in which a gate insulating film 5609, and gate electrodes 5610 and 5611 are formed on an upper layer side of the semiconductor regions 5607 and 5608. The gate insulating film may be formed from an 80 nm silicon oxide film by using plasma CVD. The gate electrodes 5610 and 5611 are formed by using tungsten or an alloy containing tungsten. Channel formation regions can be formed in the island-like semiconductor regions that fill the openings 5604a and 5604b by employing this type of structure.

TFTs can then be completed, provided that source and drain regions, low concentration drain regions, and the like are suitably formed.

Embodiment 2

Embodiment 2 shows a structure formed by processes that are similar to those of Embodiment 1, but as shown by FIGS. 41A to 41C, the openings formed in the second insulating films 5603 are formed in long, thin strip regions and regions that are connected to the long, thin strip regions. As island-like semiconductor region 5620 is formed by a crystalline silicon film in alignment with the opening 5604c, and a multi-channel TFT can be completed by forming a gate insulating film 5621 and a gate electrode 5622.

Embodiment 3

Figures 42A, 42B, 42C:
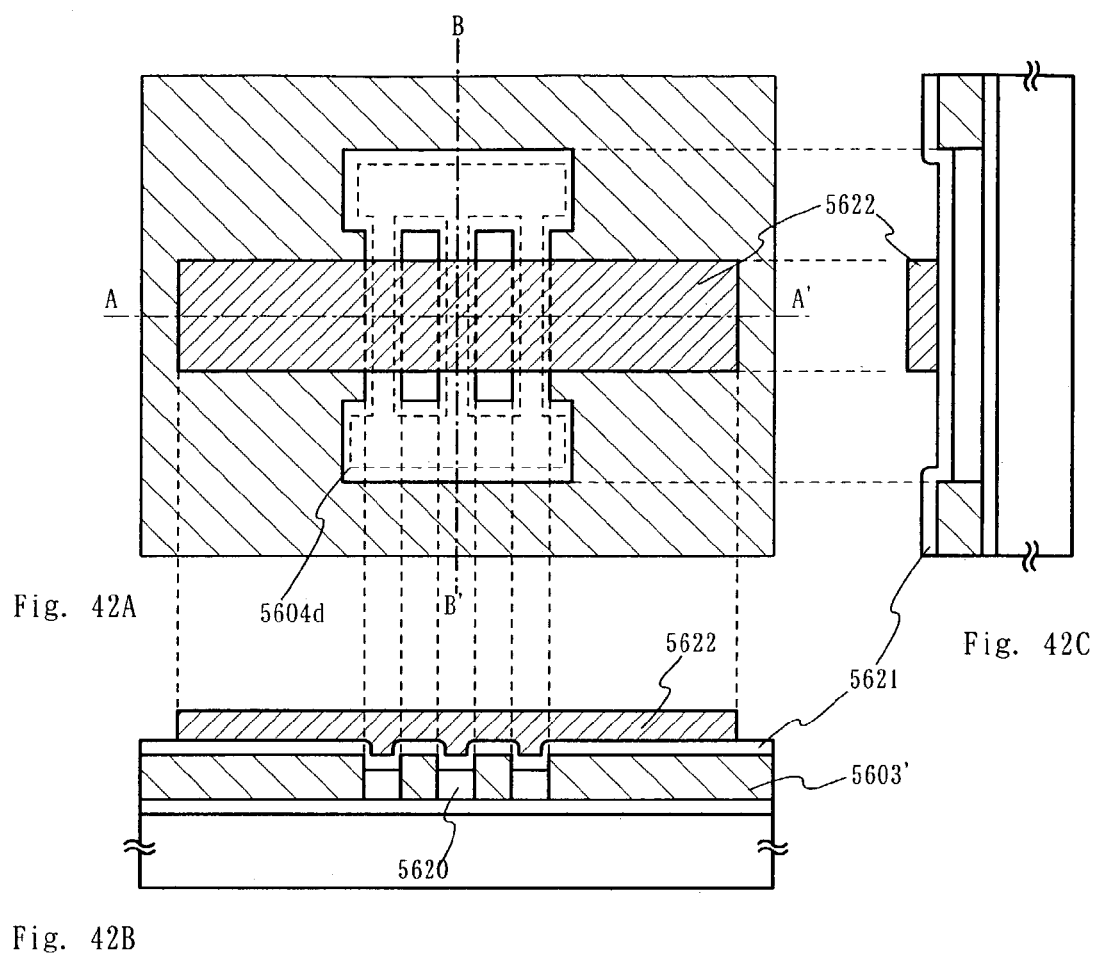
FIGS. 42A to 42C are a top view and vertical sectional views illustrating an example of a TFT manufactured in accordance with the present invention.

By forming the second insulating films 5603 thicker than the amorphous semiconductor film in Embodiment 2, for example by forming the second insulating films 5603 with the thickness of 350 nm, the island-like semiconductor region 5620 formed by the crystalline semiconductor film can be completely buried in an opening 5604d as shown in FIGS. 42A to 42C. A multi-channel TFT can then be formed provided that the gate insulating film 5621 and the gate electrode 5622 are similarly formed.

Embodiment 4

Figures 43A, 43B, 43C, 43D:
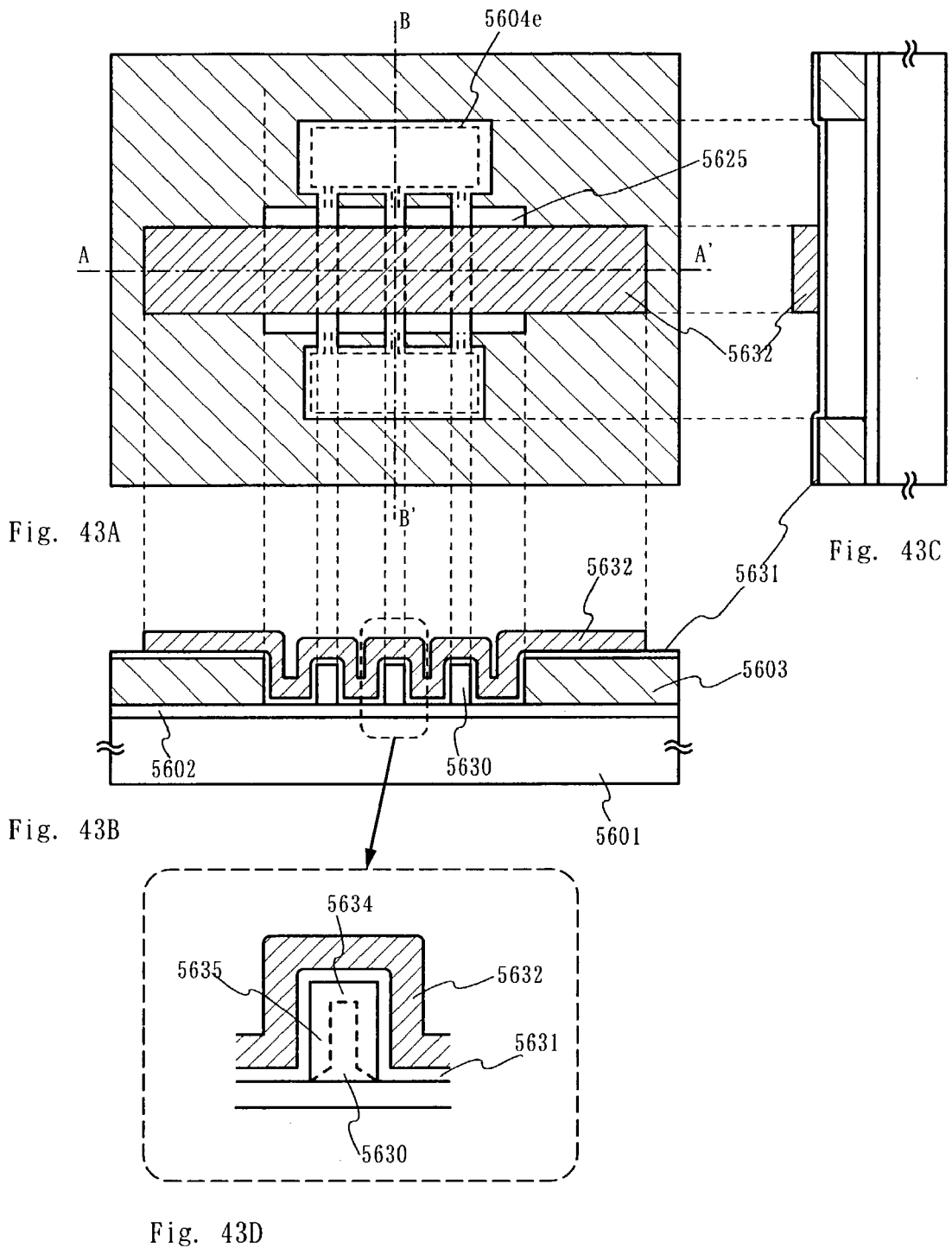
FIGS. 43A to 43D are a top view and vertical sectional views illustrating an example of a TFT manufactured in accordance with the present invention.

FIGS. 43A to 43D show another example of a multi-channel TFT. The first insulating film 5602, the second insulating films 5603, an island-like semiconductor region 5630, a gate insulating film 5631, and a gate electrode 5632 are formed on the substrate 5601 similar to those formed in Embodiments 1 to 3. Portions that differ in FIGS. 43A to 43C are an opening 5604e formed by the second insulating films 5603, and in addition, the second insulating films are removed from the periphery of the semiconductor regions, in which channel formation regions are formed, after forming the island-like semiconductor region 5630, thus forming second opening 5625.

A blow-up diagram of an embodiment of the vicinity of the channel formation region is shown in FIG. 43D. The gate electrode 5631 is formed contacting a side surface and an upper surface of the island-like semiconductor region 5630, and the gate electrode 5632 is formed with a shape that covers the gate insulating film 5631. In this case the channel formation region is formed on an upper portion 5634 and a side surface portion 5635 of the semiconductor region 5630. Depleted regions can thus be increased, and the TFT current driver performance can be increased.

Embodiment 5

A process of manufacturing a so-called multi-channel TFT, which has a plurality of channel formation regions that are mutually separated from each other, by using the semiconductor device of the present invention is discussed in Embodiment 5.

Figure 49A:
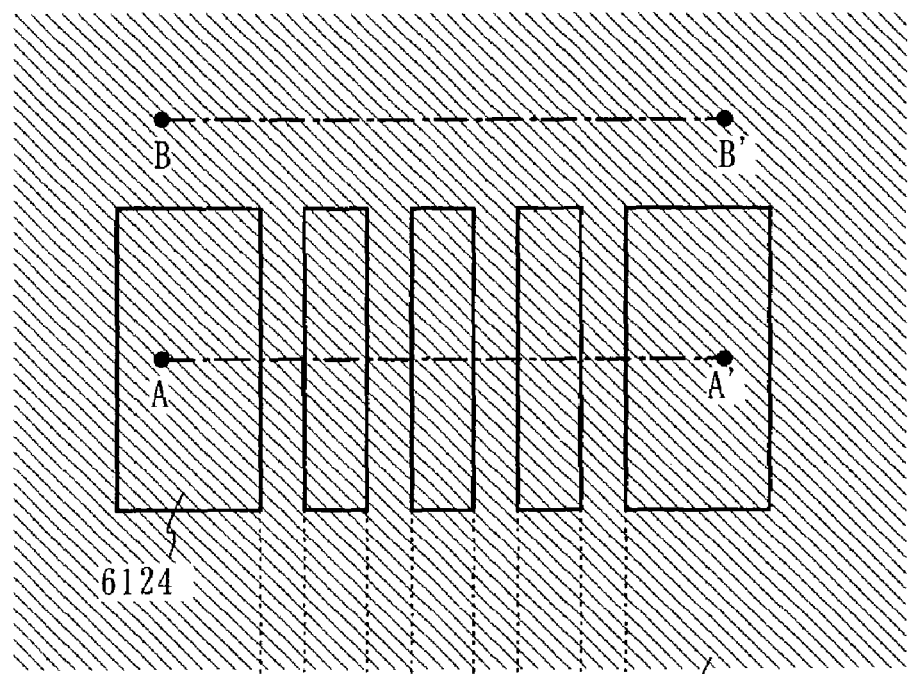
FIGS. 49A to 49C are diagrams showing a process of manufacturing a TFT of the present invention.
Figure 49B:
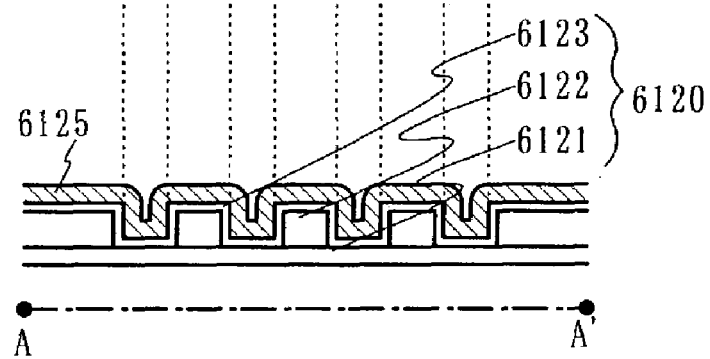
Figure 49C:
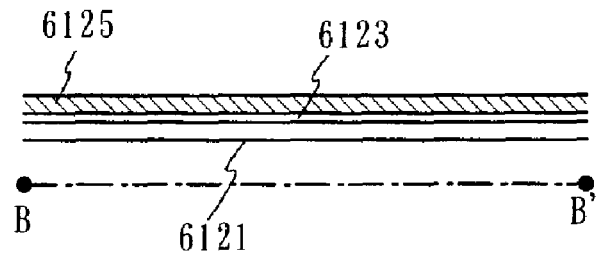

First, a base film 6120 having convex portions 6124 is formed on a substrate as shown in FIG. 49A. Note that a cross sectional diagram taken along a line segment A–A' of FIG. 49A is shown in FIG. 49B, and a cross sectional diagram taken along a line segment B–B' of FIG. 49A is shown in FIG. 49C.

The base film 6120 used in Embodiment 5 has the same structure as that shown in the Embodiment Mode. The base film 6120 is composed of three base films. First, a second base film 6122 made from rectangular shape silicon oxide is formed on a first base film 6121 made from silicon nitride, and a third base film 6123 made from silicon oxide is formed so as to cover the first base film 6121 and the second base film 6122. In Embodiment 5, convex portions 6124 are structured by the rectangular shape second insulating film 6122 and by portions of the third insulating film 6123 that contact the second insulating film 6122 but do not contact the first insulating film 6121.

Note that, although a designer can suitably set the shapes and the sizes of the convex portions 6124, it is necessary to set the thickness on an order such that cutoff of a later formed semiconductor film does not occur in the vicinity of edges of the convex portions. The height of the convex portions is set on the order of 0.1 to 1 µm in Embodiment 5.

Note that distortions of the substrate impart influence to the shape of the base film 6120 later formed. Distortions of the base film become a cause of disturbances in the uniformity of the crystallinity of the later formed semiconductor film, and therefore the surface of the substrate may be polished using a chemical mechanical polishing method (CMP method) so that the distortion difference is suppressed to a level equal to or less than 10 nm, and the substrate may be heat treated in advance prior to forming the base film so that the substrate does not distort due to heat treatment processing in later process steps.

A non-single crystalline semiconductor film 6125 is then formed covering the base film 6120. The non-single crystalline semiconductor film 6125 can be formed by using a known method (such as sputtering, LPCVD, or plasma CVD). The non-single crystalline semiconductor film 6125 is formed having a thickness of 300 nm by plasma CVD in Embodiment 5.

Figure 50A:
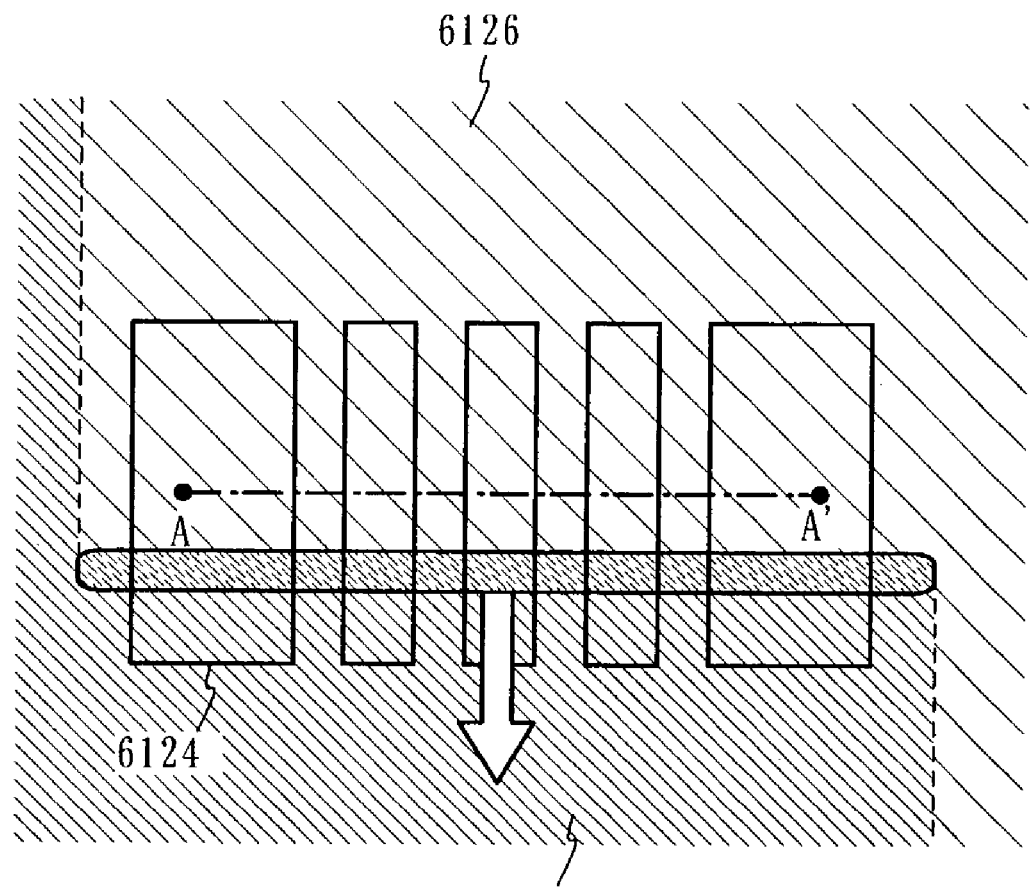
FIGS. 50A and 50B are diagrams showing a process of manufacturing a TFT of the present invention.
Figure 50B:
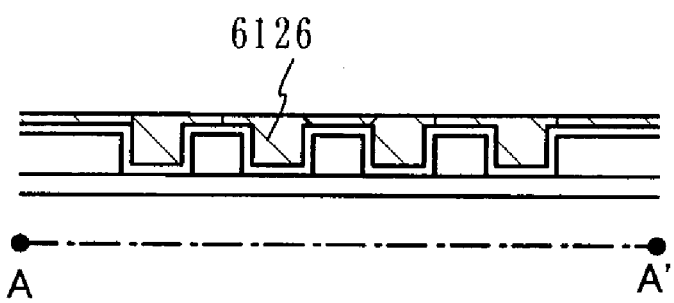

Laser light is next irradiated to the non-single crystalline semiconductor film 6125 as shown in FIG. 50A, thus performing crystallization. Note that FIG. 50B corresponds to a cross sectional diagram taken along a dashed line segment A–A' of FIG. 50A. Irradiation is performed in Embodiment 5 by using a continuous wave oscillation $YVO_4$ laser at a scanning speed of 50 cm/sec. The laser scanning direction at this point is such that it is aligned with the same direction as the carrier moves in later formed channel formation regions. Laser light is irradiated while the scanning direction lines up with the longitudinal direction of the rectangular shape convex portions 6124 in Embodiment 5, as shown by the outline arrow. The non-single crystalline semiconductor film 6125 melts due to the irradiation of laser light, and its volume moves from the upper portion of the convex portions 6124 to the upper portion of the concave portions, thus forming a crystalline semiconductor film 6126.

Figure 51A:
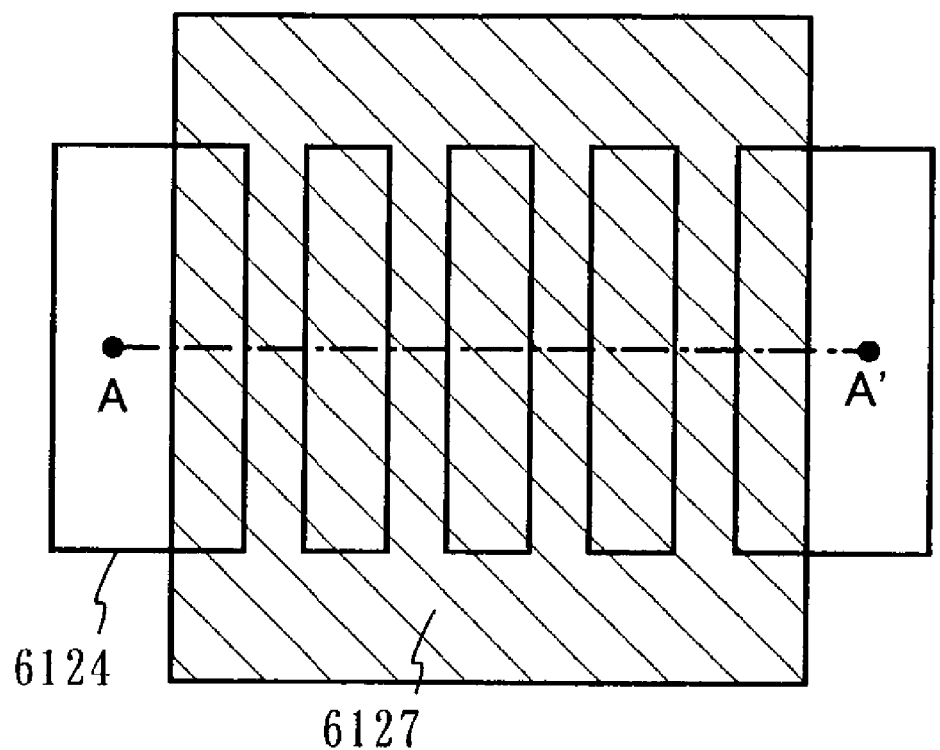
FIGS. 51A and 51B are diagrams showing a process of manufacturing a TFT of the present invention.
Figure 51B:
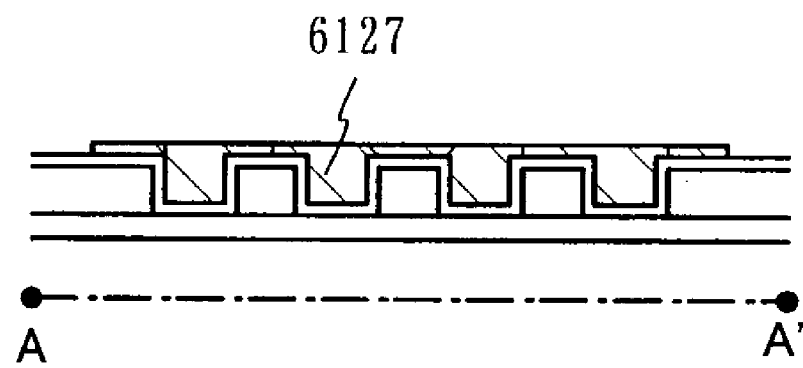

The crystalline semiconductor film 6126 is patterned next as shown in FIG. 51A, thus forming a sub-island 6127. Note that FIG. 51B corresponds to a cross sectional diagram of FIG. 51A along a dashed line segment A–A'. Portions of the sub-island 6127 exist on the concave portions formed between the convex portions 6124. The channel formation regions of the objective multi-channel TFTs are formed using portions of the crystalline semiconductor film 6126 located on the concave portions, and therefore it is essential that the positional relationship between the sub-island 6127 and the convex portions 6124 be determined by considering the number of channel formation regions, the channel length, and the channel width.

Figure 52A:
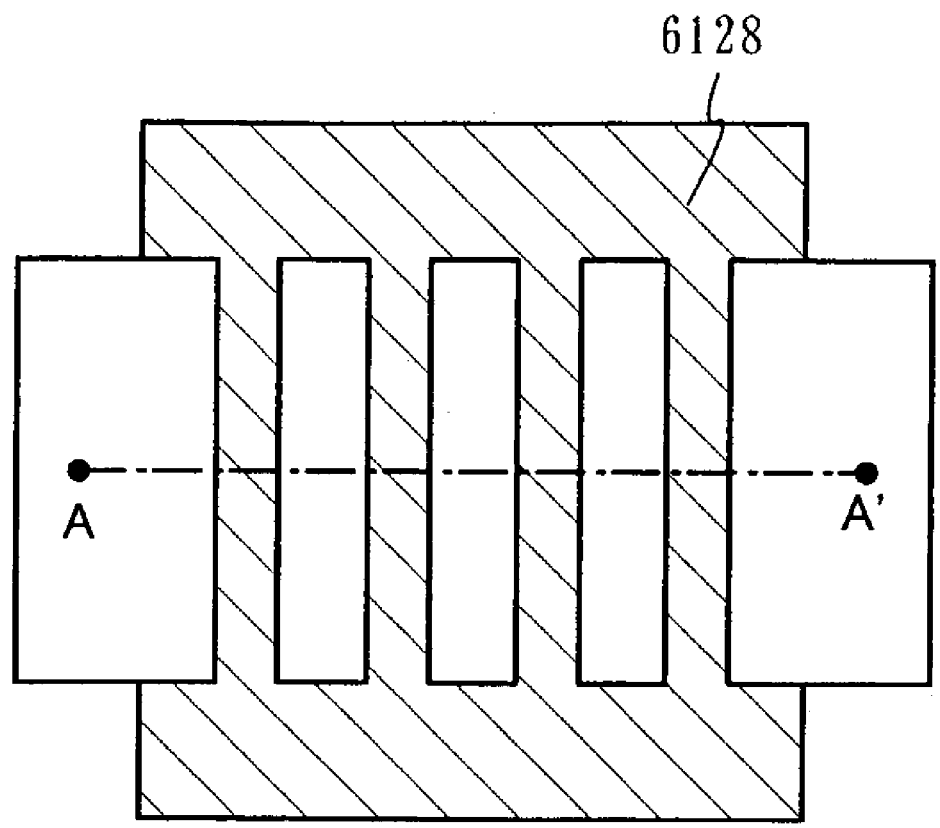
FIGS. 52A and 52B are diagrams showing a process of manufacturing a TFT of the present invention.

An island 6128 is formed next by removing the sub-island 6127 from an upper surface to an extent such that upper surfaces of the convex portions 6124 of the third base film 6123 are exposed, as shown in FIG. 52A. Note that FIG. 52B corresponds to a cross sectional diagram taken along a dashed line segment A–A' of FIG. 52A. Removal of the sub-island 6127 from its upper surface may be performed by using any method, for example the removal may be performed by using etching, and may also be performed by using a CMP method.

Figure 52B:
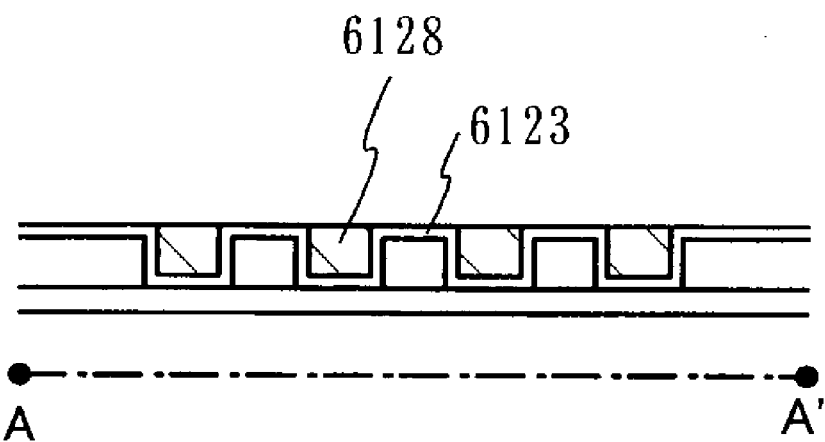

Portions in which grain boundaries exist on the convex portions 6124 are removed by performing removal from the upper surface of the sub-island 6127. Almost no grain boundaries exist on the concave portions corresponding to spaces between the convex portions 6124, and crystalline semiconductor films having superior crystallinity remain in portions that later become channel formation regions. The slit shape island 6128 is in which only channel formation regions are separated is formed as shown in FIGS. 52A and 52B. Note that portions that become source regions or drain regions do not influence the TFT characteristics, due to the semiconductor film crystallinity, as much as the channel formation regions do. The portions that become source regions or drain regions therefore do not become much of a problem, even if their crystallinity is not satisfactory compared to the crystallinity of the portions that become the channel formation regions.

Figure 53A:
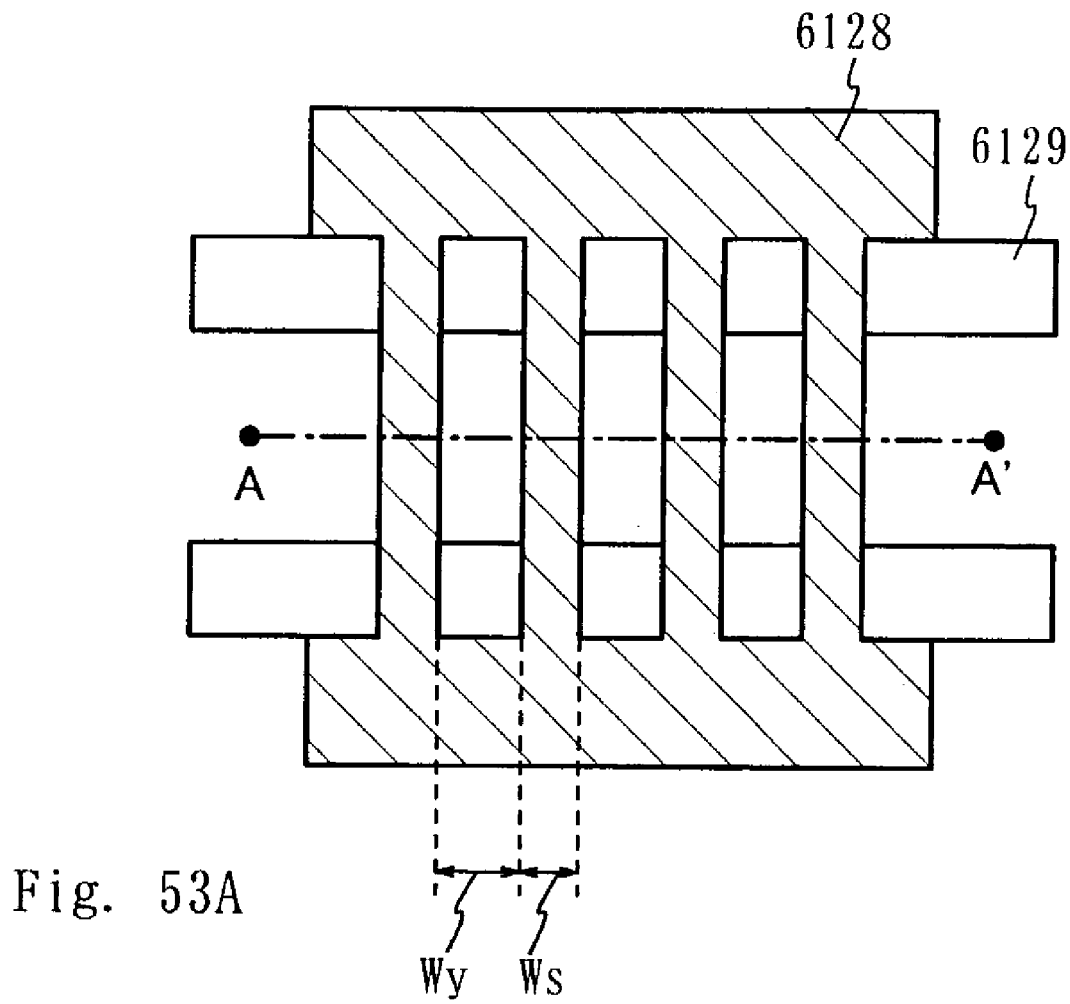
FIGS. 53A and 53B are diagrams showing a process of manufacturing a TFT of the present invention.
Figure 53B:
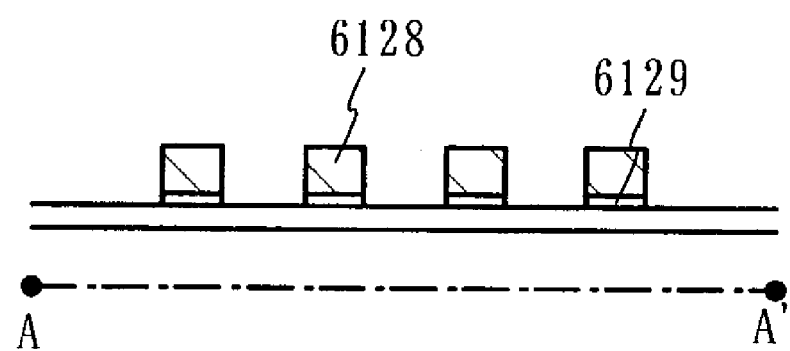

Next, as shown in FIG. 53A, a part of the convex portion 6124 of the base film 6120 is removed to expose a portion of the island 6128 that serves as a channel formation region. FIG. 53B is a sectional view taken along the dashed line A–A' in FIG. 53A. Dry etching, wet etching, or other methods can be employed for the removal of the convex portion 6124. There is a possibility that the island 6128 is partially removed by this etching.

Figure 59A:
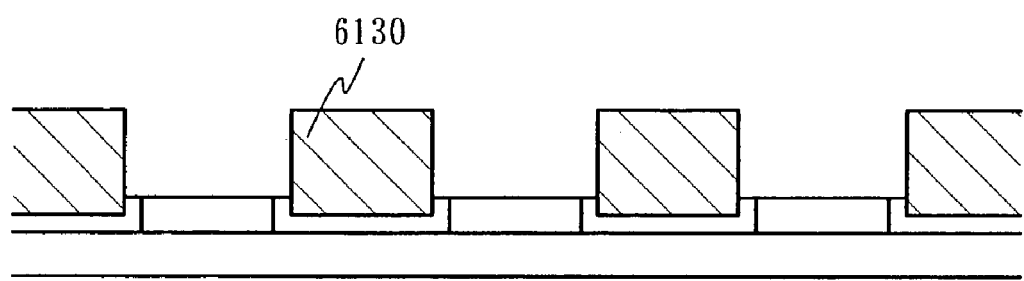
FIGS. 59A and 59B are diagrams showing shapes of an island and base film after the base film is etched.
Figure 59B:
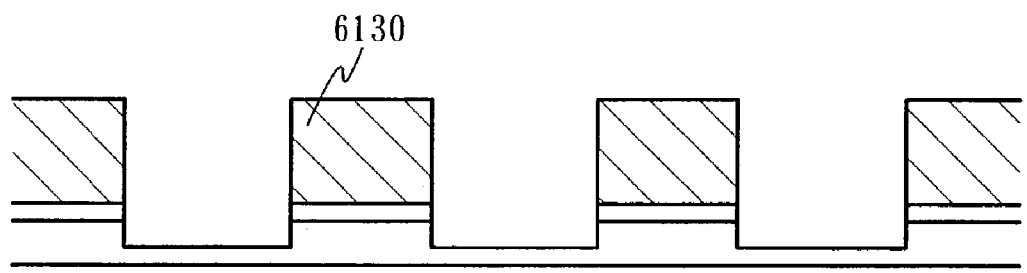

The convex portion 6124 may not completely be removed but may remain so that a portion thereof comes into contact with the channel formation region. In FIG. 59A, enough portions of the second base film 6122 and third base film 6123 remain to partially cover the side surfaces of a channel formation region 6130 with the third base film 6123. Portions of the base film 6120 other than the convex portion 6124 might also be etched slightly. In FIG. 59B, the first base film 6121 is partially etched.

Portions of the convex portion 6124 that are not in contact with the portion that later serves as a channel formation region may also be removed. Alternatively, the entire convex portion 6124 may be removed. In this embodiment, the convex portion 6124 is partially removed to form a fourth base film 6129.

Figure 54A:
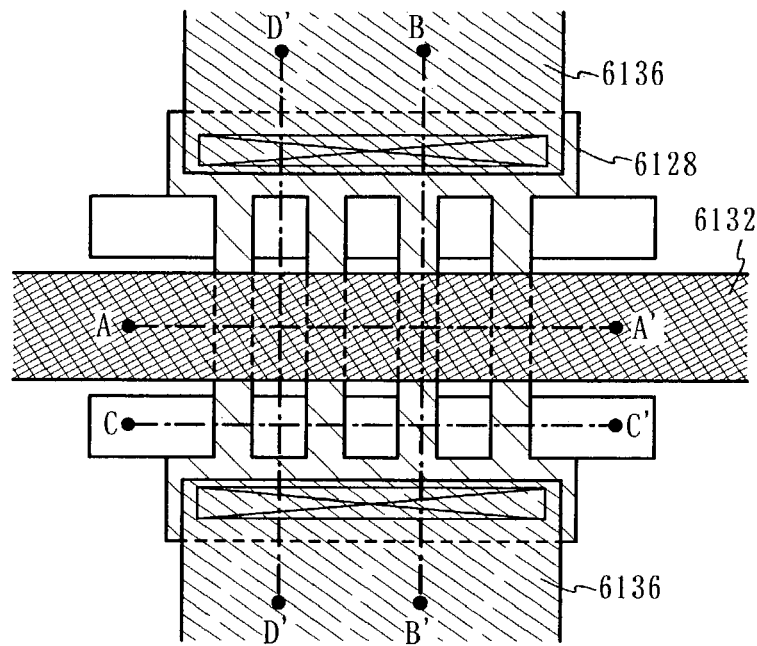
FIGS. 54A to 54C are diagrams showing a process of manufacturing a TFT of the present invention.
Figure 54B:
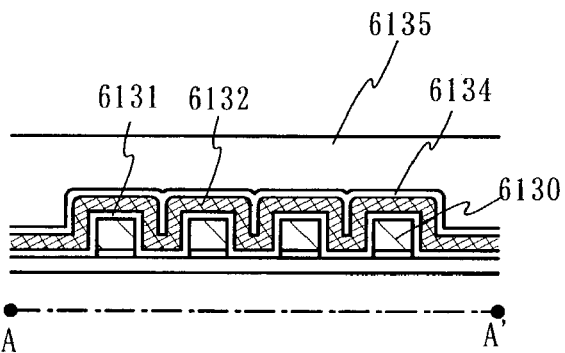
Figure 54C:
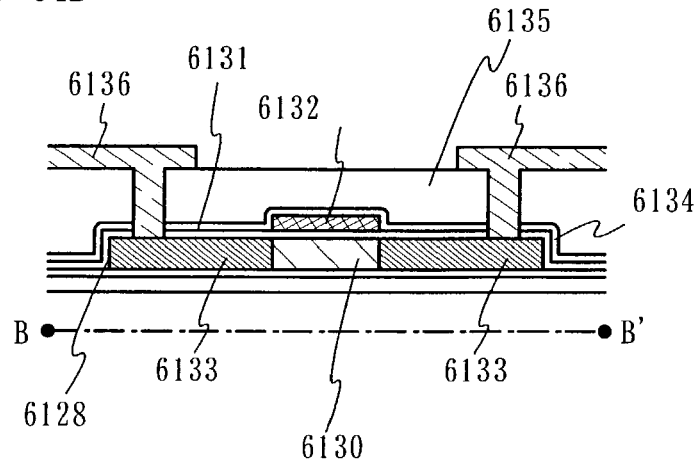
Figure 55A:
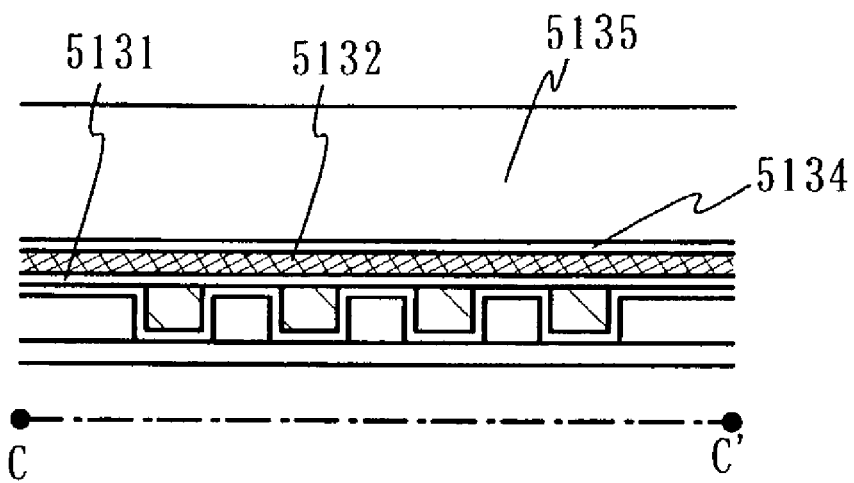
FIGS. 55A and 55B are sectional views of a TFT of the present invention.
Figure 55B:
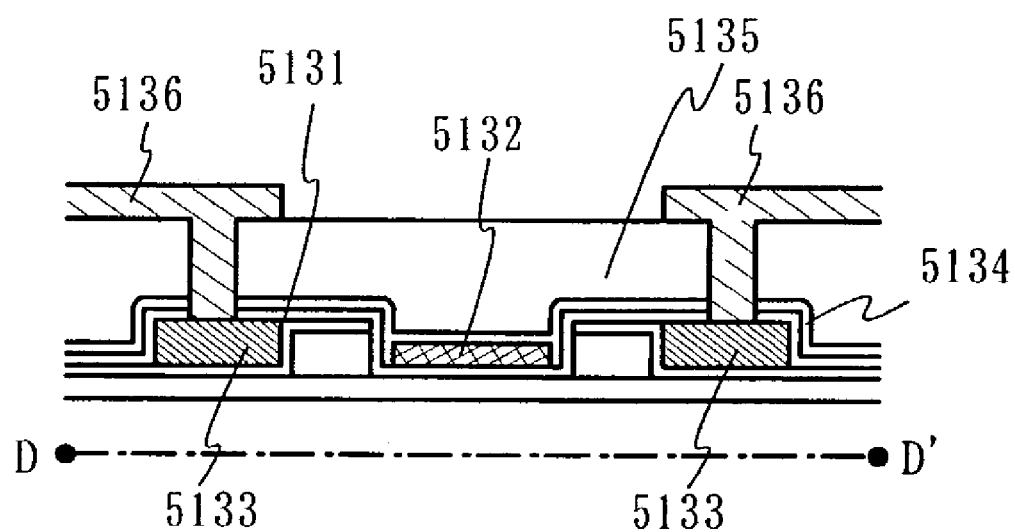

A TFT is manufactured next by using the island 6128, as shown in FIG. 54A. Note that there are various TFT structures and method of manufacturing TFTs. FIG. 54B corresponds to a cross sectional diagram taken along a dashed line segment A–A' of FIG. 54A, and FIG. 54C corresponds to a cross sectional diagram taken along a dashed line segment B–B' of FIG. 54A. FIG. 55A corresponds to a cross sectional diagram taken along a dashed line segment C–C' of FIG. 54A, and FIG. 55B corresponds to a cross sectional diagram taken along a dashed line segment D–D' of FIG. 54A.

A channel formation region 6130 in the island 6128 overlaps with a gate electrode 6132, sandwiching a gate insulating film 6131 in between. Further, the channel formation region 6130 is similarly sandwiched by two impurity regions 6133 of the island 6128. Note that the two impurity regions 6133 function as a source region or a drain region.

A first interlayer insulating film 6134 is then formed covering the island 6128, the gate insulating film 6131, and the gate electrode 6132. A second interlayer insulating film 6135 is then formed covering the first interlayer insulating film 6134. Note that the first interlayer insulating film 6134 is an inorganic insulating film, and impurities such as carbon in the second interlayer insulating film 6135 can be prevented from entering the island 6128. Further, the second interlayer insulating film 6135 is an organic resin film, and has an effect for leveling the surface so that wirings formed later do not undergo disconnection.

A wiring 6136 that is connected to the impurity region 6133 through contact holes formed in the gate electrode 6131, the first interlayer insulating film 6134, and the second interlayer insulating film 6135 is then formed on the second interlayer insulating film 6135.

A TFT having plural channel formation regions that are separated from one another is completed through the above manufacturing process. This structure makes it possible to increase a region of a channel formation region that overlaps a gate electrode with a gate insulating film sandwiched therebetween. Accordingly, the channel width is increased. An increase in channel width makes it possible to efficiently release heat that is generated by driving a TFT while securing ON current.

Note that the TFT structure is not limited to that shown in FIGS. 53A and 53B in the present invention. Further, the number of channel formation regions is not limited to four and apart from the four regions, one or plural channel formation regions may be formed.

Figure 56A:
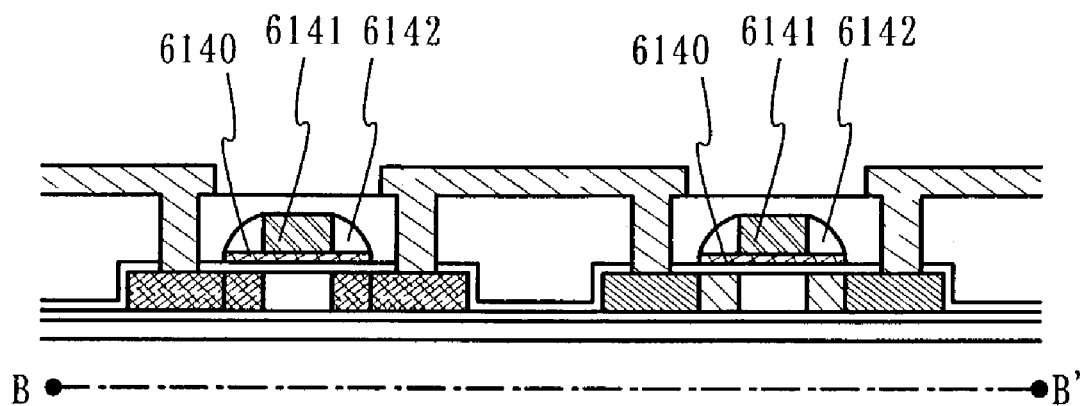
FIGS. 56A and 56B are sectional views of a TFT of the present invention.
Figure 56B:
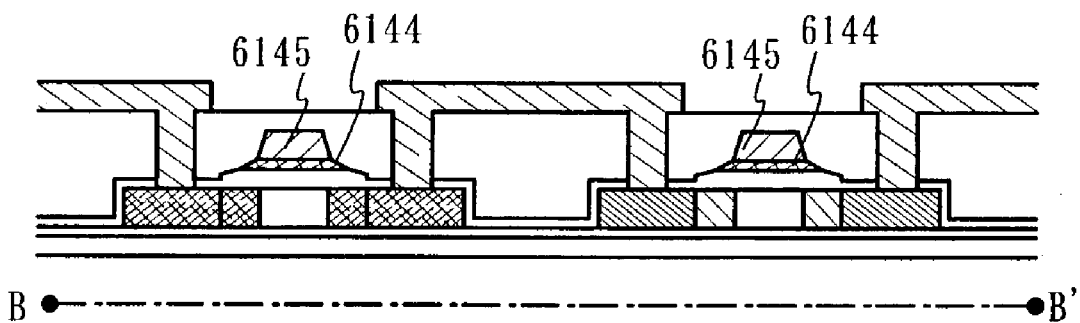

Further, the TFT structure is not limited to the aforementioned structure. For example, the TFT structure may have a structure like that shown in FIGS. 56A and 56B. The TFTs shown in FIG. 56A have gate electrodes composed of two layer conductive films 6140 and 6141. Sidewalls 6142 made from an insulating film are formed contacting upper surfaces of the conductive films 6140 and side surfaces of the conductive films 6141. For example, TaN can be used as the conductive films 6140, W can be used as the conductive films 6141, and $SiO_2$ or the like can be used as the sidewalls 6142. The TFTs shown in FIG. 56B have gate electrodes composed of two layer conductive films 6144 and 6145. The conductive films 6144 overlap with portions of impurity regions.

Note that in the above-mentioned process steps, stress which develops within the semiconductor film can be relieved by performing heat treatment at 500 to 600° C. for a period on the order of 1 minute to 60 minutes, after laser light irradiation or after etching the crystalline semiconductor film to an extent such that the convex portions of the base film are exposed.

The formation of grain boundaries in the TFT channel formation regions can be prevented by actively using the semiconductor films located on the concave portions of the insulating film as TFT active layers, and conspicuous drops in the TFT mobility, reductions in the ON current, and increases in the OFF current, which are all caused due to grain boundaries, can be prevented.

Embodiment 6

A method of manufacturing an island in which the process order differs from that of Embodiment 5 is explained in Embodiment 6. Note that Embodiment 6 may be referred to for detailed explanations of each process step.

Figure 57A:
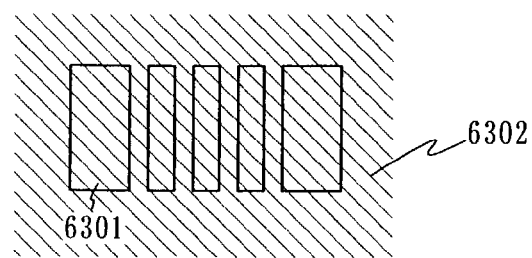
FIGS. 57A to 57E are diagrams showing a process of manufacturing a TFT of the present invention.
Figure 57B:
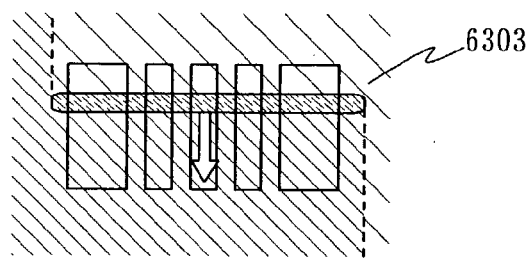

First, a base film having rectangular shape convex portions 6301 is formed as shown in FIG. 57A, and a non-single crystalline semiconductor film 6302 is formed on the base film. Laser light is next irradiated to the non-single crystalline semiconductor film 6302, thus forming a crystalline semiconductor film 6303 (FIG. 57B).

Figure 57C:
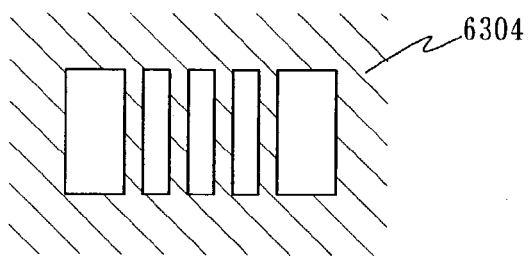

Next, a portion of the crystalline semiconductor film 6303 is removed from its surface to an extent such that upper surfaces of the convex portions 6301 are exposed. Note that removal is performed using etching in Embodiment 6, and the crystalline semiconductor film after removal becomes a crystalline semiconductor film (after etching) 6304 (FIG. 57C).

Figure 57D:
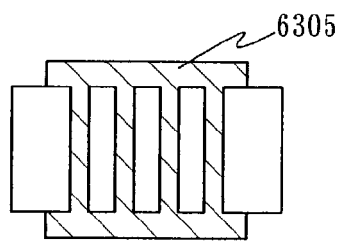
Figure 57E:
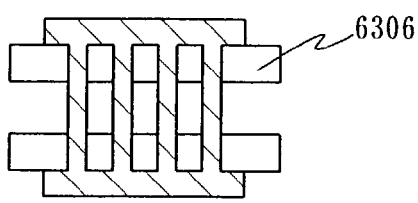

Next, the crystalline semiconductor film (after etching) 6304 is patterned to form an island 6305 (FIG. 57D). Then a part or the entirety of the convex portion 6301 is removed so as to expose a portion of the island 6305 that serves as a channel formation region. In this embodiment, only a part of the convex portion 6301 is removed by etching to form a convex portion (after etching) 6306 (FIG. 57E).

Note that in the above-mentioned process steps, stress which develops within the semiconductor film can be relieved by performing heat treatment at 500 to 600° C. for a period on the order of 1 minute to 60 minutes, after performing laser irradiation and etching the crystalline semiconductor film to an extent such that the convex portions of the base film are exposed, or after forming the island.

Removal of edge portions and side surfaces of the island due to etching can be prevented in accordance with the above process steps by etching the crystalline semiconductor film to an extent such that the convex portions of the base film are exposed before forming the island.

Embodiment 7

A method of manufacturing an island in which the process order differs from that of Embodiment 5 and Embodiment 6 is explained in Embodiment 7. Note that Embodiment 5 may be referred to for a detailed explanation of each process step.

Figure 58A:
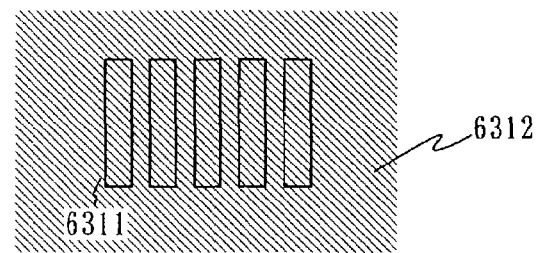
FIGS. 58A to 58E are diagrams showing a process of manufacturing a TFT of the present invention.

First, a base film having rectangular shape convex portions 6311 is formed as shown in FIG. 58A, and a non-single crystalline semiconductor film 6312 is formed on the base film.

Figure 58B:
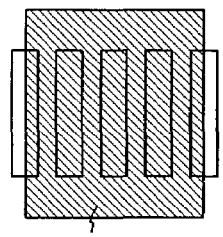

The non-single crystalline semiconductor film 6312 is patterned next, thus forming a sub-island 6313 (FIG. 58B).

Figure 58C:
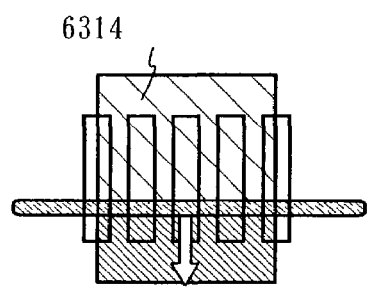

Laser light is irradiated to the sub-island 6313 next, thus causing crystallization. The sub-island after crystallization becomes a sub-island (after crystallization) 6314 in Embodiment 7 (FIG. 58C).

Figure 58D:
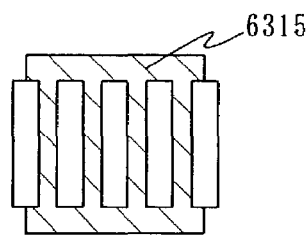

Portions of the sub-island (after crystallization) 6314 are removed next from its surface, to an extent such that upper surfaces of the convex portions 6311 are exposed. Note that the removal is performed by etching in Embodiment 7, thereby forming an island 6315 (FIG. 58D).

Figure 58E:
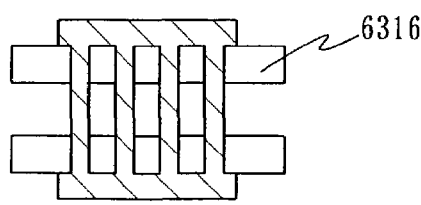

Then a part or the entirety of the convex portion 6311 is removed so as to expose a portion of the island 6315 that serves as a channel formation region. In Embodiment 7, only a part of the convex portion 6311 is removed by etching to form a convex portion (after etching) 6316 (FIG. 58E).

Note that stress which develops within the semiconductor film can be relieved in accordance with the above process steps by performing heat treatment at 500 to 600° C. for a period on the order of 1 minute to 60 minutes, after laser light irradiation or after forming the island.

Embodiment 8

An example of forming a multi-channel TFT and a single channel TFT having only one channel formation region by using a plurality of convex portions is explained in Embodiment 8.

Figure 60A:
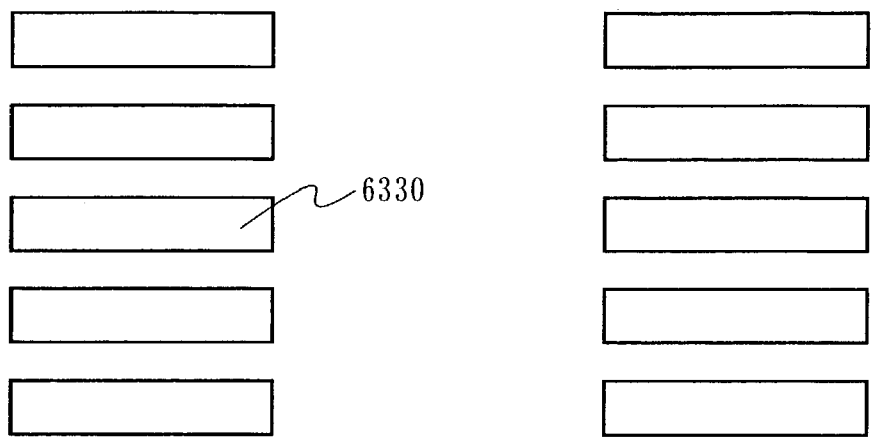
FIGS. 60A and 60B are top views of plural TFTs formed on a base film.
Figure 60B:
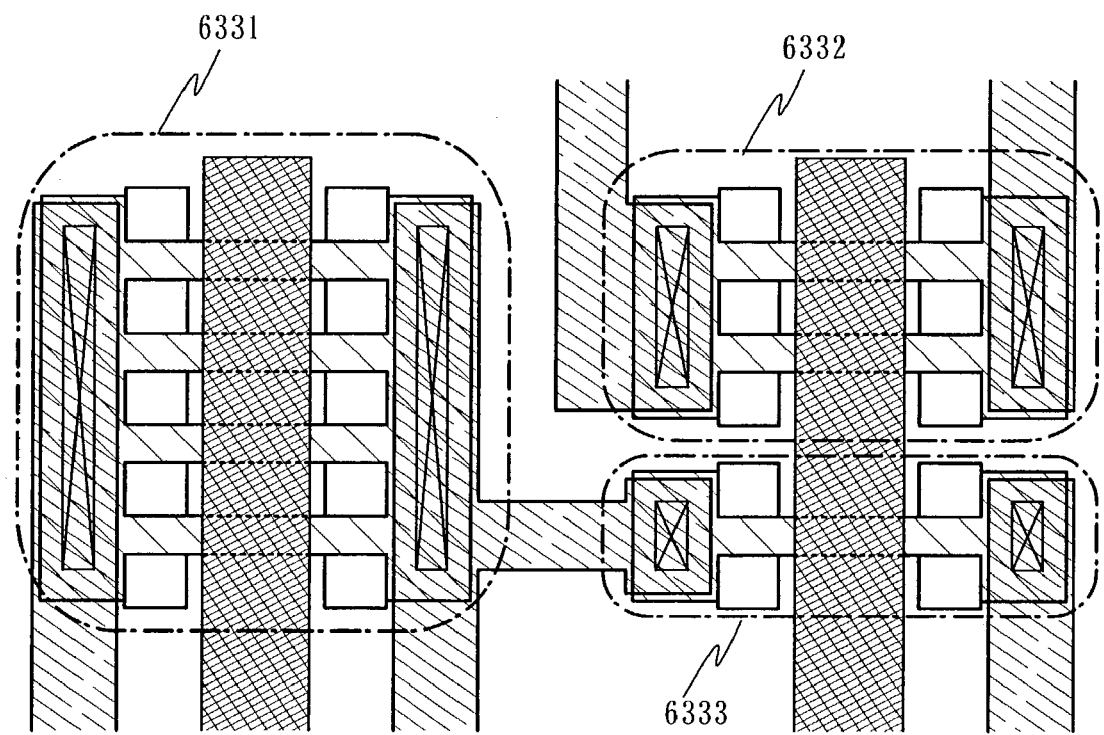

A base film having a plurality of rectangular shape convex portions 6330 is shown in FIG. 60A. A TFT that uses an island formed on the base film is shown in FIG. 60B. FIG. 60B has a multi-channel TFT 6331 having four channel formation regions, a multi-channel TFT 6332 having two channel formation regions, and a single channel TFT 6333.

Each TFT is formed on concave portions located between the convex portions 6330. It is more preferable that the channel formation regions and LDD regions be formed on the concave portions located between the convex portions 6330.

It is possible to implement Embodiment 8 in combination with Embodiments 5 to 7.

Embodiment 9

An example of combining a process of irradiating laser light with a process of crystallizing a semiconductor film using a catalyst when crystallizing the semiconductor film is explained in Embodiment 9. It is preferable to use the techniques disclosed in JP 7-130652 A and JP 8-78329 A when using a catalyst element.

Figure 61A:
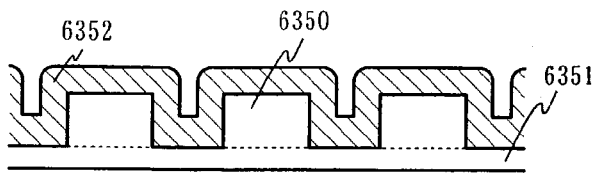
FIGS. 61A to 61F are diagrams showing the flow of crystallization of a semiconductor film of the present invention which uses a catalytic element.
Figure 61B:
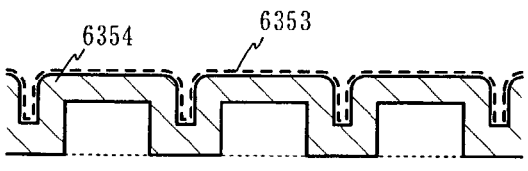

First, a non-single crystalline semiconductor film 6352 is formed on a base film 6351 having convex portions 6350 as shown in FIG. 61A. Next, the non-single crystalline semiconductor film 6352 is crystallized by using a catalytic element (FIG. 61B). For example, if the technique disclosed in JP 7-130652 A is used, then a nickel acetate solution containing nickel of 10 ppm by weight is applied to the non-single crystalline semiconductor film 6352, thus forming a nickel containing layer 6353. A dehydrogenation process is performed for one hour at 500° C., after which heat treatment is performed at 500 to 650° C. for 4 to 12 hours, for example at 550° C. for 8 hours, thus forming a crystalline semiconductor film 6354 having increased crystallinity. Note that, in addition to nickel (Ni), catalytic element capable of being used includes germanium (Ge), iron (Fe), palladium (Pd), tin (Sn), lead (Pb) cobalt (Co), platinum (Pt), copper (Cu), and gold (Au).

Figure 61C:
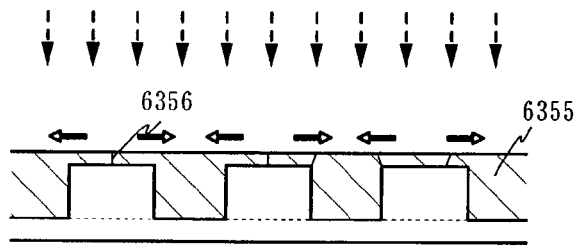

A crystalline semiconductor film (after LC) 6355 having further increased crystallinity is then formed by laser irradiation from the crystalline semiconductor film (after NiSPC) 6354 crystallized by NiSPC (FIG. 61C). The crystalline semiconductor film (after LC) 6355 melts once during laser light irradiation, and moves volumetrically from upper portions of the convex portions 6350 toward concave portions, thus leveling its surface. The film thickness on the convex portions 6350 becomes thin, and grain boundaries 6356 easily develop due to stress.

A process for gettering the catalytic element within the crystalline semiconductor film (after LC) 6355 is explained next. Note that, although gettering is performed after laser light irradiation in Embodiment 9, it may also be performed after etching the crystalline semiconductor film (after LC) 6355.

Figure 61D:
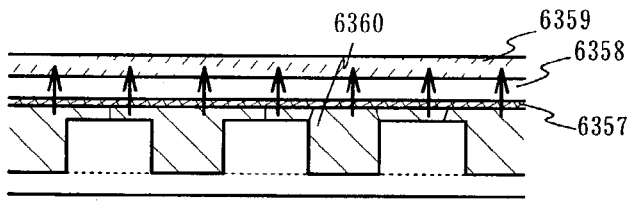

A barrier layer 6357 having silicon as its main constituent is then formed on the crystalline semiconductor film (after LC) 6355 (FIG. 61D). Note that the barrier layer 6357 may be extremely thin, may be a natural oxide film, and may be an oxide film oxidized by generating ozone by ultraviolet light irradiation under an atmosphere containing oxygen. Further, an oxide film oxidized by a liquid containing ozone and used in surface processing referred to as hydro-washing and performed in order to remove carbon, that is, an organic substance, may also be used as the barrier layer 6357. The barrier layer 6357 is mainly used as an etching stopper. Further, channel doping may be performed after forming the barrier layer 6357, after which activation may be performed by irradiating intense light.

A first semiconductor film 6358 used in gettering is next formed on the barrier layer 6357. The first semiconductor film 6358 used for gettering may be a semiconductor film having an amorphous structure, and may also be a semiconductor film having a crystal structure. The film thickness of the first semiconductor film 6358 used for gettering is set from 5 to 50 nm, preferably from 10 to 20 nm. It is preferable to increase the gettering efficiency by including oxygen in the first semiconductor film 6358 used for gettering (at a SIMS analysis concentration equal to or greater than $5 \times 10^{18}$ atoms/cm$^3$, preferably equal to or greater than $1 \times 10^{19}$ atoms/cm$^3$).

A second semiconductor film (gettering site) 6359 containing an inert gas element is formed next on the first semiconductor film 6358 used for gettering. The second semiconductor film 6359 used for gettering may be a semiconductor film having an amorphous structure, or a semiconductor film having a crystal structure, and may be formed by using plasma CVD, reduced pressure thermal CVD, or sputtering. The second semiconductor film may be a semiconductor film containing an inert gas element at the film formation stage, and an inert gas element may also be added after film formation of a semiconductor film that does not contain an inert gas element. The example shown in Embodiment 9 is one in which the semiconductor film used for gettering and containing an inert gas element at the film formation stage is formed, after which an additional inert gas element is selectively added, thus forming the second semiconductor film 6359 used for gettering. Further, the first semiconductor film and the second semiconductor film used for gettering may be formed in succession without exposure to the atmosphere. Furthermore, the sum of the film thickness of the first semiconductor film and the film thickness of the second semiconductor film may be set from 30 to 200 nm, for example 50 nm.

A gap is prepared between the crystalline semiconductor film (after LC) 6355 and the second semiconductor film 6359 by the first semiconductor film 6358 used for gettering. Impurity elements such as metals existing within the crystalline semiconductor film (after LC) 6355 tend to easily aggregate in the vicinity of gettering site boundaries during gettering, and therefore it is preferable to increase gettering efficiency by placing the gettering site boundaries far from the crystalline semiconductor film (after LC) 6355 by employing the first semiconductor film 6358 used for gettering as in Embodiment 9. In addition, the first semiconductor film 6358 used for gettering also has a blocking effect so that the impurity elements contained in the gettering site do not diffuse and reach the interface with the first semiconductor film. Further, the first semiconductor film 6358 used in gettering also has a protective effect so that damage is not imparted to the crystalline semiconductor film (after LC) 6355 in the case where an inert gas element is added.

Gettering is performed next. Heat treatment may be performed within a nitrogen atmosphere at a temperature of 450 to 800° C. for 1 to 24 hours, for example at 550° C. for 14 hours, as a process for performing gettering. Further, intense light may also be irradiated as a substitute for heat treatment. Furthermore, a heated gas may be injected so as to heat the substrate. In this case heating may be performed for 1 to 60 minutes at a temperature from 600° C. to 800° C., more preferably from 650° C. to 750° C., thus reducing the processing time. Impurity elements thus move in the second semiconductor film 6359 as shown by the arrows in FIG. 61D by this gettering. Removal of the impurity elements, or a reduction in concentration of the impurity elements, contained in the crystalline semiconductor film (after LC) 6355 that is covered by the barrier layer 6357 is thus performed. A crystalline semiconductor film (after gettering) 6360 that contains almost no impurity elements, that is, the impurity element concentration is equal to or less than $1 \times 10^{18}$ atoms/cm$^3$, preferably equal to or less than $1 \times 10^{17}$ atoms/cm$^3$, is formed by gettering.

Next, the first semiconductor film 6358 used for gettering and the second semiconductor film 6359 are selectively removed with the barrier layer 6357 used as an etching stopper.

Figure 61E:
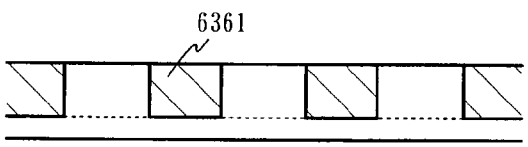
Figure 61F:
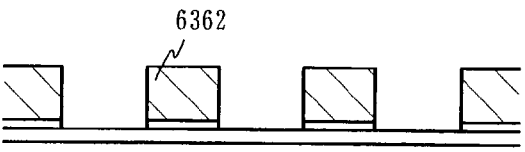

After changing the etching conditions and removing the barrier layer 6357, as shown in FIG. 61E, the crystalline semiconductor film (after gettering) 6360 is etched to an extent such that upper surfaces of the convex portions 6350 are exposed, thus forming crystalline semiconductor films 6361 in the concave portions. Then, the convex portions 6350 are etched to form an island 6362.

Note that crystal growth may also be performed by irradiating laser light, instead of SPC, after applying a solution containing a catalytic element to the semiconductor film before crystallization. Further, gettering may also use the techniques disclosed in JP 10-135468 A, JP 10-135469 A, or the like.

Note that although gettering is performed after laser light irradiation in Embodiment 9, the present invention is not limited to this structure. Gettering may also be conducted after performing the etching of FIG. 61E.

It is possible to implement Embodiment 9 in combination with Embodiments 1 to 4.

Embodiment 10

Figure 64:
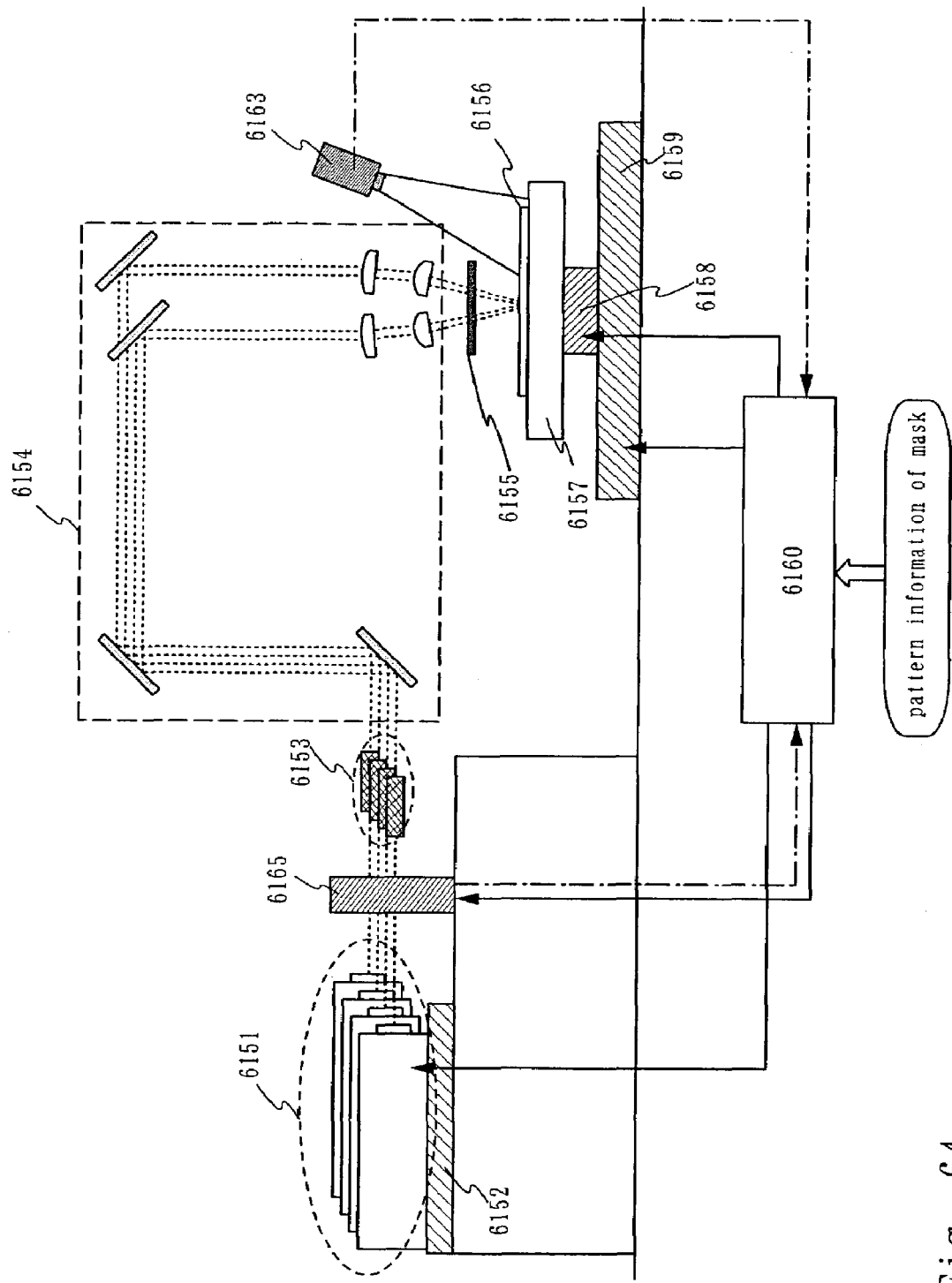
FIG. 64 is a diagram of laser irradiation apparatus.

Then, a structure of a laser irradiation apparatus which is used in the present invention will be described by using FIG. 64. Reference numeral 6151 designates a laser oscillation apparatus. In FIG. 64, four laser oscillation apparatuses are used but a laser oscillation apparatus which the laser irradiation apparatus has is not limited to this number.

In addition, the laser oscillation apparatus 6151 may be maintained its temperature constant by using a chiller 6152. The chiller 6152 is not disposed necessarily but, by maintaining temperature of the laser oscillation apparatus 6151 constant, it is possible to suppress fluctuation of energy of the laser beam to be outputted due to the temperature.

Also, reference numeral 6154 designate an optical system, and by changing a light path which was outputted from the laser oscillation apparatus 6151 and by processing a shape of its beam spot, it is possible to condense the light beam. Further, in the laser irradiation apparatus of FIG. 64, by partially overlapping the beam spots of the laser beams which were outputted from a plurality of the laser oscillation apparatuses 6151 one another, it is possible to synthesize them.

In addition, an AO modulator 6153 for changing a traveling direction of the laser beam for extreme short length of time may be disposed in a light path between a substrate 6156 as an object to be processed and the laser oscillation apparatus 6151. Also, instead of the AO modulator 6153, an attenuator (light volume adjustment filter) may be disposed so that the energy density of the laser beam is adjusted.

Also, in the light path between the substrate 6156 as the object to be processed and the laser oscillation apparatus 6151, means for measuring the energy density of the laser beam which was outputted from the laser oscillation apparatus 6151 (energy density measurement means) 6165 may be disposed so that variation per hour of the energy density measured is monitored by a computer 6160. In this case, so as to compensate attenuation of the energy density of the laser beam, the output from the laser oscillation apparatus 6151 may be heightened.

The synthesized beam spot is irradiated to the substrate 6156 as the object to be processed through a slit 6155. The slit 6165 can shield a part or a whole of the laser beam and further, it is desirable to form it by a material which is not transformed or damaged by the laser beam. Then, slit width of the slit 6155 may be made to be variable, and width of the beam spot may be made to be changed.

In addition, in case that it is not passed through the slit 6155, a shape of the beam spot of the laser beam which is oscillated from the laser oscillation apparatus 6151 in the substrate 6156 differs according to kinds of lasers and also, can be formed by the optical system.

The substrate 6156 is not mounted on a stage 6157. In FIG. 64, position control means 6158, 6159 correspond to means for controlling a position of the beam spot in the object to be processed, and a position of the stage 6157 is controlled by the position control means 6158, 6159.

In FIG. 64, the position control means 6158 controls a position of the stage 6157 in an X direction, and the position control means 6159 carries out a position control of the stage 6157 in a Y direction.

Also, the laser irradiation apparatus of FIG. 64 has a computer 6160 which had at the same time a central processing apparatus and storage means such as a memory etc. The computer 6160 controls oscillation of the laser oscillation apparatus 6151 and further, so as for the beam spot of the laser beam to cover an area which is defined according to pattern information of masks, it controls the position control means 6158, 6159 and it can move the substrate to a predetermined position.

In FIG. 64, the position of laser beam is controlled by moving the substrate, alternatively, the position can also be controlled by using optical system such as galvanometer mirror or the like. Additionally, both means may be used.

Further, in the invention, by the computer 6160, it is possible to control width of the slit 6165 and change width of the beam spot according to the pattern information of masks. The slit is not necessarily provided.

Further, in the laser irradiation apparatus, means for adjusting temperature of the object to be processed. Also, since the laser beam is light which has high directivity and energy density, it may be fine to prevent reflected light from being irradiated to an irrelevant portion by disposing a damper. It is desirable that the damper has a characteristic for absorbing the reflected light, and it may be fine to prevent temperature of a partition wall from being increased due to absorption of the reflected light, by circulating cooling water in the damper. In addition, means for heating the substrate may be disposed on the stage 6157.

In addition, in case that the marker is formed by the laser, a laser oscillation apparatus for the marker may be disposed. In this case, oscillation of the laser oscillation apparatus for the marker may be controlled by the computer 6160. Further, in case that the laser oscillation apparatus for the marker is disposed, an optical system for condensing the laser beam which was outputted from the laser oscillation apparatus for the marker is disposed separately. In addition, as the laser used on the occasion of forming the marker, typically, a YAG laser, a CO$_2$ laser etc. are cited and it is of course possible to form it by use of other lasers than these.

Also, for alignment by use of the marker, one unit of a CCD camera 6163 may be disposed and, depending on the circumstances, several units thereof may be disposed. In addition, the CCD camera means a camera which used CCD (Charge Coupled Device) as an image pickup device.

In addition, the alignment may be carried out without disposing the marker by recognizing the pattern of the insulating film or semiconductor film by the CCD camera 6163. In this case, by bringing pattern information of the sub-island by masks which were inputted to the computer 6160 into check to pattern information of the actual sub-island which was collected by the CCD camera 6163, positional information of the substrate can be grasped. In this case, there is no necessity to dispose the marker separately.

The form is not necessarily grasped by using CCD. For example, the form may be grasped by monitoring the reflected light, which is a laser light of a laser diode, irradiated to the insulating film or the semiconductor film.

Also, the laser beam which was entered to the substrate is reflected by a surface of the substrate and returns to the same light path as one when entered, becomes a so-called returned light and the returned light gives harmful effect such as variations of the output and frequency of the laser, break-down of a rod and so on. Therefore, in order to remove the returned light and stabilize the oscillation of the laser, an isolator may be disposed.

Figure 65:
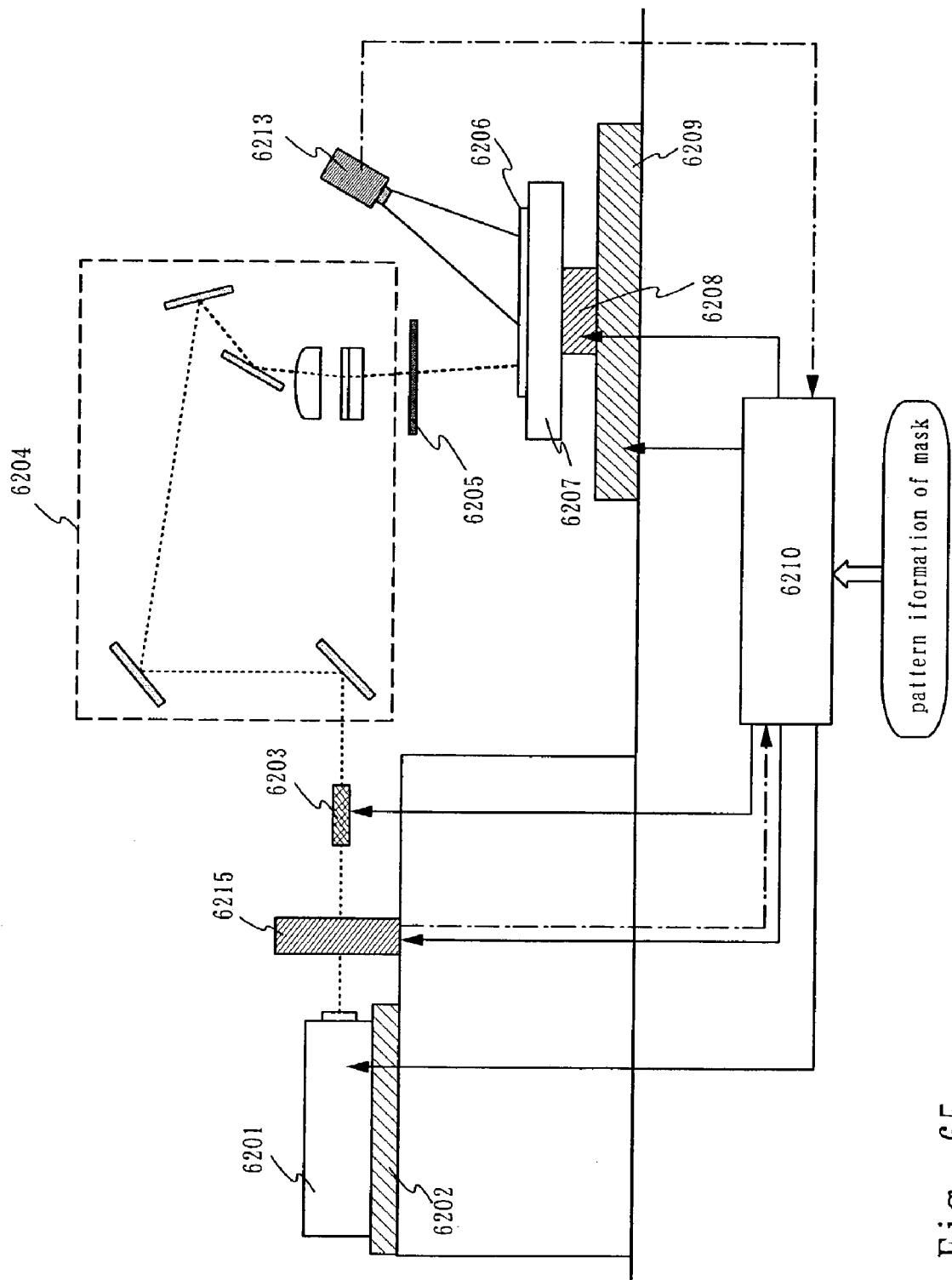
FIG. 65 is a diagram of laser irradiation apparatus.

In addition, in FIG. 64, the structure of the laser irradiation apparatus which has a plurality of the laser oscillation apparatuses was described but the laser oscillation apparatus may be one unit. FIG. 65 shows a structure of a laser irradiation apparatus which has one laser oscillation apparatus. In FIG. 65, reference numeral 6201 designates a laser oscillation apparatus, and reference numeral 6202 designates a chiller. Also, reference numeral 6215 designates an energy density measurement apparatus, and 6203 designates an AO modulator, and 6204 designates an optical system, and reference numeral 6205 designates a slit, and reference numeral 6213 designates a CCD camera. A substrate 6206 is mounted on a stage 6207, and a position of the stage 6207 is controlled by X direction position control means 6208 and Y direction position control means 6209. Then, in the same manner as one shown in FIG. 64, operations of respective means that the laser irradiation apparatus has are controlled by a computer 6210, and a difference from FIG. 64 is that there is one laser oscillation apparatus. Also, the optical system 6204 is different from a case of FIG. 64, and it may have a function for condensing one laser beam.

As just described, the invention is not a case that the laser beam is scanned and irradiated to the whole semiconductor film but, the laser beam is scanned so that at least necessary and indispensable portion can be crystallized at the very least. By the above-described structure, it is possible to omit time for irradiating the laser beam to a portion which is removed by patterning after the semiconductor film was crystallized, and to shorten processing time required per one substrate drastically.

This embodiment can be implemented by combining with Embodiments 5 to 9.

Embodiment 11

This embodiment explains how to form an insulation film having depression/projection.

Figure 62A:
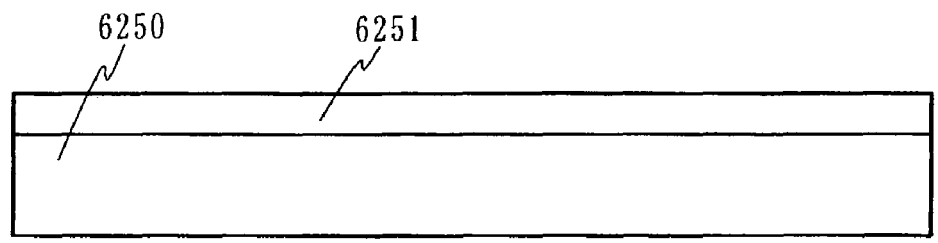
FIGS. 62A to 62D are diagrams showing a method of forming a base film that has convex portions.

At first, a first base film 6251 is formed on a substrate 6250, as shown in FIG. 62A. Although the first base film 6251 uses silicon oxide nitride in this embodiment, this is not limited to, i.e. an insulating film having a great etching selective ratio to a second base film is satisfactory. In this embodiment, the first base film 6251 was formed to a thickness of 50–200 nm using SiH$_4$ and N$_2$O by a CVD apparatus. Note that the first base film may be of a single layer or a layered structure having a plurality of insulation films.

Figure 62B:
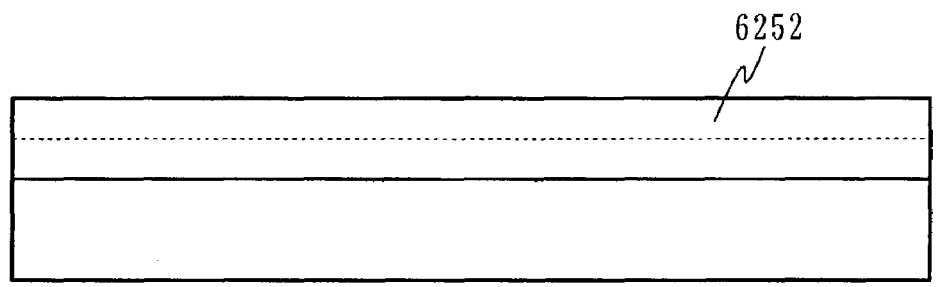

Then, a second base film 6252 is formed in contact with the first base film 6252, as shown in FIG. 62B. The second base film 6252 requires a film thickness to a degree that, when a depression/projection is formed thereon by patterning in a subsequent process, the depression/projection appears on a surface of a semiconductor film to be subsequently deposited. This embodiment forms, as the second insulation film 6252, silicon oxide having 30 nm–300 nm by using a plasma CVD process.

Figure 62C:
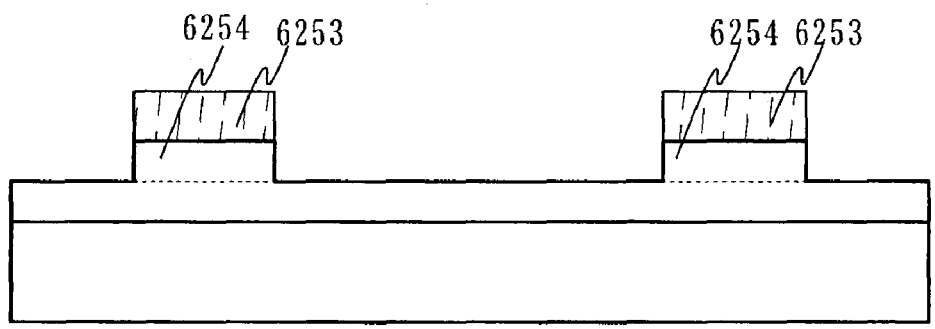
Figure 62D:
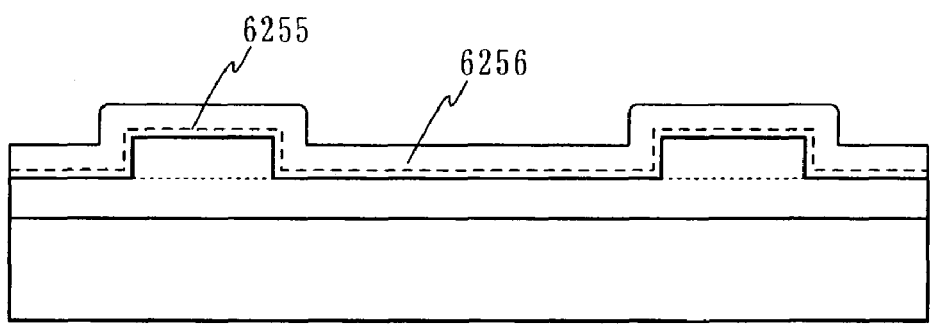

Next, a mask 6253 is formed as shown in FIG. 62C to etch the second base film 6252. This embodiment conducts wet etching at 20° C. using an etchant of a mixture solution containing 7.13% of ammonium hydrogen fluoride (NH$_4$HF$_2$) and 15.4% of ammonium fluoride (NH$_4$F) (product name: LAL500 by Stella Chemifa). This etching forms a projection part 6254 in a rectangular or stripe form. In this specification, a combination of the first base film 6251 and the projection part 6254 is considered as one base film.

It is preferred that the second base film 6252 is patterned by using an RF sputtering, in the case that aluminum nitride, aluminum oxynitride, or silicon nitride are used as the first base film 6251, and silicon oxide film is used as the second base film 6252. Aluminum nitride, aluminum oxynitride, or silicon nitride as the first base film 6251 can disperse heat quickly to prevent TFT degradation because it has a good heat conductance.

Then, a semiconductor film is formed covering the first base film 6251 and the projection part 6254. Because in the embodiment the projection part has a thickness of 30 nm–300 nm, the semiconductor film is desirably given a film thickness of 50–200 nm, herein 60 nm. Incidentally, in case an impurity is mixed between the semiconductor film and the base film, there is a possibility that bad affection is exerted to the crystallinity of semiconductor film to increase the characteristic and threshold voltage variation of the TFT fabricated. Accordingly, the base film and the semiconductor film are desirably formed continuously. For this reason, in this embodiment, after forming an base film comprising the first base film 6251 and the projection part 6254, a silicon oxide film is formed in a small thickness on the base film, followed by continuously forming a semiconductor film 6256 without exposure to the air. The thickness of silicon oxide film, although properly set by the designer, was given 5 nm–30 nm in this embodiment.

Figure 63A:
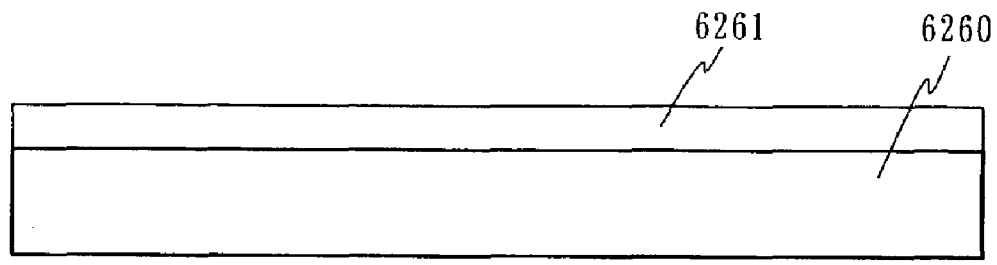
FIGS. 63A to 63C are diagrams showing a method of forming a base film that has convex portions.

Now, explanation is made on a different way to form a base film shown in FIG. 62. At first, a first base film is formed on a substrate 6260, as shown in FIG. 63A. The first base film is formed of silicon oxide, silicon nitride or silicon oxynitride.

In the case of using a silicon oxide nitride film, it can be formed by mixing Tetraethyl Ortho Silicate (TEOS) and $O_2$ and subjecting it to a plasma CVD process with discharge under a reaction pressure of 40 Pa, at a substrate temperature of 300–400° C. and with a higher harmonic (13.56 MHz) power density of 0.5–0.8 W/cm$_2$. In the case of using a silicon oxide nitride film, it may be formed by a plasma CVD process with a silicon oxide nitride film formed from $SiH_4$, $N_2O$ and $NH_3$ or a silicon oxide nitride film formed from $SiH_4$ and $N_2O$. This is performed under a forming condition of a reaction pressure of 20–200 Pa and a substrate temperature of 300–400° C., with a radio frequency (60 MHz) power density of 0.1–1.0 W/cm$^2$. Meanwhile, a silicon oxide nitride hydride film may be used that is to be formed from $SiH_4$, $N_2O$ and $H_2$. A silicon nitride film can be similarly formed from $SiH_4$ and $NH_3$ by a plasma CVD process.

Figure 63B:
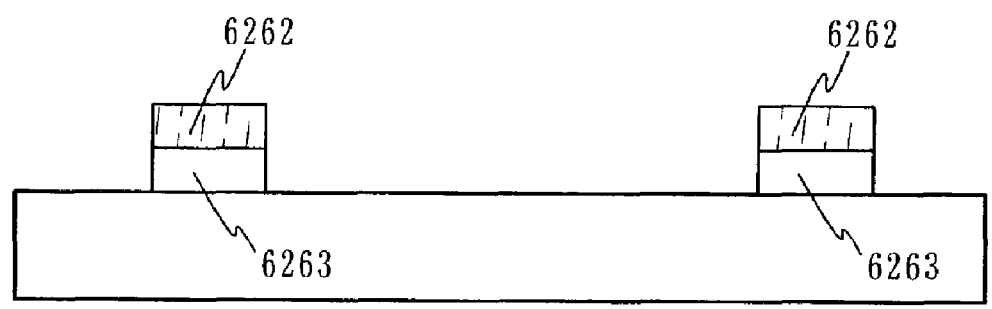
Figure 63C:
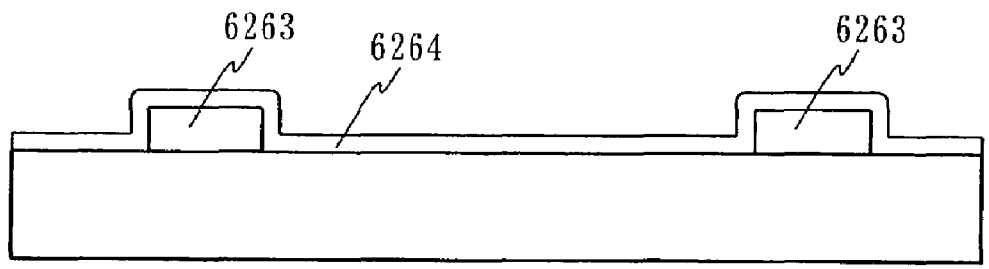

After forming a first insulation film to a thickness of 20–200 nm (preferably 30–60 nm) over the entire surface of the substrate, a mask 6262 is formed by using a photolithography technique as shown in FIG. 63B. Unwanted regions are removed away to form a projection part 6263 in a stripe or rectangular form. On the first base film 6261, a dry etching process may be used that uses a fluorine-based gas. Otherwise, a wet etching process may be used that uses a fluorine-based solution. In the case of selecting the latter, etching is preferably conducted using a mixture solution containing 7.13% of ammonium hydrogen fluoride ($NH_4HF_2$) and 15.4% of ammonium fluoride ($NH_4F$) (product name: LAL500 by Stella Chemifa).

Then, a second insulation film 6264 is formed covering the projection part 6263 and substrate 6260. This layer is formed of silicon oxide, silicon nitride or silicon oxide nitride to a thickness of 50–300 nm (preferably 100–200 nm), similarly to the first base film 6261.

By the above fabrication process, a base film is formed comprising the projection part 6263 and the second base film 6264. After forming the second base film 6264, by continuously forming a semiconductor film without exposure to the air, the impurities in the air are prevented from mixing between the semiconductor film and the base film.

This embodiment can be implemented by freely combining with Embodiments 5 to 10.

Embodiment 12

The shape of a laser beam synthesized by mutual overlap of varying laser beams is explained in Embodiment 12.

Figure 66A:
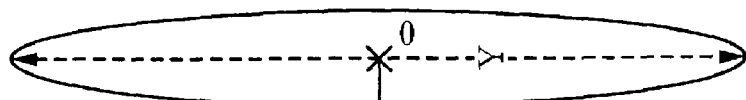
FIGS. 66A to 66D are diagrams showing the energy density distribution of a laser beam.

An example of the shape of a laser beam on a processing piece, for a case in which each laser light emitted from a plurality of laser oscillation apparatuses does not pass through a slit, is shown in FIG. 66A. The laser beams shown in FIG. 66A have elliptical shapes. Note that the shape of the laser beam of laser light emitted from a laser oscillation apparatus in the present invention is not limited to an elliptical shape. The shape of the laser beam differs depending on the type of laser used, and further, can be shaped by an optical system. For example, the shape of laser light emitted from a Lambda Corporation XeCl excimer laser (wavelength 308 nm, pulse width 30 ns) L3308 is a 10 mm×30 mm (half-value widths in the beam profile) rectangular shape. Further, the shape of laser light emitted from a YAG laser becomes circular if the rod shape is cylindrical, and becomes rectangular if a slab is used. Laser light having a desired size can be made by performing additional shaping of this type of laser light with an optical system.

Figure 66B:
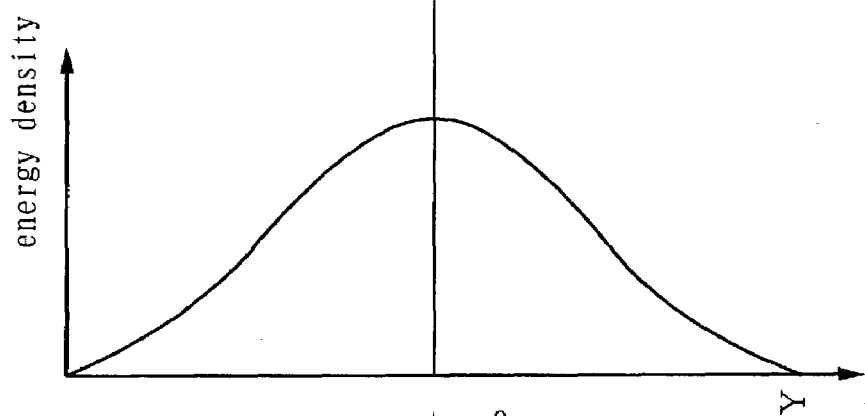

FIG. 66B shows the distribution of the energy density of laser light in the longitudinal axis Y direction of the laser beam shown in FIG. 66A. The laser beam shown in FIG. 66A corresponds to a region satisfying an energy density of $1/e^2$ of the peak value of the energy density in FIG. 66B. The distribution of the energy density of laser light in the case where the laser beam is elliptical in shape becomes higher as the center O of the ellipse is approached. The laser beam shown in FIG. 66A thus has an energy density distribution that follows a Gaussian distribution in the central axis direction, and a region capable of being judged as having a uniform energy density becomes smaller.

Figure 66C:
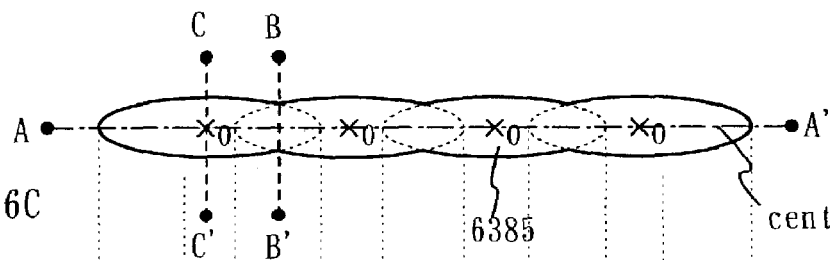

The shape of a laser beam in which laser light having the laser beam shape shown in FIG. 66A is synthesized is shown in FIG. 66C. Note that FIG. 66C shows a case in which laser beams of four laser lights are overlapped, thus forming one linear shape laser beam, but the number of laser beams overlapped is not limited to four.

Synthesis is conducted by making the longitudinal axis of the ellipse for each laser beam of laser light coincide, and mutually overlapping portions of the laser beams, thus forming one laser beam 6385 as shown in FIG. 66C. Note that a straight line obtained by connecting the centers O of respective ellipses is taken as a center axis of the laser beam 6385.

Figure 66D:
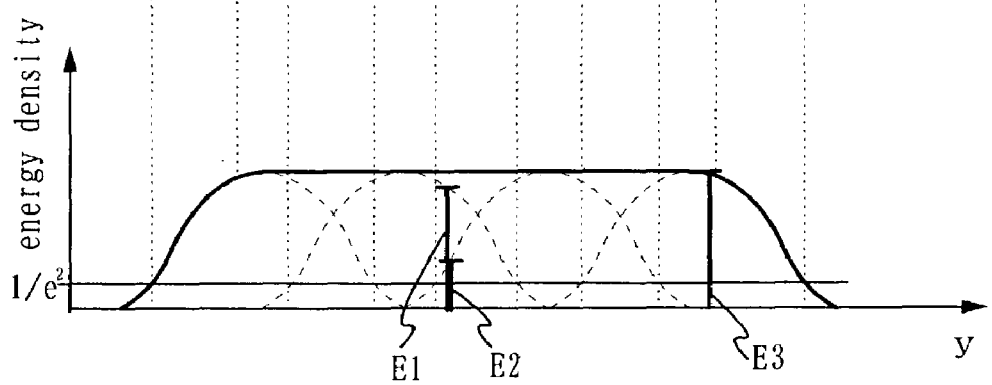

A distribution of the energy density of laser light in the center axis y direction for the laser beam after synthesis shown in FIG. 66D is shown in FIG. 66A. Note that the laser beam shown in FIG. 66C corresponds to a region satisfying an energy density of $1/e^2$ of the peak value of the energy density in FIG. 66B. The energy densities are added in the portions in which the respective laser beams before synthesis overlap. For example, if energy densities E1 and E2 of the overlapping beams shown in the figures are added, then the calculated value become nearly equal to the peak value E3 for the beam energy densities, and the energy densities between the centers O of respective ellipses are leveled.

Note that if E1 and E2 are added, the result ideally becomes equal to E3, but in practice, does not always equal E3. It is possible for a designer to suitably set a permissible range for the difference between the value of E1 and E2 added, and the value of E3.

If an independent laser beam is used, the energy density distribution follows a Gaussian distribution, and therefore it is difficult to irradiate laser light having a uniform energy density to entire portions in which a semiconductor film contacts level portions of an insulating film or portions that become islands. However, by making a plurality of laser lights overlap such that portions having low energy densities mutually complement each other, the uniform energy density region can be expanded, and the crystallinity of a semiconductor film can be increased with good efficiency compared to using an independent laser light in which a plurality of laser lights do not overlap, as can be understood from FIG. 66D.

Note that energy density distributions found by computation in line segments B–B' and C–C' of FIG. 66C are shown in FIGS. 67A and 67B, respectively. Note that, in FIGS. 67A and 67B, regions satisfying an energy density of $1/e^2$ of the peak value of the laser beams before synthesis are taken as a reference. The energy densities in B–B' and C–C' when the length of the transverse axis of the laser beams before synthesis is 37 µm, the length in the longitudinal direction is 410 µm, and the distance from the center is 192 µm have energy distributions as shown in FIGS. 67A and 67B, respectively. The energy distribution along B–B' becomes slightly smaller than that along C–C', but the two can be considered as being nearly equal. The shape of the synthesized laser beam in the regions that satisfy an energy density of $1/e^2$ of the peak value of the laser beams before synthesis can be expressed as a linear shape.

Figure 68:
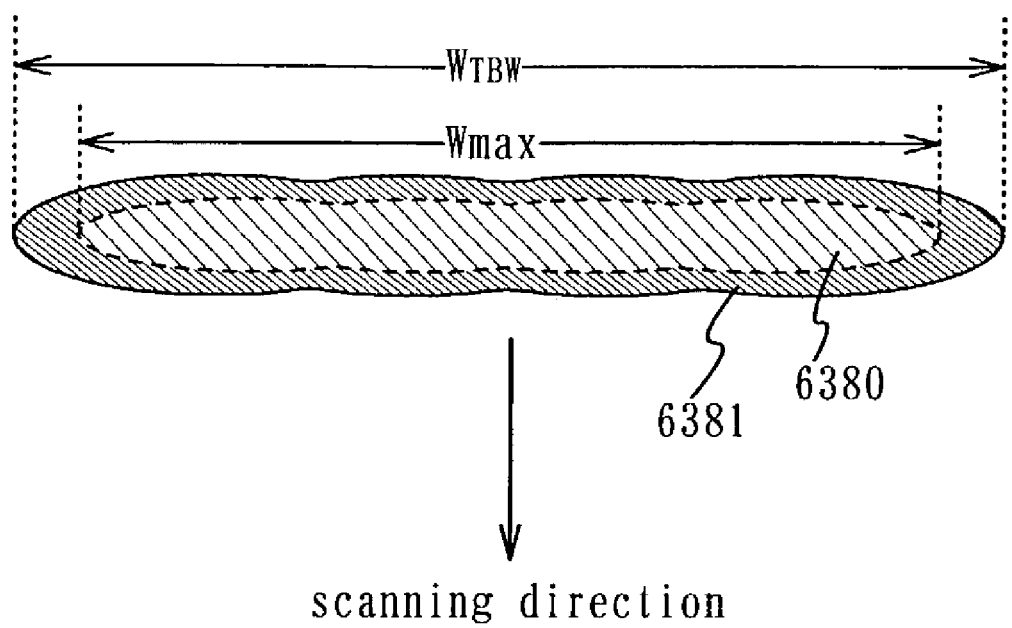
FIG. 68 is a diagram showing the energy density distribution of a laser beam.

FIG. 68A is a diagram showing the energy distribution of the synthesized laser beam. A region denoted by reference numeral 6380 is a region of uniform energy density, and a region denoted by reference numeral 6381 is a region of low energy density. In FIG. 68, the length of the laser beam in the central axis direction is taken as $W_{TBW}$, and the length in the central axis direction in the region 6380 having uniform energy density is taken as $W_{max}$. The ratio of the region 6381, which does not have uniform energy density and cannot be used in crystallizing the semiconductor film, to the region 6380, which has uniform energy density and is capable of being used in crystallization, becomes larger as $W_{TBW}$ becomes large compared to $W_{max}$. Microcrystals develop and the crystallinity is poor in the semiconductor film that is irradiated with laser light in only the non-uniform energy density region 6381. It therefore becomes necessary to set the layout of the scanning path and the unevenness in the insulating film so that regions of the semiconductor film that become islands do not overlap with only the region 6381. This restriction becomes larger if the ratio of the region 6381 to the region 6380 becomes large. Preventing only the non-uniform energy density region 6381 from being irradiated to the semiconductor film formed on concave portions or convex portions of the insulating film by using a slit is therefore effective in making the restriction, which develops when laying out the scanning path and the unevenness in the insulating film, smaller.

It is possible to implement Embodiment 12 in combination with Embodiments 6 to 12.

Embodiment 13

In this embodiment, an optical system of a laser irradiation apparatus used in the present invention, and a positional relationship between each optical system and a slit will be described.

Since, as for the laser beam having the beam spot of elliptical shape, distribution of the energy density in the perpendicular direction to the scanning direction follows Gaussian distribution, a ratio of an area where the energy density is low in the whole is high as compared to the laser beam having the beam spot of rectangular shape or linear shape. Therefore, in the present invention, it is desirable that the beam spot of the laser beam is the rectangular shape or linear shape where distribution of the energy density is relatively uniform.

Figure 69:
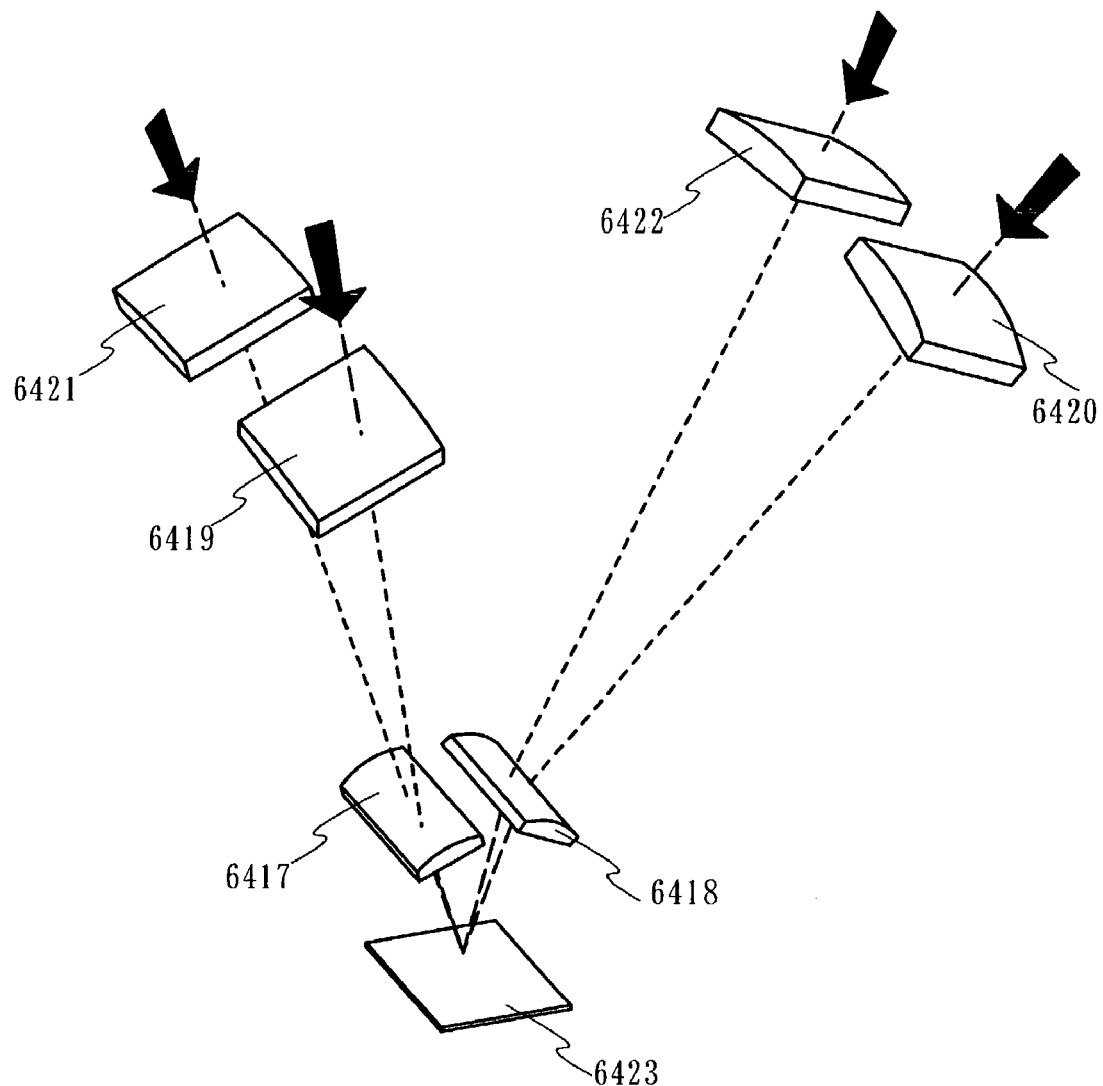
FIG. 69 is a diagram of an optical system.

FIG. 69 shows an optical system used when four laser beams are combined to one laser beam. The optical system shown in FIG. 69 has six cylindrical lenses 6417 to 6422. Four laser light beams emitted from directions indicated by arrows enter to four cylindrical lenses 6419 to 6422. Forms of two laser light beams formed by the cylindrical lenses 6419 and 6421 are shaped by the cylindrical lens 6417 again. Then, the laser light beams are irradiated to an object 6423. On the other hand, the two laser light beams shaped by the cylindrical lenses 6420 and 6422 are shaped by the cylindrical lens 6418 again. Then, the laser light beams are irradiated to the object 6423.

The laser light laser beams on the object 6423 are overlapped and are combined partially with each other to form one laser beam.

The focus distance and incident angle of each lens can be set by a designer properly. The focus distance of the cylindrical lenses 6417 and 6418 closest to the object 6423 is designed to be smaller than the focus distance of the cylindrical lenses 6419 to 6422. For example, the focus distance of the cylindrical lenses 6417 and 6418 closest to the object 6423 is 20 mm. The focus distance of he cylindrical lenses 6419 to 6422 is 150 mm. In this example, each of the lenses are set such that the incident angle of laser light from the cylindrical lenses 6417 and 6418 to the object 400 can be 25° and the incident angle of laser light from the cylindrical lenses 6419 to 6422 to the cylindrical lenses 6417 and 6418 can be 10°. In order to prevent return light and to perform uniform irradiation, the incident angle of the laser light to the substrate is maintained larger than 0° and desirably 5 to 30°.

FIG. 69 shows an example for combining four laser beams. In this case, four cylindrical lenses corresponding to four laser oscillating devices, respectively, and two cylindrical lenses corresponding to the four cylindrical lenses are provided. However, the number of laser beams to be combined is not limited thereto. Two to eight laser beams may be combined. If n laser beams are combined (where n=2, 4, 6 or 8), n cylindrical lenses corresponding to n laser oscillating devices, respectively, and n/2 cylindrical lenses corresponding to the n cylindrical lenses are provided. If n laser beams are combined (where n=3, 5 or 7), n cylindrical lenses corresponding to n laser oscillating devices, respectively, and (n+1)/2 cylindrical lenses corresponding to the n cylindrical lenses are provided.

If five or more laser beams are overlapped, the fifth and subsequent laser light beam are desirably irradiated from the opposite side of the substrate in view of a place where the optical system is placed, the interference and so on. In this case, the slit must be provided also in the opposite side of the substrate. The substrate must be transparent to light.

In order to prevent return light from returning by tracing the original light path, the incident angle to the substrate is desirably maintained larger than 0° and smaller than 90°.

In order to irradiate uniform laser light, the incident plane must be perpendicular to the irradiated surface and include a short side or a long side of a rectangular, which is formed by each beam before combined. Then, an incident angle θ of the laser light desirably satisfies $\theta \geq \arctan(W/2d)$ where W is a length of the short side or the long side included in the incident plane and d is a thickness of a substrate which is placed on the irradiated surface and is translucent to the light laser light. The equation must be satisfied for each laser light before combined. When the laser light path is not on the incident plane, the incident angle of path projected onto the incident plane is the incident angle θ. If laser light is entered at the incident angle θ, the light reflected by the substrate surface and the light reflected from the back surface of the substrate do not interfere. Therefore, uniform laser light can be irradiated. In this discussion, the refractive index of the substrate is 1. In reality, most substrates have the refractive index of around 1.5. In consideration of the value, a larger calculated value can be obtained than an angle calculated according to this discussion. However, energy at both longitudinal ends of a beam spot is attenuated. Therefore, the interference does not affect on this part very much, and the sufficient effect of interference attenuation can be obtained with the calculated value. The above-mentioned inequality of θ does not apply to those substrates that are transmissive to a laser beam.

The optical system having the laser irradiation apparatus used in the present invention is not limited to the construction described in this embodiment.

Typical example of gas laser, which can obtain laser beam of rectangular shape or linear shape without combining plural laser beams, is excimer laser. Typical example of solid laser is slab laser. The present invention may use these lasers. It is possible to form linear shape or rectangular shape laser beam that have uniform energy density by using fiber optics.

This embodiment can be implemented by combining with Embodiments 5 to 12.

Embodiment 14

In this embodiment, relationships between the energy density and the distance of center-to-center of beam spots when they are overlapped will be described.

Figure 70:
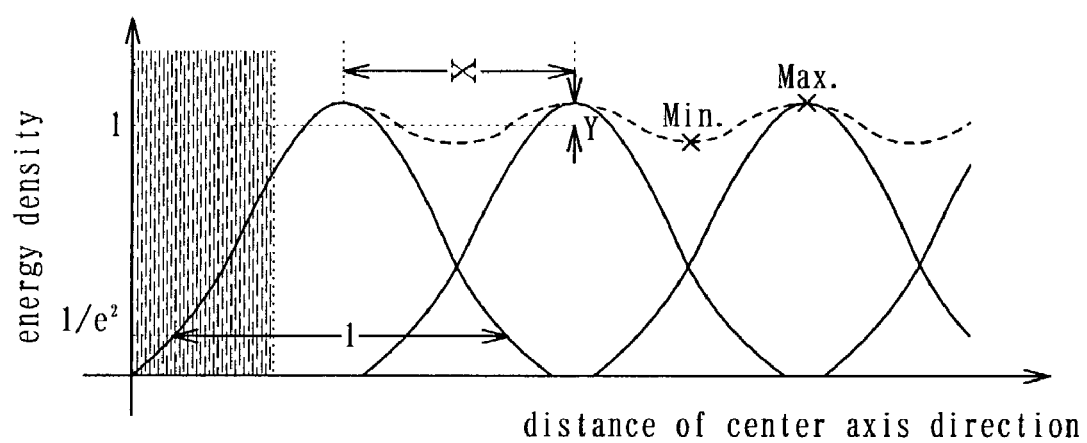
FIG. 70 is a diagram showing the energy density distribution in the central axis direction of overlapped laser beams.

In FIG. 70, the energy density distribution in the central axis direction of each beam spot is indicated by the solid line and the energy density distribution of the synthesized beam spot is indicated by the dashed line. The energy density value in the central axis direction of a beam spot generally follows Gaussian distribution.

Figure 71:
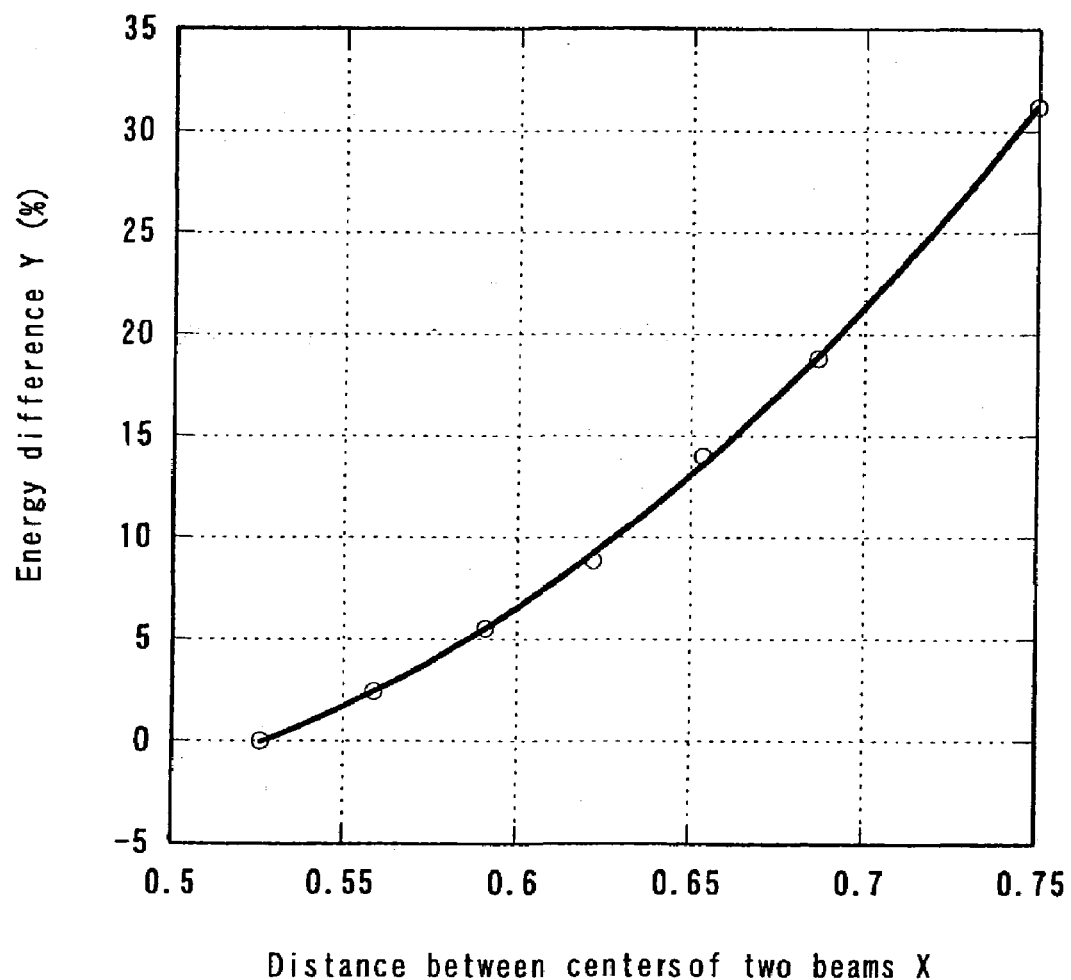
FIG. 71 is a diagram showing the energy difference in relation to the distance between the centers of laser beams.

Assume that, before synthesis, the distance in the central axis direction of a beam spot where the energy density is equal to or more than the peak value, $1/e^2$, is 1. Then, the distance between peaks is given as X. Further, in the synthesized beam spot, an increase from the peak value of the average valley value to the peak value after synthesis is given as Y. The relation between X and Y obtained through simulation is shown in FIG. 71. Y in FIG. 71 is expressed as a percentage.

In FIG. 71, the energy difference Y is expressed by the following Expression 1, which is an approximate equation.

$$Y = 60 - 293X + 340X^2 \text{ (}X\text{ is the larger one of two solutions.)} \quad \text{Equation 1}$$

According to Expression 1, if energy difference is desired to be, for example, around 5%, $X \approx 0.584$ has to be satisfied. Ideally, Y=0 but this makes the length of the beam spot short. Therefore, X is preferably determined balancing it with throughput.

Figure 72:
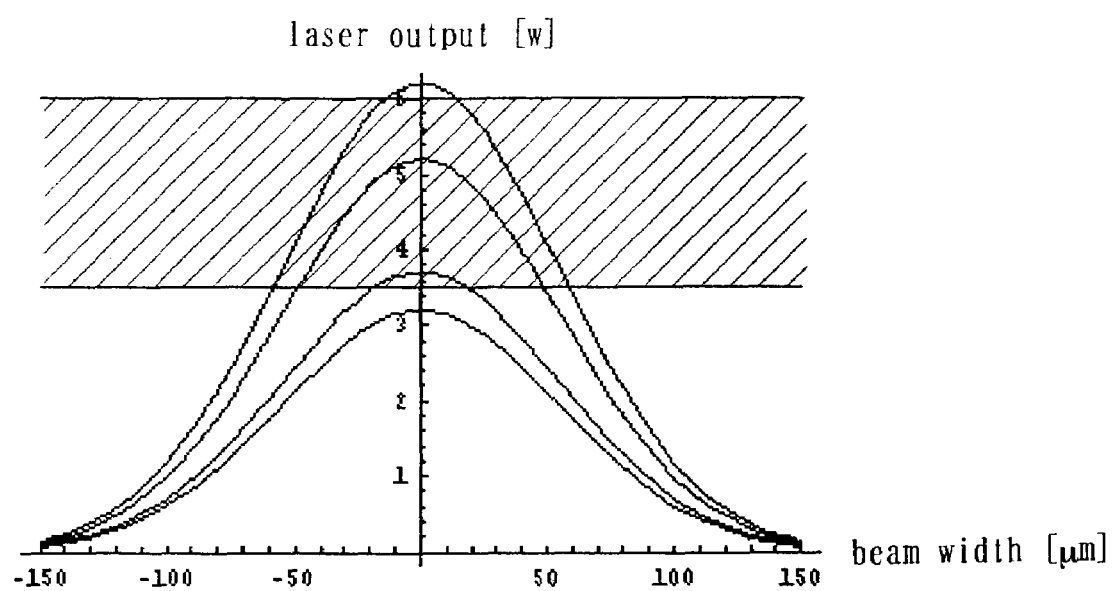
FIG. 72 is a diagram showing the output energy distribution in the central axis direction of a laser beam.

The acceptable range of Y is described next. FIG. 72 shows the output (W) distribution of an $YVO_4$ laser in relation to the beam width in the central axis direction when a beam spot has an elliptical shape. A hatched region is the range of an energy output necessary to obtain satisfactory crystallinity. The graph shows that it is sufficient if the output energy of synthesized laser light falls between 3.5 W and 6 W.

The energy difference Y for obtaining satisfactory crystallinity reaches its maximum when the maximum value and minimum value of the output energy of the synthesized beam spot fall within the range of an energy output necessary to obtain satisfactory crystallinity such that the values closely match the upper limit and lower limit of the range, respectively. Therefore, in the case of FIG. 72, satisfactory crystallinity is obtained if the energy difference Y is ±26.3%.

The range of an energy output necessary to obtain satisfactory crystallinity is varied depending on which level of crystallinity is deemed as satisfactory, and the output energy distribution is also varied depending on the beam spot shape. Accordingly, the acceptable range of the energy difference Y is not limited to the values described above. The appropriate range of energy density is affected by the state and thickness of a semiconductor film to be annealed. It is necessary for a designer to determine the range of an energy output necessary to obtain satisfactory crystallinity and to set the acceptable range of the energy difference Y from the output energy distribution of the laser light used.

This embodiment can be combined with Embodiments 5 to 13.

Embodiment 15

Figure 73:
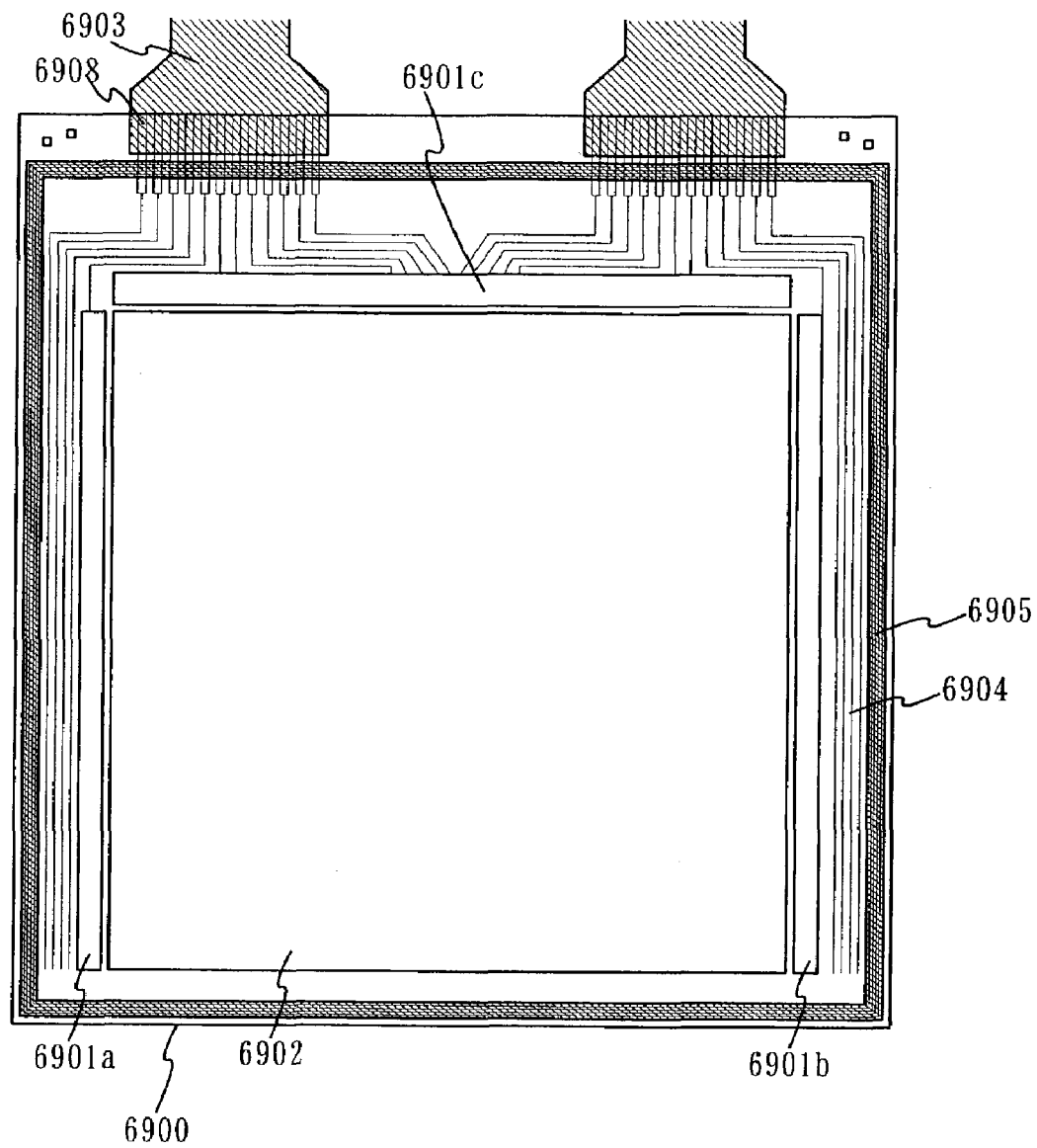
FIG. 73 is a diagram showing the structure of a light emitting device that is an example of a semiconductor device of the present invention.
Figure 74:
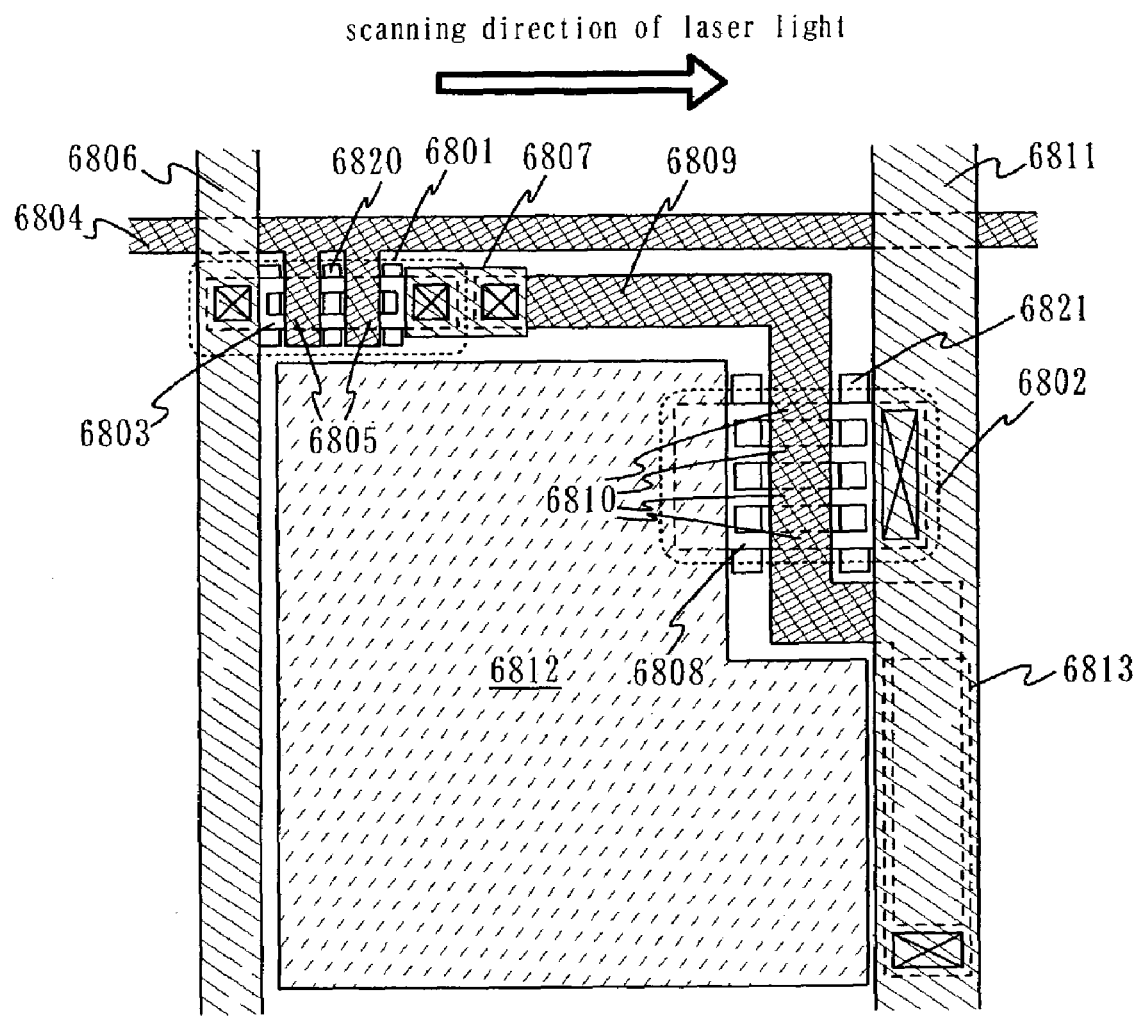
FIG. 74 is a diagram showing a pixel structure of a light emitting device that is an example of a semiconductor device of the present invention.

The present invention can be applied to various semiconductor devices, and an embodiment of a display panel manufactured based on Embodiments 5 to 14 is explained using FIGS. 73 and 74.

A pixel portion 6902, gate signal driver circuits 6901a and 6901b, a data signal driver circuit 6901c, an input/output terminal 6908, and a wiring or wiring group 6904 are prepared on a substrate 6900 in FIG. 73. A sealed pattern 6905 may partially overlap with the gate signal driver circuits 6901a and 6901b, the data signal driver circuit 6901c, and the wiring or wiring group 6904 that connects the driver circuit portion and the input/output terminal 6908. The area of a frame region of the display panel (region in the periphery of the pixel portion) can thus be made smaller. An FPC 6903 is fixed to the input/output terminal 6908.

The present invention can be used in active elements constituting the pixel portion 6902, the gate signal driver circuits 6901a and 6901b, and the data signal driver circuit 6901c.

FIG. 74 is an example showing the structure of one pixel of the pixel portion 6902 shown by FIG. 73. A pixel of a light emitting device, which is a semiconductor device of the present invention, is explained in Embodiment 15. Note that the term light emitting device is a general term for display panels in which light emitting elements formed on a substrate are enclosed between the substrate and a covering material, and for display modules in which TFTs and the like are mounted to the display panel. Note that the light emitting elements have: a layer (light emitting layer) containing an organic compound in which electroluminescence generated by the addition of an electric field can be obtained; an anode; and a cathode.

Note that the light emitting elements used in Embodiment 15 can have forms in which hole injection layers, electron injection layers, hole transporting layers, electron transporting layers, and the like are independent inorganic compounds, or are formed by materials in which an inorganic compound is mixed into an organic compound. Further, portions of these layers may also be mutually mixed together.

Reference numeral 6801 denotes a TFT (switching TFT) used as a switching element for controlling the input of video signals input to the pixel, and reference numeral 6802 denotes a TFT (driver TFT) for supplying current to a pixel electrode based on information in the video signals.

The switching TFT 6801 has an active layer 6803 having a plurality of channel formation regions with channel widths on the order of 1 to 2 μm, a gate insulating film (not shown), and a gate electrode 6805 that is a portion of a gate line 6804. The switching TFT 6801 controls switching by selection signals input from the gate signal driver circuits 6901a and 6901b to the gate line 6804.

One region, either a source region or a drain region, of the active layer 6803 of the switching TFT 6801 is connected to a signal line 6806 to which the video signals are input by the data signal driver circuit 6901c, and the other region is connected to a wiring 6807 used for connecting to another element.

Reference numeral 6820 denotes a convex portion of a base film used during formation of the active layer 6803.

On the other hand, the driver TFT 6802 has an active layer 6808 having a plurality of channel formation regions with channel widths on the order of 1 to 2 μm, a gate insulating film (not shown) and a gate electrode 6810 that is a portion of a capacitor wiring 6809.

One region, either a source region or a drain region of the active layer 6808 of the driver TFT 6802 is connected to a power source line 6811, and the other region is connected to a pixel electrode 6812.

Reference numeral 6821 denotes a convex portion of the base film used in forming the active layer 6808.

Reference numeral 6813 denotes a semiconductor film used for a capacitor, which overlaps with the capacitor wiring 6809, sandwiching a gate insulating film in between. The semiconductor film 6813 used for a capacitor is connected to the power source line. A portion in which the semiconductor film 6813 used for a capacitor, the gate insulating film, and the capacitor wiring 6809 overlap functions as a capacitor for storing the gate voltage of the driver TFT 6802. Further, the capacitor wiring 6809 and the power source line 6811 overlap, sandwiching an interlayer insulating film (not shown) in between. It is also possible for the portion in which the capacitor wiring 6809, the interlayer insulating film, and the power source line 6811 overlap to function as a capacitor for storing the gate voltage of the driver TFT 6802.

Note that the term connection as used in this specification denotes electrical connections unless otherwise specified.

The directions in which carriers move in the channel formation regions in the active layer 6803 of the switching TFT 6801 and the active layer 6808 of the driver TFT 6802 are each aligned with a laser light scanning direction as shown by the arrow.

It is preferable that the number of channel formation regions in the active layer 6808 of the driver TFT 6802 be more than the number of channel formation regions of the active layer 6803 of the switching TFT 6801. This is because the driver TFT 6802 needs a larger current capacity than the switching TFT 6801, and because the ON current can be made larger as the number of channel formation regions increases.

Note that although the structure of a TFT substrate used in a light emitting device is explained in Embodiment 15, a liquid crystal display device can also be manufactured by using the manufacturing processes of Embodiment 15.

It is possible to implement Embodiment 15 by being freely combined with Embodiments 5 to 14.

Embodiment 16

TFTs in a semiconductor device of the present invention have superior crystallinity in their channel formation regions, and therefore circuits formed by elements that normally use single crystal silicon, for example CPUs that use LSIs, various types of storage elements that use logic circuits (for example SRAM), counter circuits, logical divider circuits, and the like can be formed.

The minimum dimensions for ultra LSI are approaching the sub-micron region, and partial element three-dimensionalization is necessary in order to aim for further high integration. The structure of a semiconductor device of the present invention having a stack structure is explained in Embodiment 16.

Figure 76A:
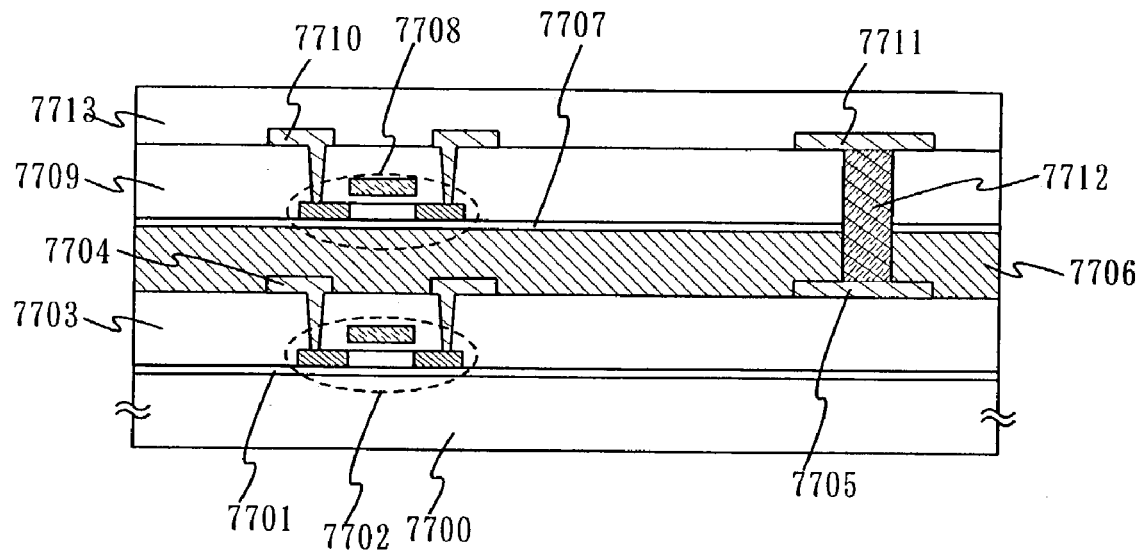
FIGS. 76A and 76B are a sectional view of TFTs forming a stack structure and a diagram showing an example of the structure of a semiconductor device that uses the stack structure TFTs.

FIG. 76A shows a cross sectional diagram of a semiconductor device of Embodiment 16. A first insulating film 7701 is formed on a substrate 7700. A first TFT 7702 is formed on the first insulating film 7701. Note that the channel width of a channel formation region of the first TFT 7702 is on the order of 1 to 2 microns.

A first interlayer insulating film 7703 is formed so as to cover the first TFT 7702, and a first connection wiring 7705, and a wiring 7704 that is electrically connected to the first TFT 7702 are formed on the first interlayer insulating film 7703.

A second interlayer insulating film 7706 is then formed so as to cover the wiring 7704 and the first connection wiring 7705. The second interlayer insulating film 7706 is formed by using an inorganic insulating film, and a film in which a substance that absorbs laser light irradiated in a later step, for example a colored dye or carbon, is mixed into silicon oxide, silicon oxynitride, or the like is used.

If an upper surface of the second interlayer insulating film 7706 is then polished by using a chemical mechanical polishing method (CMP method), then a second insulating film 7706 formed later is further leveled, and the crystallinity of a semiconductor film formed on the second insulating film 7706 and crystallized by laser light can be increased.

A second insulating film 7707 is then formed on the second interlayer insulating film 7706. A second TFT 7708 is then formed on the second insulating film 7707. Note that the channel width of a channel formation region of the second TFT 7708 is on the order of 1 to 2 microns.

A third interlayer insulating film 7709 is formed so as to cover the second TFT 7708, and a second connection wiring 7711, and a wiring 7710 that is electrically connected to the second TFT 7708 are formed on the third interlayer insulating film 7709. Note that an embedded wiring (plug) 7712 is formed between the first connection wiring 7705 and the second connection wiring 7711 by using a damascene process or the like.

A fourth interlayer insulating film 7713 is then formed so as to cover the wiring 7710 and the second connection wiring 7711.

Embodiment 16 has a so-called stack structure in which the first TFT 7702 and the second TFT 7708 can be overlapped through an interlayer insulating film. A semiconductor device having a two layer stack structure is shown in FIG. 76A, but it may also have a stack structure of three or more layers. In this case, an inorganic insulating film, like the second interlayer insulating film 7706, which absorbs laser light is formed between each layer in order to prevent laser light from being irradiated to elements formed in lower layers.

It is possible to have very high integration with a three-dimensionalized semiconductor device, and further, wirings for electrically connecting between each element can be shortened, and therefore signal delays due to the wiring capacitance can be prevented, and very high speed operation becomes possible.

Figure 76B:
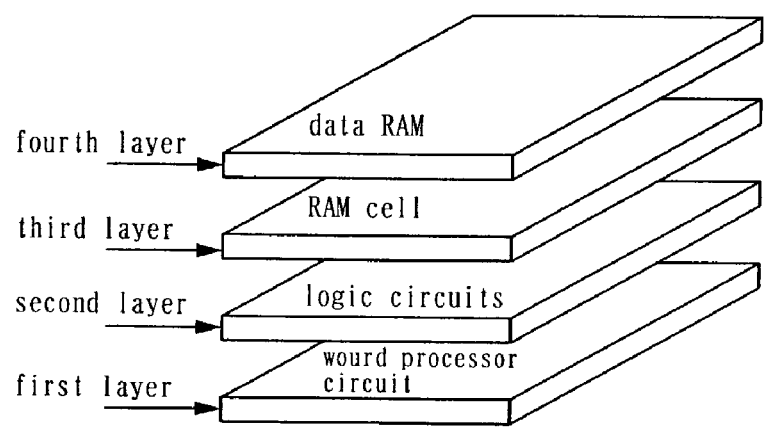

Note that TFTs which use the present invention can also be used in CAM and RAM coexistent chips as noted in "Fourth New Functional Element Technology Symposium Proceedings", July 1985, p. 205. FIG. 76B is a planned model for a RAM coexistence chip with content addressable memory (CAM) in which a processor corresponding to memory (RAM) is disposed. A first layer is a layer on which a word processor circuit is formed, a second layer is a layer on which a processor corresponding to RAM of a third layer is formed by using various types of logic circuits, and the third layer is a layer on which RAM cells are formed. A content addressable memory (CAM) is formed by the processor of the second layer and the RAM cells of the third layer. In addition, a fourth layer is a RAM for data (data RAM), and coexists with the content addressable memory formed by the second layer and the third layer.

It is thus possible for the present invention to be applied to various types of three-dimensionalized semiconductor devices.

It is possible to implement Embodiment 16 by being freely combined with Embodiments 5 to 15.

Embodiment 17

The semiconductor device equipped with the TFT formed by the present invention can be applied to various electronic apparatuses. Examples of the electronic apparatuses are portable information terminals (electronic books, mobile computers, cellular phones, or the like), video cameras, digital cameras, personal computers, TV receivers, cellular phones, projection display apparatuses, or the like. Specific examples of these electronic apparatuses are shown in FIGS. 75A to 75H.

Figure 75A:
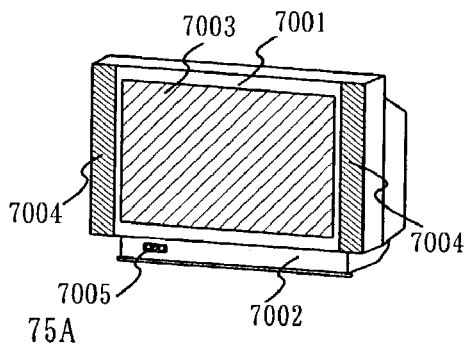
FIGS. 75A to 75H are diagrams of electronic equipment using a semiconductor device of the present invention.

FIG. 75A shows a display apparatus, which is composed of a case 7001, a support base 7002, a display unit 7003, speaker units 7004, a video input terminal 7005, etc. The display apparatus of the present invention is completed by using the semiconductor device of the present invention to the display unit 7003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 75B:
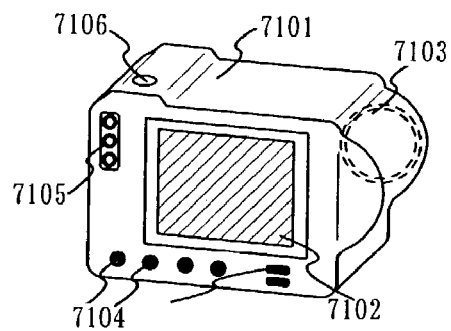

FIG. 75B shows a digital still camera, which is composed of a main body 7101, a display unit 7102, an image receiving unit 7103, operation keys 7104, an external connection port 7105, a shutter 7106, etc. The digital still camera of the present invention is completed by using the semiconductor device of the present invention to the display unit 7102.

Figure 75C:
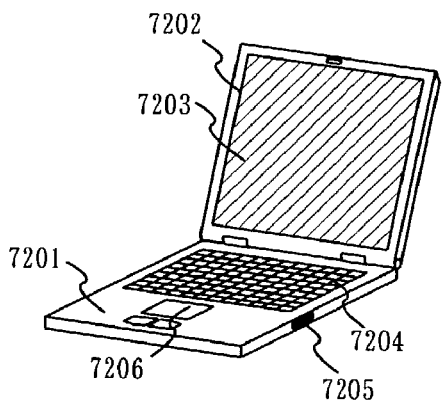

FIG. 75C shows a laptop computer, which is composed of a main body 7201, a case 7202, a display unit 7203, a keyboard 7204, an external connection port 7205, a pointing mouse 7206, etc. The laptop computer of the present invention is completed by using the semiconductor device of the present invention to the display unit 7203.

Figure 75D:
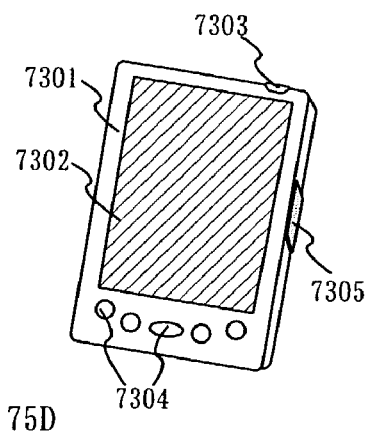

FIG. 75D shows a mobile computer, which is composed of a main body 7301, a display unit 7302, a switch 7303, operation keys 7304, an infrared port 7305, etc. The light emitting device manufactured in accordance with the present invention can be applied to the display unit 7302. The mobile computer of the present invention is completed by using the semiconductor device of the present invention to the display unit 7302.

Figure 75E:
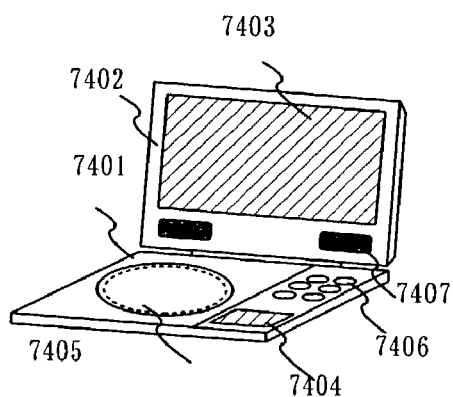

FIG. 75E shows a portable image reproducing device equipped with a recording medium (a DVD player, to be specific). The device is composed of a main body 7401, a case 7402, a display unit A 7403, a display unit B 7404, a recording medium (DVD or the like) reading unit 7405, operation keys 7406, speaker units 7407, etc. The display unit A 7403 mainly displays image information whereas the display unit B 7404 mainly displays text information. The light emitting device manufactured in accordance with the present invention can be applied to the display units A 7403 and B 7404. The portable image reproducing device of the present invention is completed by using the semiconductor device of the present invention to the display units A 7403 and B 7404.

Figure 75F:
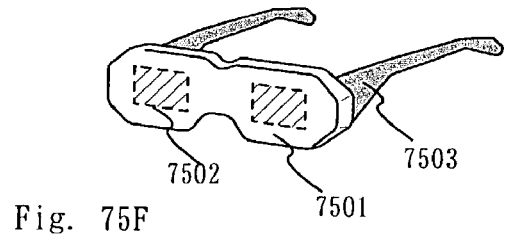

FIG. 75F shows a goggle type display (head mounted display), which is composed of a main body 7501, display units 7502, and arm units 7503. The goggle type display of the present invention is completed by using the semiconductor device of the present invention to the display units 7502.

Figure 75G:
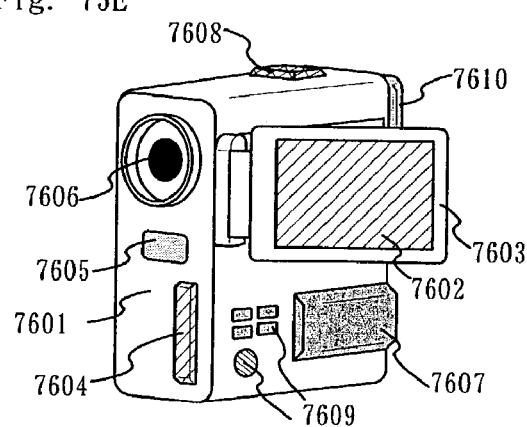

FIG. 75G shows a video camera, which is composed of a main body 7601, a display unit 7602, a case 7603, an external connection port 7604, a remote control receiving unit 7605, an image receiving unit 7606, a battery 7607, an audio input unit 7608, operation keys 7609, eye piece portion 7610 etc. The video camera of the present invention is completed by using the semiconductor device of the present invention to the display unit 7602.

Figure 75H:
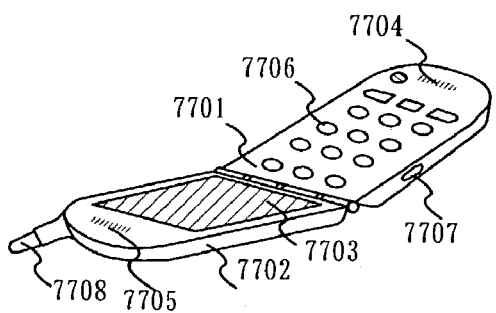

FIG. 75H shows a cellular phone, which is composed of a main body 7701, a case 7702, a display unit 7703, an audio input unit 7704, an audio output unit 7705, operation keys 7706, an external connection port 7707, an antenna 7708, etc. If the display unit 7703 displays white letters on black background, the cellular phone consumes less power. The cellular phone of the present invention is completed by using the semiconductor device of the present invention to the display unit 7703.

As described above, the application range of the present invention is so wide that it is applicable to electric apparatuses of any field. This embodiment can be operated by combining with any structure shown in Embodiments 5 to 16.

As described above, a semiconductor film is melted and gathered through surface tension in an opening formed on an insulating surface and crystals are let grow from the vicinity of the point where the bottom and side surfaces of the opening meet. In this way, distortion accompanying crystallization is concentrated on regions other than the opening. Portions of the crystalline semiconductor film that are not in the opening are removed by etching, so that regions having excellent crystallinity can be selectively picked out. In other words, a semiconductor film is melted and crystallized filling an opening formed on an insulating surface, so that distortion accompanying crystallization is concentrated on regions other than the opening. The crystalline semiconductor film filling the opening is thus free from distortion.

In other words, by forming an opening in a base insulating film and forming a semiconductor so that it fills the opening in a melting and crystallization process during crystallization of an amorphous semiconductor film by irradiating continuous wave laser light, distortions, crystal grain boundaries, and crystal sub-boundaries that accompany crystallization can be made to aggregate in regions other than the opening.

The present invention also makes it possible to form a crystalline semiconductor film that has no grain boundaries by specifying the position of a semiconductor element such as a transistor, in particular, a channel formation region of a TFT. In this way, the causes of characteristic fluctuation, namely, randomly-formed grain boundaries and crystal defects, are removed and a TFT or a group of TFTs with less characteristic fluctuation can be formed. A TFT is formed in a way that places its channel formation region in the crystalline semiconductor film of the opening. As a result, the current drive performance is improved at high speed and the reliability of the element is also improved.

By forming a gate insulating film and a gate electrode so as to overlap the top and side surfaces of the crystalline semiconductor film, the area of a channel formation region is expanded to increase ON current. Furthermore, application of gate voltage from three directions reduces carriers, in particular, hot carriers injected to the gate insulating film and thereby improves the reliability of the transistor.

With the present invention, the formation of grain boundaries in the TFT channel formation regions can be prevented by actively using semiconductor films located on concave portions of a base film as TFT active layers, and conspicuous drops in TFT mobility, decreases in the ON current, and increases in the OFF current, all due to grain boundaries, can be prevented. Note that a designer can suitably determine the degree to which patterning proceeds to remove the region considered as being in the vicinity of the edges of the convex portions and concave portions.

Further, regions in which channel formation regions overlap with gate electrodes, sandwiching gate insulating films in between, can be widely taken by mutually separating a plurality of TFT channel formation regions, and therefore the channel width can be made larger. The ON current is secured by making the channel width larger, and heat generated by driving the TFT can be dissipated efficiently.

What is claimed is:

1. A method of manufacturing a semiconductor device, comprising:
    forming an insulating film on a substrate having an insulating surface, the insulating film having at least one opening;
    forming an amorphous semiconductor film on the insulating film and the opening;
    crystallizing the amorphous semiconductor film to form a crystalline semiconductor film by melting the amorphous semiconductor film;
    forming a crystalline semiconductor island by removing at least a portion of the crystalline semiconductor film remaining on the insulating film;
    exposing side surfaces of at least a portion of the crystalline semiconductor island by removing a part of the insulating film; and
    forming a gate insulating film in contact with top and side surfaces of at least the portion of the crystalline semiconductor island;
    forming a gate electrode on the gate insulating film; and
    forming a source region and a drain region in the crystalline semiconductor island,
    wherein a channel formation region is between the source region and the drain region, and
    wherein the portion of the crystalline semiconductor island includes the channel formation region.

2. A method of manufacturing a semiconductor device, comprising:
    forming an insulating film on a substrate having an insulating surface, the insulating film having at least one opening;
    forming an amorphous semiconductor film on the insulating film and the opening;
    crystallizing the amorphous semiconductor film to form a crystalline semiconductor film by melting the amorphous semiconductor film by irradiating laser light;
    forming a crystalline semiconductor island by removing at least a portion of the crystalline semiconductor film remaining on the insulating film;
    exposing side surfaces of at least a portion of the crystalline semiconductor island by removing a part of the insulating film; and
    forming a gate insulating film in contact with top and side surfaces of at least the portion of the crystalline semiconductor island; and
    forming a gate electrode on the gate insulating film; and
    forming a source region and a drain region in the crystalline semiconductor island,
    wherein a channel formation region is between the source region and the drain region, and
    wherein the portion of the crystalline semiconductor island includes the channel formation region.

3. A method of manufacturing a semiconductor device according to claim 2, wherein the laser light is irradiated by using a continuous wave laser oscillation apparatus as a light source.

4. A method of manufacturing a semiconductor device according to claim 2, wherein the laser light is irradiated while the substrate is heated.

5. A method of manufacturing a semiconductor device, comprising:
    forming an insulating film on a substrate having an insulating surface, the insulating film having at least one opening;
    forming an amorphous semiconductor film on the insulating film and the opening;
    crystallizing the amorphous semiconductor film to form a crystalline semiconductor film by scanning a laser light over the amorphous semiconductor film;
    forming a crystalline semiconductor island by removing at least a portion of the crystalline semiconductor film remaining on the insulating film;
    exposing side surfaces of at least a portion of the crystalline semiconductor island by removing a portion of the insulating film; and
    forming a gate insulating film in contact with top and side surfaces of at least the portion of the crystalline semiconductor island; and
    forming a gate electrode on the gate insulating film; and
    forming a source region and a drain region in the crystalline semiconductor island,
    wherein a channel formation region is between the source region and the drain region, and
    wherein the portion of the crystalline semiconductor island includes the channel formation region,
    wherein the amorphous semiconductor film is melted by scanning the laser light,
    wherein the crystallizing step is performed by scanning the laser light in a direction parallel to a channel longitudinal direction, and
    wherein the opening is extended in the channel longitudinal direction.

6. A method of manufacturing a semiconductor device according to claim 5, wherein the laser light is scanned by using a continuous wave laser oscillation apparatus as a light source.

7. A method of manufacturing a semiconductor device according to claim 5, wherein the laser light is scanned while the substrate is heated.

8. A method of manufacturing a semiconductor device, comprising:
    forming an insulating film on a substrate having an insulating surface, the insulating film having at least one opening;
    forming a non-single crystalline semiconductor film on the insulating film and the opening;
    forming a crystalline semiconductor film filling the opening of the insulating film by melting and crystallizing the non-single crystalline semiconductor film;

forming a crystalline semiconductor island by removing at least a portion of the crystalline semiconductor film remaining on the insulating film;

exposing side surfaces of a portion of the crystalline semiconductor island by removing the insulating film at least from an area for forming a channel formation region; and forming a gate insulating film and a gate electrode on the gate insulating film so that the crystalline semiconductor island is overlapped with the gate electrode through the gate insulating film.

9. A method of manufacturing a semiconductor device, comprising:

forming an insulating film on a substrate having an insulating surface, the insulating film having at least a first opening and a second opening;

forming a non-single crystalline semiconductor film on the insulating film, the first opening, and the second opening;

melting and crystallizing the non-single crystalline semiconductor film by irradiating a laser light in order to form a crystalline semiconductor film filling the first opening and the second opening of the insulating film;

forming a crystalline semiconductor island by removing at least a portion of the crystalline semiconductor film remaining on the insulating film;

exposing side surfaces of a portion of the crystalline semiconductor island by removing at least a portion of the insulating film provided between the first opening and the second opening; and forming a gate insulating film and a gate electrode on the gate insulating film so that the crystalline semiconductor island is overlapped with the gate electrode through the gate insulating film.

10. A method of manufacturing a semiconductor device according to claim 9, wherein the laser light is irradiated by using a continuous wave laser oscillation apparatus as a light source.

11. A method of manufacturing a semiconductor device according to claim 9, wherein the laser light is irradiated along a longitudinal direction of the opening.

12. A method of manufacturing a semiconductor device, comprising:

forming an insulating film on a substrate having an insulating surface, the insulating film having at least one opening;

forming a non-single crystalline semiconductor film on the insulating film and the opening;

forming a crystalline semiconductor film filling the opening of the insulating film by melting and crystallizing the non-single crystalline semiconductor film;

forming a crystalline semiconductor island from the crystalline semiconductor film;

exposing side surfaces of a portion of the crystalline semiconductor island by removing the insulating film at least from an area for forming a channel formation region; and forming a gate insulating film and a gate electrode on the gate insulating film so that the crystalline semiconductor island is overlapped with the gate electrode through the gate insulating film.

13. A method of manufacturing a semiconductor device, comprising:

forming an insulating film on a substrate having an insulating surface, the insulating film having at least one opening;

forming a non-single crystalline semiconductor film on the insulating film and the opening;

melting and crystallizing the non-single crystalline semiconductor film by irradiating a laser light in order to form a crystalline semiconductor film filling the opening of the insulating film; and forming a crystalline semiconductor island from the crystalline semiconductor film;

exposing side surfaces of a portion of the crystalline semiconductor island by removing the insulating film at least from an area for forming the channel formation region; and forming a gate insulating film and a gate electrode on the gate insulating film so that the crystalline semiconductor island is overlapped with the gate electrode through the gate insulating film.

14. A method of manufacturing a semiconductor device according to claim 13, wherein the laser light is irradiated by using a continuous wave laser oscillation apparatus as a light source.

15. A method of manufacturing a semiconductor device according to claim 13, wherein the laser light is irradiated along a longitudinal direction of the opening.

16. A method of manufacturing a semiconductor device, comprising:

forming a semiconductor film on an insulating film having a plurality of convex portions so that the semiconductor film covers the plurality of convex portions wherein the plurality of convex portions includes a first convex portion, a second convex portion, and a third convex portion;

irradiating the semiconductor film with a laser light in order to increase the crystallinity of the semiconductor film;

forming a semiconductor island by patterning the semiconductor film having increased crystallinity wherein the semiconductor island includes a first portion and a second portion, the first portion of the semiconductor island is between and contacts the first convex portion and the second convex portion, and the second portion of the semiconductor island is between and contacts the second convex portion and the third convex portion;

exposing upper surfaces of the plurality of convex portions by etching an upper surface of the semiconductor island;

exposing side surfaces of at least a part of the first portion and a part of the second portion of the etched semiconductor island by removing at least a part of the first convex portion, a part of the second convex portion and a part of the third convex portion; and forming a gate insulating film in contact with top and side surfaces of at least the part of the first portion and the part of the second portion of the etched semiconductor island;

forming a gate electrode on the gate insulating film; and forming a source region and a drain region in the etched semiconductor island, wherein a first channel formation region and a second channel formation region are between the source region and the drain region, wherein the part of the first portion of the etched semiconductor island includes the first channel formation region, and wherein the part of the second portion of the etched semiconductor island includes the second channel formation region.

17. A method of manufacturing a semiconductor device according to claim 9, wherein the laser light is output by using one or a plurality of laser types selected from the group consisting of YAG lasers, $YVO_4$ lasers, YLF lasers, $YAlO_3$ lasers, glass lasers, ruby lasers, Alexandrite lasers, Ti:sapphire lasers, $Y_2O_3$ lasers, and $Nd:YVO_4$ lasers.

18. A method of manufacturing a semiconductor device according to claim 9, wherein the laser light is output by using a slab laser.

19. A method of manufacturing a semiconductor device according to claim 9, wherein the laser light is a continuous wave.

20. A method of manufacturing a semiconductor device according to claim 9, wherein the laser light is a second harmonic.

21. A method of manufacturing a semiconductor device, comprising:
    forming a semiconductor film on an insulating film having a plurality of convex portions so that the semiconductor film covers the plurality of convex portions wherein the plurality of convex portions includes a first convex portion, a second convex portion, and a third convex portion;
    irradiating laser light to the semiconductor film in order to increase the crystallinity of the semiconductor film;
    exposing upper surfaces of the plurality of convex portions by etching an upper surface of the semiconductor film having increased crystallinity;
    forming a semiconductor island by patterning the etched semiconductor film wherein the semiconductor island includes a first portion and a second portion, the first portion of the semiconductor island is between and contacts the first convex portion and the second convex portion, and the second portion of the semiconductor island is between and contacts the second convex portion and the third convex portion;
    exposing side surfaces of at least a part of the first portion and a part of the second portion of the semiconductor island by removing at least a part of the first convex portion, a part of the second convex portion and a part of the third convex portion,
    forming a gate insulating film in contact with top and side surfaces of at least the part of the first portion and the part of the second portion of the semiconductor island;
    forming a gate electrode on the gate insulating film; and
    forming a source region and a drain region in the semiconductor island,
    wherein a first channel formation region and a second channel formation region are between the source region and the drain region,
    wherein the part of the first portion of the semiconductor island includes the channel formation region, and
    wherein the part of the second portion of the semiconductor island includes the second channel formation region.

22. A method of manufacturing a semiconductor device according to claim 21, wherein the laser light is output by using one or a plurality of laser types selected from the group consisting of YAG lasers, $YVO_4$ lasers, YLF lasers, $YAlO_3$ lasers, glass lasers, ruby lasers, Alexandrite lasers, Ti:sapphire lasers, $Y_2O_3$ lasers, and $Nd:YVO_4$ lasers.

23. A method of manufacturing a semiconductor device according to claim 21, wherein the laser light is output by using a slab laser.

24. A method of manufacturing a semiconductor device according to claim 21, wherein the laser light is a continuous wave.

25. A method of manufacturing a semiconductor device according to claim 21, wherein the laser light is a second harmonic.

26. A method of manufacturing a semiconductor device, comprising:
    forming a semiconductor film on an insulating film having a plurality of convex portions so that the semiconductor film covers the plurality of convex; portions wherein the plurality of convex portions includes a first convex portion, a second convex portion, and a third convex portion;
    forming a semiconductor island by patterning the semiconductor film wherein the semiconductor island includes a first portion and a second portion, the first portion of the semiconductor island is between and contacts the first convex portion and the second convex portion, and the second portion of the semiconductor island is between and contacts the second convex portion and the third convex portion;
    irradiating the semiconductor island with a laser light in order to increase the crystallinity of the semiconductor island;
    exposing upper surfaces of the plurality of convex portions by etching an upper surface of the semiconductor island having increased crystallinity;
    exposing side surfaces of at least a part of the first portion and a part of the second portion of the semiconductor island by removing at least a part of the first convex portion, a part of the second convex portion and a part of the third convex portion,
    forming a gate insulating film in contact with top and side surfaces of at least the part of the first portion and the part of the second portion of the etched semiconductor island:
    forming a gate electrode on the gate insulating film; and
    forming a source region and a drain region in the etched semiconductor island,
    wherein a first channel formation region and a second channel formation region are between the source region and the drain region,
    wherein the part of the first portion of the etched semiconductor island includes the channel formation region, and
    wherein the part of the second portion of the etched semiconductor island includes the second channel formation region.

27. A method of manufacturing a semiconductor device according to claim 10, wherein the laser light is output by using one or a plurality of laser types selected from the group consisting of YAG lasers, $YVO_4$ lasers, YLF lasers, $YAlO_3$ lasers, glass lasers, ruby lasers, Alexandrite lasers, Ti:sapphire lasers, $Y_2O_3$ lasers, and $Nd:YVO_4$ lasers.

28. A method of manufacturing a semiconductor device according to claim 10, wherein the laser light is output by using a slab laser.

29. A method of manufacturing a semiconductor device according to claim 10, wherein the laser light is a continuous wave.

30. A method of manufacturing a semiconductor device according to claim 10, wherein the laser light is a second harmonic.

* * * * *

UNITED STATES PATENT AND TRADEMARK OFFICE
CERTIFICATE OF CORRECTION

PATENT NO. : 7,749,818 B2 Page 1 of 1
APPLICATION NO. : 10/352233
DATED : July 6, 2010
INVENTOR(S) : Atsuo Isobe et al.

It is certified that error appears in the above-identified patent and that said Letters Patent is hereby corrected as shown below:

At column 58, line 67, "claim 9" should be --claim 16--;

At column 59, line 6, "claim 9" should be --claim 16--;

At column 59, line 9, "claim 9" should be --claim 16--;

At column 59, line 12, "claim 9" should be --claim 16--;

At column 60, exact line 47, "claim 10" should be --claim 26--;

At column 60, exact line 53, "claim 10" should be --claim 26--;

At column 60, exact line 56, "claim 10" should be --claim 26--;

At column 60, exact line 59, "claim 10" should be --claim 26--.

Signed and Sealed this

Twenty-first Day of December, 2010

David J. Kappos
*Director of the United States Patent and Trademark Office*